United States Patent
Katsuyama et al.

(10) Patent No.: US 11,106,254 B2
(45) Date of Patent: Aug. 31, 2021

(54) CONDUCTIVE MEMBER, CONDUCTIVE FILM, DISPLAY DEVICE HAVING THE SAME, TOUCH PANEL, METHOD OF PRODUCING WIRING PATTERN OF CONDUCTIVE MEMBER, AND METHOD OF PRODUCING WIRING PATTERN OF CONDUCTIVE FILM

(71) Applicant: FUJIFILM Corporation, Tokyo (JP)

(72) Inventors: Kimito Katsuyama, Kanagawa (JP); Masaya Nakayama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/950,862

(22) Filed: Nov. 17, 2020

(65) Prior Publication Data

US 2021/0064106 A1 Mar. 4, 2021

Related U.S. Application Data

(63) Continuation of application No. PCT/JP2019/019198, filed on May 15, 2019.

(30) Foreign Application Priority Data

May 21, 2018 (JP) .............................. JP2018-097213

(51) Int. Cl.
| | |
|---|---|
| *G06F 1/18* | (2006.01) |
| *G06F 3/041* | (2006.01) |
| *H01L 27/32* | (2006.01) |
| *G06F 17/14* | (2006.01) |

(52) U.S. Cl.
CPC ............ *G06F 1/189* (2013.01); *G06F 3/0412* (2013.01); *G06F 17/14* (2013.01); *H01L 27/323* (2013.01); *H01L 27/3276* (2013.01)

(58) Field of Classification Search
CPC ........ G06F 3/0412; G06F 1/189; G06F 17/14; G06F 2203/04112; H01L 27/323; H01L 27/3276; H05K 1/0296; H05K 1/0274
See application file for complete search history.

(56) References Cited

U.S. PATENT DOCUMENTS

| | | | | |
|---|---|---|---|---|
| 9,710,088 | B2 * | 7/2017 | Yamaguchi | ............... G06F 1/16 |
| 9,791,712 | B2 * | 10/2017 | Iwami | .................. H05K 1/0274 |

(Continued)

FOREIGN PATENT DOCUMENTS

| | | |
|---|---|---|
| JP | 2014071544 | 4/2014 |
| JP | 2015181060 | 10/2015 |

(Continued)

OTHER PUBLICATIONS

"International Search Report (Form PCT/ISA/210) of PCT/JP2019/019198," dated Jul. 16, 2019, with English translation thereof, pp. 1-5.

(Continued)

*Primary Examiner* — Sardis F Azongha
(74) *Attorney, Agent, or Firm* — JCIPRNET

(57) ABSTRACT

In order to achieve the above object, according to a first aspect of the present invention, there is provided a conductive member including a wiring portion that is composed of a plurality of thin metal wires. The wiring portion has two or more insulated wiring layers and has a mesh-shaped wiring pattern in which line wirings each being composed of a plurality of thin metal wires arranged in parallel in one direction are overlapped in two or more directions, in front observation of the conductive member. The line wiring in at least one direction is a straight line wiring in which the plurality of thin metal wires are straight lines. The straight line wiring in at least one direction is a wiring in which the two or more thin metal wires are consecutively arranged on at least one wiring layer among the two or more wiring (Continued)

layers, and has a non-equal pitch wiring pattern in which repetitive pitches of a predetermined number of the thin metal wires are equal pitches and at least two pitches of the respective pitches of the predetermined number of the thin metal wires are different, in front observation of the conductive member. The conductive member has a wiring pattern that is able to reduce occurrence of moiré in both front observation and oblique observation regardless of the observation angle (viewing angle). A conductive film, a display device, and a touch panel each include the conductive member.

24 Claims, 43 Drawing Sheets

(56) References Cited

U.S. PATENT DOCUMENTS

| | | | |
|---|---|---|---|
| 9,891,657 | B2 | 2/2018 | Iwami |
| 2014/0218325 | A1 | 8/2014 | Iwami |
| 2015/0015979 | A1* | 1/2015 | Iwami .................. G06F 3/0412 |
| | | | 359/893 |
| 2015/0342034 | A1* | 11/2015 | Iwami .................. G06F 3/0445 |
| | | | 345/174 |
| 2016/0274703 | A1 | 9/2016 | Satou |
| 2017/0102342 | A1 | 4/2017 | Iwami |
| 2017/0228090 | A1 | 8/2017 | Nakamura |
| 2017/0351132 | A1 | 12/2017 | Kanari |

FOREIGN PATENT DOCUMENTS

| | | |
|---|---|---|
| JP | 2016014929 | 1/2016 |
| JP | 2017220015 | 12/2017 |
| WO | 2015083419 | 6/2015 |
| WO | 2016068161 | 5/2016 |
| WO | 2016080046 | 5/2016 |

OTHER PUBLICATIONS

"International Preliminary Report on Patentability (Form PCT/IPEA/409) of PCT/JP2019/019198," completed on Jun. 22, 2020, with English translation thereof, pp. 1-18.

* cited by examiner

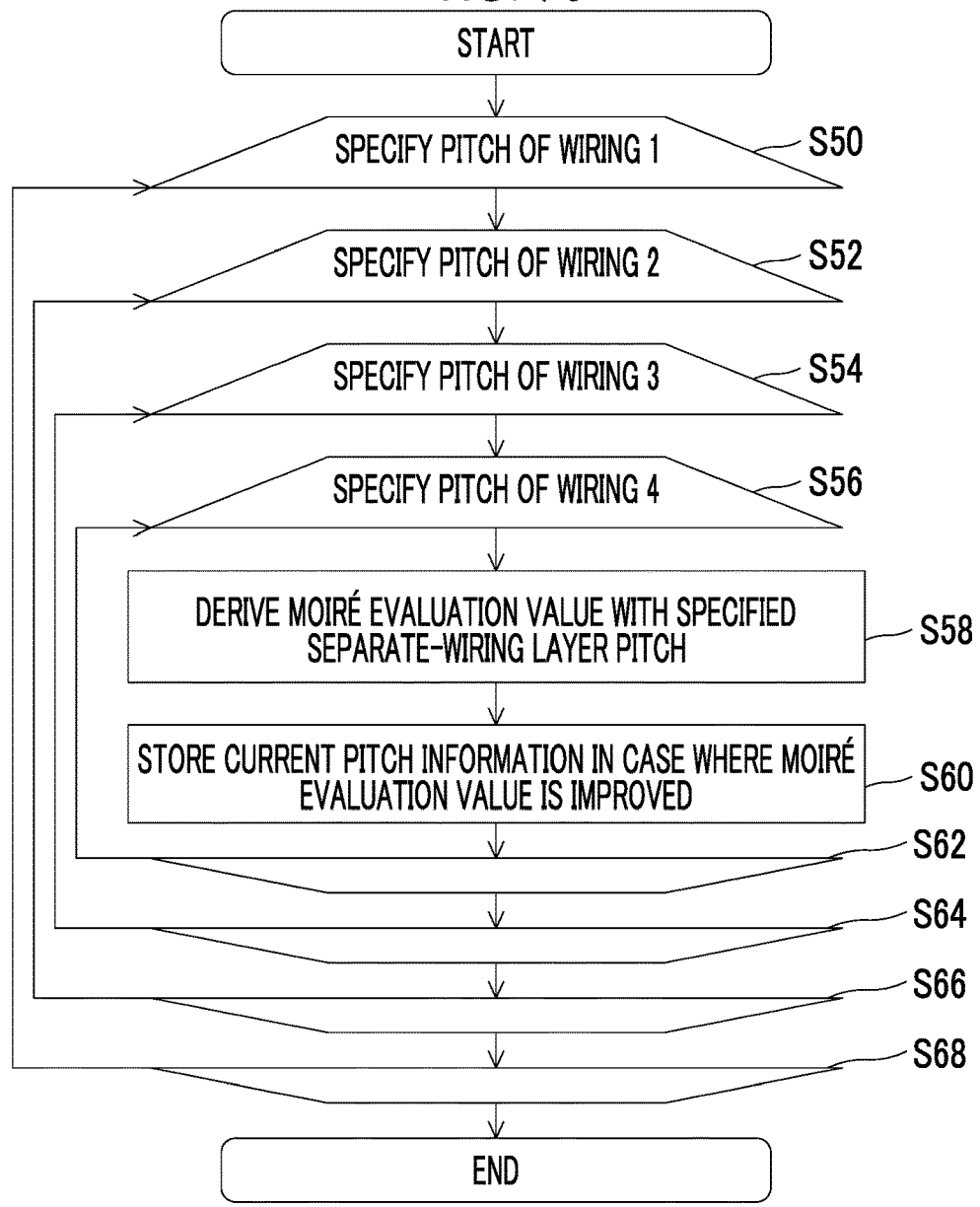
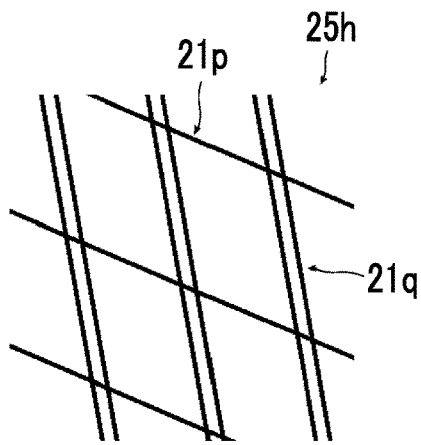

CONDUCTIVE MEMBER, CONDUCTIVE FILM, DISPLAY DEVICE HAVING THE SAME, TOUCH PANEL, METHOD OF PRODUCING WIRING PATTERN OF CONDUCTIVE MEMBER, AND METHOD OF PRODUCING WIRING PATTERN OF CONDUCTIVE FILM

CROSS-REFERENCE TO RELATED APPLICATIONS

This application is a Continuation of PCT International Application No. PCT/JP2019/019198 filed on May 15, 2019, which claims priority under 35 U.S.C. § 119(a) to Japanese Patent Application No. 2018-097213 filed on May 21, 2018. Each of the above applications is hereby expressly incorporated by reference, in its entirety, into the present application.

BACKGROUND OF THE INVENTION

1. Field of the Invention

The present invention relates to a conductive member, a conductive film, a display device having the same, a touch panel, a method of producing a wiring pattern of the conductive member, and a method of producing a wiring pattern of the conductive film. More specifically, the present invention relates to a conductive member having a mesh-shaped wiring pattern that provides an image quality with improved visibility of moiré even in a case where overlapped on a pixel array pattern of a display device, a conductive film, a display device having the same, a touch panel, a method of producing a wiring pattern of the conductive member, and a method of producing a wiring pattern of the conductive film.

2. Description of the Related Art

Examples of a conductive film provided on a display unit of a display device (hereinafter, also referred to as a display) include a conductive film for a touch panel having a conductive film which is composed of thin metal wires having a mesh-shaped wiring pattern (hereinafter, also referred to as a mesh pattern).

In these conductive films, there is a problem of visibility of moiré due to interference between the mesh pattern and the pixel array pattern of the display. Here, the pixel array pattern of the display is, for example, each array pattern of red (R), green (G), and blue (B) color filters or a black matrix (hereinafter also referred to as BM) pattern which is an inverted pattern thereof. As for the problem of visibility of moiré, specifically, there is a known problem that regular moiré is conspicuous in a case where the equal pitch wiring pattern is overlapped on the pixel array pattern. For this reason, various conductive films, each of which has a mesh pattern in which moiré (particularly regular moiré) is not visible or hardly likely to be visible, have been proposed (refer to, for example, JP2014-071544A).

The technique disclosed in JP2014-071544A filed by the present applicant is a conductive film having a wiring pattern that has two or more wiring layers formed on both surfaces of one transparent substrate or one surface of two or more transparent substrates and arranged in layers. The lowest frequency of the spatial frequencies of moiré obtained by convolution between the spatial frequency characteristics of the wiring pattern and the spatial frequency characteristics of the pixel array pattern is fm1. The lowest frequency of the moiré spatial frequencies obtained by convolution between the spatial frequency characteristics of half the wiring pattern and the spatial frequency characteristics of the pixel array pattern is fm2. In this case, fm1<=fm2. According to the technique of JP2014-071544A, occurrence of moiré can be reduced regardless of the viewing angle (observation angle).

On the other hand, WO2016-068161 discloses a wiring pattern. The wiring pattern contains a conductive material on both surfaces of a transparent substrate, and has pairs of parallel lines that are formed as a result of separating the conductive material through movement of a liquid. In the wiring pattern, the pair of parallel lines in one direction and the pair of parallel lines in the other direction on the front surface of the transparent substrate intersect at a predetermined angle such as 90°, and the pair of parallel lines in one direction and the pair of parallel lines in the other direction on the back surface of the transparent substrate intersect at a predetermined angle such as 90°. In addition, in a case where the wiring pattern is viewed through a transparent substrate, one pair of parallel lines in one direction on the back surface is positioned between two pairs of adjacent parallel lines in one direction on the front surface, and one pair of parallel lines in the other direction on the back surface is positioned between two pairs of adjacent parallel lines in the other direction on the front surface. WO2016-068161 describes that the low visibility in a case where the wiring patterns on both surfaces are viewed through the transparent substrate can be improved.

The technology disclosed in JP2016-014929A relating to the application filed by the present applicant is a technology based on a 2-layer wiring pattern on the upper side (TOP) and the lower side (BOTTOM) and a rhomboid wiring pattern to which irregularity is provided. Here, at least one of TOP or BOTTOM is a wiring pattern in which irregularity is provided to the pitches of rhomboids. According to this technology, the 2-layer wiring pattern is configured such that the moiré evaluation value calculated from the moiré evaluation indexes of the respective colors is equal to or less than a threshold value. The moiré evaluation value of each color is obtained by applying visual response characteristics to the intensity and frequency of the spectrum peak of the 2-dimensional fast Fourier transform (2DFFT) spectrum of each color and the intensity and frequency of moiré calculated from the intensity and frequency of the 2DFFT spectrum of the overlapped wiring pattern. According to the technology disclosed in JP2016-014929A, it is possible to restrain occurrence of moiré depending on the intensity of the display regardless of the observation distance, and it is possible to greatly improve visibility.

SUMMARY OF THE INVENTION

By the way, JP2014-071544A requires a wiring pattern for which fm1<=fm2. Here, fm1 is the lowest frequency of the spatial frequencies of moiré obtained by convolution between the spatial frequency characteristics of the wiring pattern and the spatial frequency characteristics of the pixel array pattern. In addition, fm2 is the lowest frequency of the moiré spatial frequencies obtained by convolution between the spatial frequency characteristics of half the wiring pattern and the spatial frequency characteristics of the pixel array pattern. JP2014-071544A addresses only the lowest frequency of moiré, and deterioration of image quality is restrained only in a case where the viewing angle (observation angle) is not in the front observation.

Further, WO2016-068161 discloses a wiring pattern in which a plurality of pairs of parallel lines are arranged on both surfaces of the transparent substrate, but discloses only a wiring pattern for improving the low visibility in a case where the wiring patterns on both surfaces are viewed through the transparent substrate. Thus, neither the image quality including moiré nor the viewing angle (observation angle) dependency of the image quality is considered or mentioned at all.

In JP2016-014929A, an attempt is made to "select a wiring pattern in which the moiré evaluation index is equal to or less than a threshold value after providing irregularity". However, in a case where such an attempt is made, although the regular moiré can be reduced as compared with the regular wiring pattern, there is no guarantee that both the regular moiré and the irregular moiré (noise) can be reduced. In JP2016-014929A, the characteristics of a wiring pattern capable of reducing both regular moiré and irregular moiré (noise) as compared with a regular wiring pattern and the reason for that are not clarified.

In order to solve the above-mentioned problems of the prior art, the present invention has an object to provide a conductive member, a conductive film, a display device and a touch panel having the same, a method of producing a wiring pattern of a conductive member, and a method of producing a wiring pattern of a conductive film. The conductive member and the conductive film each have a conductive member having a wiring pattern capable of reducing occurrence of moirés in front observation and oblique observation, regardless of the observation angle (viewing angle).

In order to achieve the above object, according to a first aspect of the present invention, there is provided a conductive member including a wiring portion that is composed of a plurality of thin metal wires. The wiring portion has two or more insulated wiring layers and has a mesh-shaped wiring pattern in which line wirings each being composed of a plurality of thin metal wires arranged in parallel in one direction are overlapped in two or more directions, in front observation of the conductive member. The line wiring in at least one direction is a straight line wiring in which the plurality of thin metal wires are straight lines. The straight line wiring in at least one direction is a wiring in which the two or more thin metal wires are consecutively arranged on at least one wiring layer among the two or more wiring layers, and has a non-equal pitch wiring pattern in which repetitive pitches of a predetermined number of the thin metal wires are equal pitches and at least two pitches of the respective pitches of the predetermined number of the thin metal wires are different, in front observation of the conductive member.

Here, it is preferable that the conductive member is to be provided on a display unit of a display device. In addition, it is preferable that the mesh-shaped wiring pattern is overlapped on a pixel array pattern of the display unit.

Further, it is preferable that a moiré evaluation value in the non-equal pitch wiring pattern is less than a moiré evaluation value in an equal pitch wiring pattern which is composed of a plurality of straight thin metal wires, in which repetitive pitches of the predetermined number of thin metal wires are equal to those of the non-equal pitch wiring pattern, and in which respective pitches of the thin metal wires are equal. In addition, it is preferable that the moiré evaluation value is a sum of intensities of frequency components of moiré obtained by applying human's visual response characteristics to frequency components of moiré calculated from frequency components of 2-dimensional Fourier frequency distributions of transmittances of the non-equal pitch wiring pattern and the equal pitch wiring pattern and frequency components of a 2-dimensional Fourier frequency distribution of a luminance or a transmittance of the pixel array pattern.

In addition, in order to achieve the above-mentioned object, according to a second aspect of the present invention, there is provided a conductive member provided on a display unit of a display device, the conductive member comprising a wiring portion that is composed of a plurality of thin metal wires. The wiring portion has two or more insulated wiring layers and has a mesh-shaped wiring pattern in which line wirings each being composed of a plurality of thin metal wires arranged in parallel in one direction are overlapped in two or more directions, in front observation of the conductive member. The mesh-shaped wiring pattern is overlapped on a pixel array pattern of the display unit. The line wiring in at least one direction is a straight line wiring in which the plurality of thin metal wires are straight lines. In addition, the straight line wiring in at least one direction is a wiring in which the two or more thin metal wires are consecutively arranged on at least one wiring layer among the two or more wiring layers, and has a non-equal pitch wiring pattern in which repetitive pitches of a predetermined number of thin metal wires are equal pitches and at least two pitches of the respective pitches of the predetermined number of the thin metal wires are different, on a wiring layer in which the two or more thin metal wires are consecutively arranged. A moiré evaluation value in the non-equal pitch wiring pattern is less than a moiré evaluation value in an equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal. In addition, the moiré evaluation value is a sum of intensities of frequency components of moiré obtained by applying human's visual response characteristics to frequency components of moiré calculated from frequency components of 2-dimensional Fourier frequency distributions of transmittances of the non-equal pitch wiring pattern and the equal pitch wiring pattern and frequency components of a 2-dimensional Fourier frequency distribution of a luminance or a transmittance of the pixel array pattern.

In any one of the first and second aspects, it is preferable that the visual response characteristics are given by a visual transfer function VTF represented by Expression (1).

$k \leq \log(0.238/0.138)/0.1$,
$VTF = 1$,
$k > \log(0.238/0.138)/0.1$, $$VTF = 5.05 e^{0.138k}(1 - e^{0.1k}) \qquad (1), \text{ and}$$

$k = \pi du/180$,

Here, log is a natural logarithm, k is a spatial frequency defined by solid angle (cycle/deg), u is a spatial frequency defined by length (cycle/mm), and d is an observation distance (mm) within a range of 100 mm to 1000 mm.

Further, it is preferable that the observation distance d in the visual response characteristics is a certain distance in a range from 300 mm to 800 mm.

Furthermore, it is preferable that assuming that the moiré evaluation value is I, the moiré evaluation value I is derived from an intensity of each frequency component of the moiré by Expression (2).

$$I = (\Sigma (R[i])^x)^{1/x} \qquad (2)$$

Here, R[i] is an intensity of an i-th frequency component of moiré, and the order x is a certain value in a range of 1 to 4.

In addition, it is preferable that the order x is 2.

Further, it is preferable that the moiré evaluation value is derived by a non-linear sum of the intensities of the frequency components of the moiré.

Furthermore, it is preferable that the moiré evaluation value also includes frequency components of the moiré calculated from a frequency of 0 of the pixel array pattern and the frequency components of the wiring pattern.

Further, it is preferable that an intensity of a frequency component of the moiré that contributes most to the moiré in the non-equal pitch wiring pattern is less than an intensity of a frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal.

Furthermore, it is preferable that a frequency of the frequency component of the moiré that contributes most to the moiré in the non-equal pitch wiring pattern is greater than a frequency of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal.

In addition, it is preferable that at or below a frequency of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, the moiré evaluation value in the non-equal pitch wiring pattern is less than the moiré evaluation value in the equal pitch wiring pattern. In addition, it is preferable that the moiré evaluation value is a sum of intensities of frequency components of moiré obtained by applying human's visual response characteristics to frequency components of moiré calculated from frequency components of 2-dimensional Fourier frequency distributions of transmittances of the non-equal pitch wiring pattern and the equal pitch wiring pattern and frequency components of a 2-dimensional Fourier frequency distribution of a luminance or a transmittance of the pixel array pattern.

In addition, it is preferable that at a frequency of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, an intensity of the frequency component of the moiré in the non-equal pitch wiring pattern is less than an intensity of the frequency component of the moiré in the equal pitch wiring pattern.

Further, it is preferable that an intensity of the frequency component of the non-equal pitch wiring pattern as a cause of the frequency component of the moiré that contributes most to the moiré in the non-equal pitch wiring pattern is less than an intensity of the frequency component of the equal pitch wiring pattern as a cause of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal.

In addition, it is preferable that at a frequency of the frequency component of the equal pitch wiring pattern as a cause of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, an intensity of the frequency component of the non-equal pitch wiring pattern is less than an intensity of the frequency component of the equal pitch wiring pattern.

Further, It is preferable that assuming that the predetermined number is n and the thin metal wires are thin metal wires 1, 2, . . . , and n in the non-equal pitch wiring pattern, a pitch p of each thin metal wires from the thin metal wires 1 satisfies at least one of Condition 1 or Condition 2.

Condition 1: a difference between a number of thin metal wires where the pitch p belongs to an interval of $(N-d)*T<p<(N+d)*T$ and a number of thin metal wires where the pitch p belongs to an interval of $(N+0.5-d)*T<p<(N+0.5+d)*T$ is equal to or less than 1; and Condition 2: a difference between a number of thin metal wires where the pitch p belongs to an interval of $(N+0.25-d)*T<p<(N+0.25+d)*T$ and a number of thin metal wires where the pitch p belongs to an interval of $(N+0.75-d)*T<p<(N+0.75+d)*T$ is equal to or less than 1, where T is a period given by 1/F in which F is a frequency of the frequency component of the equal pitch wiring pattern as a cause of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, N is 0 or a positive integer and is equal to or less than an integer of $(n*PA/T)$ in which PA is a pitch of the equal pitch wiring pattern, and d is a certain value in a range of 0.025 to 0.25.

Further, It is preferable that assuming that the predetermined number is n and the thin metal wires are thin metal wires 1, 2, . . . , and n in the non-equal pitch wiring pattern, a pitch p of each thin metal wires from the thin metal wires 1 satisfies at least one of Condition 1 or Condition 2.

Condition 1: a difference between a number of thin metal wires where the pitch p belongs to an interval of $(N-d)*T<p<(N+d)*T$ and a number of thin metal wires where the pitch p belongs to an interval of $(N+0.5-d)*T<p<(N+0.5+d)*T$ is equal to or less than 1; and Condition 2: a difference between a number of thin metal wires where the pitch p belongs to an interval of $(N+0.25-d)*T<p<(N+0.25+d)*T$ and a number of thin metal wires where the pitch p belongs to an interval of $(N+0.75-d)*T<p<(N+0.75+d)*T$ is equal to or less than 1, where T is a period given by 1/F in which F is a frequency of the frequency component of the wiring pattern of the thin metal wires as a cause of the frequency component of the moiré that contributes most to the moiré in the wiring pattern formed only of any of thin metal wires 1, 2, . . . , and n, N is 0 or a positive integer and is equal to or less than an integer of $(n*PA/T)$ in which PA is a pitch of the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, and d is a certain value in a range of 0.025 to 0.25.

Further, it is preferable that the pixel array pattern is a black matrix pattern.

Further, it is preferable that the plurality of thin metal wires are all straight lines in line wirings in all the two or more directions.

Furthermore, it is preferable that the predetermined number is equal to or less than 16.

Further, it is preferable that the wiring portion has the mesh-shaped wiring pattern in which the line wirings are overlapped in two directions and all the plurality of thin metal wires are straight lines.

Moreover, it is preferable that the mesh-shaped wiring pattern in which the line wirings are overlapped in two directions is a bilaterally asymmetric wiring pattern.

Further, it is preferable that an angle formed by the line wirings in the two directions is in a range of 40° to 140°.

Further, it is preferable that an average pitch of the line wiring in at least one direction among the line wirings overlapped in the two or more directions is in a range of 30 μm to 600 μm.

Furthermore, it is preferable that the average pitch is equal to or less than 300 μm.

Further, it is preferable that the wiring portion has a wiring pattern in which an average pitch of the line wiring in at least one direction among the line wirings in two or more directions is equal to an average pitch of the line wiring in at least one different direction but the wiring portion may have a wiring pattern in which the average pitches thereof are different.

In addition, it is preferable that there is a wiring pattern of a line wiring in a direction, in which the average pitch is the narrowest is the non-equal pitch wiring pattern, among the line wirings in two or more directions.

In order to achieve the above object, according to a third aspect of the present invention, there is provided a conductive film comprising: a transparent substrate; and a wiring portion that is composed of a plurality of thin metal wires. The wiring portion has two or more insulated wiring layers and has a mesh-shaped wiring pattern in which line wirings each being composed of a plurality of thin metal wires arranged in parallel in one direction are overlapped in two or more directions, in front observation of the conductive film. The line wiring in at least one direction is a straight line wiring in which the plurality of thin metal wires are straight lines. In addition, the straight line wiring in at least one direction is a wiring in which the two or more thin metal wires are consecutively arranged on at least one wiring layer among the two or more wiring layers, and has a non-equal pitch wiring pattern in which repetitive pitches of a predetermined number of the thin metal wires are equal pitches and at least two pitches of the respective pitches of the predetermined number of the thin metal wires are different, in front observation of the conductive film.

In order to achieve the above object, according to a fourth aspect of the present invention, there is provided a conductive film provided on a display unit of a display device, the conductive film comprising: a transparent substrate; and a wiring portion that is composed of a plurality of thin metal wires. The wiring portion has two or more insulated wiring layers and has a mesh-shaped wiring pattern in which line wirings each being composed of a plurality of thin metal wires arranged in parallel in one direction are overlapped in two or more directions, in front observation of the conductive film. The mesh-shaped wiring pattern is overlapped on a pixel array pattern of the display unit. The line wiring in at least one direction is a straight line wiring in which the plurality of thin metal wires are straight lines. In addition, the straight line wiring in at least one direction is a wiring in which the two or more thin metal wires are consecutively arranged on at least one wiring layer among the two or more wiring layers, and has a non-equal pitch wiring pattern in which repetitive pitches of a predetermined number of thin metal wires are equal pitches and at least two pitches of the respective pitches of the predetermined number of the thin metal wires are different, on a wiring layer in which the two or more thin metal wires are consecutively arranged. A moiré evaluation value in the non-equal pitch wiring pattern is less than a moiré evaluation value in an equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal. In addition, the moiré evaluation value is a sum of intensities of frequency components of moiré obtained by applying human's visual response characteristics to frequency components of moiré calculated from frequency components of 2-dimensional Fourier frequency distributions of transmittances of the non-equal pitch wiring pattern and the equal pitch wiring pattern and frequency components of a 2-dimensional Fourier frequency distribution of a luminance or a transmittance of the pixel array pattern.

In order to achieve the above object, according to a fifth aspect of the present invention, there is provided a display device including: a display unit having a predetermined pixel array pattern; and the conductive member according to the first or second aspect of the present invention or the conductive film according to the third or fourth aspect of the present invention, which is provided on the display unit.

Here, it is preferable that the display unit is an organic EL display (OELD), and the pixel array patterns of at least two colors of red (R), green (G), and blue (B) are different.

In order to achieve the above object, according to a sixth aspect of the present invention, there is provided a touch panel using the conductive member according to the first or second aspect of the present invention or the conductive film according to the third or fourth aspect of the present invention.

In addition, in order to achieve the above-mentioned object, according to a seventh aspect of the present invention, there is provided a method of producing a wiring pattern of a conductive member which is provided on a display unit of a display device and has a wiring portion that is composed of a plurality of thin metal wires, where the wiring portion has two or more insulated wiring layers and has a mesh-shaped wiring pattern in which line wirings each being composed of a plurality of thin metal wires arranged in parallel in one direction are overlapped in two or more directions, in front observation, in which the mesh-shaped wiring pattern is overlapped on a pixel array pattern of the display unit, the line wiring in at least one direction is a straight line wiring in which the plurality of thin metal wires are straight lines, and the straight line wiring in at least one direction is a wiring in which the two or more thin metal wires are consecutively arranged on at least one wiring layer among the two or more wiring layers, and has a non-equal pitch wiring pattern in which repetitive pitches of a predetermined number of the thin metal wires are equal pitches and at least two pitches of the respective pitches of the predetermined number of the thin metal wires are different, in front observation of the conductive member, the method comprising: acquiring a luminance or a transmittance of the pixel array pattern; acquiring transmittances of respective wiring patterns of the non-equal pitch wiring pattern and an equal pitch wiring pattern, which is composed of a plurality of straight thin metal wires, in which repetitive pitches of the predetermined number of the thin metal wires are equal to those of the non-equal pitch wiring pattern, and in which respective pitches of the thin metal wires are equal; deriving 2-dimensional Fourier frequency distributions of the transmittances of the respective wiring patterns of the non-equal pitch wiring pattern and the equal pitch wiring pattern; deriving a 2-dimensional Fourier frequency distribution of the luminance or the transmittance of the pixel array pattern; calculating respective frequency components of moiré from frequency components of the 2-dimensional Fourier frequency distributions of the transmittances of the non-equal pitch wiring pattern and the equal pitch wiring pattern and frequency components of the 2-dimensional Fourier frequency distribution of the luminance or the transmittance of the pixel array pattern; applying human's visual response characteristics to the calculated respective frequency components of the moiré so as to obtain a moiré evaluation value, which is a sum of intensities of the respective frequency components; and producing the non-equal pitch wiring pattern in which the obtained moiré evaluation value in the non-equal pitch wiring pattern is less than a moiré evaluation value in the equal pitch wiring pattern.

In addition, in order to achieve the above-mentioned object, according to an eighth aspect of the present invention, there is provided a method of producing a wiring pattern of a conductive member which is provided on a display unit of a display device and has a wiring portion that is composed of a plurality of thin metal wires, where the wiring portion has two or more insulated wiring layers and has a mesh-shaped wiring pattern in which line wirings each being composed of a plurality of thin metal wires arranged in parallel in one direction are overlapped in two or more directions, in front observation, in which the mesh-shaped wiring pattern is overlapped on a pixel array pattern of the display unit, the line wiring in at least one direction is a straight line wiring in which the plurality of thin metal wires are straight lines, and the straight line wiring in at least one direction is a wiring in which the two or more thin metal wires are consecutively arranged on at least one wiring layer among the two or more wiring layers, and has a non-equal pitch wiring pattern in which repetitive pitches of a predetermined number of the thin metal wires are equal pitches and at least two pitches of the respective pitches of the predetermined number of the thin metal wires are different, on a wiring layer in which the two or more thin metal wires are consecutively arranged, the method comprising: acquiring a luminance or a transmittance of the pixel array pattern; acquiring transmittances of respective wiring patterns of the non-equal pitch wiring pattern and an equal pitch wiring pattern, which is composed of a plurality of straight thin metal wires, in which repetitive pitches of the predetermined number of the thin metal wires are equal to those of the non-equal pitch wiring pattern, and in which respective pitches of the thin metal wires are equal; deriving 2-dimensional Fourier frequency distributions of the transmittances of the respective wiring patterns of the non-equal pitch wiring pattern and the equal pitch wiring pattern; deriving a 2-dimensional Fourier frequency distribution of the luminance or the transmittance of the pixel array pattern; calculating respective frequency components of moiré from frequency components of the 2-dimensional Fourier frequency distributions of the transmittances of the non-equal pitch wiring pattern and the equal pitch wiring pattern and frequency components of the 2-dimensional Fourier frequency distribution of the luminance or the transmittance of the pixel array pattern; applying human's visual response characteristics to the calculated respective frequency components of the moiré so as to obtain a moiré evaluation value, which is a sum of intensities of the respective frequency components; and producing the non-equal pitch wiring pattern in which the obtained moiré evaluation value in the non-equal pitch wiring pattern is less than a moiré evaluation value in the equal pitch wiring pattern.

In order to achieve the above object, according to a ninth aspect of the present invention, there is provided a method of producing a wiring pattern of a conductive film which is provided on a display unit of a display device and has a transparent substrate and a wiring portion that is composed of a plurality of thin metal wires, where the wiring portion has two or more insulated wiring layers and has a mesh-shaped wiring pattern in which line wirings each being composed of a plurality of thin metal wires arranged in parallel in one direction are overlapped in two or more directions, in front observation, in which the mesh-shaped wiring pattern is overlapped on a pixel array pattern of the display unit, the line wiring in at least one direction is a straight line wiring in which the plurality of thin metal wires are straight lines, and the straight line wiring in at least one direction is a wiring in which the two or more thin metal wires are consecutively arranged on at least one wiring layer among the two or more wiring layers, and has a non-equal pitch wiring pattern in which repetitive pitches of a predetermined number of the thin metal wires are equal pitches and at least two pitches of the respective pitches of the predetermined number of the thin metal wires are different, in front observation of the conductive film, the method comprising: acquiring a luminance or a transmittance of the pixel array pattern; acquiring transmittances of respective wiring patterns of the non-equal pitch wiring pattern and an equal pitch wiring pattern, which is composed of a plurality of straight thin metal wires, in which repetitive pitches of the predetermined number of the thin metal wires are equal to those of the non-equal pitch wiring pattern, and in which respective pitches of the thin metal wires are equal; deriving 2-dimensional Fourier frequency distributions of the transmittances of the respective wiring patterns of the non-equal pitch wiring pattern and the equal pitch wiring pattern; deriving a 2-dimensional Fourier frequency distribution of the luminance or the transmittance of the pixel array pattern; calculating respective frequency components of moiré from frequency components of the 2-dimensional Fourier frequency distributions of the transmittances of the non-equal pitch wiring pattern and the equal pitch wiring pattern and frequency components of the 2-dimensional Fourier frequency distribution of the luminance or the transmittance of the pixel array pattern; applying human's visual response characteristics to the calculated respective frequency components of the moiré so as to obtain a moiré evaluation value, which is a sum of intensities of the respective frequency components; and producing the non-equal pitch wiring pattern in which the obtained moiré evaluation value in the non-equal pitch wiring pattern is less than a moiré evaluation value in the equal pitch wiring pattern.

In order to achieve the above object, according to a tenth aspect of the present invention, there is provided a method of producing a wiring pattern of a conductive film which is provided on a display unit of a display device and has a transparent substrate and a wiring portion that is composed of a plurality of thin metal wires, where the wiring portion has two or more insulated wiring layers and has a mesh-shaped wiring pattern in which line wirings each being composed of a plurality of thin metal wires arranged in parallel in one direction are overlapped in two or more directions, in front observation, in which the mesh-shaped wiring pattern is overlapped on a pixel array pattern of the display unit, the line wiring in at least one direction is a straight line wiring in which the plurality of thin metal wires are straight lines, and the straight line wiring in at least one direction is a wiring in which the two or more thin metal wires are consecutively arranged on at least one wiring layer among the two or more wiring layers, and has a non-equal pitch wiring pattern in which repetitive pitches of a predetermined number of the thin metal wires are equal pitches and at least two pitches of the respective pitches of the predetermined number of the thin metal wires are different, on a wiring layer in which the two or more thin metal wires are consecutively arranged, the method comprising: acquiring a luminance or a transmittance of the pixel array pattern; acquiring transmittances of respective wiring patterns of the non-equal pitch wiring pattern and an equal pitch wiring pattern, which is composed of a plurality of straight thin metal wires, in which repetitive pitches of the predetermined number of the thin metal wires are equal to those of the non-equal pitch wiring pattern, and in which respective pitches of the thin metal wires are equal; deriving 2-dimensional Fourier frequency distributions of the transmittances of the respective wiring patterns of the non-equal pitch wiring pattern and the equal pitch wiring pattern; deriving a 2-dimensional Fourier frequency distribution of the luminance or the transmittance of the pixel array pattern; calculating respective frequency components of moiré from frequency components of the 2-dimensional Fourier frequency distributions of the transmittances of the non-equal pitch wiring pattern and the equal pitch wiring pattern and frequency components of the 2-dimensional Fourier frequency distribution of the luminance or the transmittance of the pixel array pattern; applying human's visual response characteristics to the calculated respective frequency components of the moiré so as to obtain a moiré evaluation value, which is a sum of intensities of the respective frequency components; and producing the non-equal pitch wiring pattern in which the obtained moiré evaluation value in the non-equal pitch wiring pattern is less than a moiré evaluation value in the equal pitch wiring pattern.

As described above, according to the embodiment of the present invention, it is possible to provide a conductive member having a wiring pattern capable of reducing occurrence of moiré in both front observation and oblique observation regardless of the observation angle (viewing angle), a conductive film having the same, a display device, and a touch panel, a method of producing a wiring pattern of the conductive member, and a method of producing a wiring pattern of the conductive film.

BRIEF DESCRIPTION OF THE DRAWINGS

FIG. 90 is a flowchart showing another example of a front/oblique moiré value calculation processing method according to the embodiment of the present invention.

FIG. 91 is a plan view schematically showing another example of a wiring pattern of a wiring portion of the conductive film shown in FIG. 1.

DESCRIPTION OF THE PREFERRED EMBODIMENTS

Figure 1:
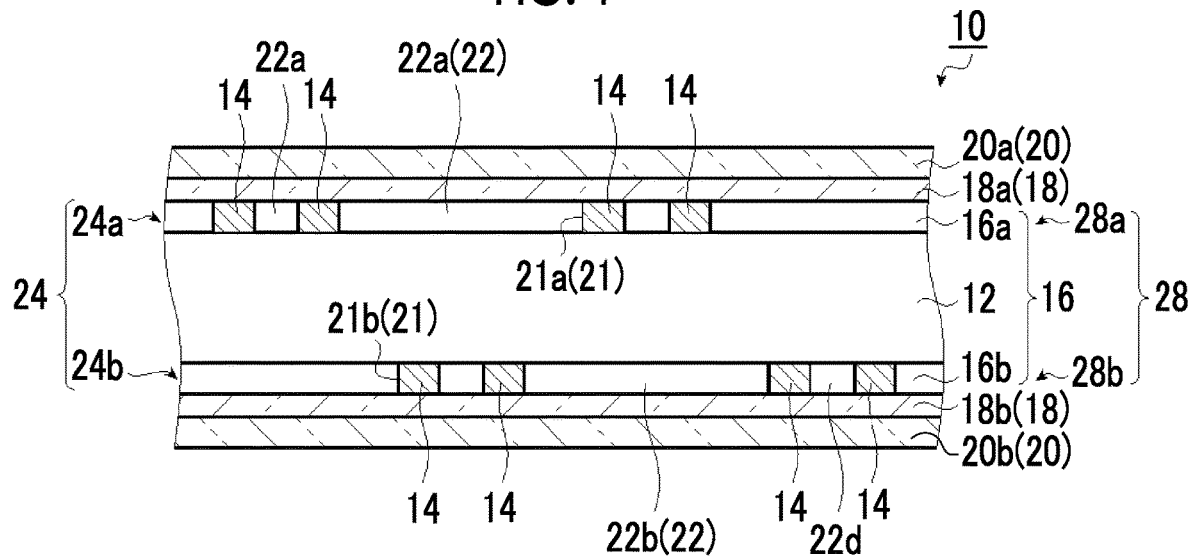
FIG. 1 is a partial cross-sectional view schematically showing an example of a conductive film according to a first embodiment of the present invention.

Hereinafter, a conductive member, a conductive film, a display device having the same, a touch panel, a method of producing a wiring pattern of a conductive member, and a method of producing a wiring pattern of a conductive film according to the embodiment of the present invention will be described in detail with reference to suitable embodiments shown in the accompanying drawings.

In the embodiment of the present invention, one having at least a wiring portion being composed of a plurality of thin metal wires is defined as a conductive member, and one having a transparent substrate among them is defined as a conductive film. That is, the conductive member of the embodiment of the present invention includes both a conductive film, which does not have a transparent substrate, and a conductive film, which has a transparent substrate, used in a case where the film is directly disposed on the display unit or in a case where the film is directly disposed on the pixel array of the display unit. Therefore, the present invention is characterized by a wiring pattern being composed of a plurality of thin metal wires, and relates to a typical wiring pattern itself being composed of thin metal wires, regardless of the transparent substrate, in both the conductive member that does not define the transparent substrate and the conductive film including the transparent substrate. Hereinafter, the present invention will be mainly described with respect to a conductive film having a transparent substrate, but the embodiment of the present invention is characterized in a wiring pattern being composed of a plurality of thin metal wires. Thus, the description thereof relates to a conductive member which is a superordinate concept. Here, the conductive member of the embodiment of the present invention can be called a sensor member.

In addition, the conductive member and the conductive film according to the embodiment of the present invention will be described below by using a conductive member and a conductive film for touch panels as representative examples, but the embodiment of the present invention is not limited thereto. The conductive member and the conductive film according to the embodiment of the present invention have a wiring portion having the characteristics described below, and may be any conductive member and any conductive film as long as the conductive member and the conductive film are provided on a display unit having various light emission intensities of a display device. Further, as a matter of course, the conductive film according to the embodiment of the present invention may be applied to a conductive film for shielding electromagnetic waves and the like.

Here, the target display device may be any one of a liquid crystal display (LCD), a plasma display panel (PDP), an organic electro-luminescence display (OELD), an inorganic EL display, or the like.

The wiring portion of each of the conductive member and the conductive film according to the embodiment of the present invention has two or more insulated wiring layers and has a mesh-shaped wiring pattern in which line wirings each being composed of a plurality of thin metal wires arranged in parallel in one direction are overlapped in two or more directions, in front observation of the conductive member and the conductive film. The line wiring in at least one direction is a straight line wiring in which the plurality of thin metal wires are straight lines. The straight line wiring in at least one direction is a wiring in which the two or more thin metal wires are consecutively arranged on at least one wiring layer among the two or more wiring layers.

The conductive member and the wiring portion of the conductive film according to the embodiment of the present invention each may be characterized to have a wiring pattern which has two or more wiring layers in at least one direction and in which two or more thin metal wires arranged in parallel on one wiring layer are consecutively arranged. In the wiring pattern, straight line wirings being composed of a plurality of thin metal wires arranged in parallel on two or more wiring layers are overlapped in two or more directions.

Further, the wiring pattern of the wiring portion of each of the conductive member and the conductive film according to the embodiment of the present invention is a wiring pattern in which the wiring patterns of respective wiring layers of two or more wiring layers are overlapped. In both front observation (front view) and oblique observation of the conductive member and the conductive film, the wiring pattern observed as it is or through the transparent substrate is a wiring pattern in which occurrence of moiré is reduced.

That is, the present invention provides a conductive member and a conductive film each has a "mesh-shaped wiring pattern which has two or more wiring layers, in which line wirings in two or more directions are overlapped, and in which two or more wirings are consecutively arranged on one wiring layer in a straight line wiring in at least one direction".

It should be noted that the present invention provides a conductive member and a conductive film each has a "wiring pattern in which straight line wirings in two or more directions are overlapped, which has two or more wiring layers in at least one direction, and in which two or more wirings are consecutively arranged on one layer".

With such a wiring pattern, it is possible to reduce occurrence of moiré in oblique observation, as compared with a wiring pattern in which wirings are alternately arranged in each layer.

A display unit (hereinafter, also referred to as a display) of a display device, on which the conductive film of the embodiment of the present invention is overlapped, is not particularly limited as long as pixels are arranged in accordance with a pixel array pattern (hereinafter, also referred to as a BM pattern) and the light emission intensity (luminance) thereof can be considered in the evaluation of visibility of moiré due to the overlap of conductive films. Alternatively, the display unit is not particularly limited as long as respective sub-pixels that emit light of a plurality of colors including at least three different colors, for example, three colors of red, green, and blue, are arranged in accordance with the pixel array patterns of the respective sub-pixels and the light emission intensity (luminance) thereof can be considered in the evaluation of visibility of moiré due to the overlap of conductive films.

For example, as in the related art, the display unit may be a display unit of which the pixel array patterns (shapes, sizes, pixel array periods, and directions of the sub-pixels) of the sub-pixels of respective colors such as RGB are all the same and are represented by the G sub-pixel. In addition, in a similar manner to the above-mentioned OELD, the display unit may be a display unit which has pixel array patterns not the same for a plurality of colors, that is, different pixel array patterns of sub-pixels for at least two colors.

In a manner similar to that of a high resolution smartphone, a tablet terminal, or the like, the display of the display device subjected to the embodiment of the present invention may be a display which has a high light emission intensity. In a manner similar to that of a low resolution desktop PC, a television (TV), or the like, the display may be a display having a low light emission intensity. In a manner similar to that of a medium resolution laptop or the like, the display may be a display having approximately a medium light emission intensity.

Figure 2:
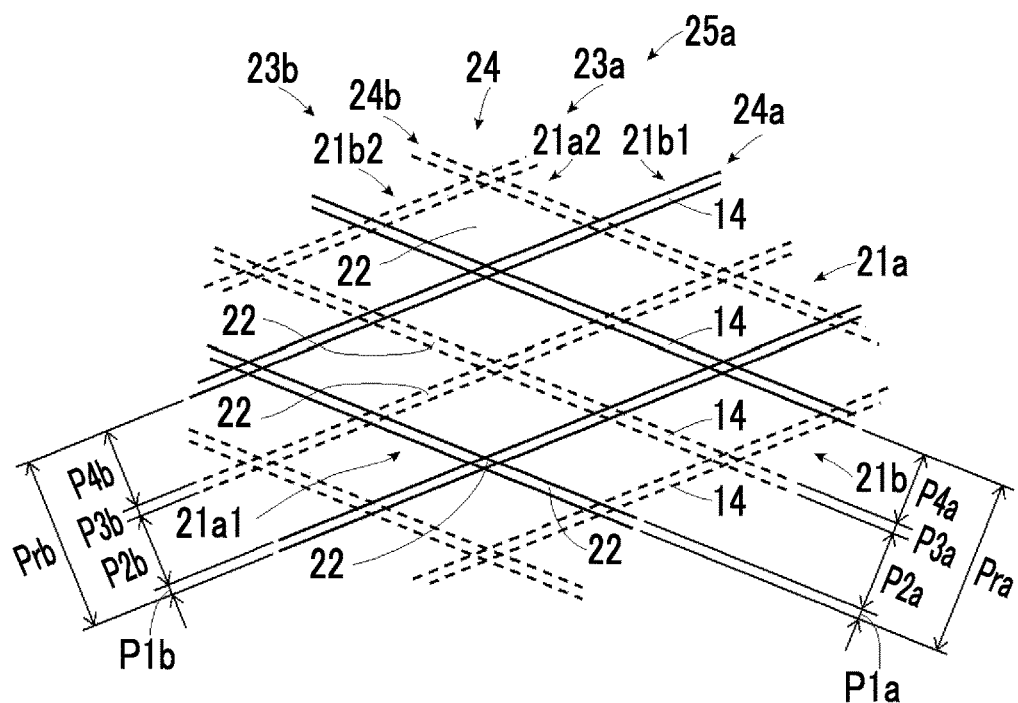
FIG. 2 is a plan view schematically showing another example of a wiring pattern in front view of a wiring portion of the conductive film shown in FIG. 1.
Figure 3A:
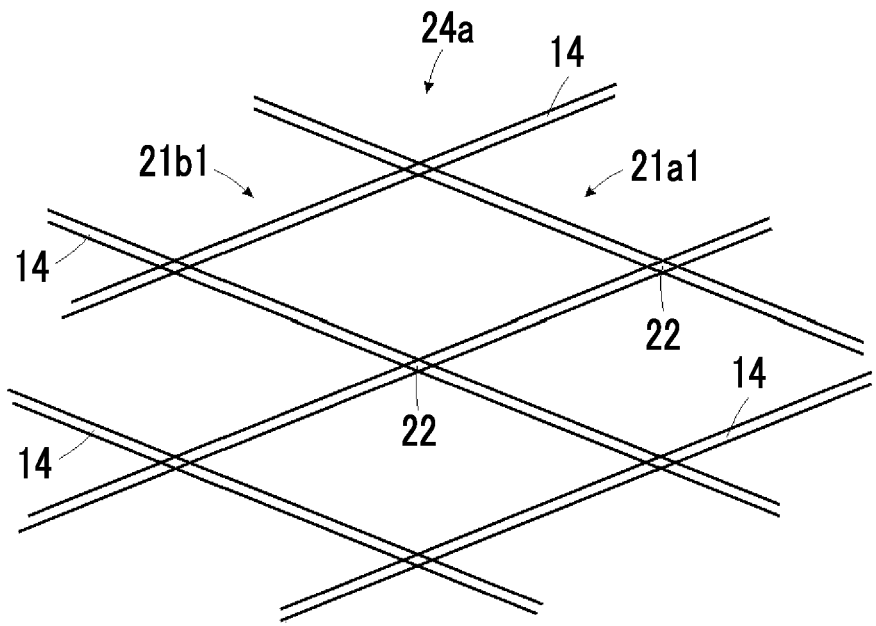
FIG. 3A is a plan view schematically showing a wiring pattern in which two thin metal wires are consecutively arranged on a wiring layer on the upper side of a transparent substrate in the wiring pattern shown in FIG. 2.
Figure 3B:
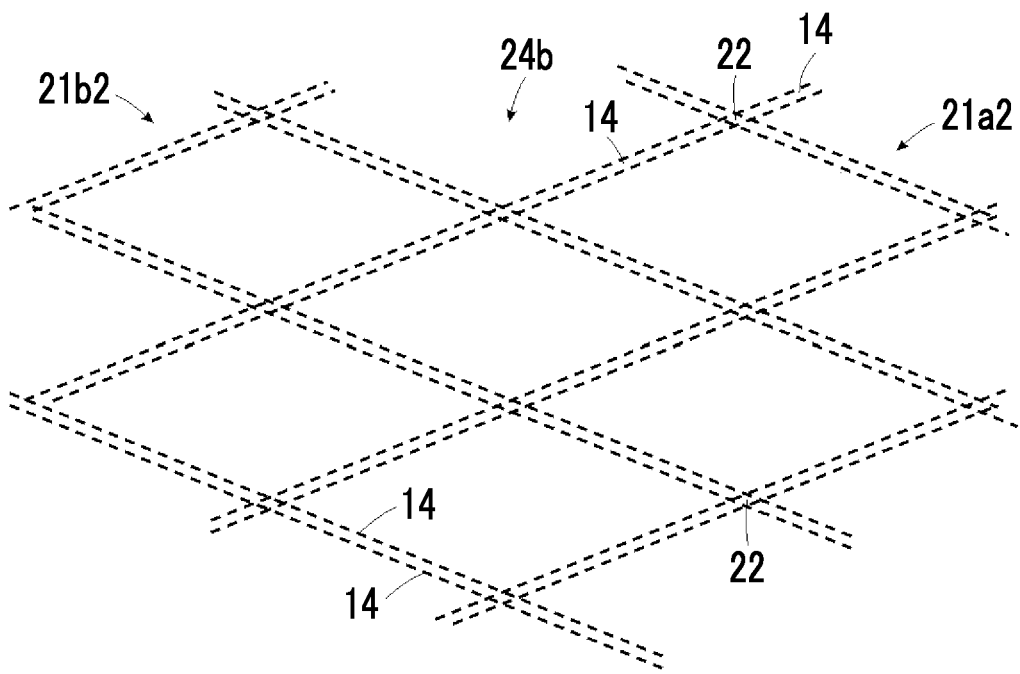
FIG. 3B is a plan view schematically showing a wiring pattern in which two thin metal wires are consecutively arranged on a wiring layer on the lower side of the transparent substrate in the wiring pattern shown in FIG. 2.
Figure 4A:
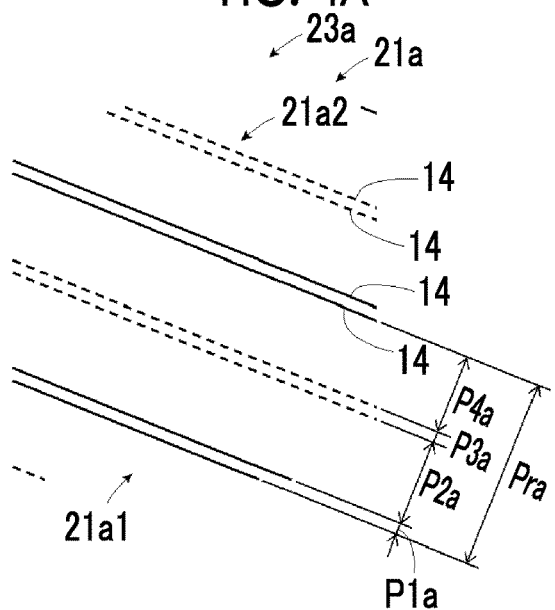
FIG. 4A is a plan view schematically showing a wiring pattern in a straight line wiring of the wiring pattern in one direction in front view shown in FIG. 2.
Figure 4B:
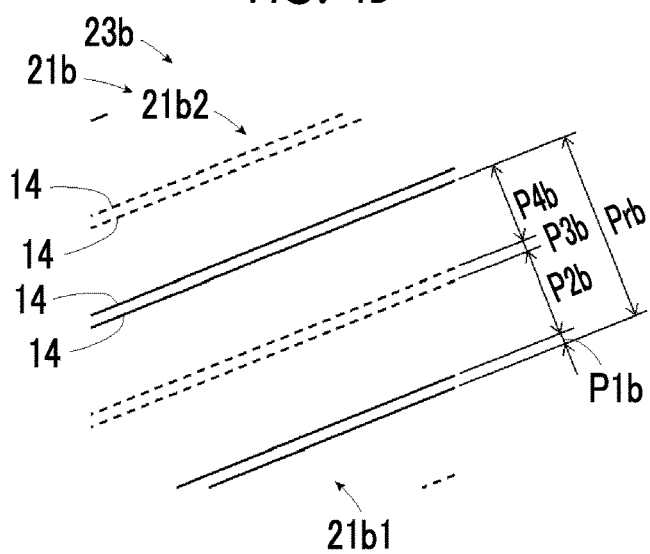
FIG. 4B is a plan view schematically showing a wiring pattern in a straight line wiring of the wiring pattern in another direction in front view shown in FIG. 2.

FIG. 1 is a partial cross-sectional view schematically showing an example of a conductive film according to a first embodiment of the present invention. FIG. 2 is a plan view schematically showing another example of a wiring pattern in front view of a wiring portion of the conductive film shown in FIG. 1. FIG. 3A is a plan view schematically showing a wiring pattern in which two thin metal wires are consecutively arranged on a wiring layer on the upper side of a transparent substrate 12 in the wiring pattern shown in FIG. 2. FIG. 3B is a plan view schematically showing a wiring pattern in which two thin metal wires are consecutively arranged on a wiring layer on the lower side of the transparent substrate 12 in the wiring pattern shown in FIG. 2. FIG. 4A is a plan view schematically showing a non-equal pitch wiring pattern in a straight line wiring in one direction of the wiring pattern in front view shown in FIG. 2. FIG. 4B is a plan view schematically showing a non-equal pitch wiring pattern in a straight line wiring in another direction of the wiring pattern in front view shown in FIG. 2.

As shown in FIGS. 1 and 2, the conductive film 10 of the present embodiment is provided on the display unit of the display device, and is a conductive film which has a wiring pattern excellent in restraining occurrence of moiré with respect to the pixel array of the display unit, particularly, a wiring pattern optimized in terms of visibility of moiré with respect to the pixel array pattern in a case where the film is overlapped on the pixel array pattern.

In addition, in description of configurations of the conductive film according to the embodiment of the present invention and the display device to which the conductive film according to the embodiment of the present invention is applied from this paragraph to the paragraph where the description of the display device to which the conductive film according to the embodiment of the present invention is applied is finished, it is a premise that the wiring pattern of the wiring portion of the conductive film in front view is "non-equal pitch wiring pattern in which the repetitive pitches of a predetermined number of thin metal wires are equal pitches in a straight line wiring in at least one direction and the respective pitches of the predetermined number of thin metal wires are non-equal pitches". However, as will be described later in detail, the wiring portion of the conductive film according to the embodiment of the present invention is characterized to "have two or more layers and a wiring pattern in which two or more wirings are consecutively arranged on one wiring layer in at least one direction". The effect of reducing occurrence of moiré due to the characteristic in oblique observation is effective regardless of whether the pitches of the wiring pattern in front view are non-equal or equal. Thus, it is apparent that the present invention also includes a configuration in which the pitches of the wiring pattern in front view are equal.

The conductive film 10 shown in FIG. 1 is composed of: a transparent substrate 12; a first sub-wiring portion 16a that is formed on one surface (upper surface in FIG. 1) of the transparent substrate 12, is composed of a plurality of thin lines made of metal (hereinafter, referred to as thin metal wires) 14, and serves as the first electrode portion; a first protective layer 20a that is adhered to the substantially entire surface of the first sub-wiring portion 16a with the first adhesive layer 18a interposed therebetween so as to cover the thin metal wires 14; a second sub-wiring portion (electrode) 16b that is formed on the other surface (lower surface in FIG. 1) of the transparent substrate 12, is composed of a plurality of thin metal wires 14, and serves as a second electrode portion; and a second protective layer 20b that is adhered to the substantially entire surface of the second sub-wiring portion 16b with the second adhesive layer 18b interposed therebetween.

In the following, the first sub-wiring portion 16a and the second sub-wiring portion 16b are collectively referred to as the wiring portion 16.

The first adhesive layer 18a and the second adhesive layer 18b are collectively referred to as the adhesive layer 18, and the first protective layer 20a and the second protective layer 20b are collectively referred to as the protective layer 20.

The conductive film 10 may have at least the transparent substrate 12, the first sub-wiring portion 16a, and the second sub-wiring portion 16b. Although not shown, a functional layer such as an adhesion enhancing layer and/or an undercoat layer may be provided between the transparent substrate 12 and the first sub-wiring portion 16a or between the transparent substrate 12 and the second sub-wiring portion 16b.

The transparent substrate 12 is transparent and electrically insulating, that is, made of a material having a high insulating property and a high light-transmitting property, and is particularly not limited as long as the substrate is able to support the first sub-wiring portion 16a and the second sub-wiring portion 16b. Examples of the material forming the transparent substrate 12 include materials such as resin, glass, and silicon. Examples of the glass include tempered glass and alkali-free glass. Examples of the resin include polyethylene terephthalate (PET), polyethylene naphthalate (PEN), polymethyl methacrylate (PMMA), cyclo olefin polymer (COP), cyclic olefin copolymer (COC), polycarbonate (PC), acrylic resin, polyethylene (PE), polypropylene (PP), polystyrene (PS), polyvinyl chloride (PVC), polyvinylidene chloride (PVDC), cellulose triacetate (TAC), and the like. The thickness of the transparent substrate 12 is, for example, 20 to 1000 and particularly preferably 30 to 100 μm.

In the embodiment of the present invention, "transparent" means that the light transmittance is at least 30% or more, preferably 50% or more, more preferably 70% or more, even more preferably 90% or more, in the visible light wavelength range of 400 to 800 nm. The light transmittance is measured using "Plastic: a method of calculating a total light transmittance and a total light reflectance" prescribed in JIS K7375: 2008.

The total light transmittance of the transparent substrate 12 is preferably 30% to 100%. The total light transmittance is measured using, for example, "Plastic: a method of calculating a total light transmittance and a total light reflectance" prescribed in JIS K7375: 2008.

The conductive member according to the first embodiment of the present invention is the conductive film according to the first embodiment of the present invention shown in FIG. 1 having at least the wiring portion 16 (the sub-wiring portion 16a and the sub-wiring portion 16b). FIG. 2 is a plan view schematically showing an example of a wiring pattern of a wiring portion of the conductive member according to the first embodiment of the present invention, and is a diagram showing the conductive member according to the first embodiment of the present invention.

The thin metal wires 14 are not particularly limited as long as they are thin lines made of metal having high conductivity, and include thin lines made of a line material such as gold (Au), silver (Ag) or copper (Cu). While it is more preferable indeed in terms of visibility in a case where the thin metal wires 14 have a narrower line width, the line width has only to be equal to or less than 30 μm, for example. For application to a touch panel, the line width of the thin metal wires 14 is preferably equal to or greater than 0.1 μm and equal to or less than 15 μm, more preferably equal to or greater than 1 μm and equal to or less than 9 μm, and still more preferably equal to or greater than 1 μm and equal to or less than 7 μm. Furthermore, the line width is particularly preferably equal to or greater than 1 μm and equal to or less than 4 μm.

As shown in FIG. 2, in the front view (front observation) of the conductive film 10 according to the embodiment of the present invention, the sub-wiring portion 16a is composed of a plurality of thin metal wires 14 arranged in parallel in two directions intersecting at a predetermined angle, and is composed of the wiring layer 28a having a mesh-shaped wiring pattern 24a in which a plurality of thin metal wires 14 are arranged in a mesh shape. Similarly, the sub-wiring portion 16b is composed of a wiring layer 28b having a mesh-shaped wiring pattern 24b in which a plurality of thin metal wires 14 are arranged in a mesh shape. The wiring portion 16 is composed of a wiring layer 28a and a wiring layer 28b, and has a mesh-shaped wiring pattern 24 in which a plurality of thin metal wires 14 are arranged in a mesh shape in front view (front observation) of the conductive film 10 according to the embodiment of the present invention. In the description of the present invention, the front view (front observation) of the conductive film 10 according to the embodiment of the present invention means that the wiring portion 16 (sub-wiring portion 16a, sub-wiring portion 16b) of the conductive film 10 shown in FIG. 1 is observed from vertically upper side. In addition, with respect to the transparent substrate 12, the side of the sub-wiring portion 16a is referred to as the upper side and the side of the sub-wiring portion 16b is referred to as the lower side.

Here, the sub-wiring portion 16a is composed of the wiring layer 28a on the upper side of the transparent substrate 12, and has, as shown by the solid line in FIG. 3A, a mesh-shaped wiring pattern 24a in which straight line wirings 21a1 and 21b1 are overlapped. In each of the straight line wirings 21a1 and 21b1, two thin metal wires 14 parallel to each other in each of two directions intersecting at a predetermined angle are consecutively arranged.

Further, the sub-wiring portion 16b is composed of the wiring layer 28b on the lower side of the transparent substrate 12, and has, as shown by the dotted line in FIG. 3B, a mesh-shaped wiring pattern 24b in which straight line wirings 21a2 and 21b2 are overlapped. In each of the straight line wirings 21a2 and 21b2, two thin metal wires 14 parallel to each other in each of two directions intersecting at a predetermined angle are consecutively arranged.

Therefore, in front view, as shown in FIG. 2, the mesh-shaped wiring pattern 24 is a mesh-shaped wiring pattern (hereinafter, also simply referred to as a wiring pattern) 25a of the first embodiment of the present invention in which the mesh-shaped wiring pattern 24a shown by a solid line in FIG. 3A and the mesh-shaped wiring pattern 24b shown by a dotted line in FIG. 3B are overlapped with the transparent substrate 12 interposed therebetween.

That is, in the front view, the wiring pattern 25a is formed by overlapping the straight line wirings 21a1 and 21b1 and the straight line wirings 21a2 and 21b2. The straight line wirings 21a1 and 21b1 are each composed of two thin metal wires 14 consecutively arranged in parallel in two directions intersecting at a predetermined angle shown by the solid line in FIG. 3A. The straight line wirings 21a2 and 21b2 are each composed of two thin metal wires 14 consecutively arranged in parallel in the same two directions shown by the dotted line in FIG. 3B. Here, the straight line wirings 21a1 and 21b1 are arranged on the wiring layer on the upper side of the transparent substrate 12, thereby forming the upper mesh-shaped wiring pattern 24a. The straight line wirings 21a2 and 21b2 are arranged on the wiring layer on the lower side of the transparent substrate 12, thereby forming a lower mesh-shaped wiring pattern 24b. Therefore, the mesh-shaped wiring pattern 25a according to the first embodiment of the present invention may be a wiring pattern 24 in which the upper mesh-shaped wiring pattern 24a and the lower mesh-shaped wiring pattern 24b are overlapped in front view.

In other words, in front view, the wiring pattern 24a being composed of the straight line wirings 21a1 and 21b1 of the sub-wiring portion 16a on the upper side of the transparent substrate 12 shown by the solid line in FIG. 3A and the wiring pattern 24b being composed of the straight line wirings 21a2 and 21b2 of the sub-wiring portion 16b on the lower side of the transparent substrate 12 shown by the dotted line in FIG. 3B are overlapped with the transparent substrate 12 interposed therebetween, thereby forming a wiring pattern 25a shown by the solid line and the dotted line in FIG. 2.

In addition, in the drawings for explaining the present invention including FIGS. 2, 3A, 3B, and the like, the solid lines indicate that the straight line wirings 21a1 and 21b1 (wiring pattern 24a) each being composed of the two thin metal wires 14 consecutively arranged are on the upper side of the transparent substrate 12, and the dotted line indicates that the straight line wirings 21a2 and 21b2 (wiring pattern 24b) being composed of the two thin metal wires 14 consecutively arranged are on the lower side of the transparent substrate 12.

In the example shown in FIGS. 2, 3A, and 3B, the wiring portion 16 has two wiring layers 28 (28a and 28b), and has a wiring pattern 24 in which straight line wirings 21a1, 21b1, 21a2, and 21b2 in which two thin metal wires 14 arranged in parallel in each of two directions intersecting at a predetermined angle on the wiring layers 28a and 28b are consecutively arranged are overlapped, thereby forming a mesh-shaped wiring pattern 25a in front view. However, the present invention is not limited to this. For example, in any one of the two intersecting directions, there may be provided a straight line wiring in which two thin metal wires 14 arranged in parallel are consecutively arranged on each of the wiring layers 28a and 28b. In the other one direction, there may be provided a straight line wiring in which the thin metal wires 14 arranged in parallel alternately arranged on the wiring layers 28a and 28b. Further, in the present invention, the wiring portion 16 may have three or more wiring layers, may have a wiring pattern in which three or more thin metal wires arranged in parallel in one direction are consecutively arranged on one wiring layer, and may have a wiring pattern in which straight line wirings arranged in parallel in one direction are overlapped in three or more directions on two or more wiring layers.

The number of wiring layers included in the wiring portion 16 is not particularly limited as long as the number is two or more.

Further, the number of thin metal wires consecutively arranged is not particularly limited as long as the number is two or more.

By the way, focusing on each one direction in front view, it can be said that the wiring pattern 24 shown in FIG. 2 are formed by overlapping a wiring pattern 23a and a wiring pattern 23b. The wiring pattern 23a is formed by the straight line wiring 21a being composed of the straight line wirings 21a1 and 21a2 each including two thin metal wires 14 consecutively arranged in parallel in one direction shown in FIG. 4A. The wiring pattern 23b is formed by the straight line wiring 21b being composed of the straight line wiring 21b1 and the straight line wiring 21b2 each including two thin metal wires 14 consecutively arranged in parallel in another direction shown in FIG. 4B.

In the present invention, the wiring pattern 23a formed by the straight line wiring 21a shown in FIG. 4A and the wiring pattern 23b formed by the straight line wiring 21b shown in FIG. 4B each are a wiring pattern in which two or more thin metal wires arranged in parallel in one direction are consecutively arranged in front view. Further, the wiring pattern 23a formed by the straight line wiring 21a shown in FIG. 4A and the wiring pattern 23b formed by the straight line wiring 21b shown in FIG. 4B are non-equal pitch wiring patterns that respectively have the repetitive pitches Pra and Prb of the four thin metal wires 14 in a front view. The repetitive pitches Pra and Prb are equal pitches (Pra and Prb are constant values), and the pitches P1a, P2a, P3a, and P4a of the four thin metal wires 14 of the straight line wiring 21a are non-equal pitches (among P1a, P2a, P3a, and P4a, at least two pitches are different). At the same time, the wiring pattern is a non-equal pitch wiring patterns in which the pitches P1b, P2b, P3b, and P4b of the respective four thin metal wires 14 of the straight line wiring 21b are non-equal pitches (at least two pitches among P1b, P2b, P3b, and P4b are different). Further, the repetitive pitches Pra and Prb of the four thin metal wires 14 of the straight line wirings 21a and 21b are equal (Pra=Prb), and the respective pitches of the four thin metal wires 14 of the straight line wirings 21a and 21b are also equal (P1a=P1b, P2a=P2b, P3a=P3b, and P4a=P4b).

Here, in front view, the straight line wirings 21a1 and 21a2 are referred to as the straight line wiring 21a and the straight line wirings 21b1 and 21b2 are referred to as the straight line wiring 21b. In this case, in front view, as shown in FIG. 2, it can be said that the wiring pattern 25a in which the wiring pattern 23a and the wiring pattern 23b are overlapped is a mesh-shaped wiring pattern in which opening portions (cells) 22 are arranged. The opening portions 22 has a predetermined shape formed by intersecting a plurality of thin metal wires 14 with each other through overlap between the straight line wiring 21a and the straight line wiring 21b, which are non-equal pitch wiring pattern.

Therefore, it can be said that the mesh-shaped wiring pattern 25a is a wiring pattern in which a plurality of opening portions 22, which have a plurality of types of parallelogram shapes having predetermined angles kept therebetween in front view and having different pitches (accordingly, sizes), are successively connected in two directions forming the predetermined angle.

In the wiring patterns 23a and 23b of the mesh-shaped wiring pattern 25a in the front view shown in FIG. 2, the repetitive pitches Pra and Prb of the four thin metal wires 14 are equal pitches, and the pitches P1a, P2a, P3a, and P4a of the four thin metal wires 14 and the pitches P1b, P2b, P3b, and P4b of the four thin metal wires 14 are non-equal pitches. However, the present invention is not limited to this, and the wiring pattern may be a non-equal pitch wiring pattern in which the repetitive pitches of the predetermined number of the thin metal wires 14 are equal pitches and the respective pitches of the predetermined number of the thin metal wires 14 are non-equal pitches.

Since the minimum number of the thin metal wires 14 that can be formed in the non-equal pitch is 2, the predetermined number is 2 or more. Further, the predetermined number is preferably 64 or less, more preferably 32 or less, and still more preferably 16 or less. A particularly preferable predetermined number is 2 or more and 8 or less. The reason for this is that, as will be described later, the minimum frequency of the straight line wirings 21 is lower and the straight line wirings 21 themselves is more visible as the predetermined number of non-equal pitches is increased. Further, the reason for this is that, as the predetermined number is increased, the frequency components of the straight line wirings 21 is more finely spread, as a result, a large number of fine moiré components are generated, and no matter how the pitches of the predetermined number of the thin metal wires 14 is optimized, it may be difficult to keep all of a large number of moirés away from each frequency component of the pixel array pattern. In the embodiment of the present invention, it is not necessary that all the pitches of the predetermined number of thin metal wires 14 are different, and pitches of at least two thin metal wires 14 of the predetermined number of the thin metal wires 14 may be different.

Even in this case, it is apparent that it is necessary for the non-equal pitch wiring pattern in at least one direction to be a wiring pattern in which two or more thin metal wires 14 arranged in parallel on one wiring layer are consecutively arranged.

In addition, in the example shown in FIG. 2, in front view, the mesh-shaped wiring pattern 25a is a non-equal pitch wiring pattern in which repetitive pitches of predetermined numbers (4) of thin metal wires 14 are equal pitches and pitches of the predetermined numbers (4) of the thin metal wires 14 are non-equal pitches in the straight line wirings 21 in the two directions of the straight line wirings 21a and 21b. The straight line wiring 21a is a combination of the straight line wirings 21a1 and 21a2 that form the wiring pattern 23a shown in FIG. 4A. The straight line wiring 21b is a combination of the straight line wirings 21b1 and 21b2 that form the wiring pattern 23b shown in FIG. 4B. However, the present invention is not limited to this. In the embodiment of the present invention, wiring patterns having different directions in the non-equal pitch wiring pattern in which the repetitive pitches of the predetermined number of the thin metal wires 14 are equal pitches and the respective pitches of the predetermined number of the thin metal wires 14 are non-equal pitches may be only the straight line wiring 21 in one direction (either one of the straight line wirings 21a and 21c), as in the wiring pattern 25b shown in FIG. 5, for example. Further, although not shown, all the straight line wirings 21 in three or more directions each may be a non-equal pitch wiring pattern in which the repetitive pitches of the predetermined number of the thin metal wires 14 are equal pitches and the respective pitches of the predetermined number of the thin metal wires 14 are non-equal pitches.

Further, the number of directions of the straight line wiring is not particularly limited as long as the number is two or more. In addition, the number of directions of the straight line wirings 21 having different overlapping directions is preferably 8 or less, more preferably 4 or less, and still more preferably two directions. The reason for this is that, as will be described later, there is an upper limit to the number of the thin metal wires 14 per unit area in order to secure the transmittance. Therefore, the smaller the number of directions of the straight line wirings 21, the more the number of the thin metal wires 14 per one direction, and as a result, the wiring pitches of the thin metal wires 14 can be narrowed such that moiré is hardly likely to occur. Further, as the wiring pitches of the thin metal wires 14 are narrower, the more freely the pitches of the predetermined number of the thin metal wires 14 can be optimized and the moiré can be reduced within a range in which visibility of the straight line wirings 21 themselves is not affected. On the other hand, in order to prevent loss of the function of the conductive film as the touch sensor, it is necessary for the number of directions of the straight line wirings 21 to be at least two directions, and thus two directions are most desirable.

In the wiring pattern 25a in front observation shown in FIG. 2, the straight line wirings 21a and 21b of which the repetitive pitches are equal are overlapped in two directions. However, the present invention is not limited to this, and the straight line wirings having different repetitive pitches may be overlapped in two or more directions. Here, in a wiring pattern in which straight line wirings are overlapped in two directions, as in the example shown in FIG. 2, in front observation, rhomboids are formed in units of the repetitive pitches in a case where the repetitive pitches in the two directions are equal, and parallelograms are formed in units of the repetitive pitches in a case where the repetitive pitches in the two directions are different.

Figure 5:
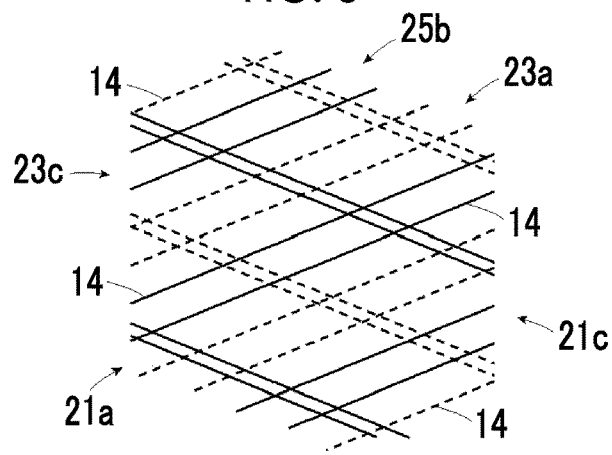
FIG. 5 is a plan view schematically showing another example of a wiring pattern of a wiring portion of the conductive film shown in FIG. 1.

The wiring pattern 25b of a second example of the present invention shown in FIG. 5 is a mesh-shaped wiring pattern in which the wiring pattern 23a being composed of the straight line wiring 21a and the wiring pattern 23c being composed of the straight line wiring 21c are overlapped and arranged in a mesh shape. In the straight line wiring 21a, the repetitive pitches of the predetermined numbers (4) of thin metal wires 14 arranged in parallel in one direction shown in FIG. 4A are equal pitches, and the pitches of the predetermined numbers (4) of the thin metal wires 14 are non-equal pitches. The straight line wiring 21c is composed of a plurality of thin metal wires 14 arranged at equal pitches in parallel in another direction shown in FIG. 6.

Even in this case, it is apparent that it is necessary for the non-equal pitch wiring pattern 23a to be a wiring pattern in which two or more thin metal wires 14 arranged in parallel on one wiring layer are consecutively arranged.

Figure 6:
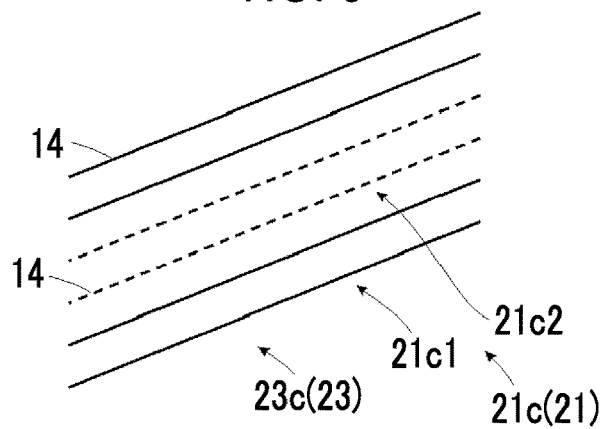
FIG. 6 is a plan view schematically showing a wiring pattern in a straight line wiring of the wiring pattern in another direction shown in FIG. 5.

Further, as shown in FIGS. 5 and 6, the equal pitch wiring pattern 23c having an equal pitch may also be a wiring pattern in which two or more thin metal wires 14 arranged in parallel on one wiring layer are consecutively arranged. As will be described later in detail, not only in a non-equal pitch wiring pattern but also in an equal pitch wiring pattern, by forming a wiring pattern in which two or more thin metal wires arranged in parallel on one wiring layer are consecutively arranged, as compared with a wiring pattern in which wirings are alternately arranged in each layer, it is possible to reduce occurrence of moiré in oblique observation. Therefore, as shown in FIG. 6, the equal pitch wiring pattern 23c may also be a wiring pattern in which two or more thin metal wires 14 arranged in parallel on one wiring layer are consecutively arranged.

Figure 94:
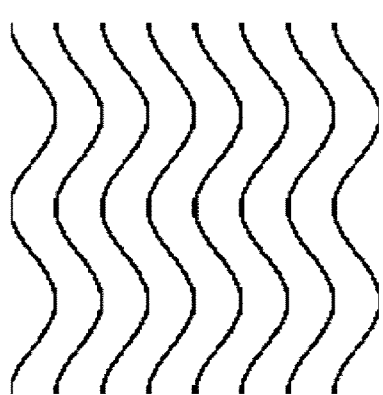
FIG. 94 is a plan view schematically showing another example of the line wiring of the wiring portion of the conductive film.

As described above, according to the embodiment of the present invention, there is provided at least a wiring pattern being composed of the straight line wirings in which the repetitive pitches of the predetermined number of thin metal wires 14 arranged in parallel in one direction are equal pitches, and the respective pitches of the predetermined number of the thin metal wires 14 are non-equal pitches. Here, the line wiring, which overlaps with the straight line wiring having the characteristics of the embodiment of the present invention and which is composed of a plurality of thin metal wires arranged in parallel in another direction, does not necessarily have to be a straight line wiring. The curved line wiring may be, for example, a curved line wiring 23f as shown in FIG. 94 to be described later, and may be a line wiring being composed of polygonal lines. In the embodiment of the present invention, a straight line wiring, a curved line wiring, and a line wiring being composed of polygonal lines are collectively referred to as a line wiring. In the embodiment of the present invention, it is preferable that the line wirings overlapped in two or more directions are straight line wirings in all the two or more overlapped directions in order to reduce moiré. In the following description, an example in which the line wirings overlapped in two or more directions are all straight line wirings will be described as a representative example. However, it is needless to say that the embodiment of the present invention includes the following case. As long as the line wiring in at least one direction among the line wirings overlapped in two or more directions is a straight line wiring having the characteristics of the embodiment of the present invention, line wiring in at least one different direction may not be a straight line wiring.

It can be said that the wiring pattern 25b includes a non-equal pitch wiring pattern 23a of the straight line wiring 21a, and is a wiring pattern in which a plurality of opening portions 22, which have a plurality of types of parallelogram shapes having predetermined angles kept therebetween in plan view and having different pitches (accordingly, sizes), are successively connected in two directions forming the predetermined angle.

It should be noted that, needless to say, the number of the straight line wirings 21 having different directions, in which the repetitive pitches of the predetermined number of thin metal wires 14 are equal pitches and the respective pitches of the predetermined number of thin metal wires 14 are non-equal pitches, is equal to or less than the number of directions of straight line wirings overlapped in different directions but preferably equal to the number of directions of straight line wirings overlapped in different directions. That is, it is preferable that the repetitive pitches of the predetermined number of thin metal wires 14 in the straight line wirings 21 overlapped in all the directions are equal pitches, and the pitches of the predetermined number of the thin metal wires 14 are non-equal pitches. The reason for this is as follows. As will be described later, in the straight line wirings 21 in the respective directions, each of the predetermined number of the thin metal wires 14 has a non-equal pitch so as to cancel out the frequency components that cause moiré. Thereby, moiré can be reduced rather than that in the case of setting the equal pitches. Thus, it is preferable to reduce moiré by setting the non-equal pitches so as to cancel out the frequency components that cause moiré in the straight line wirings 21 in all directions. Further, in the embodiment of the present invention, the repetitive pitches of the predetermined number of the thin metal wires 14 to be non-equal pitches, the respective pitches of the thin metal wires 14, and the predetermined numbers thereof may be equal in all directions or may be different in the respective directions.

In the straight line wirings 21 (21a and 21b) of the wiring pattern 23a shown in FIG. 4A and wiring pattern 23b shown in FIG. 4B, assuming that the average pitch obtained by dividing the repetitive pitches by the predetermined number is 100%, non-equal pitches of at least two thin metal wires 14 among the predetermined number of the thin metal wires 14 of which the repetitive pitches are equal pitches are preferably 10% or more or 190% or less in order to make the straight line wirings 21 themselves invisible, and are preferably 99% or less or 101% or more in order to obtain an effect of reducing moiré. That is, it is preferable that the non-equal pitches of at least two thin metal wires are 10% or more and 99% or less, or 101% or more and 190% or less in order to obtain the effect of reducing moiré without making the straight line wirings 21 themselves visible.

Further, the variation of the predetermined number of repetitive pitches is preferably within ±20%, more preferably within ±10%, and still more preferably within ±5%.

Although details will be described later, the conductive film 10 includes a wiring pattern in which straight line wirings 21 in two or more directions are overlapped, a wiring pattern which has two or more wiring layers 28 and in which two or more thin metal wires 14 arranged in parallel on one wiring layer 28 are consecutively arranged in the straight line wirings 21 in at least one direction, and a non-equal pitch wiring pattern in which the repetitive pitches of the predetermined number of thin metal wires 14 are equal pitches and the respective pitches of the predetermined number of the thin metal wires 14 are non-equal pitches in a straight line wiring 21 in at least one direction. In addition, the conductive film 10 has a wiring pattern that is optimized in terms of moiré visibility with respect to a predetermined luminance (luminance image data) of the pixel array pattern of the display unit in both front observation (front view) and oblique observation. In the embodiment of the present invention, the wiring pattern optimized in terms of moiré visibility with respect to the pixel array pattern having the predetermined luminance means a wiring pattern in which moiré is not perceived by human vision with respect to a pixel array pattern having a predetermined luminance.

Therefore, each of the wiring patterns 25a and 25b is a wiring pattern in which two or more thin metal wires 14 are consecutively arranged, has a non-equal pitch wiring pattern, and is a wiring pattern which is optimized in terms of moiré visibility with respect to the predetermined luminance (luminance image data) of the pixel array pattern of the display unit and in which a moiré evaluation index is equal to or less than a predetermined evaluation threshold value. The moiré evaluation index is calculated from the combined image data of the combined wiring patterns 25a and 25b in which (the transmittance image data pieces of) the wiring patterns 24a and 24b or (the transmittance image data pieces of) the wiring pattern 23a and 23b or 23c are overlapped and the luminance image data of the pixel array pattern of each color in a case where light of each of a plurality of colors of the display is turned on. That is, each of the wiring patterns 25a and 25b is overlapped on the display screen of the display having a predetermined light emission intensity. Thereby, it is possible to sufficiently restrain occurrence of moiré and to improve visibility. In addition, the wiring patterns 25a and 25b each are a wiring pattern including a non-equal pitch wiring pattern optimized in terms of moiré visibility with respect to the pixel array pattern having a predetermined luminance of the display unit.

According to the embodiment of the present invention, as described above, it is possible to generate a wiring pattern which is excellent in visibility of moiré by using a wiring pattern in which straight line wirings in two or more directions are overlapped, a wiring pattern in which two or more thin metal wires arranged in parallel on one wiring layer are consecutively arranged in the straight line wiring in at least one direction, and a non-equal pitch wiring pattern which is optimized in terms of moiré visibility with respect to the pixel array pattern having the predetermined luminance of the display unit.

In addition, in the wiring patterns 24 and 25b included in such an optimized wiring pattern, disconnection (break) may be included in the side (straight line wiring 21) of the thin metal wires 14 forming the opening portion 22. The thin metal wires 14 may be cut in the middle due to disconnection (break) in order to form electrical insulation like a dummy electrode portion or an in-electrode dummy pattern portion described later. In addition, even in the straight line wiring 21c having an equal pitch shown in FIG. 5 which overlaps with the straight line wiring 21a having a non-equal pitch wiring pattern, disconnection (break) may be included in the side of the thin metal wires 14 forming the opening portion 22. Needless to say, the thin metal wires 14 may be cut in the middle. As the shape of the mesh-shaped wiring pattern having such a break (disconnection portion), it is possible to apply the shape of the mesh-shaped wiring pattern of the conductive film described in JP6001089B or WO 2013/094729A relating to the application filed by the present applicant.

In the conductive film 10 of the embodiment shown in FIG. 1, in front view (front observation), in FIG. 1, the plurality of thin metal wires 14 of the first sub-wiring portion 16a on the upper side (observation side) of the transparent substrate 12, and the plurality of thin metal wires 14 of the second sub-wiring portion 16b on the lower side (display side) are overlapped. Thereby, the combined wiring pattern 25a or 25b is configured by overlapping the straight line wiring 21a and the straight line wiring 21b or 21c. In the conductive film 10 of the embodiment shown in FIG. 1, together with the wiring patterns 24a and 24b, the combined wiring patterns 25a and 25b each are also a wiring pattern including non-equal pitch wiring patterns. Then, each of the combined wiring patterns 25a and 25b is a wiring pattern including a non-equal pitch wiring pattern which is optimized in terms of moiré visibility with respect to the pixel array pattern of the predetermined luminance of the display unit in both front view (front observation) and oblique observation.

That is, in the example shown in FIG. 1, each layer of the wiring layer 28a of the first sub-wiring portion 16a and the wiring layer 28b of the second sub-wiring portion 16b is configured to have a non-equal pitch wiring pattern in which two or more wirings as shown in FIG. 3A or FIG. 3B are consecutively arranged. Thereby, the combined wiring pattern 25a (24) formed by overlapping the wiring patterns 24a and 24b of the thin metal wires 14 of the first sub-wiring portion 16a and the second sub-wiring portion 16b may be configured as a wiring pattern which is optimized in terms of moiré visibility in both front observation and oblique observation. However, the present invention is not limited to this, and the wiring layer 28a and the wiring layer 28b each have a non-equal pitch wiring pattern in which two or more wirings are consecutively arranged on at least one layer. As long as the combined wiring pattern of the non-equal pitch wiring pattern and the wiring pattern of the other layer is a wiring pattern optimized in terms of moiré visibility in both front observation and oblique observation, the wiring pattern of each layer of the wiring layer 28a and the wiring layer 28b may be configured in any manner.

As described above, the first protective layer 20a is adhered to the substantially entire surface of the wiring layer 28a being composed of the first sub-wiring portion 16a through the first adhesive layer 18a so as to cover the thin metal wires 14 of the first sub-wiring portion 16a. Further, the second protective layer 20b is adhered to the substantially entire surface of the wiring layer 28b being composed of the second sub-wiring portion 16b through the second adhesive layer 18b so as to cover the thin metal wires 14 of the second sub-wiring portion 16b.

In the above-described example, the first protective layer 20a is adhered to the wiring layer 28a by the first adhesive layer 18a, and the second protective layer 20b is adhered to the substantially entire surface of the wiring layer 28b by the second adhesive layer 18b. However, the present invention is not limited to this, and the protective layer does not necessarily need to be adhered to each other as long as the protective layer is able to cover and protect the thin metal wires of the sub-wiring portion, and the adhesive layer may be omitted. Further, the first protective layer 20a and/or the second protective layer 20b may be omitted.

Here, examples of materials of the adhesive layers 18 (the first adhesive layer 18a and the second adhesive layer 18b) include a wet lamination adhesive, a dry lamination adhesive, a hot melt adhesive, and the like. The material of the first adhesive layer 18a and the material of the second adhesive layer 18b may be the same or different.

Further, the protective layers 20 (the first protective layer 20a and the second protective layer 20b) are each composed of a high light transmitting material including resin, glass, and silicon, similarly to the transparent substrate 12. The material of the first protective layer 20a and the material of the second protective layer 20b may be the same or may be different.

It is preferable that both a refractive index n1 of the first protective layer 20a and a refractive index n2 of the second protective layer 20b are values equal or approximate to a refractive index n0 of the transparent substrate 12. In this case, both the relative refractive index nr1 of the transparent substrate 12 with respect to the first protective layer 20a and the relative refractive index nr2 of the transparent substrate 12 with respect to the second protective layer 20b are values approximate to 1.

In this specification, the refractive index means a refractive index for the light at a wavelength of 589.3 nm (sodium D ray). For example, in regard to resins, the refractive index is defined by ISO 14782: 1999 (corresponding to JIS K 7105) that is an international standard. Further, the relative refractive index nr1 of the transparent substrate 12 with respect to the first protective layer 20a is defined as nr1= (n1/n0), and the relative refractive index nr2 of the transparent substrate 12 with respect to the second protective layer 20b is defined as nr2=(n2/n0).

Here, the relative refractive index nr1 and the relative refractive index nr2 are preferably in a range equal to or greater than 0.86 and equal to or less than 1.15, and more preferably in a range equal to or greater than 0.91 and equal to or less than 1.08.

By limiting the ranges of the relative refractive index nr1 and the relative refractive index nr2 as the above-mentioned range and controlling a member-to-member light transmittance between the transparent substrate 12 and the protective layers 20 (20a, 20b), visibility of moiré can be further improved, and thus the conductive film can be improved.

In the conductive film 10 of the embodiment shown in FIG. 1, the wiring portions 16 (sub-wiring portions 16a and 16b) on both the upper side and the lower side of the transparent substrate 12 each are formed as an electrode portion having the plurality of thin metal wires 14. However, the present invention is not limited to this, and at least one of the first or second sub-wiring portion 16a or 16b may composed of an electrode portion and a non-electrode portion (dummy electrode portion).

Figure 7:
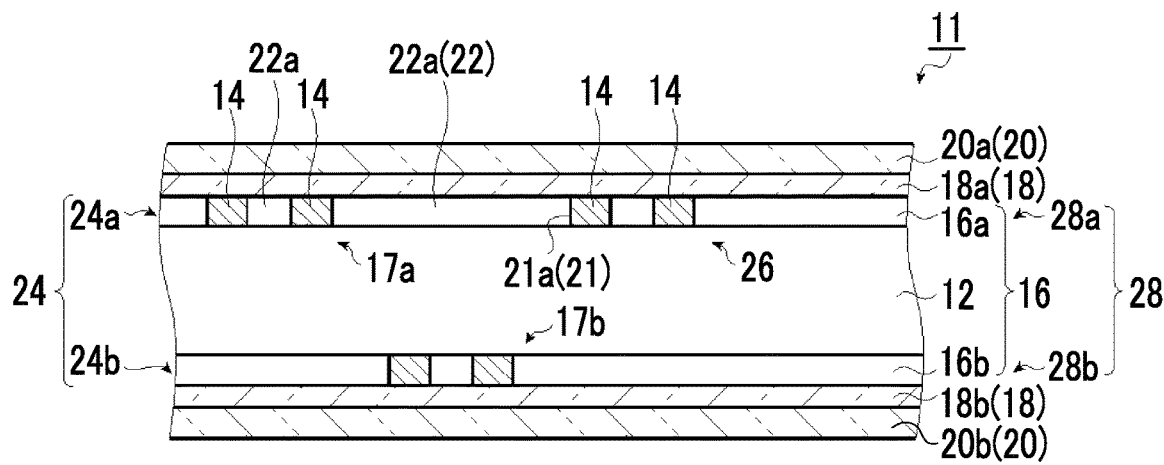
FIG. 7 is a schematic partial cross-sectional view of an example of a conductive film according to a second embodiment of the present invention.

FIG. 7 is a schematic partial cross-sectional view of an example of a conductive film according to a second embodiment of the present invention. The plan view of the wiring patterns of the conductive film according to the second embodiment of the present invention shown in FIG. 7 is the same as the plan view of the wiring pattern shown in FIG. 2 or 5, and accordingly, will be omitted herein.

As shown in FIG. 7, the conductive film 11 according to the second embodiment of the present invention has: the first sub-wiring portion 16a that is composed of a first electrode portion 17a and the dummy electrode portion 26 which are formed on one surface (on the upper side in FIG. 7) of the transparent substrate 12; the second sub-wiring portion 16b that is composed of the second electrode portion 17b which is formed on the other surface (on the lower side in FIG. 7) of the transparent substrate 12; the first protective layer 20a that is adhered to the substantially entire surface of the first sub-wiring portion 16a, which is composed of the first electrode portion 17a and the dummy electrode portion 26, through the first adhesive layer 18a; and the second protective layer 20b that is adhered to the substantially entire surface of the second sub-wiring portion 16b, which is composed of the second electrode portion 17b, through the second adhesive layer 18b.

In the conductive film 11, the first electrode portion 17a and the dummy electrode portion 26 are each composed of the plurality of thin metal wires 14 and both thereof are formed as the wiring layer 28a on one surface (on the upper side in FIG. 7) of the transparent substrate 12, and the second electrode portion 17b is composed of the plurality of thin metal wires 14 and is formed as the wiring layer 28b on the other surface (on the lower side in FIG. 7) of the transparent substrate 12. Here, the dummy electrode portion 26 is formed on one surface (on the upper side in FIG. 7) of the transparent substrate 12 similarly to the first electrode portion 17a, and is composed of the plurality of thin metal wires 14 similarly arranged at positions corresponding to the plurality of thin metal wires 14 of the second electrode portion 17b formed on the other surface (on the lower side in FIG. 7), as shown in the drawing.

The dummy electrode portion 26 is disposed to be spaced from the first electrode portion 17a by a predetermined interval, and is in the state of being electrically insulated from the first electrode portion 17a.

In the conductive film 11 according to the present embodiment, the dummy electrode portion 26 being composed of the plurality of thin metal wires 14 corresponding to the plurality of thin metal wires 14 of the second electrode portion 17b formed on the other surface (on the lower side in FIG. 7) of the transparent substrate 12 is formed on one surface (on the upper side in FIG. 7) of the transparent substrate 12. Therefore, scattering due to the thin metal wires on the one surface (on the upper side in FIG. 7) of the transparent substrate 12 can be controlled, and it is thus possible to improve visibility of electrode.

Here, the first electrode portion 17a and the dummy electrode portion 26 of the wiring layer 28a have the wiring pattern 24a having a mesh shape which is formed by the thin metal wires 14 and opening portions 22. The second electrode portion 17b of the wiring layer 28b has a wiring pattern 24b having a mesh shape which is formed by the thin metal wires 14 and opening portions 22, similarly to the first electrode portion 17a. As described above, the transparent substrate 12 is composed of an insulating material, and the second electrode portion 17b is in the state of being electrically insulated from the first electrode portion 17a and the dummy electrode portion 26.

In addition, the first and second electrode portions 17a and 17b and the dummy electrode portion 26 each can be formed of the same material as the wiring portions 16 of the conductive film 10 shown in FIG. 1 in the same manner.

The first protective layer 20a is adhered to the substantially entire surface of the wiring layer 28a being composed of the first electrode portion 17a and the dummy electrode portion 26 through the first adhesive layer 18a so as to cover the thin metal wires 14 of the first electrode portion 17a and the dummy electrode portion 26 of the first sub-wiring portion 16a.

Further, the second protective layer 20b is adhered to the substantially entire surface of the wiring layer 28b being composed of the second electrode portion 17b through the second adhesive layer 18b so as to cover the thin metal wires 14 of the second electrode portion 17b of the second sub-wiring portion 16b.

It should be noted that the first and second adhesive layers 18a and 18b and the first and second protective layers 20a and 20b of the conductive film 11 shown in FIG. 7 are those of the conductive film 10 shown in FIG. 1, and description thereof will be omitted. As described above, the first protective layer 20a, the second protective layer 20b, the first adhesive layer 18a, and the second adhesive layer 18b may be omitted.

In the conductive film 11 of the present embodiment, the second sub-wiring portion 16b having the second electrode portion 17b does not have the dummy electrode portion. However, the present invention is not limited to this, and in the second sub-wiring portion 16b, the dummy electrode portion, which is electrically insulated from the second electrode portion 17b to be spaced by a predetermined interval from the first electrode portion 17a and is composed of the thin metal wires 14, may be disposed at a position corresponding to the first electrode portion 17a of the first sub-wiring portion 16a.

In the conductive film 11 of the present embodiment, the dummy electrode portion is provided on the first sub-wiring portion 16a, and such a dummy electrode portion 26 is provided on the second sub-wiring portion 16b. Thereby, the dummy electrode portions may be disposed to correspond to respective mesh wirings of the first electrode portion 17a of the first sub-wiring portion 16a and the second electrode portion 17b of the second sub-wiring portion 16b. Therefore, scattering due to the thin metal wires on the one surface (on the upper side or the lower side in FIG. 7) of the transparent substrate 12 can be controlled, and it is thus possible to improve visibility of electrode. It should be noted that the dummy electrode portion described herein corresponds to the non-conductive pattern described in WO2013/094729A.

In the conductive films 10 and 11 of the first and second embodiments shown in FIGS. 1 and 7, the sub-wiring portions 16a and 16b are respectively formed on both the upper side and the lower side of the transparent substrate 12. However, the present invention is not limited to this, and in a manner similar to that of a conductive film 11A of a third embodiment of the present invention shown in FIG. 8, the following structure may be adopted: the sub-wiring portions 16a and 16b being composed of the plurality of thin metal wires 14 each may be formed on one surface (the upper surface in FIG. 8) of each of the transparent substrates 12a and 12b, and two conductive film elements, in which the protective layers 20a and 20b are adhered to respective substantially the entire surfaces of the sub-wiring portions 16a and 16b through the adhesive layers 18a and 18b so as to cover the thin metal wires 14, overlap with each other.

Figure 8:
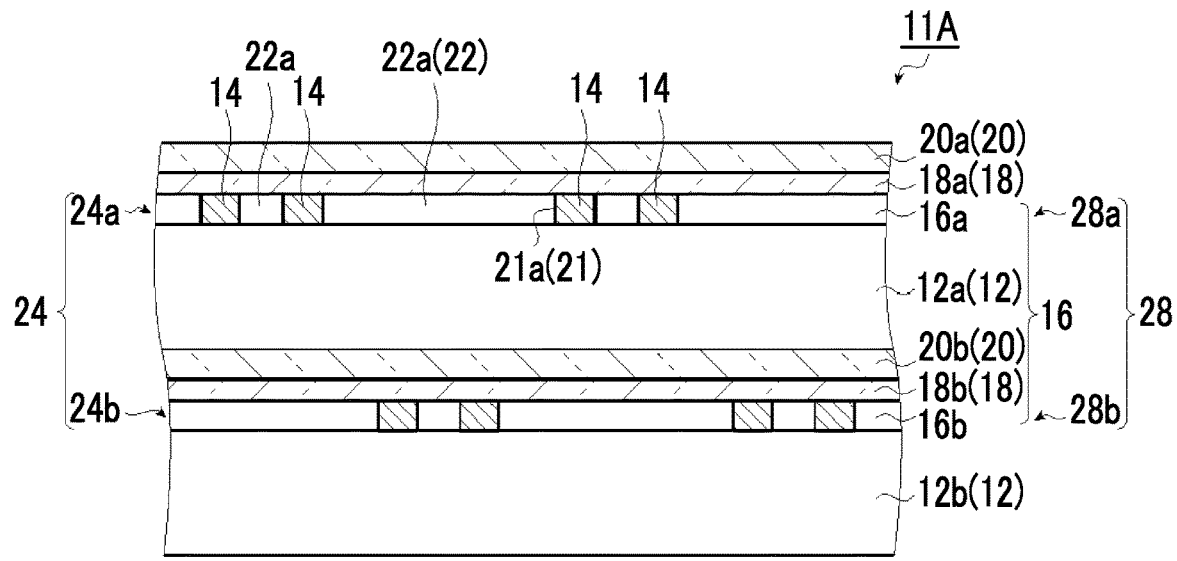
FIG. 8 is a schematic partial cross-sectional view of an example of a conductive film according to a third embodiment of the present invention.

The conductive film 11A of the third embodiment of the present invention shown in FIG. 8 has: a lower transparent substrate 12b in FIG. 8; the second sub-wiring portion 16b that is composed of the plurality of thin metal wires 14 formed on the upper surface of the transparent substrate 12b; the second protective layer 20b that is adhered onto the second sub-wiring portion 16b through the second adhesive layer 18b; an upper transparent substrate 12a that is adhered onto and disposed on the second protective layer 20b through for example an adhesive or the like; the first sub-wiring portion 16a that is composed of the plurality of thin metal wires 14 formed on the upper surface of the transparent substrate 12a; and the first protective layer 20a that is adhered onto the first sub-wiring portion 16a through the first adhesive layer 18a.

Here, all or a part of at least one of the thin metal wires 14 of the first sub-wiring portion 16a and/or the second sub-wiring portion 16b has a wiring pattern including a wiring pattern in which two or more wirings shown in FIG. 3A or FIG. 3B are consecutively arranged in at least one direction. A combined wiring pattern formed by overlapping the wiring pattern of the first sub-wiring portion 16a and the wiring pattern of the second sub-wiring portion 16b is a wiring pattern including the non-equal pitch wiring pattern 25a or 25b shown in FIG. 2 or 5.

Figure 9:
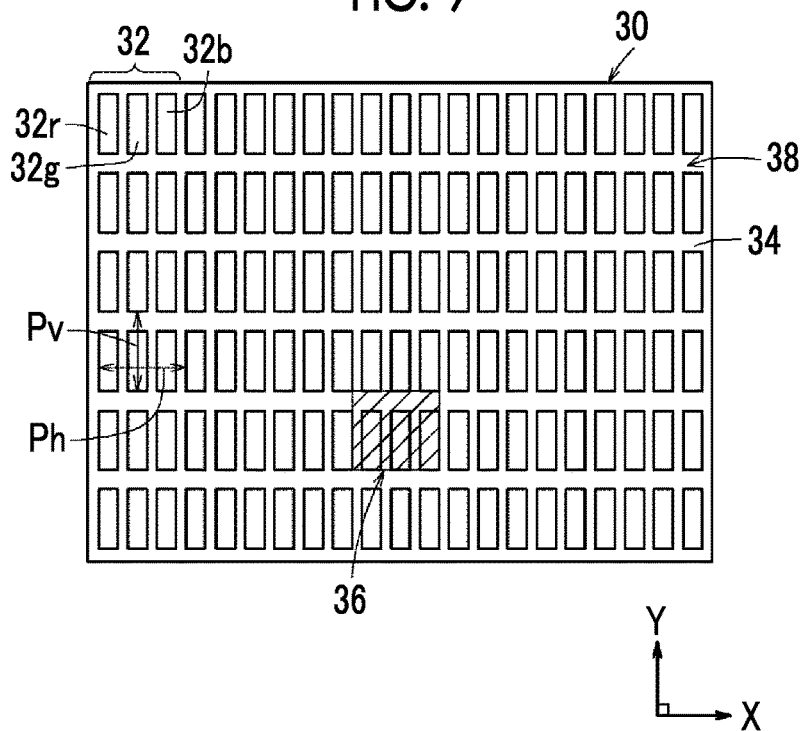
FIG. 9 is a schematic explanatory diagram showing an example of a pixel array pattern of a part of the display unit to which the conductive film according to the embodiment of the present invention is applied.

The conductive films 10, 11, and 11A of the first, second, and third embodiments of the present invention described above each are, for example, a conductive film in which a wiring pattern optimized in terms of moiré visibility with respect to the pixel array (BM) pattern of the display is included in a combined wiring pattern formed by overlapping wiring patterns of both sub-wiring portions on the upper side or the lower side of the conductive film applied to a touch panel (44: refer to FIG. 10) of a display unit 30 (display) schematically shown in FIG. 9.

The optimization of moiré visibility of the wiring pattern with respect to the pixel array pattern of the display, which is essential in the embodiment of the present invention, will be described later.

The conductive film according to the embodiment of the present invention basically has the above-mentioned configuration.

FIG. 9 is a schematic explanatory diagram schematically showing an example of a pixel array pattern of a part of the display unit using the conductive film of the embodiment of the present invention.

As the part thereof is shown in FIG. 9, the display unit 30 has a plurality of pixels 32 arranged in a matrix shape to constitute a predetermined pixel array pattern. Each pixel 32 has a configuration in which three sub-pixels (a red sub-pixel 32r, a green sub-pixel 32g, and a blue sub-pixel 32b) are arranged in a horizontal direction. Each sub-pixel has a quadrilateral shape which is long in the vertical direction. The arrangement pitch (horizontal pixel pitch Ph) of the pixels 32 in the horizontal direction and the arrangement pitch (vertical pixel pitch Pv) of the pixels 32 in the vertical direction are approximately equal to each other. That is, a shape (refer to a region 36 indicated by hatching), which is composed of a single pixel 32 and a black matrix (BM) 34 (pattern material) surrounding the single pixel 32, is a square shape. Further, in the example shown in FIG. 9, an aspect ratio of the single pixel 32 is not 1, and satisfies the following expression: a length thereof in the horizontal (transverse) direction>a length thereof in the vertical (longitudinal) direction.

As clearly seen from FIG. 9, a pixel array pattern formed by sub-pixels 32r, 32g, and 32b of a plurality of pixels 32 is defined by a BM pattern 38 of the BMs 34 each of which surrounds the sub-pixels 32r, 32g, and 32b. Moiré, which occurs in a case where the display unit 30 and the conductive film 10, 11, or 11A are overlapped, is caused by interference between the pixel array pattern of each of the sub-pixels 32r, 32g, and 32b, which is defined by the BM pattern 38 of the BMs 34 of the display unit 30, and the wiring pattern 24 of the conductive film 10, 11, or 11A.

For example, in a case where the conductive film 10, 11, or 11A is disposed on the display panel of the display unit 30 having the pixel array pattern of each of the sub-pixels 32r, 32g, and 32b described above, in the wiring pattern 25a of the conductive film 10, 11, or 11A (combined wiring pattern 24 of the wiring patterns 24a and 24b), the wiring pattern 24a or 24b is a wiring pattern in which two or more wirings are consecutively arranged, and the combined wiring pattern 25a in front view includes a non-equal pitch wiring pattern, and is optimized in terms of moiré visibility with respect to the pixel array pattern of each of the sub-pixels 32r, 32g, and 32b. Therefore, there is no interference of the spatial frequency between the pixel array pattern of each of the sub-pixels 32r, 32g, and 32b, and the wiring pattern of the thin metal wires 14 of the conductive films 10, 11, or 11A, and occurrence of moiré is restrained in both front observation and oblique observation. As a result, moiré visibility is excellent. Hereinafter, the conductive film 10 will be described as a representative example, but the description is the same as those of the conductive film 11 or 11A.

It should be noted that the display unit 30 shown in FIG. 9 may be formed as a display panel such as a liquid crystal panel, a plasma panel, an organic EL panel, or an inorganic EL panel, and a light emission intensity thereof may be different in accordance with a resolution.

The pixel array pattern and the light emission intensity of the display, which can be applied to the embodiment of the present invention, is not particularly limited, and may be the same as the pixel array pattern and the light emission intensity of a known display. For example, a display such as OLED having different periods and/or intensities of the respective colors of RGB may be used. A display, which is composed of RGB sub-pixels having the same shapes as shown in FIG. 9 and in which an intensity variation of the sub-pixels is large, or a display, in which an intensity variation of the sub-pixels is small and only a G sub-pixel (channel) having a highest intensity is considered, may be used. In particular, a display such as a smartphone or a tablet having a high intensity may be used.

As a pixel pattern of OELD, for example, there is a pen-tile array disclosed in JP2018-198198A. The display of the display device into the conductive film of the embodiment of the present invention is incorporated may be a pen-tile array OELD.

Figure 10:
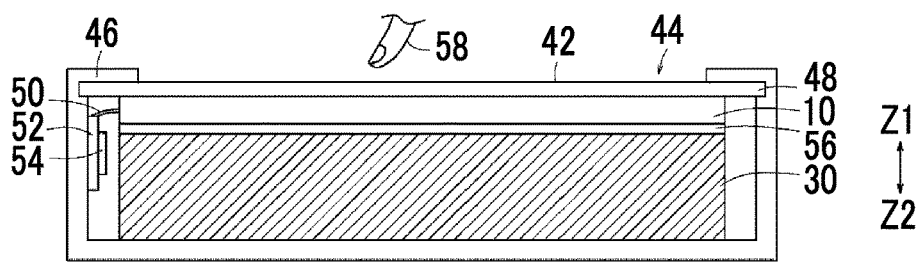
FIG. 10 is a schematic cross-sectional view of one example of a display device provided with the conductive film shown in FIG. 1.

Next, a display device, in which the conductive film according to the embodiment of the present invention is incorporated, will be described in FIG. 10. In FIG. 10, a projected electrostatic capacitive type touch panel, in which the conductive film 10 according to the first embodiment of the present invention is incorporated, will be described as a representative example of a display device 40, but it is needless to say that the present invention is not limited to this example.

As shown in FIG. 10, the display device 40 includes the display unit 30 (refer to FIG. 9) that can display a color image and/or a monochrome image, a touch panel 44 that detects a contact position on an input side 42 (located on the side as directed by the arrow Z1), and a housing 46 in which the display unit 30 and the touch panel 44 are housed. A user is able to access the touch panel 44 through a large opening portion provided in one surface (on the side as directed by the arrow Z1) of the housing 46.

The touch panel 44 includes not only the conductive film 10 (refer to FIGS. 1 and 2) described above but also a cover member 48 stacked on one surface (on the side as directed by the arrow Z1) of the conductive film 10, a flexible substrate 52 electrically connected to the conductive film 10 through a cable 50, and a detection control unit 54 disposed on the flexible substrate 52.

The conductive film 10 is adhered to one surface (on the side as directed by the arrow Z1) of the display unit 30 through an adhesive layer 56. The conductive film 10 is disposed on the display screen such that the other main surface side (second sub-wiring portion 16b side) is opposite to the display unit 30.

The cover member 48 functions as the input side 42 by covering one surface of the conductive film 10. In addition, by preventing a contact body 58 (for example, a finger or a stylus pen) from coming into direct contact with the conductive film 10, it is possible to restrain occurrence of a scratch, adhesion of dust, and/or the like, and thus it is possible to stabilize conductivity of the conductive film 10.

The material of the cover member 48 may be, for example, glass, a tempered glass, or a resin film. One surface (on the side as directed by the arrow Z2) of the cover member 48 may be coated with silicon oxide or the like, and may be adhered to one surface (on the side as directed by the arrow Z1) of the conductive film 10. Further, in order to prevent damage due to rubbing or the like, the conductive film 10 and the cover member 48 may be configured to be adhered to each other.

The flexible substrate 52 is an electronic substrate having flexibility. In the example shown in this diagram, the flexible substrate 52 is fixed to an inner side wall of the housing 46, while the position of the substrate may be varied. The detection control unit 54 constitutes an electronic circuit that catches a change in capacitance between the contact body 58 and the conductive film 10 and detects the contact position (or the approach position) in a case where the contact body 58 as a conductor is brought into contact with (or comes closer to) the input side 42.

The display device, to which the conductive film according to the embodiment of the present invention is applied, basically has the above-mentioned configuration.

Next, in the present invention, in a wiring pattern in which straight line wirings in two or more directions are overlapped or a wiring pattern in which a straight line wiring in one or more directions and a line wiring (for example, a curved line or a polygonal line) that is not a straight line wiring in one or more directions are overlapped, two or more wiring layers are provided. In addition, in at least one direction of straight line wiring, two or more wirings are consecutively arranged in each layer. Thereby, it will be described that, in the direction, occurrence of moiré in oblique observation can be reduced as compared with a wiring pattern in the related art in which wirings are alternately arranged in each layer. First, the principle of moiré occurrence in a case where the pixel array pattern and the wiring pattern are overlapped will be described, and then the reason for the moiré occurrence in oblique observation will be described. Then, description will be given of the principle of how to reduce occurrence of moiré in oblique observation as compared with the alternate arrangement in the related art by the configuration in which "two or more wirings are consecutively arranged in each layer" in the present invention. In addition, description will be given of the following. In front observation, the moiré can be further reduced by the configuration in which "the repetitive pitches of the predetermined number of wirings are set as equal pitches and the respective pitches of the predetermined number of wirings are set as non-equal pitches".

In the following description, the wiring pattern in which all the line wirings overlapped in two or more directions are straight line wirings is described as a representative example. However, as long as the line wiring in at least one direction among the line wirings overlapped in two or more directions is a straight line wiring, it is apparent that it is possible to reduce occurrence of moiré in oblique observation by the configuration in which "two or more wirings are consecutively arranged in each layer" in the present invention in the straight line wiring, as compared with the alternate arrangement in the related art in the straight line wiring. In addition, it is apparent that the moiré can be further reduced by the configuration in which "the repetitive pitches of the predetermined number of wirings are set as equal pitches and the respective pitches of the predetermined number of wirings are set as non-equal pitches" in the straight line wiring.

(Principle of Moiré in Case Where Pixel array pattern and wiring pattern Are Overlapped)

The following is considered 1-dimensionally for convenience of description.

First, the light emission luminance pattern of the pixel array is set to bm(x). Here, bm(x) represents a luminance at a position x. The Fourier series expansion of bm(x) can be expressed as Expression (3). Here, the symbol "*" represents multiplication. Further, bm(x) is a periodic function having a period of 2*Lb, and ω1, ω2, ω3, . . . respectively represent π/Lb, 2*π/Lb, 3*π/Lb, . . .

$$bm(x)=A0+(a1*\cos(\omega1*x)+b1*\sin(\omega*x)+a2*\cos(\omega2*x)+b2*\sin(\omega2*x)) \qquad (3)$$

From Euler's formula, cos(ωn*x) and sin(ωn*x) can be represented by complex numbers as follows, respectively. Here, i represents an imaginary unit.

cos(ωn*x)=(exp(i*ωn*x)+exp(−i*ωn*x))/2
sin(ωn*x)=(exp(i*ωn*x)−exp(−i*ωn*x))/(2*i)

Therefore, from Expression (3), Expression (4) is obtained.

$$bm(x)=A0+(((a1-i*b1)/2)*\exp(i*\omega1*x)+((a1+i*b1)/2)*\exp(-1*\omega1*x)) \qquad (4)$$

Thus, Expression (4) can be expressed by a complex number as Expression (5).

$$bm(x)=A0+\Sigma(An*\exp(i*\omega n*x)+Bn*\exp(-i*\omega n*x)) \qquad (5)$$

Here, An and Bn are complex numbers and have a conjugate relation as follows.
An=(an−i*bn)/2
Bn=(an+i*bn)/2

Similarly, in a case where the transmittance pattern of the wiring is mesh(x) and mesh(x) is expressed by a Fourier series of complex numbers, mesh(x) can be represented by Expression (6).

$$mesh(x)=C0+\Sigma(Cm*\exp(i*\beta m*x)+Dm*\exp(-i*\beta m*x)) \qquad (6)$$

Here, assuming that mesh(x) is a periodic function having a period of 2*Lm, β(m) represents m*π/Lm. Further, Cm and Dm are complex numbers and have a conjugate relation as follows.
Cm=(cm−1*dm)/2
Dm=(cm+i*dm)/2

The pattern in which the pixel array pattern and the wiring pattern are overlapped is expressed by multiplication of the above-described light emission luminance pattern (5) of the pixel array and the transmittance pattern (6) of the wiring, as follows.

$$bm(x)*mesh(x) = \qquad (7)$$
$$A0*C0 + C0*\left(\sum(An*\exp(i*\omega n*x) + Bn*\exp(-i*\omega n*x))\right) +$$
$$A0*\left(\sum(Cm*\exp(i*\beta m*x) + Dm*\exp(-i*\beta m*x))\right) +$$
$$\sum\sum(An*\exp(i*\omega n*x) + Bn*\exp(-i*\omega n*x))*$$
$$(Cm*\exp(i*\beta m*x) + Dm*\exp(-i*\beta m*x))$$

In Expression (7), A0*C0 in the first row indicates the average luminance of the overlapped pattern, the second row indicates each frequency component of the luminance pattern of the pixel array multiplied by the average transmittance C0 of the wiring pattern, and the third row Indicates each frequency component of the wiring pattern multiplied by the average luminance A0 of the pixel array pattern.

The moiré of the overlapped pattern is given by the expression on the fourth row. In a case where the expression on the fourth row is expanded for one combination of n and m, the expression be represented by Expression (8).

$$(An*\exp(i*\omega n*x) + Bn*\exp(-i*\omega n*x))* \qquad (8)$$
$$(Cm*\exp(i*\beta m*x) + Dm*\exp(-i*\beta m*x)) =$$
$$An*Cm*\exp(i*(\omega n*x + \beta m*x)) +$$
$$Bn*Dm*\exp(-i*(\omega n*x + \beta m*x)) +$$
$$An*Dm*\exp(i*(\omega n*x - \beta m*x)) +$$
$$Bn*Cm*\exp(-i*(\omega n*x - \beta m*x))$$

Here, considering that An and Bn have a conjugate relation and Cm and Dm also have a conjugate relation, it can be seen that An*Cm and Bn*Dm, and An*Dm and Bn*Cm in the above expression have conjugate relations.

In addition, it can be seen that An*Cm*exp(i*(ωn*x+βm*x)) and Bn*Dm*exp(−i*(ωn*x+βm*x)), and An*Dm*exp(i*(ωn*x−βm*x)) and Bn*Cm*exp(−i*(ωn*x−βm*x)) in the above expression also have conjugate relations.

Here, An*Cm and Bn*Dm can be expressed as follows.
An*Cm=ABS(An*Cm)*exp(i*θ1)
Bn*Dm=ABS(An*Cm)*exp(−1*θ1)

Then, An*Cm*exp(i*(ωn*x+ωm*x))+Bn*Dm*exp(−i*(ωn*x+βm*x)) in Expression (8) is 2*ABS(An*Cm)*cos(ωn*x+βm*x+θ1), which can be represented only by real numbers. Here, ABS(An*Cm) represents the absolute value of the complex number An*Cm.

Similarly, An*Dm*exp(i*(ωn*x−βm*x))+Bn*Cm*exp(−i*(ωn*x−βm*x)) in Expression (8) is 2*ABS(An*Dm)*cos(ωn*x−βm*x+θ2), which can be represented only by real numbers.

After all, in a case where the expression on the fourth row of Expression (7) is expanded for one combination of n and m, Expression (9) is obtained.

$$2*ABS(An*Cm)*\cos(\omega n*x+\beta m*x+\theta 1)+2*ABS(An*Dm)*\cos(\omega n*x-\beta m*x+\theta 2) \quad (9)$$

In a case where the pixel array pattern and the wiring pattern are overlapped (that is, multiplied) from Expression (9), it can be seen that moiré with the intensity of 2*ABS(An*Cm)=2*ABS(An)*ABS(Cm) occurs at a frequency ωn+βm of the sum of the respective frequencies ωn and βm, and moiré with the intensity 2*ABS(An*Dm)=2*ABS(An)*ABS(Dm) occurs at a difference frequency ωn-βm. Here, ABS(Cm) and ABS(Dm) both have the same value of the intensity of the frequency βm of the wiring pattern.

It should be noted that ABS(An), ABS(Bn), ABS(Cm), and ABS(Dm) respectively are intensities in the complex Fourier series, as can be seen from the above description, and thus is ½ of intensities in the Real Fourier series (the reason for this is that in a complex Fourier series, the intensity is separated into two complex numbers having a conjugate relation).

In addition, in the 1-dimensional frequency distribution of the pattern obtained by overlapping (multiplying) the pixel array pattern and the wiring pattern from Expression (8), it can be seen that the moiré components occur at frequencies to which frequencies ωn and βm are added. Coefficients of the moiré components are multiplication values (complex numbers) of the coefficients An and Bn of the components of the frequencies ωn in the 1-dimensional frequency distribution of the pixel array pattern and the coefficients Cm and Dm of the components of the frequencies βm in the 1-dimensional frequency distribution of the wiring pattern. Here, it is assumed that the frequency of the coefficient Bn is −ωn and the frequency of the coefficient Dm is −βm. Among these moirés, the problematic moiré is a moiré having a frequency ωn-βm and −(ωn-βm)). The reason for this is that since the human's visual response characteristics are sensitive to low-frequency patterns, even in a case where the respective patterns ωn and βm of the pixel array pattern and the wiring pattern are not visible, the moiré with the frequency ωn-βm is at a low frequency and is likely to be visible.

In order to make understanding of the description easier, the luminance pattern of the pixel array and the transmittance pattern of the wiring are hitherto considered 1-dimensionally. In reality, both patterns are 2-dimensional, but in the case of two dimensions, not only the frequency in the x direction but also the frequency in the y direction may be taken into consideration, and an expression expressing moiré can be derived in the same manner. In conclusion, in the case of two dimensions, the moiré of the intensity of the product of the respective intensities of the difference frequency and the sum frequency of the frequency components in the x direction and the y direction of the luminance pattern of the pixel array and the transmittance pattern of the wiring occurs.

Figure 11:
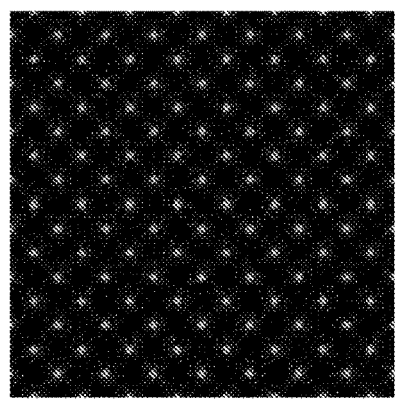
FIG. 11 is a plan view schematically showing an example of a luminance pattern of a pixel array of the display unit shown in FIG. 9.

Next, a specific example will be described. FIG. 11 schematically shows an example of the luminance pattern of the pixel array of any of the sub-pixels 32r, 32g, and 32b of the display unit 30 shown in FIG. 9. In addition, FIG. 12 schematically shows an equal pitch wiring pattern (that is, a transmittance pattern of the wiring) 25c.

Figure 12:
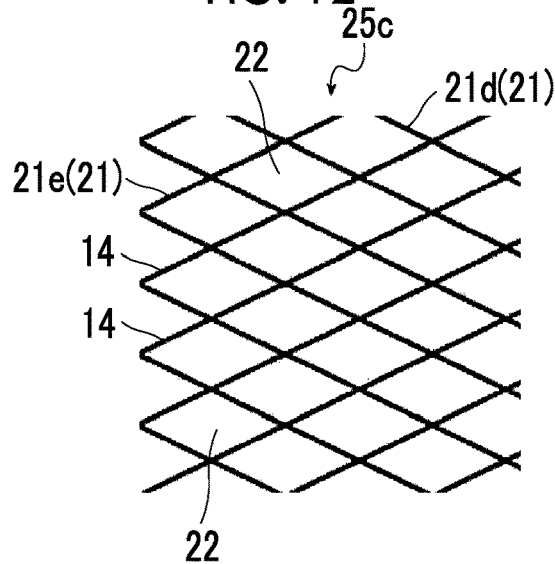
FIG. 12 is a plan view schematically showing a conventional equal pitch wiring pattern (transmittance pattern of the wiring).
Figure 13A:
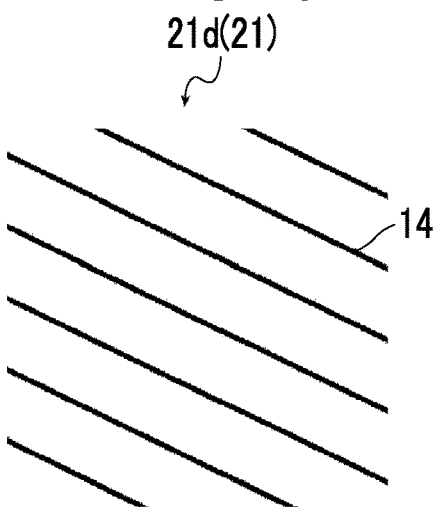
FIG. 13A is a plan view schematically showing a wiring pattern in a straight line wiring of the wiring pattern in one direction shown in FIG. 12.
Figure 13B:
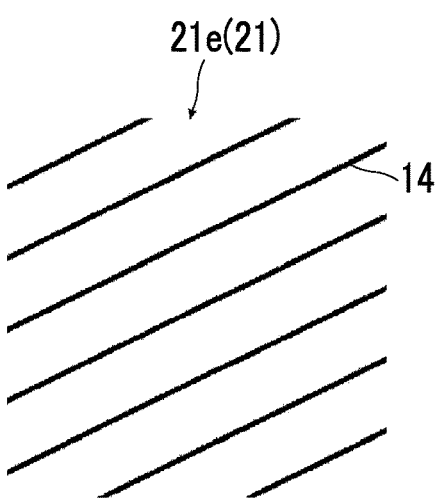
FIG. 13B is a plan view schematically showing a wiring pattern in a straight line wiring of the wiring pattern in another direction shown in FIG. 12.

Here, for example, a shape of the opening portion 22 of the wiring pattern 25c shown in FIG. 12 is a rhomboid, and in FIG. 12, an angle formed with the x direction is 26°, and a pitch is 101 μm. In a case where the shape of the opening portion 22 of the wiring pattern 25 is a rhomboid, the shape can be represented by overlapping the wiring patterns of straight line wirings in two directions. FIG. 13A shows a straight line wiring 21d in the right direction (extending in the left (up) direction and arranged in the right (up) direction) of the two directions. FIG. 13B shows a straight line wiring 21e in the left direction (extending in the right (up) direction and arranged in the left (up) direction) of the two directions. Here, "the direction" of the straight line wiring is a direction in which the straight line wirings are arranged, and means a direction vertical to the straight line.

Figure 14:
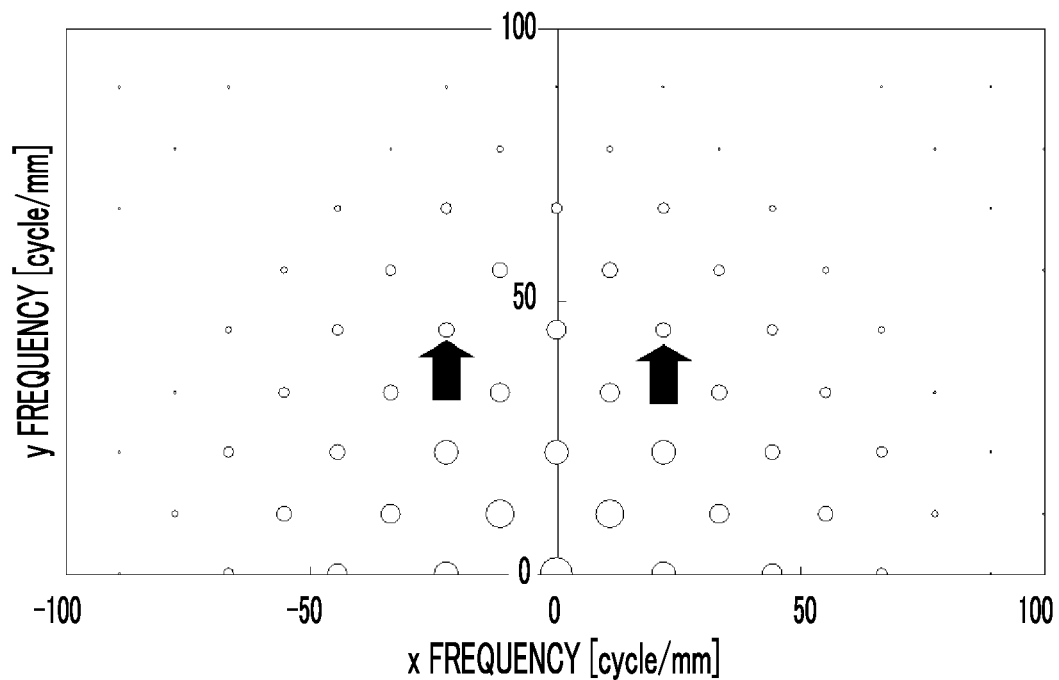
FIG. 14 is a diagram of a 2-dimensional frequency distribution of the pixel array pattern shown in FIG. 11.
Figure 15:
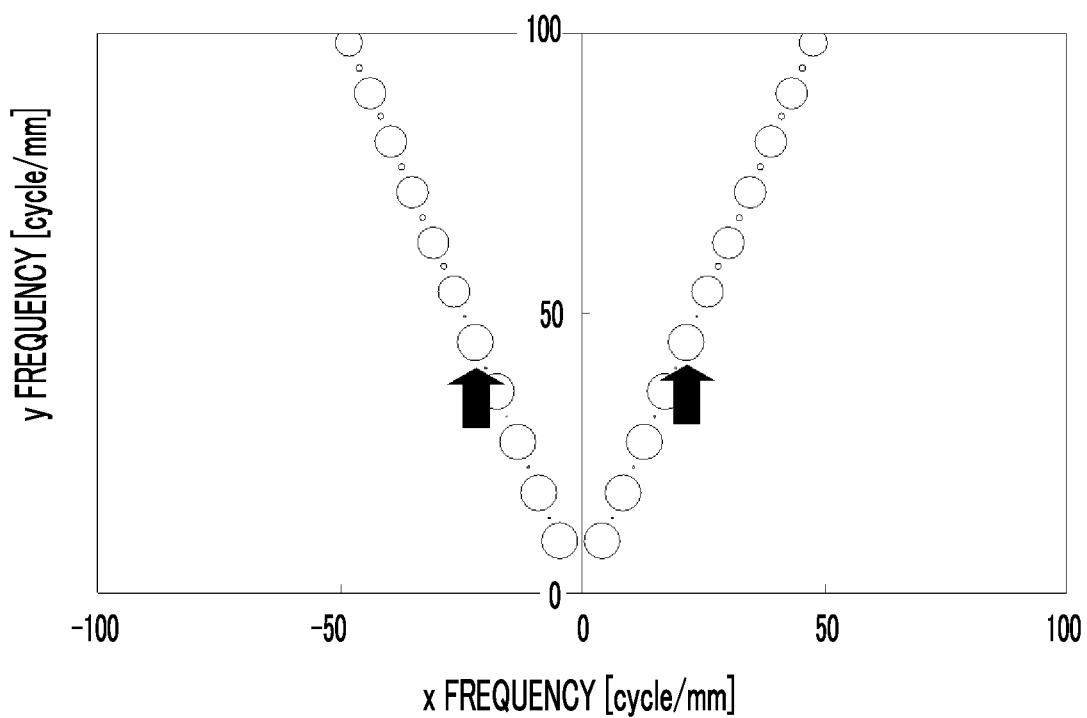
FIG. 15 is a diagram showing a 2-dimensional frequency distribution of the wiring pattern shown in FIG. 12.

Further, FIG. 14 is a 2-dimensional frequency distribution of the pixel array pattern of FIG. 11 (that is, the luminance pattern of the pixel array), where the intensity of each frequency component is indicated by the area of the circle. FIG. 15 is a 2-dimensional frequency distribution of the wiring pattern 25c of FIG. 12, where the intensity of each frequency component is indicated by the area of the circle. It should be noted that the 2-dimensional frequency distributions of FIGS. 14 and 15 each show only the first quadrant and the second quadrant. The frequency components in the first quadrant of FIG. 15 represent the frequency components in the straight line wiring 21d in the right direction in FIG. 12, and the frequency components in the second quadrant of FIG. 15 represent the frequency components in the straight line wiring 21e in the left direction in FIG. 12.

Figure 105:
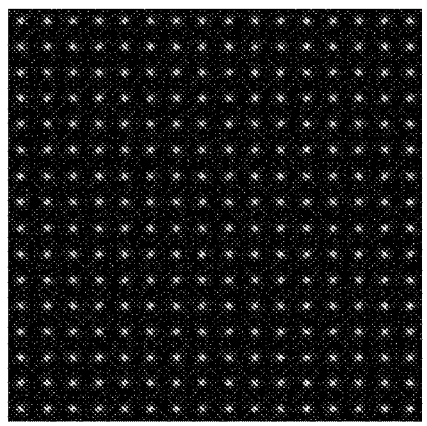
FIG. 105 is a plan view schematically showing another example of the luminance pattern of the pixel array of the display unit to which the conductive film according to the embodiment of the present invention is applied.
Figure 106:
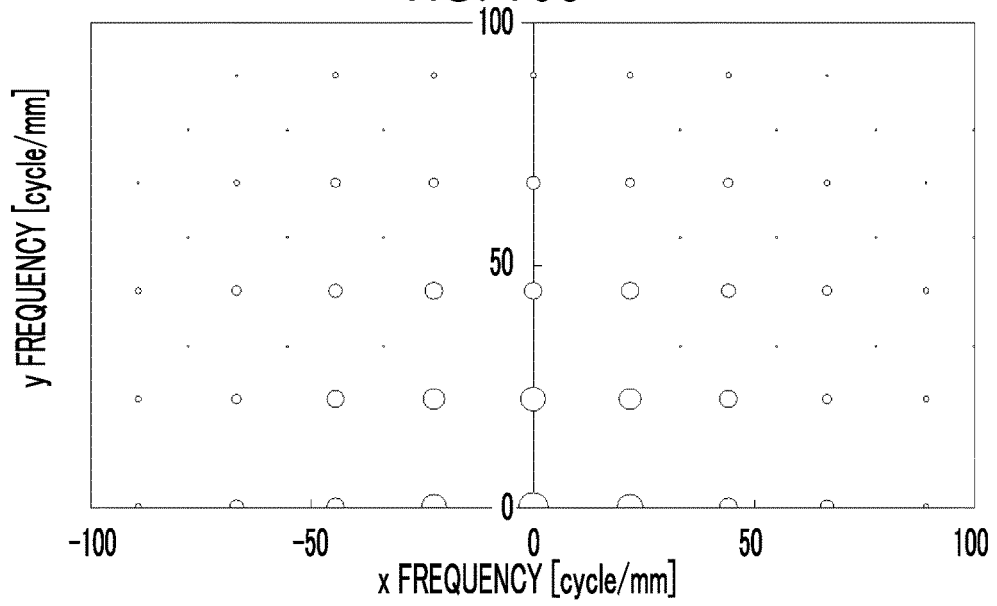
FIG. 106 is a diagram of a 2-dimensional frequency distribution of the pixel array pattern shown in FIG. 105.

It should be noted that, In the embodiment of the present invention, as a display unit, it is possible to use a display unit of a display having different pixel array patterns for at least two colors of red (R), green (G), and blue (B) pixels, as in an organic EL display (OELD). FIG. 105 schematically shows another example of the luminance pattern of any pixel array of the sub-pixels RGB of the display unit 30a of such an organic EL display (OELD). Further, FIG. 106 is a 2-dimensional frequency distribution of the pixel array pattern of FIG. 105 (that is, the luminance pattern of the pixel array), where the intensity of each frequency component is indicated by the area of the circle. Here, FIG. 105 shows a pixel array pattern corresponding to FIG. 11, and FIG. 106 shows a 2-dimensional frequency distribution corresponding to FIG. 14.

Figure 16:
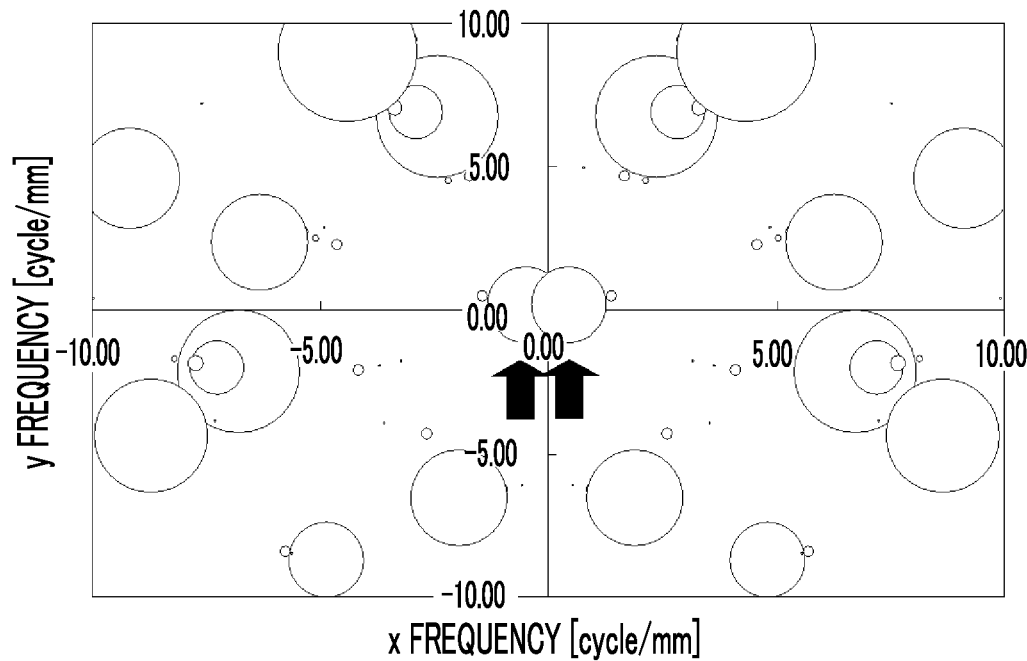
FIG. 16 is a diagram in which moiré components calculated from frequency components of the pixel array pattern shown in FIG. 14 and frequency components of the wiring pattern shown in FIG. 15 are plotted.

FIG. 16 is a diagram in which a multiplication value of each intensity is plotted at the difference frequency obtained by calculating a difference between moiré components, that is, a difference between frequencies, which are calculated from each frequency component of the pixel array pattern shown in FIG. 14 and each frequency component of the wiring pattern 25c shown in FIG. 15. Here, FIG. 16 differs from FIG. 14 and FIG. 15 in the scale range of the x frequency and the y frequency, and also there is a difference in the relationship between the area of the circle of each component and the intensity.

Here, as can be seen from Expression (8), in order to accurately derive the moiré component, it is necessary for all frequency components of the pixel array pattern (including components of the conjugate relation) and all frequency components of the wiring to be multiplied by the coefficients (complex numbers) of the components and to be plotted on the frequency of the sum of the frequencies of the components (the sum with the negative frequencies corresponds to the above difference calculation). However, description thereof will be omitted for simplification of description. FIG. 16 is a diagram in which moirés of components are plotted. The components include components in a region in which the y frequency is 0 or less in the 2-dimensional frequency distribution of the pixel array pattern and components obtained by excluding components of the frequency 0 from a region in which the y frequency is 0 or more in the region of the 2-dimensional frequency distribution of the wiring pattern.

Here, as can be seen from Expression (7), the pattern, in which the pixel array pattern and the wiring pattern are overlapped, includes, in addition to the moiré given by the expression in the fourth row of Expression (7), "the frequency components of the wiring pattern multiplied by the average luminance of the pixel array pattern" given by the third row of Expression (7). In FIG. 16, these components are also included. Specifically, the component of the frequency 0 of the pixel array pattern (corresponding to A0 in Expression (7)) is multiplied by the components of the wirings, and the multiplication values are plotted on the sum of the frequencies of the component of the frequency 0 and the components of the wirings, that is, in the frequencies of the components of the wirings.

The pattern obtained by overlapping the pixel array pattern and the wiring pattern includes "each frequency component of the luminance pattern of the pixel array multiplied by the average transmittance of the wiring pattern" given in the second row of Expression (7). However, in FIG. 16, this component is not included. Specifically, in a case where the multiplication values of the frequency components of the pixel array pattern and the frequency components of the wiring pattern are plotted on the frequency of the sum of the frequencies of the respective components, the component of the frequency 0 of the wiring pattern (corresponding to C0 in Expression (7)) is excluded. In the plot of FIG. 16, the phase information of each moiré component is not necessary and only the intensity thereof may be derived therefrom. Therefore, the intensity can be easily derived from each frequency component of the pixel array pattern of FIG. 14 and each frequency component of the wiring pattern of FIG. 15. That is, the difference between each frequency component of the wiring pattern of FIG. 15 and the frequency of each frequency component of the pixel array pattern of FIG. 14 is simply calculated, and the multiplication values of the intensities of the components are plotted on the frequencies of the differences.

Here, as described above, the plot of FIG. 16 includes "each frequency component of the wiring pattern multiplied by the average luminance of the pixel array pattern". Therefore, the frequency distribution of the pixel array pattern of FIG. 14 includes the frequency distribution of the component of the frequency 0 (corresponding to A0 in Expression (7)), and does not include "each frequency component of the pixel array pattern multiplied by the average transmittance of the wiring pattern". As a result, the frequency distribution of the wiring pattern of FIG. 15 does not include the component of the frequency 0 (corresponding to C0 in Expression (7)). In the embodiment of the present invention, not only FIG. 16 but also any moiré component diagrams in the following description include "each frequency component of the wiring pattern multiplied by the average luminance of the pixel array pattern", and does not include "each frequency component of the pixel array pattern multiplied by the average transmittance of the wiring pattern".

The human eye's visual response characteristics are sensitive to low frequencies, that is, only the low-frequency components of the moiré components in FIG. 16 are visible to the human eye.

Figure 17:
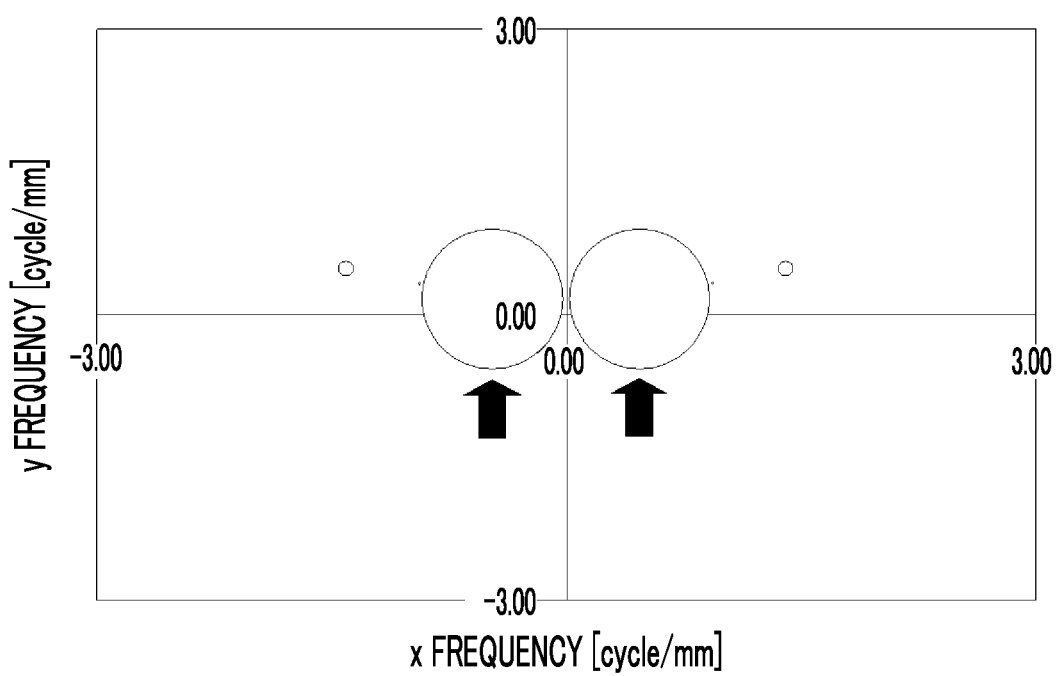
FIG. 17 is a diagram showing a result of multiplying each moiré component shown in FIG. 16 by the sensitivity of the human eye's visual characteristics.

FIG. 17 shows a result of multiplying each moiré component shown in FIG. 16 by the sensitivity of the human eye's visual response characteristics. Here, FIG. 17 differs from FIG. 16 in the scale range of the x frequency and the y frequency. In addition, the intensity indicated by the area of the circle of each component is different, and each component is plotted as a circle having a larger area in FIG. 17. In the embodiment of the present invention, as the sensitivity of the human eye's visual response characteristics, the Dooley-Shaw expression (R. P. Dooley, R. Shaw: Noise Perception in Electrophotography, J.Appl.Photogr.Eng., 5, 4 (1979), pp.190-196.) is used, which is represented by Expression (1). Here, Expression (1) is given as the visual transfer function VTF.

k≤log(0.238/0.138)/0.1,
VTF=1,
k>log(0.238/0.138)/0.1, $$VTF=5.05e^{-0.138k}(1-e^{-0.1k}) \qquad (1)$$

k=πdu/180,

Here, k is a spatial frequency (cycle/deg) defined by a solid angle, and is represented by the above expression. u is a spatial frequency (cycle/mm) defined by a length, and d is an observation distance (mm).

The Dooley-Shaw expression is given by VTF=5.05e$^{-0.138k}$(1-e$^{-0.1k}$) in Expression (1), and is less than 1 around 0 cycle/mm, and has so-called characteristics of a bandpass filter. However, in the embodiment of the present invention, even in a case where the spatial frequency band is low (k≤log(0.238/0.138)/0.1), the value of VTF is set to 1 so as to eliminate attenuation in sensitivity of low-frequency components.

Figure 18A:
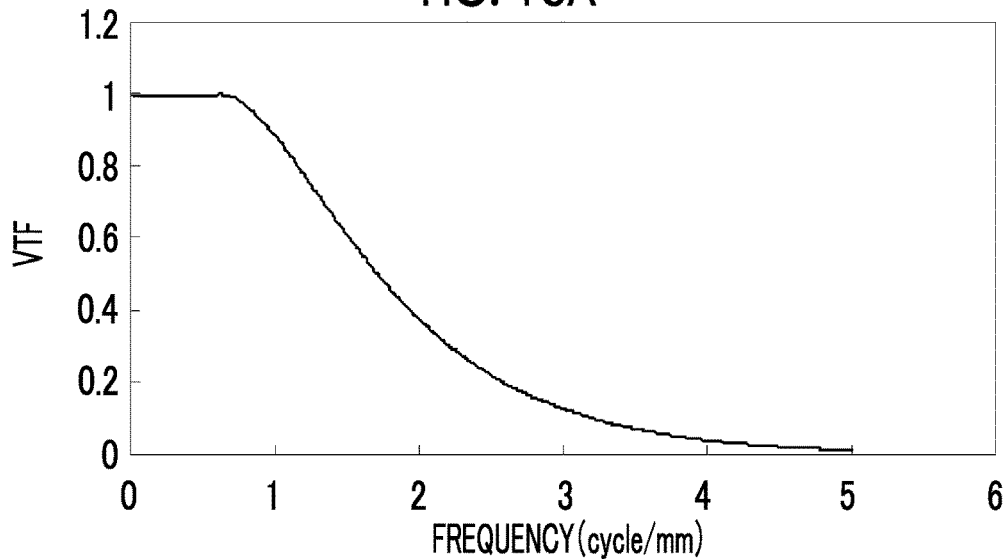
FIG. 18A is a graph of a visual transfer function indicating the sensitivity of the human eye's visual characteristics.
Figure 18B:
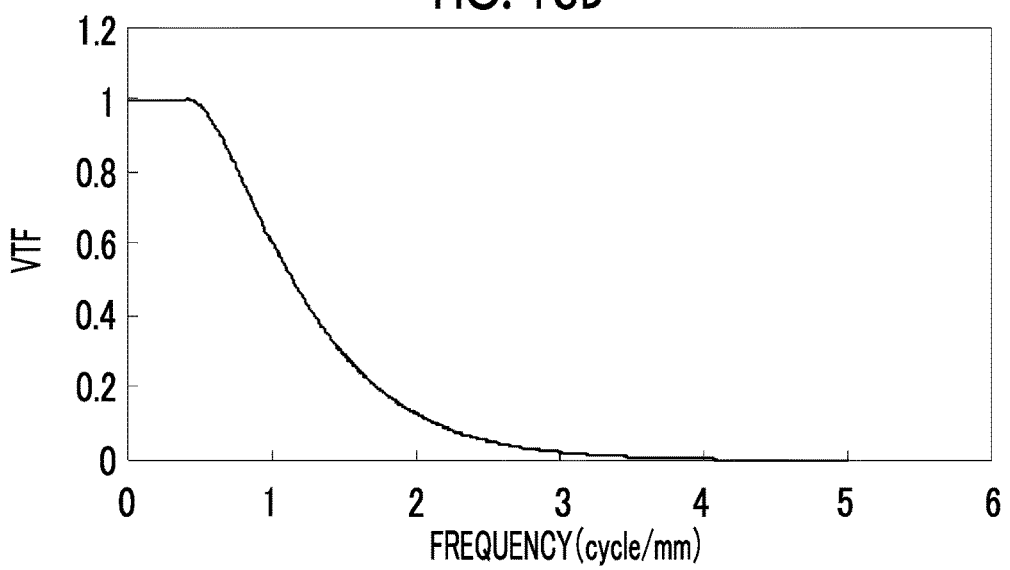
FIG. 18B is a graph of another visual transfer function indicating the sensitivity of the human eye's visual characteristics.

FIGS. 18A and 18B show examples of an observation distance of 500 mm and an observation distance of 750 mm as examples of VTF. In the description of the present specification, the VTF at the observation distance of 500 mm is used as the sensitivity of the human eye's visual response characteristics.

In FIG. 17, it can be seen that there is a moiré component in the low frequency range of 1 cycle/mm or less, and there is moiré visible to the human eye.

This moiré is caused by the components (x=22.2 cycle/mm, y=44.4 cycle/mm) indicated by the black arrows in the frequency distribution of the pixel array pattern of FIG. 14 and the components (x=21.8 cycle/mm, y=44.6 cycle/mm) indicated by the black arrows in the frequency distribution of the wiring pattern of FIG. 15.

As described above, it can be seen that in a case where there are close components of frequencies in the frequency distribution of the pixel array pattern and the frequency distribution of the wiring pattern, low-frequency moiré visible to the human eye occurs.

It should be noted that, as in the components indicated by the black arrows in FIG. 17, a component having the highest intensity among the moiré components obtained by applying the human eye's visual response characteristics is referred to as "a frequency component of moiré that contributes most to the moiré" or "a main moiré component".

(Reason for Moiré Occurrence in Oblique Observation)

First, based on the above-described principle of moiré occurrence, the distance between each frequency component of the wiring and each frequency component of the pixel array in the 2-dimensional frequency space is large. As a result, an example, in which the wiring angle and wiring pitch are examined such that low-frequency moiré visible to the human eye is reduced, is shown below. Then, the example describes occurrence of moiré in a case where oblique observation is assumed. Finally, the reason will be described.

Figure 19:
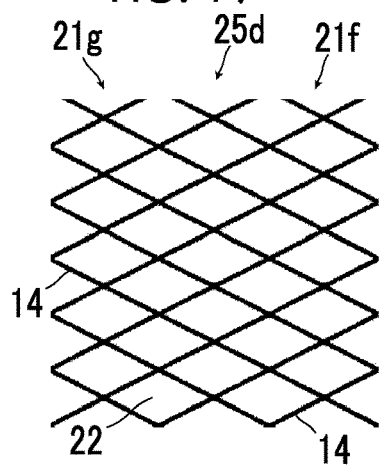
FIG. 19 is a plan view schematically showing an equal pitch wiring pattern having less moiré in front observation.
Figure 20:
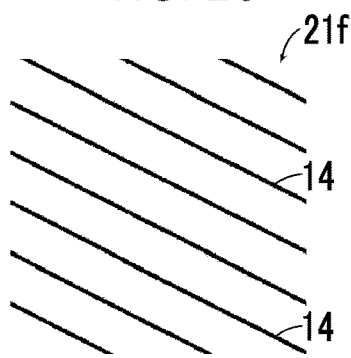
FIG. 20 is a plan view schematically showing a wiring pattern in a straight line wiring of the wiring pattern in one direction shown in FIG. 19.

First, FIG. 19 schematically shows an example of a wiring pattern in which the wiring angle and wiring pitch are examined such that moiré is reduced. FIG. 19 shows an equal pitch wiring pattern (that is, a wiring transmittance pattern) 25d having an angle of 27° with the x direction and a wiring pitch of about 90 μm. Here, the shape of the opening portion 22 of the wiring pattern 25d shown in FIG. 19 is a rhomboid. Since the shape of the opening portion 22 of the wiring pattern 25d is a rhomboid, the shape can be represented by overlapping the straight line wirings 21f and 21g in two directions. FIG. 20 shows the straight line wiring 21f in the right direction (extending in the left direction and arranged in the right direction) of the two directions. It should be noted that only a straight line wiring 21g in the left direction (extending in the right direction and arranged in the left direction) of the two directions is symmetric to that in FIG. 20 and is thus not shown in the drawing.

Here, the straight line wirings 21f and 21g in the two directions of the wiring pattern 25d shown in FIGS. 19 and 20 are straight line wirings in front observation, and each is composed of thin metal wires 14 which are alternately arranged on the upper surface and the lower surface of the transparent substrate 12. Therefore, in the wiring pattern 25d shown in FIG. 19, it can be said that the thin metal wires 14 are alternately arranged on the upper surface and the lower surface of the transparent substrate 12.

Figure 21:
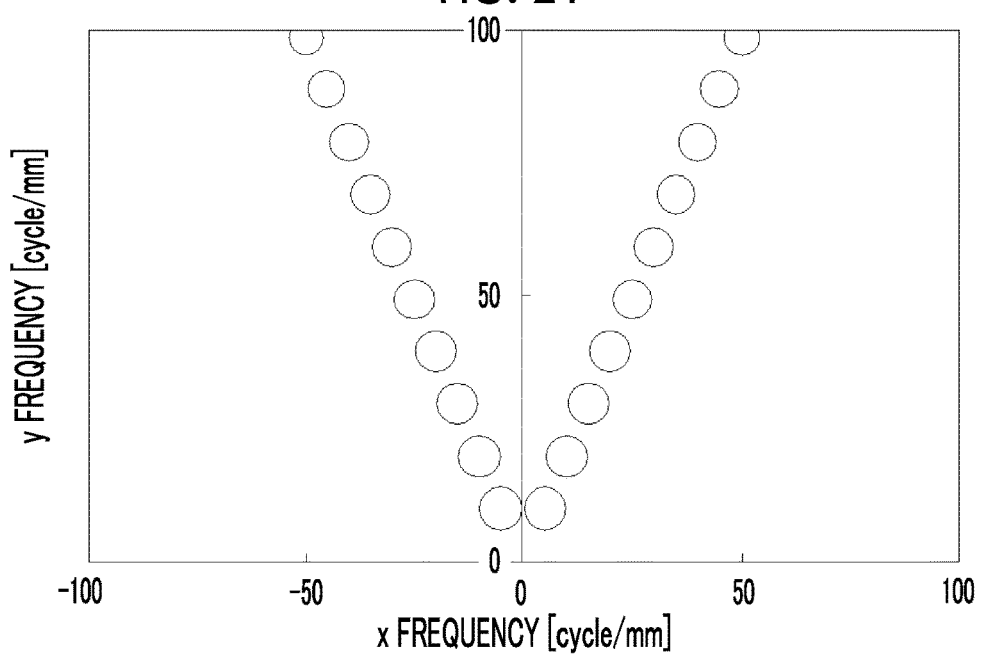
FIG. 21 is a diagram showing a 2-dimensional frequency distribution of the wiring pattern shown in FIG. 19.

FIG. 21 shows each frequency component (2-dimensional frequency distribution) in the 2-dimensional frequency space of the wiring pattern 25d shown in FIG. 19, where the intensity of each frequency component is indicated by an area of a circle. It should be noted that the 2-dimensional frequency distribution of FIG. 21 shows only the first quadrant and the second quadrant. The frequency components in the first quadrant of FIG. 21 represent the frequency components in the straight line wiring 21f in the right direction in FIG. 19, and the frequency components in the second quadrant of FIG. 21 represent the frequency components in the straight line wiring 21g in the left direction in FIG. 19.

Figure 22:
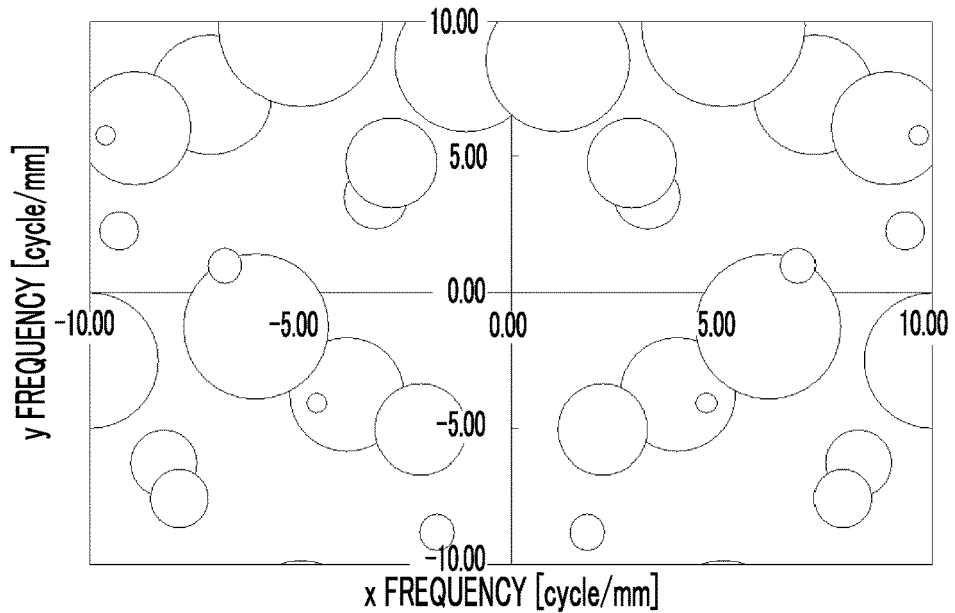
FIG. 22 is a diagram in which moiré components calculated from frequency components of the pixel array pattern shown in FIG. 14 and frequency components of the wiring pattern shown in FIG. 21 are plotted.

FIG. 22 is a diagram in which a multiplication value of each intensity is plotted at the difference frequency obtained by calculating a difference between moiré components, that is, a difference between frequencies, which are calculated from each frequency component of the pixel array pattern shown in FIG. 14 and each frequency component of the wiring pattern 25d shown in FIG. 21. Here, FIG. 22 differs from FIG. 14 and FIG. 21 in the scale range of the x frequency and the y frequency, and also there is a difference in the relationship between the area of the circle of each component and the intensity.

Figure 23:
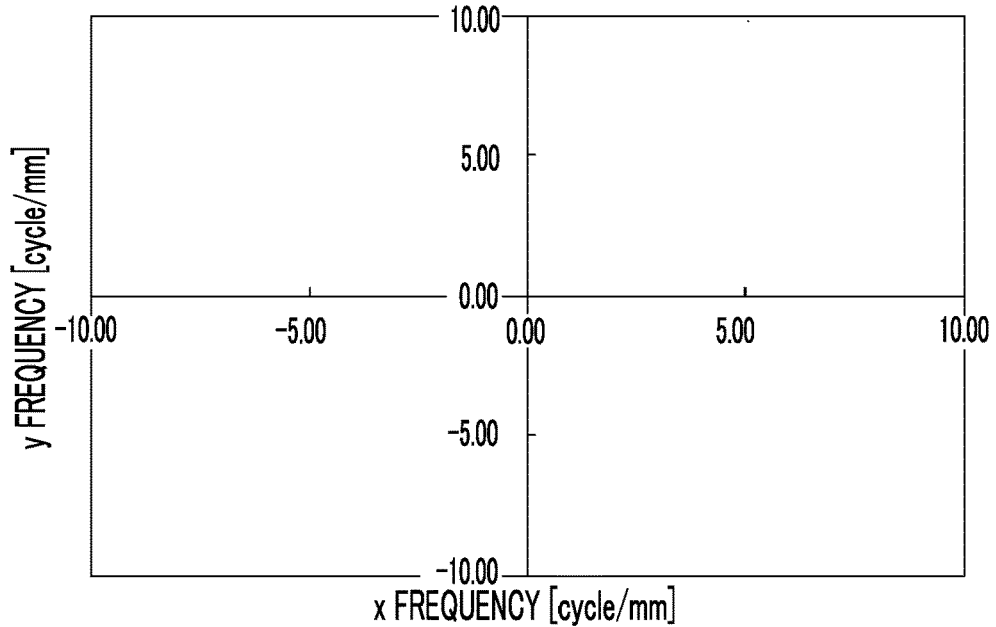
FIG. 23 is a diagram showing a result of multiplying each moiré component shown in FIG. 22 by the sensitivity of the human eye's visual characteristics.

FIG. 23 shows a result of multiplying each moiré component shown in FIG. 22 by the sensitivity of the human eye's visual response characteristics. Here, the intensity indicated by the area of the circle of each component in FIG. 23 is different from that in FIG. 22, and each component is plotted as a circle having a larger area in FIG. 23. For the sensitivity of the human eye's visual response characteristics, Expression (1) given as a visual transfer function VTF is used.

Here, comparing FIG. 23 with FIG. 17, it can be seen that FIG. 23 has less low-frequency moiré visible to the human eye. That is, it can be seen that the wiring pattern 25d shown in FIG. 19 is a wiring pattern in which the wiring angle and wiring pitch are examined such that moiré is reduced.

Figure 24:
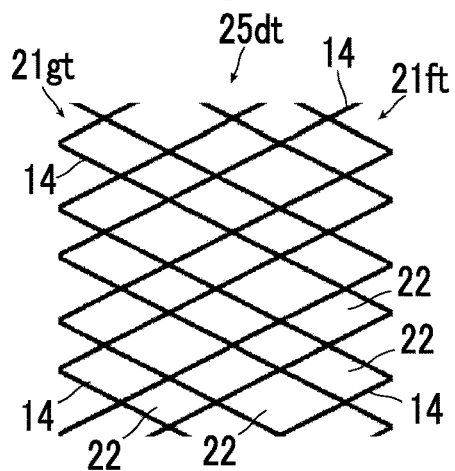
FIG. 24 is a plan view schematically showing a wiring pattern in a case where the equal pitch wiring pattern shown in FIG. 19 is obliquely observed.
Figure 25:
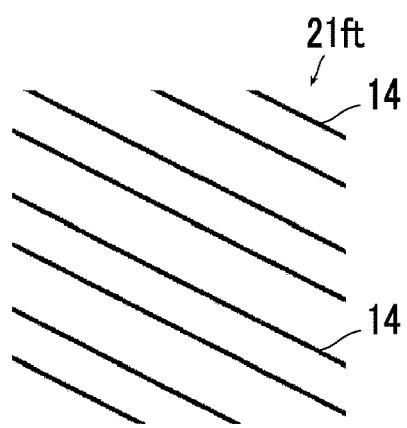
FIG. 25 is a plan view schematically showing a wiring pattern in a straight line wiring of the wiring pattern in one direction shown in FIG. 24.

Next, in the example of the wiring pattern 25d shown in FIG. 19, FIG. 24 schematically show a wiring pattern 25dt in a case where oblique observation is assumed. FIG. 25 shows the straight line wiring 21ft in the right direction (extending in the left direction and arranged in the right direction) of the two directions. It should be noted that only a straight line wiring 21gt in the left direction (extending in the right direction and arranged in the left direction) of the two directions is not shown.

Figure 26:
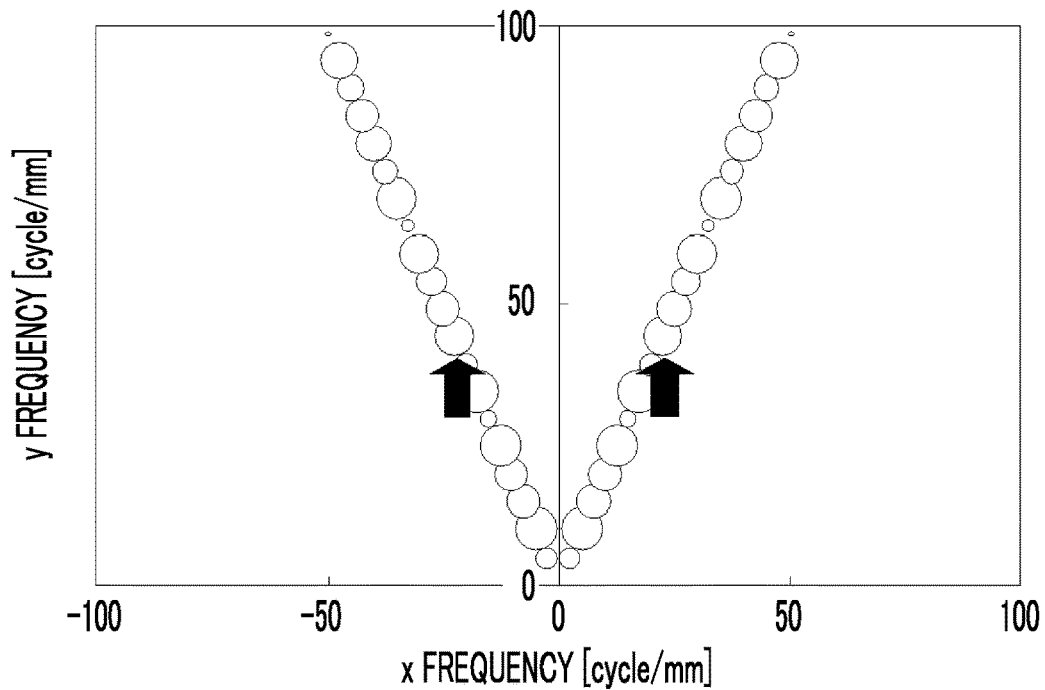
FIG. 26 is a diagram showing a 2-dimensional frequency distribution of the wiring pattern shown in FIG. 24.

FIG. 26 shows each frequency component (2-dimensional frequency distribution) in the 2-dimensional frequency space of the wiring pattern 25d t shown in FIG. 24, where the intensity of each frequency component is indicated by an area of a circle.

Figure 27:
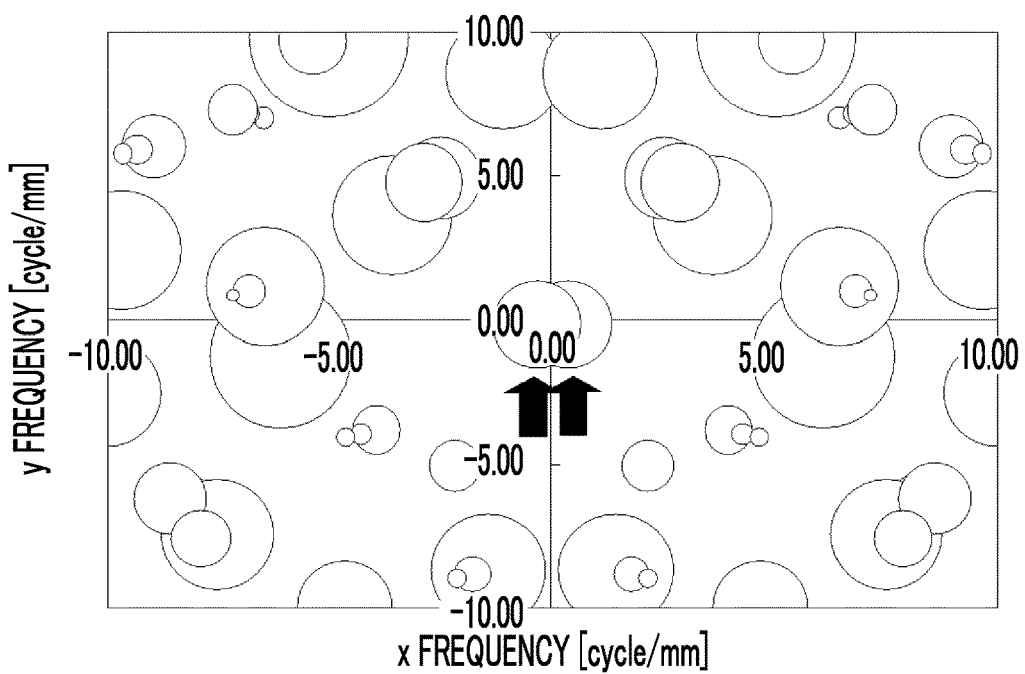
FIG. 27 is a diagram in which moiré components calculated from frequency components of the pixel array pattern shown in FIG. 14 and frequency components of the wiring pattern shown in FIG. 26 are plotted.

FIG. 27 is a diagram in which a multiplication value of each intensity is plotted at the difference frequency obtained by calculating a difference between moiré components, that is, a difference between frequencies, which are calculated from each frequency component of the pixel array pattern shown in FIG. 14 and each frequency component of the wiring pattern 25dt shown in FIG. 26.

Figure 28:
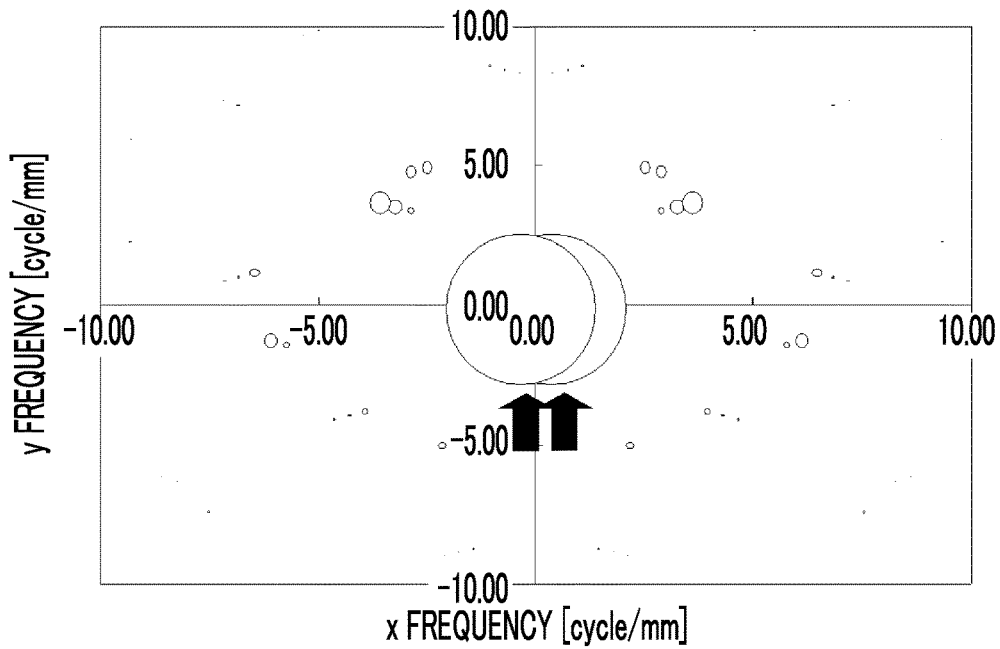
FIG. 28 is a diagram showing a result of multiplying each moiré component shown in FIG. 27 by the sensitivity of the human eye's visual characteristics.

FIG. 28 shows a result obtained by multiplying the moiré components shown in FIG. 27 by Expression (1) given as the visual transfer function VTF as the sensitivity of the human eye's visual response characteristics.

Here, comparing the wiring pattern 25dt shown in FIG. 24 with the wiring pattern 25d shown in FIG. 19, it can be seen that the wiring pitches of the wiring pattern 25dt are set as non-equal pitches. As a result, comparing FIG. 26 with FIG. 21, it can be seen that a large number of frequency components that are not shown in FIG. 21 are generated in FIG. 26. Due to the generation of the large number of frequency components, comparing FIGS. 27 and 28 with FIGS. 22 and 23, respectively, it can be seen that the low frequency moiré component which is not shown in FIGS. 22 and 23 occurs in FIGS. 27 and 28.

In particular, in the frequency distribution of the wiring pattern 25dt shown in FIG. 26, the frequency component indicated by the black arrow closest to the frequency component of the pixel array pattern indicated by the black arrow in FIG. 14 causes the low frequency moiré indicated by the black arrow in FIGS. 27 and 28. That is, the frequency component of the wiring pattern 25dt that causes the moiré shown by the black arrow in FIG. 26 is a frequency component that is not present in FIG. 21.

Next, the reason why the wiring pitches are non-equal to generate a large number of frequency components in oblique observation will be described.

Figure 29:
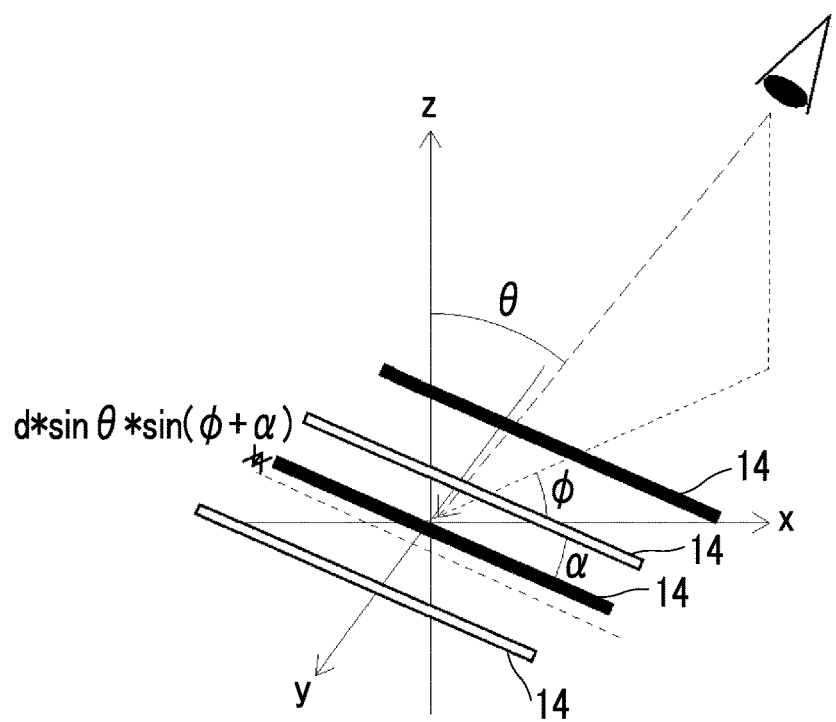
FIG. 29 is a diagram showing a wiring pattern in one direction in a case where the wiring patterns alternately arranged on the upper surface and the lower surface of the transparent substrate are observed in an oblique direction.

A case where the wiring pattern is observed from the θ and φ directions as shown in FIG. 29 is considered. In this example, it is considered that the wirings of the thin metal wires 14 are alternately arranged in two layers of the upper surface and the lower surface of the transparent substrate 12.

Figure 30:
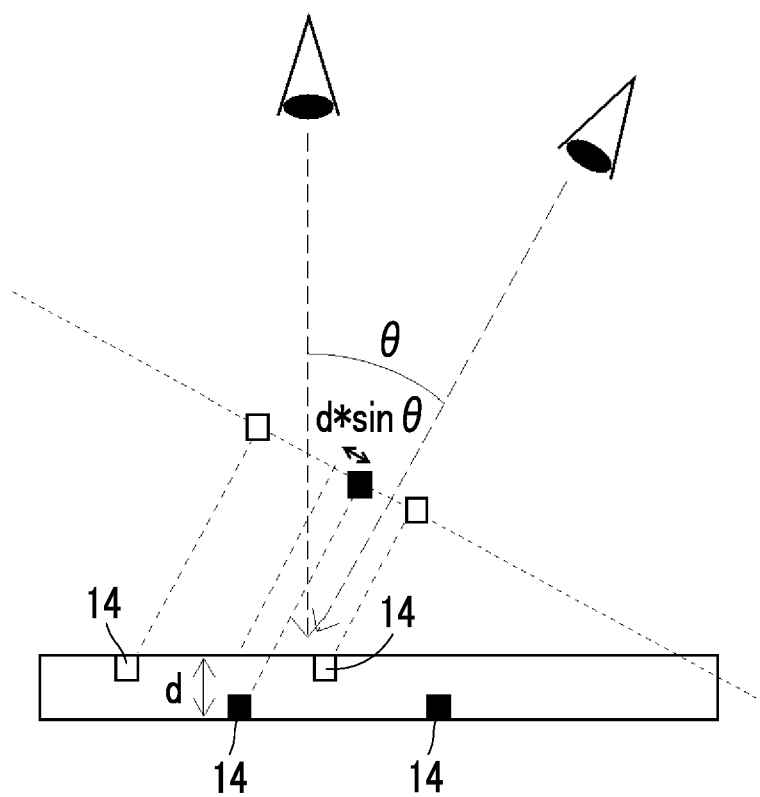
FIG. 30 is an explanatory diagram showing wirings of the wiring pattern shown in FIG. 29 within a plane including the observation direction.

FIG. 30 shows wirings within a plane including the observation direction. As shown in FIG. 30, as observed from the θ direction, it can be seen that the position of the wiring on the lower surface deviates from the wiring on the upper surface by d*sinθ. Here, it can be seen from FIG. 30 that the pitches of the wirings on the upper surface and the lower surface are narrowed by cos θ times as observed from the θ direction, but here, the change in this pitch is ignored. Even in a case where the pitches of the wirings are narrowed as a whole, the frequency distribution of the wiring patterns is broadened as a whole, and a new frequency component is generated. The reason for this is that there is no relationship therebetween.

On the other hand, due to the positional deviation of the wiring on the lower surface, the pitches of the wiring pattern is non-equal pitches and a new frequency component is generated. Thus, it is necessary for the positional deviation to be taken into consideration. As shown in FIG. 29, as the rightward wiring pattern is observed from the θ and φ directions, it can be seen that the pitches of the wiring on the upper surface and the wiring on the lower surface are non-equal pitches, and are increased and decreased by d*sinθ*sin(φ+α). In a case where the wiring pattern is directed to the left, it can be assumed that the pitches are increased and decreased by d*sinθ*sin(φ-α).

Assuming that the thickness t of the substrate is 30 μm, the angle α of the wiring pattern is 27°, the pitch is about 90 μm, and θ and φ in the observation direction are respectively 30° and 90°, d*sinθ*sin(φ+α) is about 13 μm, and the wiring pattern 25*dt* shown in FIG. 24 is obtained. FIGS. 31 to 34 each show a transmittance profile in which straight line wiring in one direction is viewed along the wiring direction (that is, 27° direction), in each of a wiring pattern on the upper surface of the transparent substrate 12, a wiring pattern on the lower surface of the transparent substrate 12, a wiring pattern 25*d* in front observation (refer to FIG. 19), and a wiring pattern 25*dt* n oblique observation (refer to FIG. 24). In the present invention, the upper surface means the upper surface of the transparent substrate 12 and means that the upper surface is on the observation side, and the lower surface means the lower surface of the transparent substrate 12 and means that the lower surface is on the opposite side to the observation side.

Figure 35:
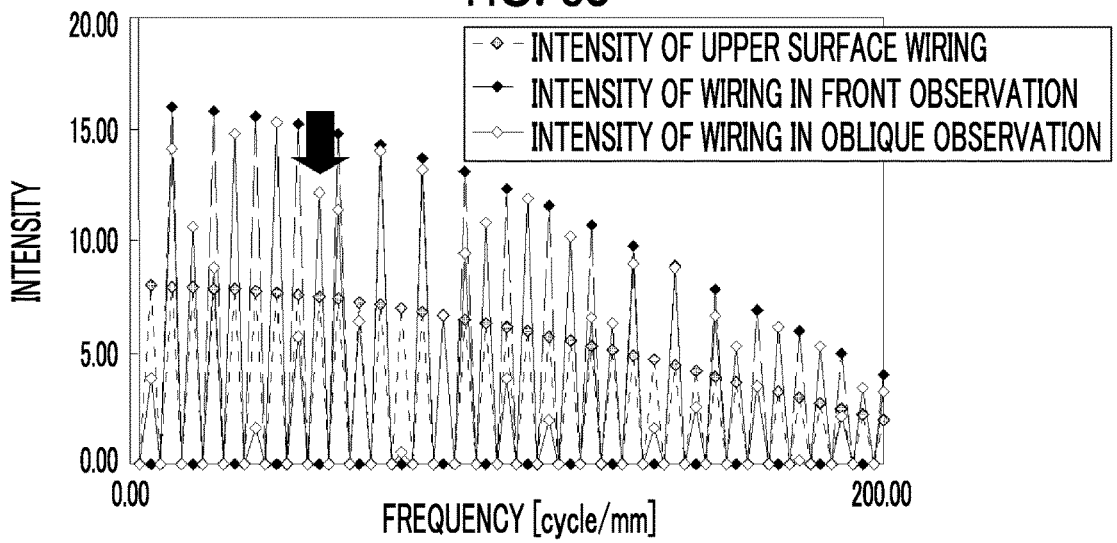
FIG. 35 is a diagram showing the intensity of each frequency component of the upper surface wiring pattern shown in FIG. 31 and the wiring patterns in the front observation shown in FIG. 33 and the oblique observation shown in FIG. 34.
Figure 36:
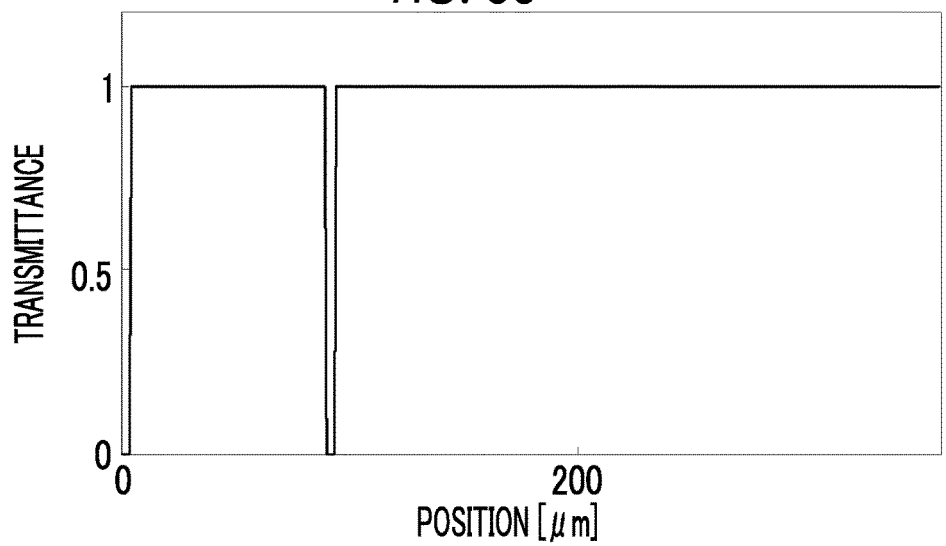
FIG. 36 is a 1-dimensional profile of the transmittance of two wirings of the wiring pattern on the upper surface of the wiring pattern according to the embodiment of the present invention.
Figure 37:
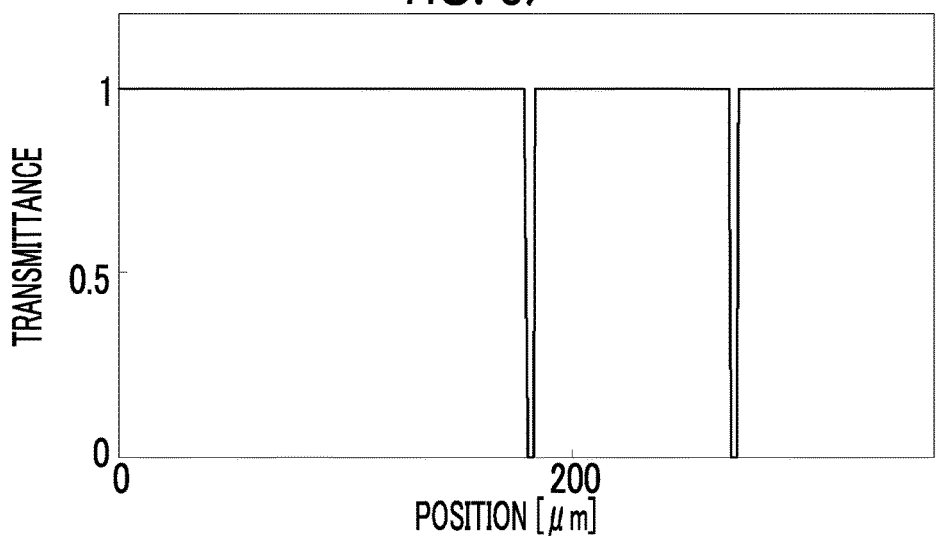
FIG. 37 is a 1-dimensional profile of the transmittance of two wirings of the wiring pattern on the lower surface of the wiring pattern according to the embodiment of the present invention.
Figure 38:
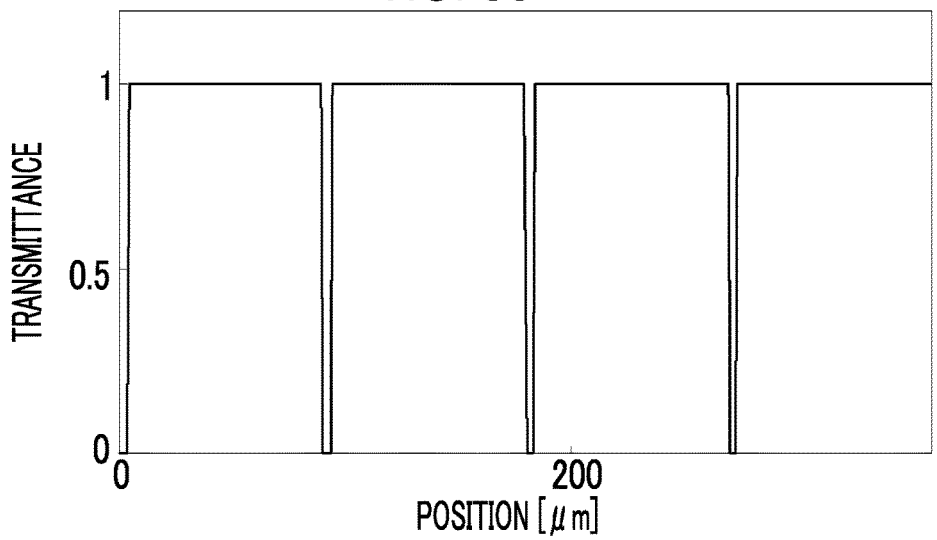
FIG. 38 is a 1-dimensional profile of the transmittance of four wirings of the wiring pattern in front observation of the wiring pattern according to the embodiment of the present invention.

In addition, FIG. 35 shows intensities of frequency components of the transmittance profiles, each of which is obtained by viewing the straight line wiring in one direction along the wiring direction (that is, the 27° direction), in the upper surface wiring pattern and the wiring patterns in front observation and oblique observation. The black arrow shown in FIG. 26 is also shown in FIG. 35. It should be noted that, in FIG. 35, the intensity of each frequency component of the transmittance profile viewed along the wiring direction of the straight line wiring in one direction in the lower surface wiring pattern is the same as the intensity of each frequency component in the upper surface wiring pattern, and is thus not shown in the drawing.

From FIG. 31 to FIG. 35, the pitches of the wiring pattern on the upper surface and the wiring pattern on the lower surface are twice as long as the pitch of the wiring pattern 25*d* in front observation. Therefore, in a case where the minimum frequency thereof is as small as ½, it can be seen that all the pitches are integer multiples of the minimum frequency and there are a large number of frequency components (that is, odd-numbered frequency components) that are not included in the wiring pattern 25*d* in front observation. Conversely, although the wiring pattern on the upper surface and the wiring pattern on the lower surface have a large number of frequency components, in the wiring pattern 25*d* in front observation in which the respective wiring patterns are alternately overlapped so as to have an equal pitch, it can be seen that (odd-numbered) frequency components cancel each other out (the even-numbered frequency components strengthen each other), and are reduced to ½.

Then, the wiring pattern 25*dt* in oblique observation is a wiring pattern in which the wiring pattern on the upper surface and the wiring pattern on the lower surface are shifted and overlapped so as to have non-equal pitches. Therefore, it can be seen that the odd-numbered frequency components of the wiring pattern on the upper surface and the wiring pattern on the lower surface do not completely cancel each other out and remain and include a large number of frequency components similarly to the wiring pattern on the upper surface and the wiring pattern on the lower surface. As a result, as indicated by the black arrow in FIG. 35, it can be seen that moiré occurs due to the frequency components that are canceled in front observation but are not canceled in oblique observation.

In addition, the description ranging from FIG. 29 to the subsequent "Summary of Characteristics of Wiring Patterns according to Embodiment of the Present Invention" is limited only to an example in which the number of wiring layers is two (an example in which the wiring is disposed on the upper surface and the lower surface of the transparent substrate) for easy understanding. However, the principle described herein does not depend on the number of wiring layers. This will be mentioned again later.

(Principle of Moiré Reduction by Wiring Pattern according to Embodiment of the Present Invention and Example Thereof)

As described with reference to FIGS. 29 and 30, in a case where the wiring pattern is observed in the oblique θ and φ directions, the position of the wiring on the lower surface with respect to the wiring on the upper surface deviates by d*sinθ*sin(φ+α). Here, the derivation of Expression of d*sinθ*sin(φ+α) is not precise, but what is important is that the position of the wiring on the lower surface deviates from the wiring on the upper surface in oblique observation. Depending on the θ and φ directions, the positions deviate in various directions by various amounts. Due to the deviation, a large number of frequency components are generated in the overlapped wiring patterns, and moiré occurs. In order to restrain occurrence of moiré due to the overlapped wiring patterns even in a case where the wiring on the lower surface deviates from the wiring on the upper surface by various amounts in various directions, the inventor thought that each of the wiring pattern on the upper surface and the wiring pattern on the lower surface before overlap should be a wiring pattern having less moiré.

Figure 31:
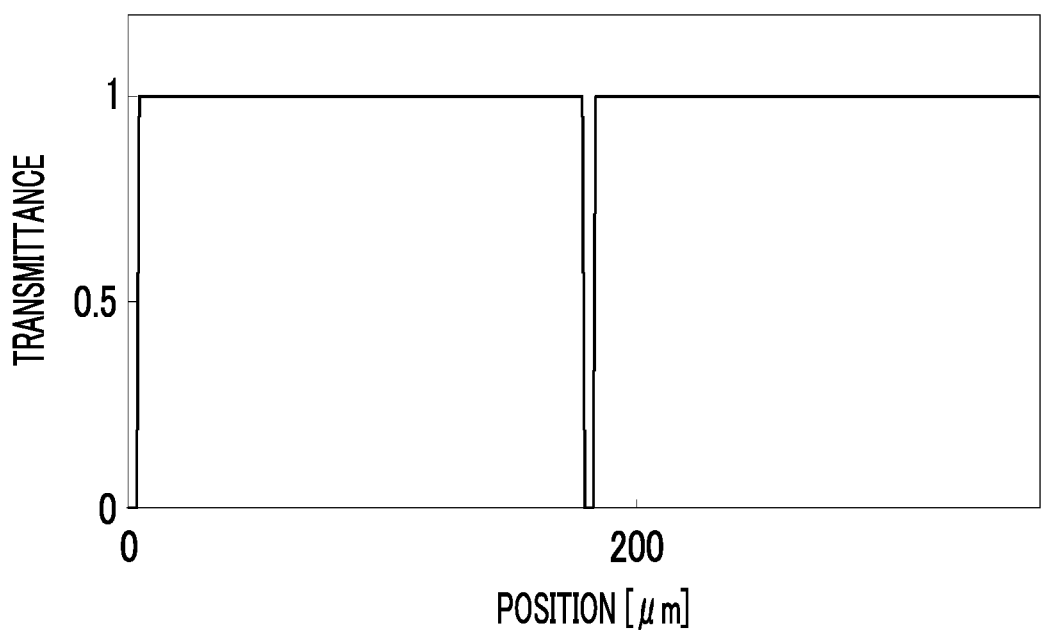
FIG. 31 is a 1-dimensional profile of the transmittance of two wirings of the wiring pattern on the upper surface of the wiring pattern shown in FIG. 19.
Figure 32:
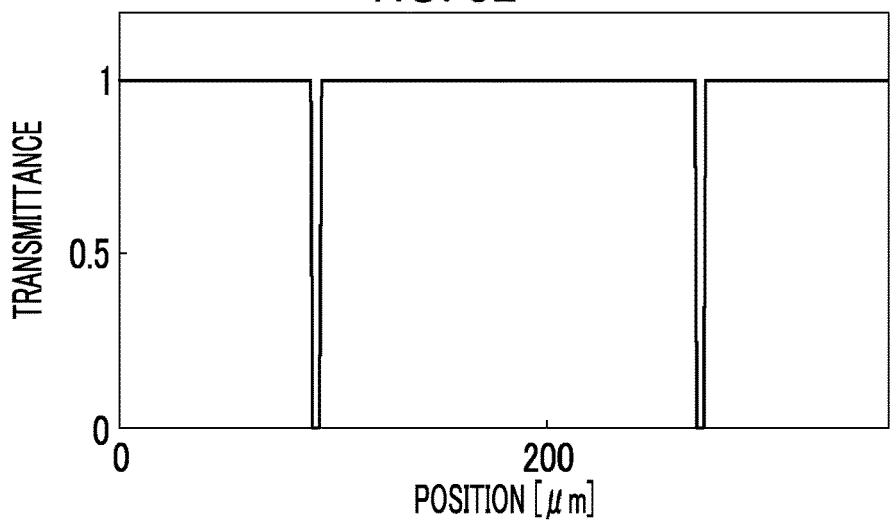
FIG. 32 is a 1-dimensional profile of the transmittance of two wirings of the wiring pattern on the lower surface of the wiring pattern shown in FIG. 19.
Figure 33:
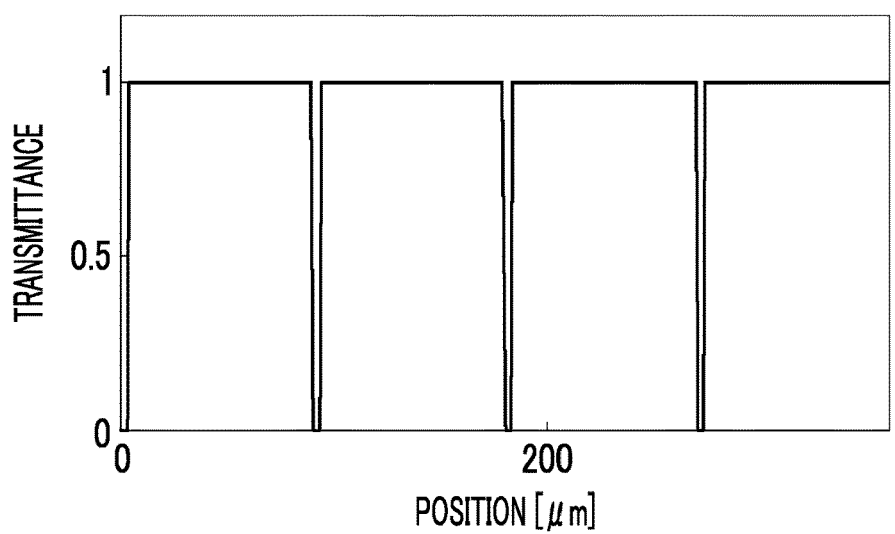
FIG. 33 is a 1-dimensional profile of the transmittance of four wirings of the wiring pattern in front observation shown in FIG. 19.
Figure 34:
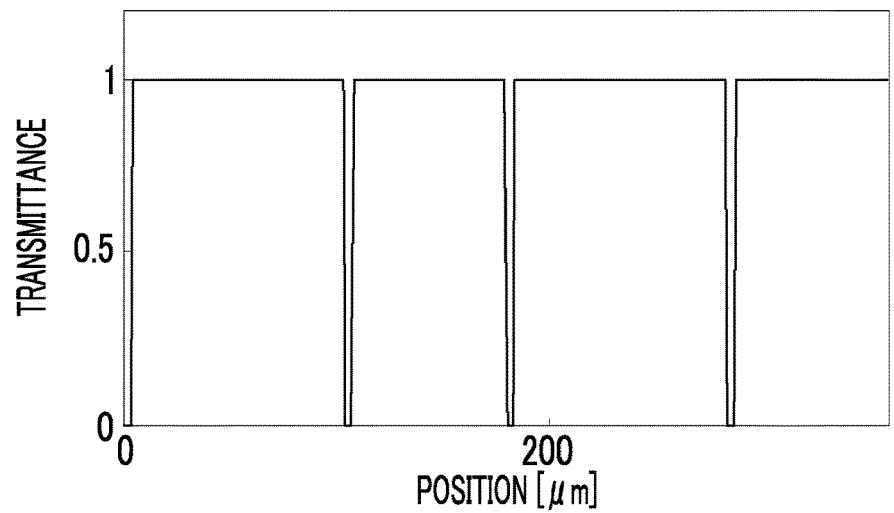
FIG. 34 is a 1-dimensional profile of the transmittance of four wirings in the wiring pattern in oblique observation shown in FIG. 24.

In addition, the wiring pattern on the upper surface and the wiring pattern on the lower surface of the wiring pattern according to the embodiment of the present invention are not equal pitch patterns alternately arranged as shown in FIGS. 31 and 32. However, it has been noticed that the patterns are non-equal pitch patterns including wirings consecutive on the upper surface and the lower surface, that is, wiring patterns each including equal pitch as at least a part of the overlapped wiring pattern.

FIGS. 36 to 39 show examples of such a wiring pattern according to the embodiment of the present invention. FIGS. 36 to 39 each show a transmittance profile in which straight line wiring in one direction is viewed along the wiring direction, in each of a wiring pattern on the upper surface of the wiring pattern according to the embodiment of the present invention, a wiring pattern on the lower surface, a wiring pattern in front observation, and a wiring pattern in oblique observation. In addition, FIG. 40 shows intensities of frequency components of the transmittance profiles, each of which is obtained by viewing the straight line wiring in one direction along the wiring direction, in the upper surface wiring pattern and the wiring patterns in front observation and oblique observation. It should be noted that, in FIG. 40, the intensity of each frequency component of the transmittance profile viewed along the wiring direction of the straight line wiring in one direction in the lower surface wiring pattern is the same as the intensity of each frequency component in the upper surface wiring pattern, and is thus not shown in the drawing.

It can be seen that the intensity of the frequency component indicated by the black arrow, which causes moiré in the frequency distribution of the wiring pattern on the upper surface (or the lower surface) shown in FIG. 40, is smaller than that in FIG. 35. As a result, it can be seen that the intensity of the frequency component of the black arrow is also small in the obliquely observed wiring pattern in which the wiring pattern on the upper surface and the wiring pattern on the lower surface are shifted and overlapped. In the examples shown in FIGS. 31 to 35 and 36 to 40, the front observed wiring patterns (shown in FIGS. 33 and 38) are the same, and the wiring patterns have less moiré.

However, in FIG. 35, the frequency distributions of the front observed wiring pattern and the wiring pattern on the upper surface (or the lower surface) are largely different, and the wiring pattern on the upper surface (or the lower surface) has a large intensity of the frequency component of the black arrow. As a result, the frequency distribution of the obliquely observed wiring pattern in which the wiring pattern on the upper surface and the wiring pattern on the lower surface are shifted and overlapped is significantly different from the frequency distribution of the front observed wiring pattern. In addition, moiré (moiré due to the frequency component of the black arrow), which did not occur in the front observed wiring pattern, occur in the obliquely observed wiring pattern.

On the other hand, in FIG. 40, the frequency distribution of the front observed wiring pattern is close to that of the wiring pattern on the upper surface (or the lower surface), and the wiring pattern on the upper surface (or the lower surface) has a small intensity of the frequency component of the black arrow. As a result, the obliquely observed wiring pattern, in which the wiring pattern on the upper surface and the wiring pattern on the lower surface are shifted and overlapped, is close to the frequency distribution of the front observed wiring pattern. In addition, the intensity of the frequency component of the black arrow is small, and moiré can be reduced as in front observation even in oblique observation.

In FIG. 35, the front observed wiring pattern is a wiring pattern having less moiré, but the wiring pattern on the upper surface (or lower surface) has a significantly different frequency distribution from the front observed wiring pattern, and is a wiring pattern that causes moiré. On the other hand, in FIG. 40, the wiring pattern on the upper surface (or the lower surface) has a frequency distribution similar to that of the front observed wiring pattern, and is a wiring pattern having less moiré as in front observation.

In summary, in a case where a wiring pattern is formed of a part of the wiring patterns on the upper surface and the lower surface such that the pitch is the same as the front observed wiring pattern, the frequency distribution of the wiring patterns on the upper surface and the lower surface and the obliquely observed wiring pattern, in which the wiring patterns on the upper surface and the lower surface are shifted and overlapped by various amounts in various directions, can be made close to the frequency distribution in front observation. In addition, moiré can be reduced in terms of the upper surface, the lower surface, and the oblique observation, similarly to the front observation.

Figure 39:
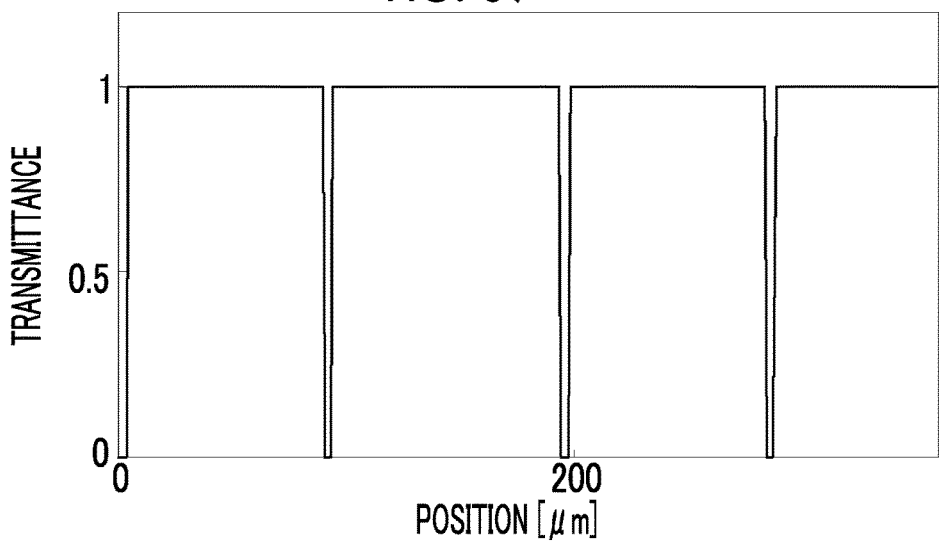
FIG. 39 is a 1-dimensional profile of the transmittance of four wirings of the wiring pattern in oblique observation of the wiring pattern according to the embodiment of the present invention.
Figure 40:
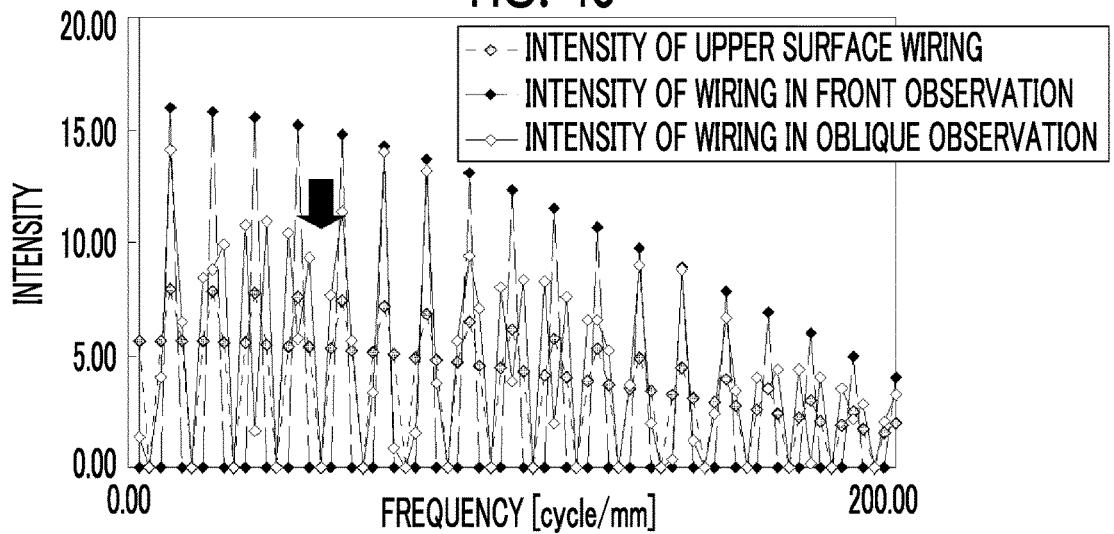
FIG. 40 is a diagram showing the intensity of each frequency component of the upper surface wiring pattern shown in FIG. 36 and the wiring patterns in the front observation shown in FIG. 38 and the oblique observation shown in FIG. 39.
Figure 41:
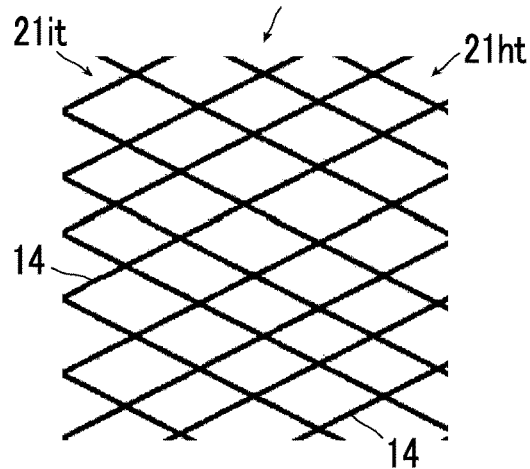
FIG. 41 is a plan view schematically showing a wiring pattern having the transmittance profile shown in FIG. 39.
Figure 42:
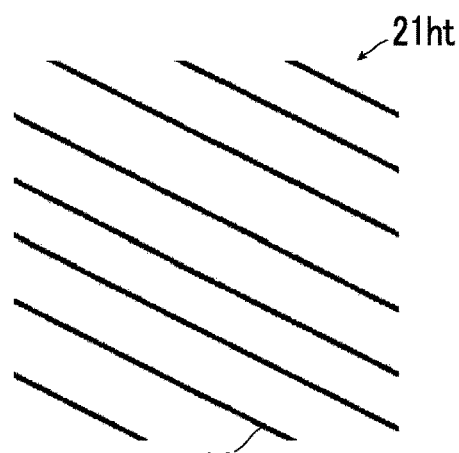
FIG. 42 is a plan view schematically showing a wiring pattern in a straight line wiring of the wiring pattern in one direction shown in FIG. 41.

FIG. 41 shows a wiring pattern 25et in oblique observation having the transmittance profile shown in FIG. 39 in the straight line wiring in one direction. FIG. 42 shows a straight line wiring 21h t (extending in the left direction and arranged in the right direction) in the right direction of the two directions of the wiring pattern 25et in oblique observation. It should be noted that only a straight line wiring 21it in the left direction (extending in the right direction and arranged in the left direction) of the two directions is not shown. Further, as long as the wiring on the upper surface and the wiring on the lower surface are not distinguished, the wiring pattern in front observation is the same as the wiring pattern 25d shown in FIG. 19, and is thus not shown in the drawing.

Figure 43:
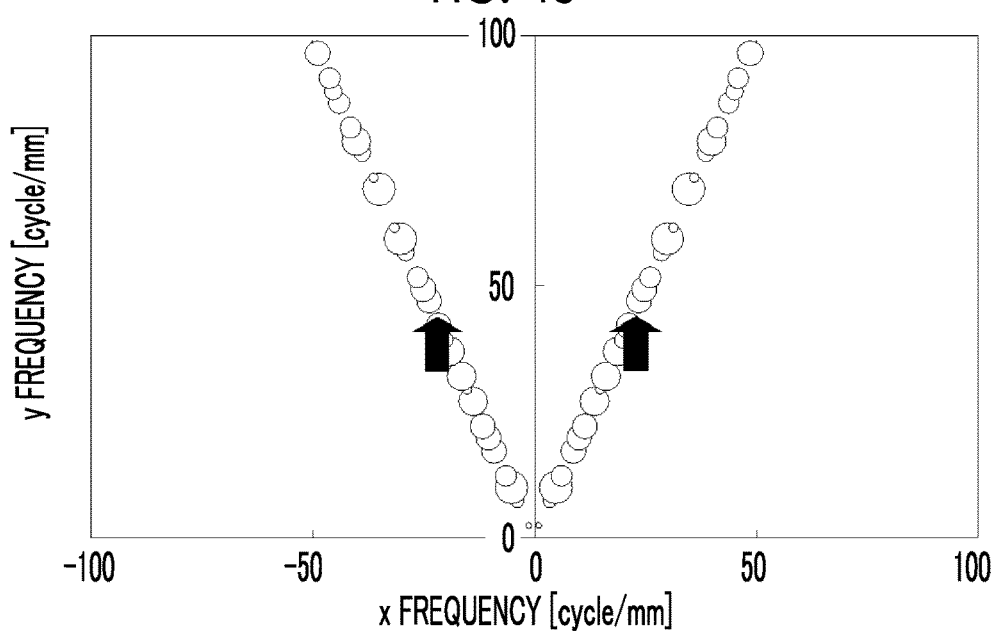
FIG. 43 is a diagram showing a 2-dimensional frequency distribution of the wiring pattern shown in FIG. 41.

FIG. 43 shows each frequency component (2-dimensional frequency distribution) in the 2-dimensional frequency space of the wiring pattern 25et shown in FIG. 41, where the intensity of each frequency component is indicated by an area of a circle.

Figure 44:
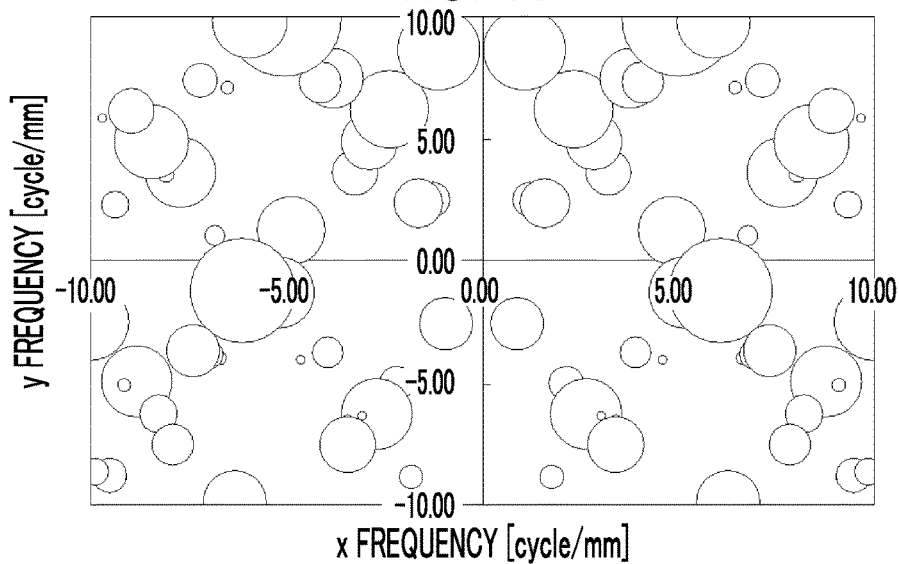
FIG. 44 is a diagram in which moiré components calculated from frequency components of the pixel array pattern shown in FIG. 14 and frequency components of the wiring pattern shown in FIG. 43 are plotted.

FIG. 44 is a diagram in which a multiplication value of each intensity is plotted at the difference frequency obtained by calculating a difference between moiré components, that is, a difference between frequencies, which are calculated from each frequency component of the pixel array pattern shown in FIG. 14 and each frequency component of the wiring pattern 25et shown in FIG. 43.

Figure 45:
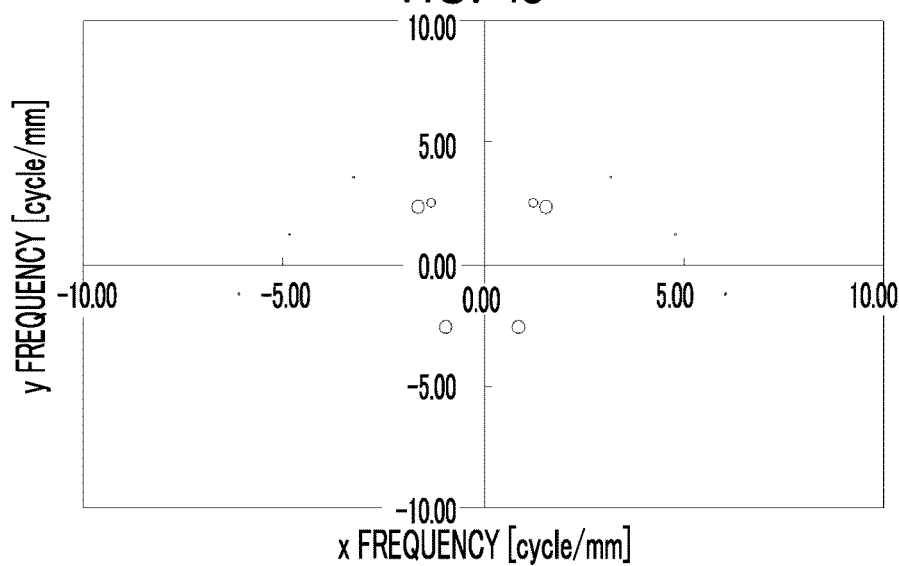
FIG. 45 is a diagram showing a result of multiplying each moiré component shown in FIG. 44 by the sensitivity of the human eye's visual characteristics.

FIG. 45 shows a result obtained by multiplying the moiré components shown in FIG. 44 by Expression (1) given as the visual transfer function VTF as the sensitivity of the human eye's visual response characteristics.

It can be seen that the moiré components shown in FIGS. 44 and 45 have less moiré than the moiré components shown in FIGS. 27 and 28.

The present inventor found the following fact. The moiré can be further reduced by the configuration in which "the repetitive pitches of the predetermined number of wirings are set as equal pitches and the respective pitches of the predetermined number of wirings are set as non-equal pitches". The principle will be described in the next section. Even in such a wiring pattern, moiré can be reduced in a manner similar to the upper surface, the lower surface, the oblique observation, and the front observation by forming the wiring pattern such that a part of the wiring patterns on the upper surface and the lower surface have equal pitch as the front observed wiring pattern.

Examples of such a wiring pattern are first described in FIGS. 2 to 4B, and include the non-equal pitch wiring pattern 25a in front observation which has already been described in detail.

Figure 46:
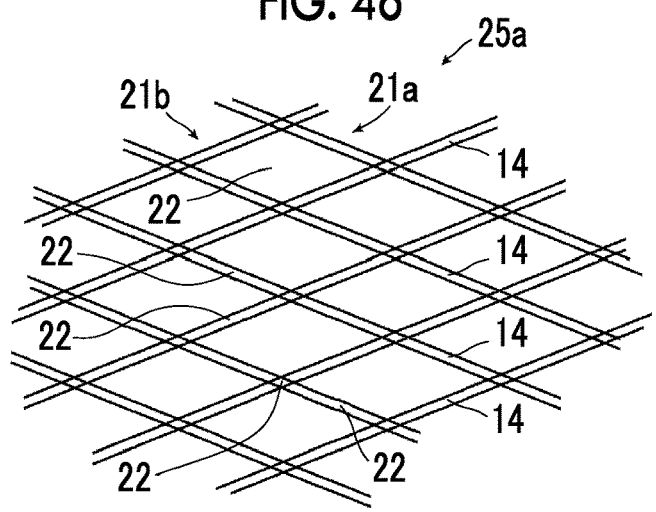
FIG. 46 is a plan view schematically showing a non-equal pitch wiring pattern in front observation of the wiring pattern shown in FIG. 2.
Figure 47:
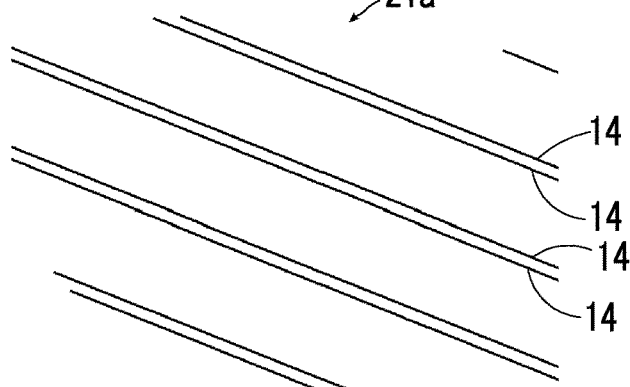
FIG. 47 is a plan view schematically showing a wiring pattern in a straight line wiring of the wiring pattern in one direction shown in FIG. 46.

Here, FIG. 46 shows the non-equal pitch wiring pattern 25a in front observation, where the upper surface and the lower surface of the transparent substrate 12 are not distinguished and both are indicated by the solid lines. The non-equal pitch wiring pattern 25a in front observation shown in FIG. 46 is a non-equal pitch wiring pattern having an angle of 22°, an average pitch of about 76 μm, and a predetermined number of four (thus, the repetitive pitch is about 304 μm (4*76 μm)). FIG. 47 shows the straight line wiring 21a in the right direction of the wiring pattern 25a shown in FIG. 46.

Figure 48:
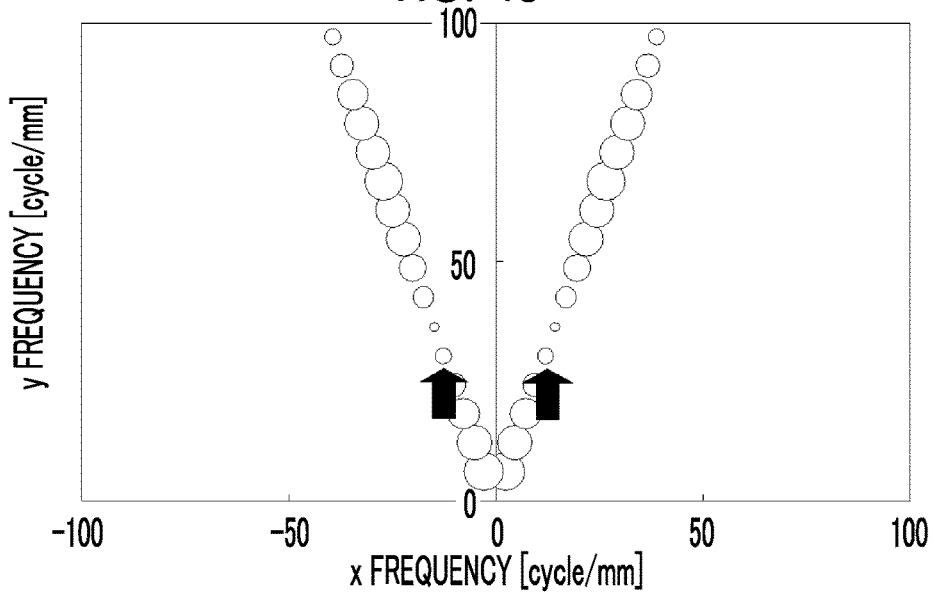
FIG. 48 is a diagram showing a 2-dimensional frequency distribution of the wiring pattern shown in FIG. 46.
Figure 49:
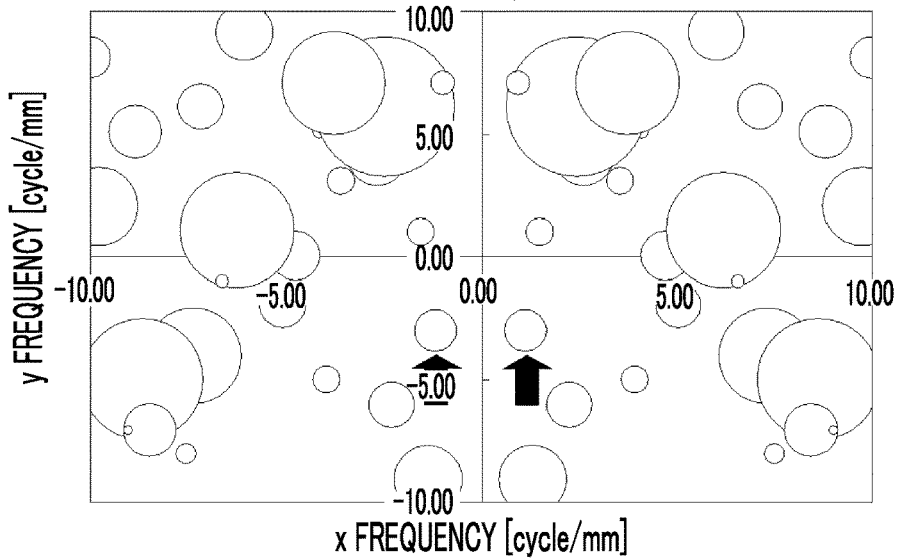
FIG. 49 is a diagram in which moiré components calculated from frequency components of the pixel array pattern shown in FIG. 14 and frequency components of the wiring pattern shown in FIG. 48 are plotted.
Figure 50:
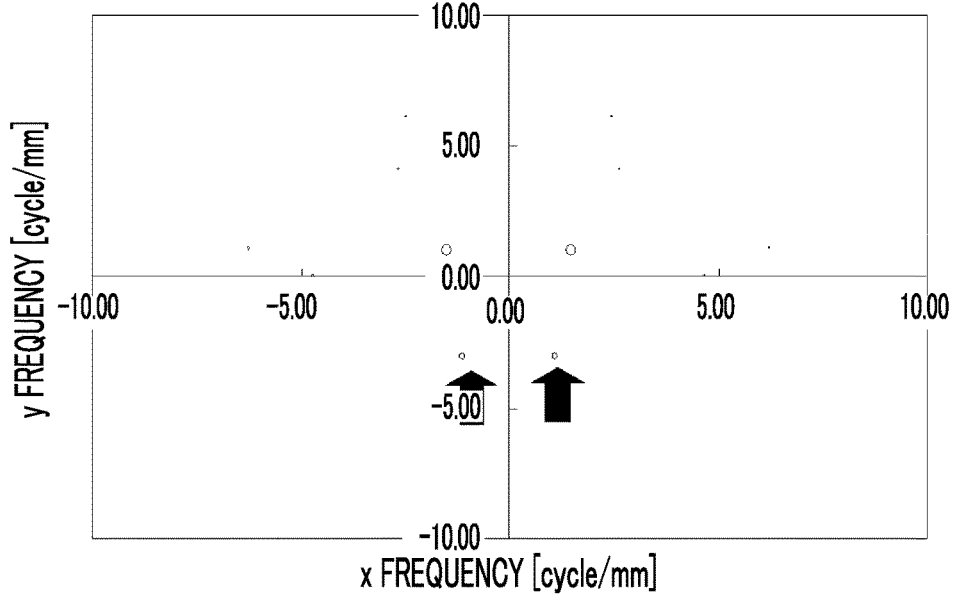
FIG. 50 is a diagram showing a result of multiplying each moiré component shown in FIG. 49 by the sensitivity of the human eye's visual characteristics.

Further, FIG. 48 shows a 2-dimensional frequency distribution of the wiring pattern 25a in front observation shown in FIG. 46. FIG. 49 shows moiré components of the pixel array pattern shown in FIG. 14 and the wiring pattern 25a shown in FIG. 48. FIG. 50 shows the result of multiplying each moiré component shown in FIG. 49 by the visual transfer function VTF of Expression (1) and applying the human eye's visual response characteristics.

Here, from the comparison between the moiré components shown in FIGS. 49 and 50 and FIGS. 16 and 17, it can be seen that the wiring pattern 25*a* shown in FIG. 46 is able to reduce the moiré compared to the wiring pattern 25*c* shown in FIG. 12.

Figure 51:
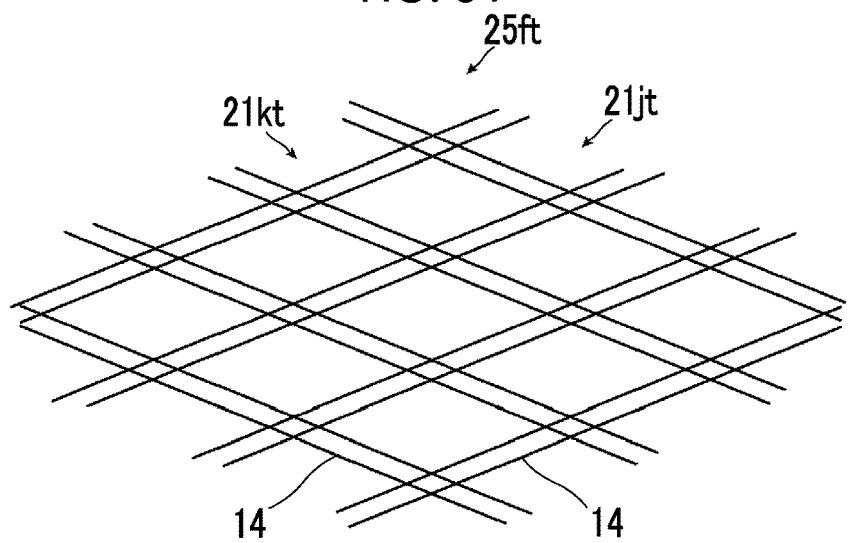
FIG. 51 is a plan view schematically showing wiring patterns in oblique observation of the wiring patterns, which have non-equal pitch wiring patterns in front observation shown in FIG. 46 and in which wirings on upper and lower surfaces are alternately arranged.
Figure 52:
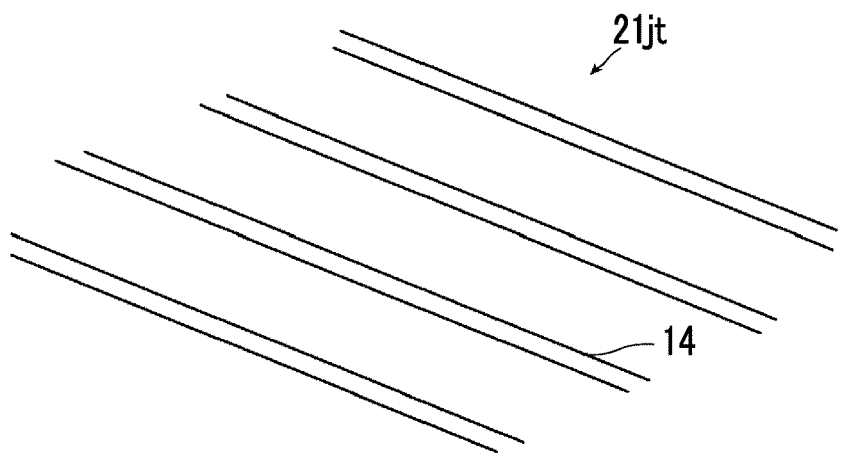
FIG. 52 is a plan view schematically showing a wiring pattern in a straight line wiring of the wiring pattern in one direction shown in FIG. 51.

Next, regarding the wiring pattern having the same wiring pattern in front observation as the wiring pattern 25*a* shown in FIG. 46, FIG. 51 shows the wiring pattern 25*ft* in oblique observation assumed as oblique observation in a case where the wiring on the upper surface and the wiring on the lower surface are alternately arranged. FIG. 52 shows a straight line wiring 21*jt* in the right direction (extending in the left direction and arranged in the right direction) of the two directions of the wiring pattern 25*ft* in oblique observation. It should be noted that only a straight line wiring 21*kt* in the left direction (extending in the right direction and arranged in the left direction) of the two directions is not shown.

Figure 53:
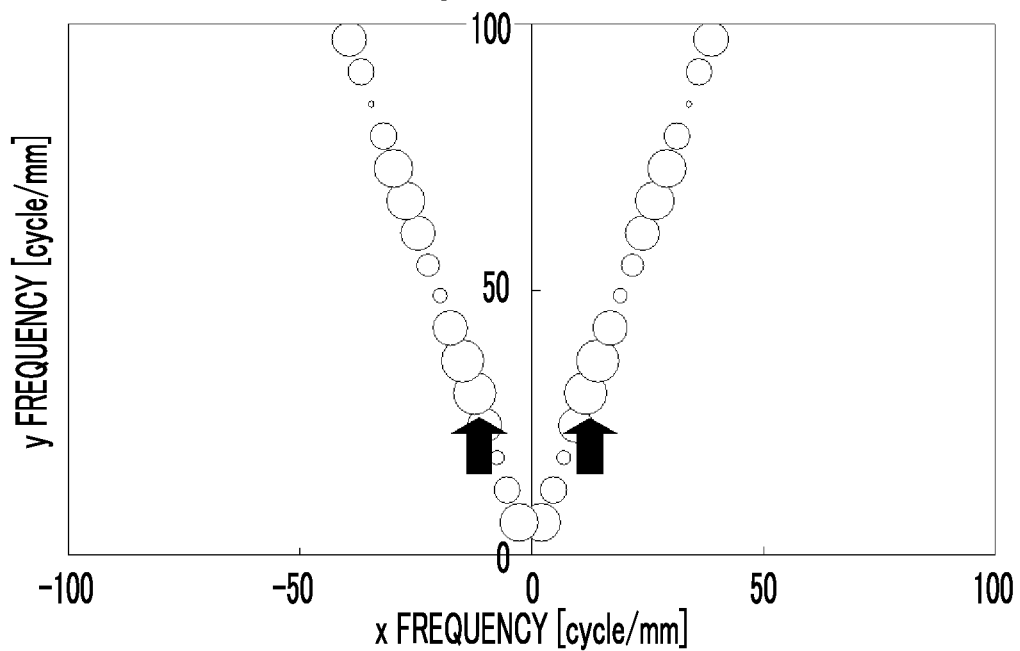
FIG. 53 is a diagram showing a 2-dimensional frequency distribution of the wiring pattern shown in FIG. 51.
Figure 54:
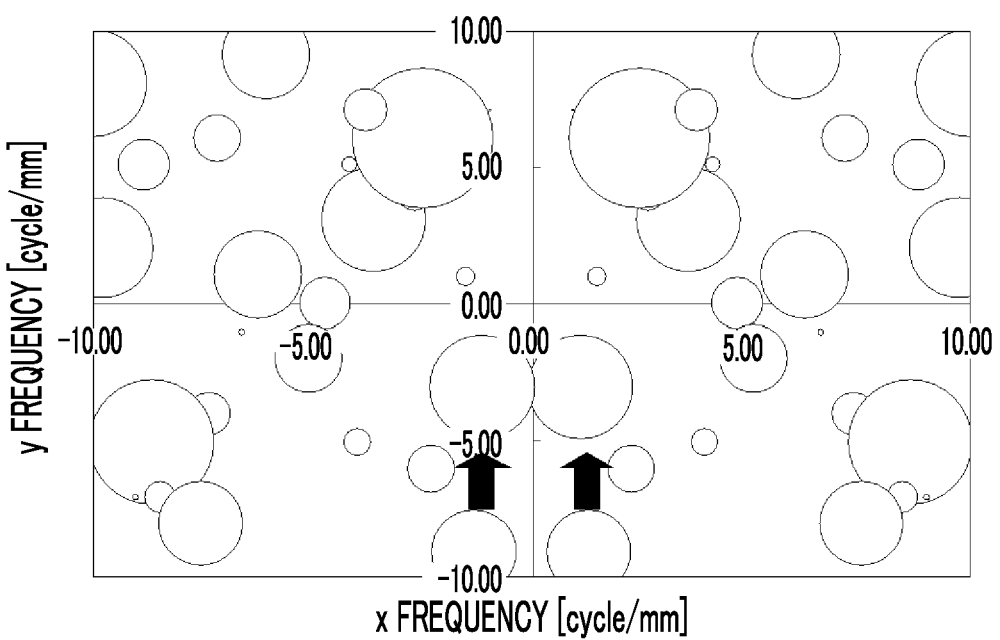
FIG. 54 is a diagram in which moiré components calculated from frequency components of the pixel array pattern shown in FIG. 14 and frequency components of the wiring pattern shown in FIG. 53 are plotted.
Figure 55:
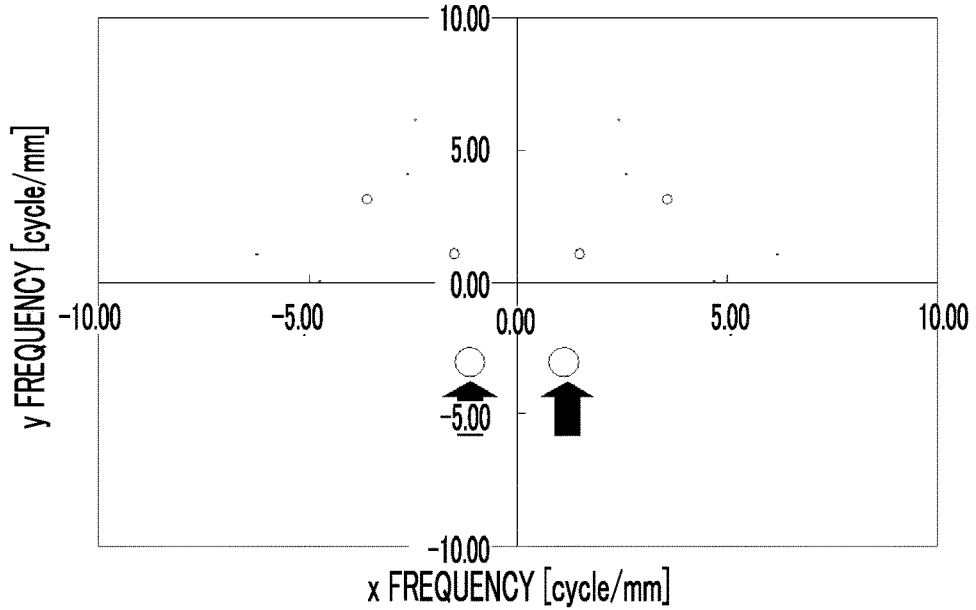
FIG. 55 is a diagram showing a result of multiplying each moiré component shown in FIG. 54 by the sensitivity of the human eye's visual characteristics.

Further, FIG. 53 shows a 2-dimensional frequency distribution of the wiring pattern 25*ft* in oblique observation shown in FIG. 51. FIG. 54 shows moiré components of the pixel array pattern shown in FIG. 14 and the wiring pattern 25*ft* shown in FIG. 53. FIG. 55 shows the result of multiplying each moiré component shown in FIG. 54 by the visual transfer function VTF of Expression (1) and applying the human eye's visual response characteristics.

It can be seen that the 2-dimensional frequency distribution of the wiring pattern 25*ft* in oblique observation shown in FIG. 53 is significantly different from the 2-dimensional frequency distribution of the wiring pattern 25*a* in front observation shown in FIG. 48. In addition, regarding the moiré component in front observation shown in FIGS. 49 and 50, it can be seen that the intensity of the moiré component in oblique observation is high as shown in FIGS. 54 and 55.

Figure 56:
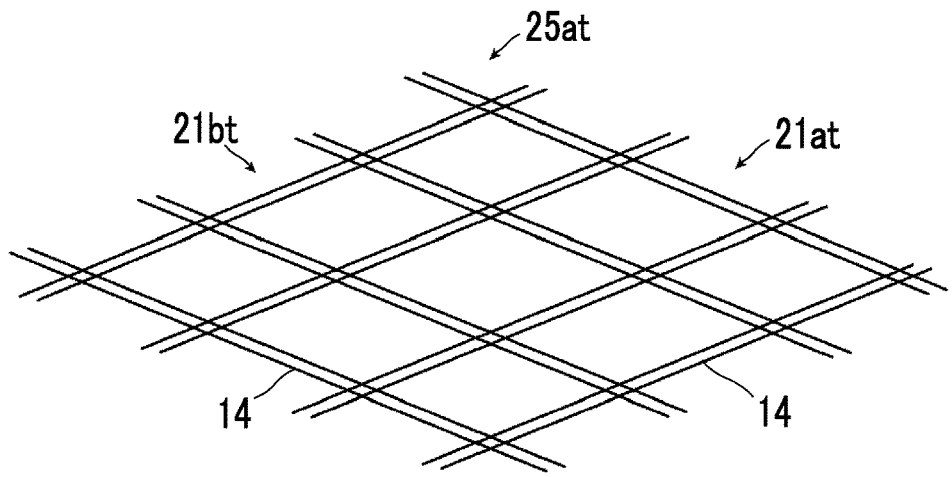
FIG. 56 is a plan view schematically showing wiring patterns in oblique observation of the wiring patterns, which have non-equal pitch wiring patterns in front observation shown in FIG. 46 and each of which has two wirings on upper and lower surfaces consecutively arranged.
Figure 57:
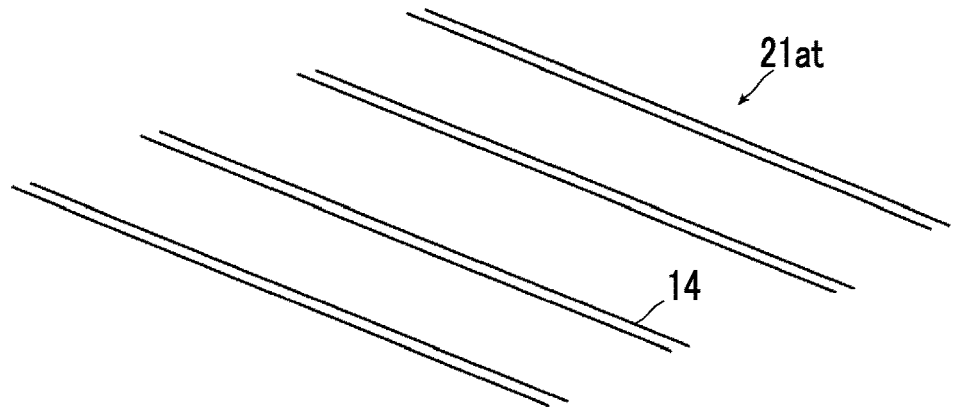
FIG. 57 is a plan view schematically showing a wiring pattern in a straight line wiring of the wiring pattern in one direction shown in FIG. 56.

Next, regarding the wiring pattern having the same wiring pattern in front observation as the wiring pattern 25*a* shown in FIG. 46, FIG. 56 shows the wiring pattern 25*at* in oblique observation assumed as oblique observation in a case where two wirings are consecutively arranged in each of the straight line wirings on the upper surface and the lower surface. Further, FIG. 57 shows the straight line wiring 21*at* in the right direction (extending in the left direction and arranged in the right direction) of the two directions of the wiring pattern 25*at* in oblique observation. It should be noted that only a straight line wiring 21*bt* in the left direction (extending in the right direction and arranged in the left direction) of the two directions is not shown.

Figure 58:
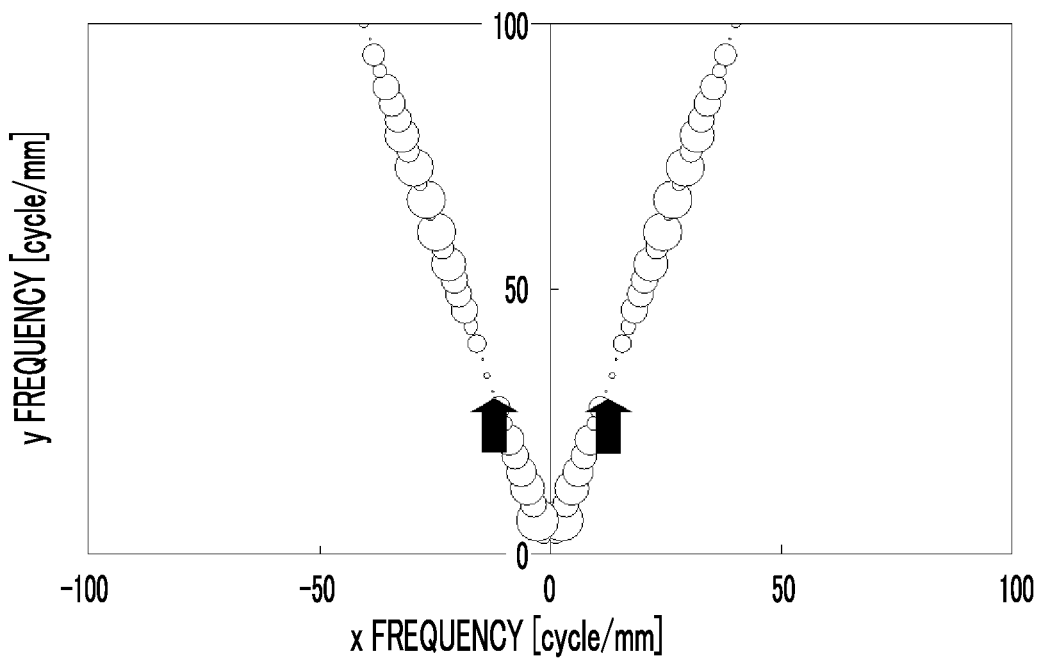
FIG. 58 is a diagram showing a 2-dimensional frequency distribution of the wiring pattern shown in FIG. 56.
Figure 59:
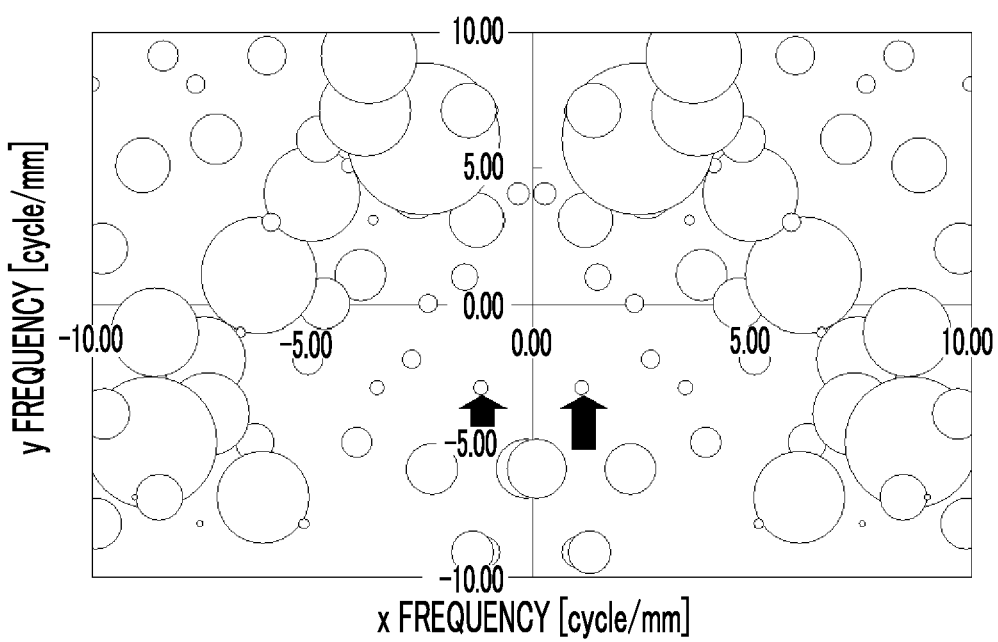
FIG. 59 is a diagram in which moiré components calculated from frequency components of the pixel array pattern shown in FIG. 14 and frequency components of the wiring pattern shown in FIG. 58 are plotted.
Figure 60:
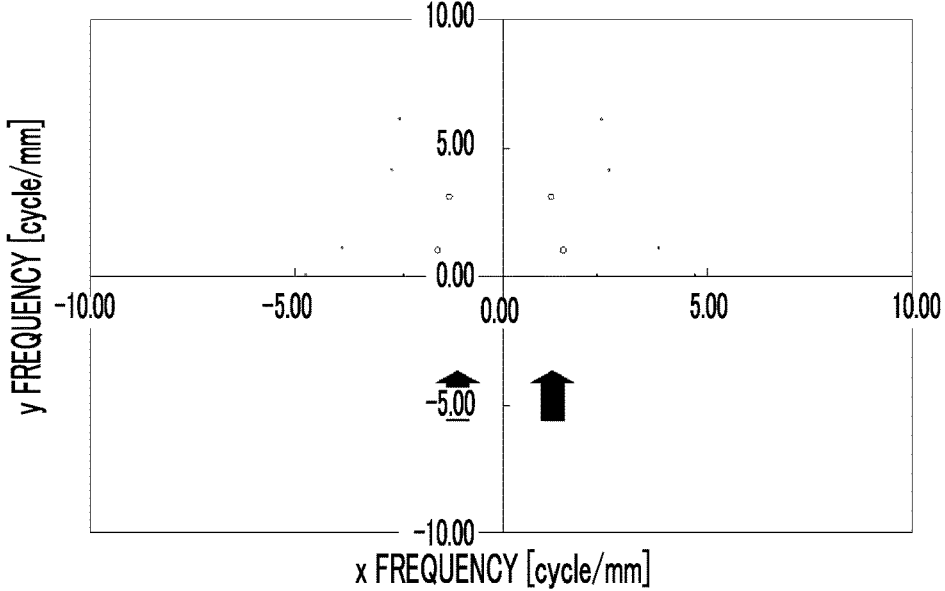
FIG. 60 is a diagram showing a result of multiplying each moiré component shown in FIG. 59 by the sensitivity of the human eye's visual characteristics.
Figure 61:
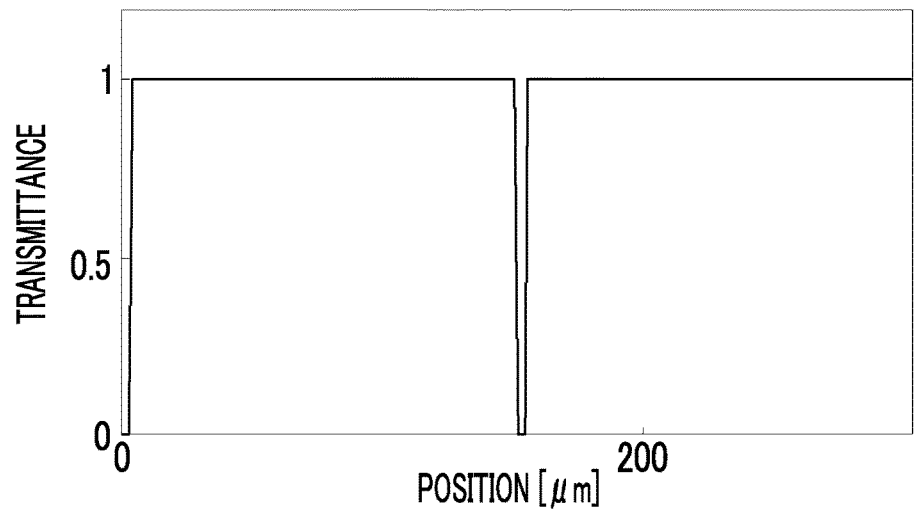
FIG. 61 is a 1-dimensional profile of the transmittance of two wirings of the wiring pattern on the upper surface of the wiring pattern shown in FIG. 51.
Figure 62:
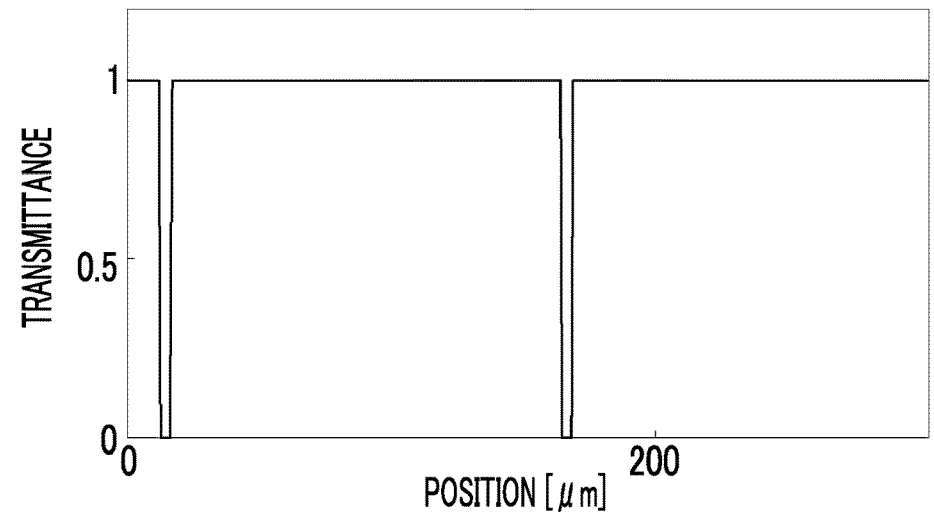
FIG. 62 is a 1-dimensional profile of the transmittance of two wirings of the wiring pattern on the lower surface of the wiring pattern shown in FIG. 51.

Further, FIG. 58 shows a 2-dimensional frequency distribution of the wiring pattern 25*at* in oblique observation shown in FIG. 56. FIG. 59 shows moiré components of the pixel array pattern shown in FIG. 14 and the wiring pattern 25*at* shown in FIG. 58. FIG. 60 shows the result of multiplying each moiré component shown in FIG. 59 by the visual transfer function VTF of Expression (1) and applying the human eye's visual response characteristics.

It can be seen that the 2-dimensional frequency distribution of the wiring pattern 25*at* in oblique observation shown in FIG. 58 is similar to the 2-dimensional frequency distribution of the wiring pattern 25*a* in front observation shown in FIG. 48. Further, it can be seen that the intensities of the moiré components indicated by the black arrows in oblique observation in FIGS. 59 and 60 are as small as the intensities of the moiré components indicated by the black arrows in front observation in FIGS. 49 and 50, respectively.

Figure 65:
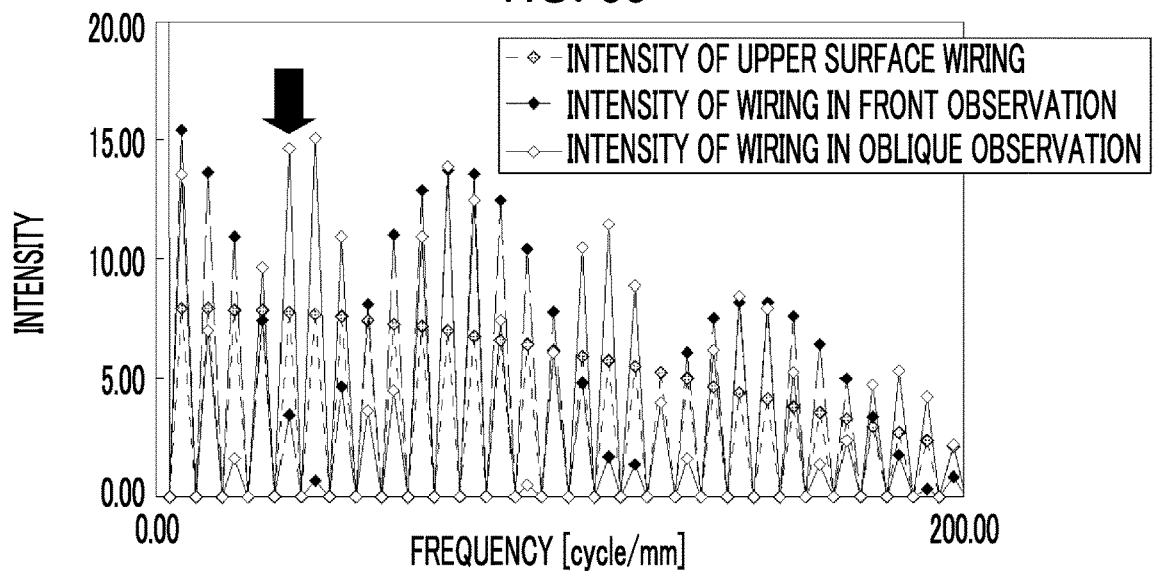
FIG. 65 is a diagram showing the intensity of each frequency component of the upper surface wiring pattern shown in FIG. 61 and the wiring patterns in the front observation shown in FIG. 63 and the oblique observation shown in FIG. 64.
Figure 66:
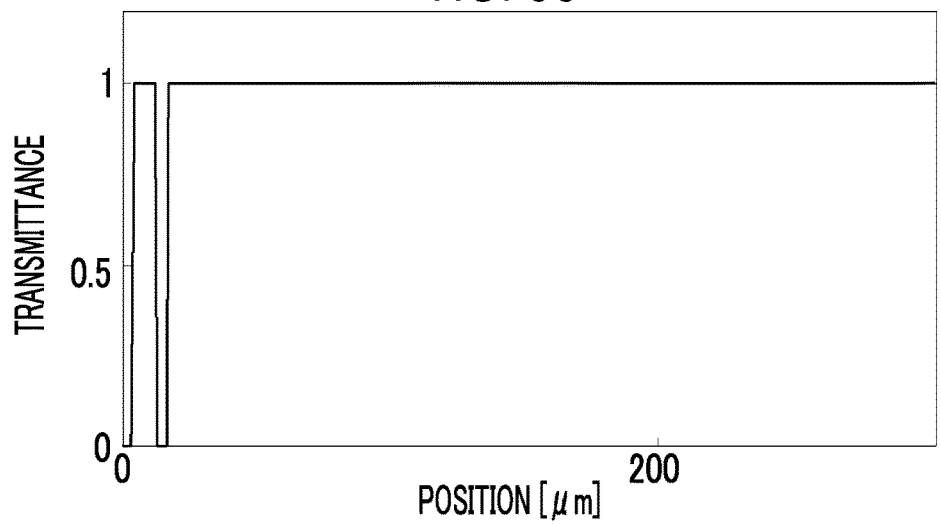
FIG. 66 is a 1-dimensional profile of the transmittance of two wirings of the wiring pattern on the upper surface of the wiring pattern shown in FIG. 56.
Figure 67:
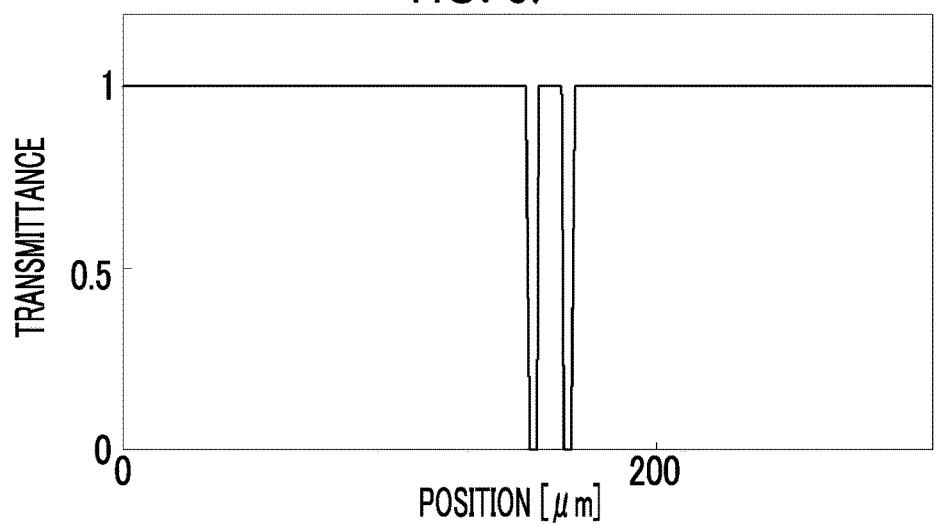
FIG. 67 is a 1-dimensional profile of the transmittance of two wirings of the wiring pattern on the lower surface of the wiring pattern shown in FIG. 56.

Regarding the wiring pattern 25*ft* in oblique observation shown in FIG. 51, FIGS. 61 to 64 respectively show transmittance profiles, each of which is obtained by viewing the straight line wiring in one direction along the wiring direction (that is, the 22° direction), in the wiring pattern on the upper surface, the wiring pattern on the lower surface, the wiring pattern 25*a* in front observation (refer to FIG. 46), and the wiring pattern 25*ft* in oblique observation (refer to FIG. 51). In addition, FIG. 65 shows intensities of frequency components of the transmittance profiles, each of which is obtained by viewing the straight line wiring in one direction along the wiring direction, in the upper surface wiring pattern and the wiring patterns in front observation and oblique observation. The black arrow shown in FIG. 53 is also shown in FIG. 65. It should be noted that, in FIG. 65, the intensity of each frequency component of the transmittance profile viewed along the wiring direction of the straight line wiring in one direction in the lower surface wiring pattern is the same as the intensity of each frequency component in the upper surface wiring pattern, and is thus not shown in the drawing.

Figure 70:
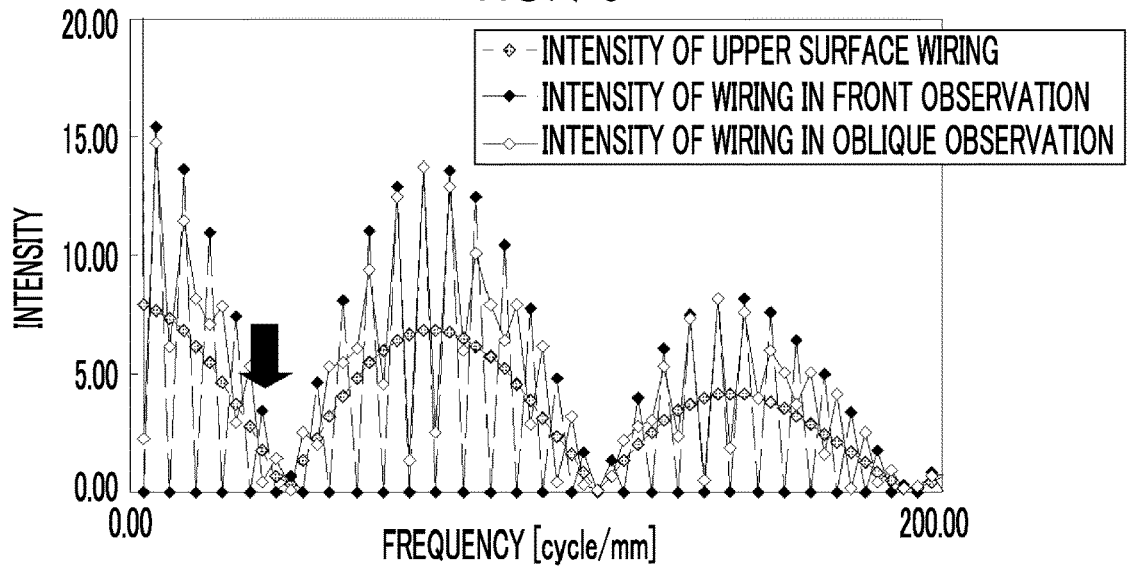
FIG. 70 is a diagram showing the intensity of each frequency component of the upper surface wiring pattern shown in FIG. 66 and the wiring patterns in the front observation shown in FIG. 68 and the oblique observation shown in FIG. 69.

Further, regarding the wiring pattern 25*at* in oblique observation shown in FIG. 56, FIGS. 66 to 69 respectively show transmittance profiles, each of which is obtained by viewing the straight line wiring in one direction along the wiring direction (that is, the 22° direction), in the wiring pattern on the upper surface, the wiring pattern on the lower surface, the wiring pattern 25*a* in front observation (refer to FIG. 46), and the wiring pattern 25*at* in oblique observation (refer to FIG. 56). In addition, FIG. 70 shows intensities of frequency components of the transmittance profiles, each of which is obtained by viewing the straight line wiring in one direction along the wiring direction, in the upper surface wiring pattern and the wiring patterns in front observation and oblique observation. The black arrow shown in FIG. 58 is also shown in FIG. 70. It should be noted that, in FIG. 70, the intensity of each frequency component of the transmittance profile viewed along the wiring direction of the straight line wiring in one direction in the lower surface wiring pattern is the same as the intensity of each frequency component in the upper surface wiring pattern, and is thus not shown in the drawing.

Figure 63:
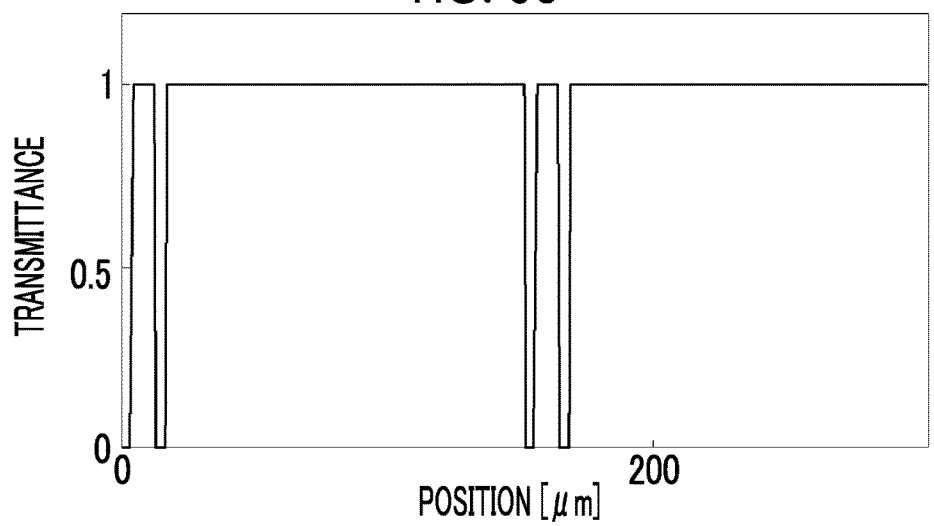
FIG. 63 is a 1-dimensional profile of the transmittance of four wirings of the wiring pattern in front observation shown in FIG. 46.
Figure 64:
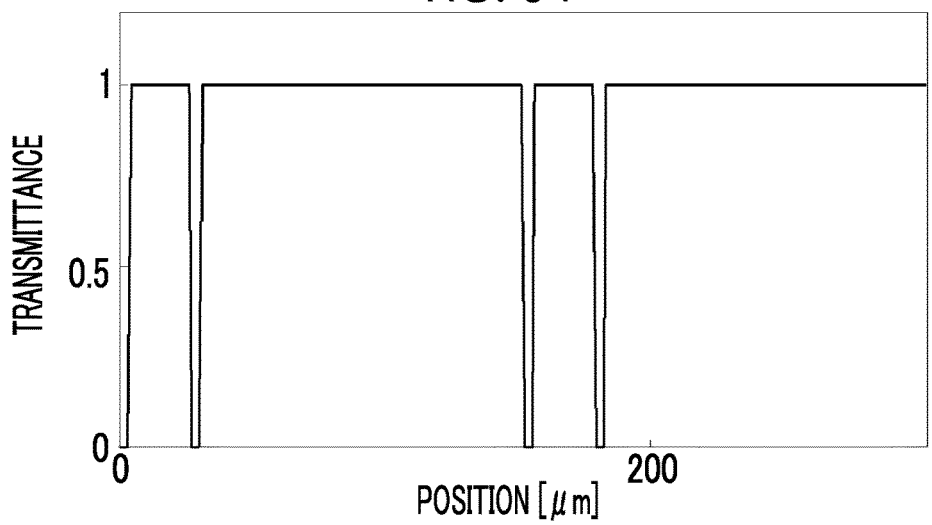
FIG. 64 is a 1-dimensional profile of the transmittance of four wirings in the wiring pattern in oblique observation shown in FIG. 51.
Figure 68:
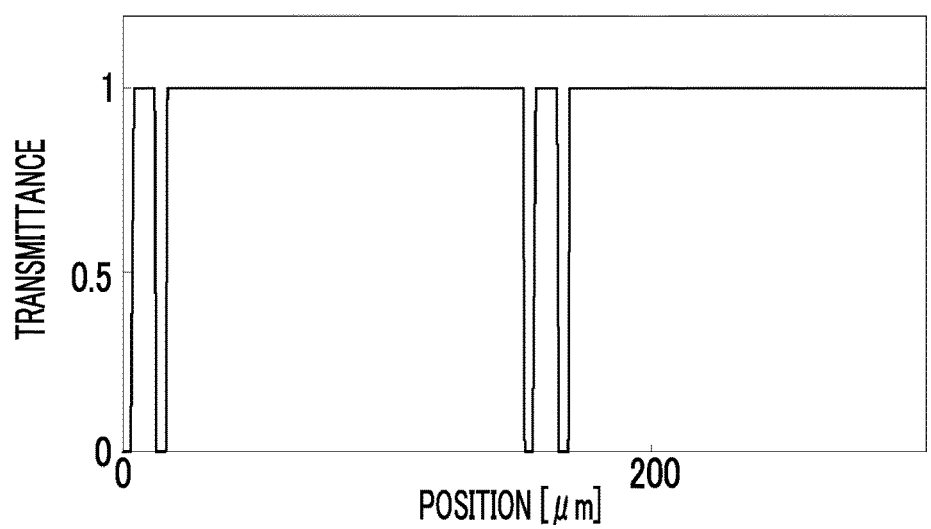
FIG. 68 is a 1-dimensional profile of the transmittance of four wirings of the wiring pattern in front observation shown in FIG. 46.
Figure 69:
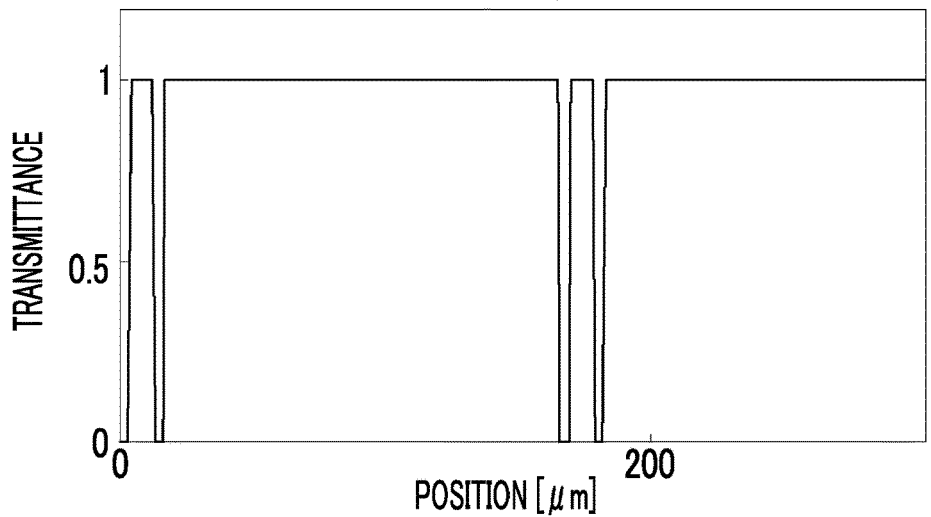
FIG. 69 is a 1-dimensional profile of the transmittance of four wirings in the wiring pattern in oblique observation shown in FIG. 56.

In the examples shown in FIGS. 61 to 65 and 66 to 70, the front observed wiring pattern (25*a*: refer to FIG. 46) is the same, as shown in FIGS. 63 and 68, and the wiring pattern has less moiré, as shown in FIGS. 49 and 50.

However, in the examples shown in FIGS. 61 to 65, as shown in FIG. 65, the frequency distributions of the front observed wiring pattern and the wiring pattern on the upper surface (or the lower surface) are largely different, and the wiring pattern on the upper surface (or the lower surface) has a large intensity of the frequency component of the black arrow. As a result, as shown in FIG. 65, the frequency distributions of the obliquely observed wiring pattern (25*ft*: refer to FIG. 51) in which the wiring pattern on the upper surface and the wiring pattern on the lower surface are shifted and overlapped is significantly different from the frequency distribution of the front observed wiring pattern (25*a*: refer to FIG. 46). In addition, moiré (moiré due to the frequency component of the black arrow), of which the intensity is small in the front observed wiring pattern, is large in the obliquely observed wiring pattern.

On the other hand, in the examples shown in FIGS. 66 to 70, as shown in FIG. 70, the frequency distributions of the front observed wiring pattern and the wiring pattern on the upper surface (or the lower surface) are close, and the wiring pattern on the upper surface (or the lower surface) has a small intensity of the frequency component indicated by the black arrow. As a result, as shown in FIG. 70, the obliquely observed wiring pattern (25at: refer to FIG. 56), in which the wiring pattern on the upper surface and the wiring pattern on the lower surface are shifted and overlapped, is close to the frequency distribution of the front observed wiring pattern (25a). In addition, the intensity of the frequency component of the black arrow is small, and moiré can be reduced as in front observation even in oblique observation.

In the examples shown in FIGS. 61 to 65, the front observed wiring pattern is a wiring pattern having less moiré, but the wiring pattern on the upper surface (or lower surface) has a significantly different frequency distribution from the front observed wiring pattern, and is a wiring pattern that causes moiré.

On the other hand, in the examples shown in FIGS. 66 to 70, the wiring pattern on the upper surface (or the lower surface) has a frequency distribution similar to that of the front observed wiring pattern (25a), and is a wiring pattern having less moiré as in front observation.

In the examples shown in FIGS. 2 to 4B, 36 to 39, 46 to 47, 56 to 57, and 66 to 69, two wirings of the four wirings are disposed on the upper surface and two wirings are disposed on the lower surface, but the characteristics of the wiring pattern described herein are not limited to this example. In other words, in a case where the wiring pattern is configured such that two or more of at least a part of the predetermined number of wirings are consecutively arranged on the upper surface and two or more wirings of at least a part thereof are consecutively arranged on the lower surface, compared to the wiring patterns alternately arranged on the upper and lower surfaces in the related art, the frequency distributions of the wiring patterns on the upper surface (and the lower surface) and the obliquely observed wiring pattern can be made closer to that of the front observed wiring pattern. As a result, it is possible to reduce occurrence of moiré in oblique observation.

Further, in a case where the wirings are consecutively arranged on the upper surface and the lower surface as in the present invention, the pitches of the wirings on the upper surface and the lower surface include a narrow pitch and a wide pitch as compared with the pitch of the alternate arrangement in the related art (refer to FIGS. 36, 37, 66, and 67). Therefore, in the present invention, the minimum frequency of the wiring patterns on the upper surface and the lower surface is lower than that of that in the related art, and the minimum frequency of the wiring pattern in oblique observation is also lower than that in the related art (FIGS. 40 and 70). Therefore, it is necessary to take care that the wiring is not visible in oblique observation. For this reason, in a case where the moiré due to the wiring pattern according to the embodiment of the present invention is evaluated based on the above-mentioned "principle of moiré occurrence in a case where the pixel array pattern and the wiring pattern are overlapped", in Expression (7) representing the pattern in which the pixel array pattern and the wiring pattern are overlapped, it is desirable to evaluate not only the moiré component in the expression on the fourth row but also "each frequency component of the wiring pattern multiplied by the average luminance A0 of the pixel array pattern" in the expression on the third row. Specifically, in a case of deriving the moiré component from each frequency component of the pixel array pattern shown in FIG. 14 and each frequency component of the wiring pattern, it is desirable that a component of the frequency 0 is included in the frequency distribution of the pixel array pattern (corresponding to A0 in Expression (7)). The moiré components shown in the present invention mean "a moiré component derived by adding a component of the frequency 0 to the frequency distribution of the pixel array pattern" unless otherwise specified.

As described above, the wiring pattern according to the embodiment of the present invention is disadvantageous in the visibility of the wiring pattern in oblique observation as compared with the wiring pattern in the related art. Due to this disadvantage, the moiré including the frequency component of the wiring patterns in front observation and oblique observation in the wiring pattern in the related art and the wiring pattern according to the embodiment of the present invention is evaluated for various pixel array patterns (a moiré component including a frequency 0 component in the frequency distribution of the pixel array pattern is derived and evaluated). As a result, in a case where the wiring pattern in front observation is limited to a wiring pattern having an equal pitch as in the examples shown in FIGS. 31 to 35 and 36 to 40, the wiring pattern in the related art may be improved depending on the pixel array pattern. Specifically, the angle and pitch of the equal pitch wiring pattern are variously changed, and each of moirés in front observation and oblique observation is evaluated, such that investigation for improving both is made. As a result, there was a case where it improved (however, in a case where the visibility of the wiring pattern was not included, the wiring pattern according to the embodiment of the present invention is improved regardless of the pixel array pattern).

However, as in the examples shown in FIGS. 61 to 65 and 66 to 70, the wiring pattern in front observation includes an example in which "the repetitive pitches of the predetermined number of wirings are equal pitches and the respective pitches of the predetermined number of wirings are non-equal pitches". The angle and average pitch (repetitive pitch) of the wiring pattern and the respective pitches of the predetermined number of wirings are variously changed, such that investigation for improving both moirés in front observation and oblique observation is made. As a result, the wiring pattern according to the embodiment of the present invention was constantly improved regardless of the pixel array pattern. That is, "the wiring pattern in which the repetitive pitches of the predetermined number of wirings are equal pitches and the respective pitches of the predetermined number of wirings are non-equal pitches" is configured as a "wiring pattern in which two or more wirings are consecutively arranged on the upper surface and the lower surface" in the present invention. This configuration is particularly effective for reducing moirés in front observation and oblique observation. In "the wiring pattern in which the repetitive pitches of the predetermined number of wirings are equal pitches and the respective pitches of the predetermined number of wirings are non-equal pitches", in a case where the wirings are alternately arranged on the upper surface and the lower surface as in the related art, as compared with the case of the equal pitch, the difference in the frequency distribution between the front observed wiring pattern and the wiring patterns on the upper surface (and the lower surface) is larger. Therefore, it is considered that the difference in frequency distribution between the front observed and obliquely observed wiring patterns larger, and the deterioration of the moiré is larger. Thus, as in the present invention, two or more wirings are consecutively arranged on the upper surface and the lower surface, and the frequency distributions of the front observed wiring pattern, the wiring patterns on the upper surface (and the lower surface), and the obliquely observed wiring pattern are closer. Thereby, it is considered that it is necessary to prevent moiré in oblique observation from being deteriorated.

(Principle of Moiré Reduction by Setting Predetermined Number of Pitches as Non-Equal Pitches)

From the above-described principle of moiré occurrence, in a case where the frequency of each frequency component of the wiring pattern can be set apart from the frequency of each frequency component of the pixel array pattern, it can be seen that a low-frequency moiré visible to the human eye does not occur. Here, the moiré can be reduced by the configuration in which "the repetitive pitches of the predetermined number of wirings are set as equal pitches and the respective pitches of the predetermined number of wirings are set as non-equal pitches". It should be noted that here, in order to facilitate understanding, only the front observation will be assumed.

Figure 71:
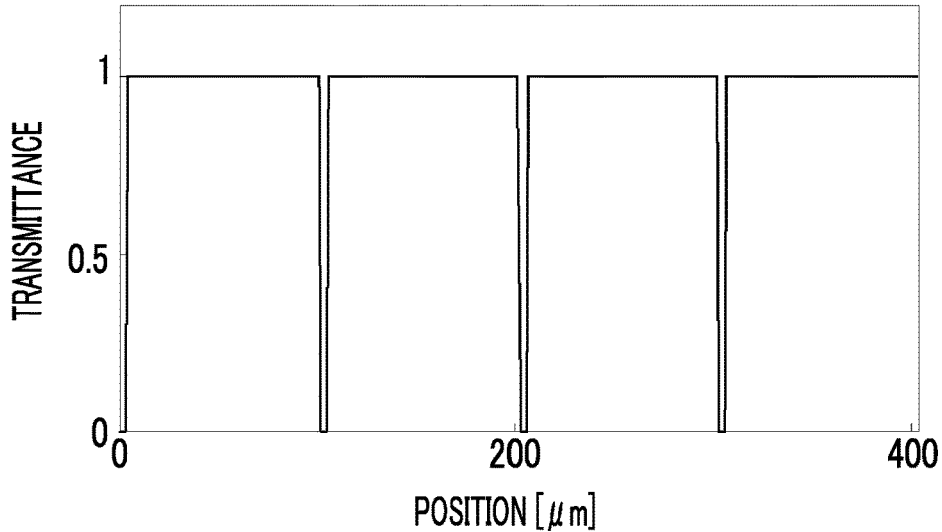
FIG. 71 is a 1-dimensional profile of the transmittance of four wirings of the wiring pattern shown in FIG. 12.
Figure 72:
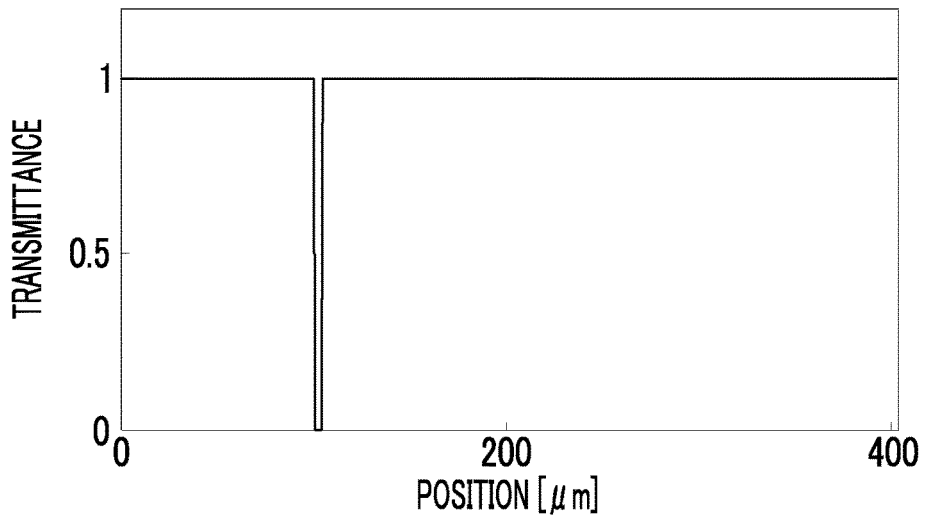
FIG. 72 is a 1-dimensional profile of the transmittance of the second wiring of the four wirings shown in FIG. 71.

The wiring pattern shown in FIG. 12 will be described as a representative example. As the straight line wiring in one direction, that is, the straight line wiring 21*d* in the right direction or the straight line wiring 21*e* in the left direction is viewed along the direction of the wiring in the wiring pattern (transmittance pattern of the wiring) shown in FIG. 12, the straight line wiring is as shown in FIG. 71. In FIG. 71, there are four wirings. As might be expected, all the respective pitches of the four wirings are equal pitches, which are 101 µm. Although only four wirings are shown in FIG. 71, there are wirings after this and the pitches thereof are naturally 101 µm. Here, only the second wiring in FIG. 71 is extracted and the extracted portion is shown in FIG. 72. The second wiring is repeated with a pitch of 404 µm for four wirings.

Figure 73:
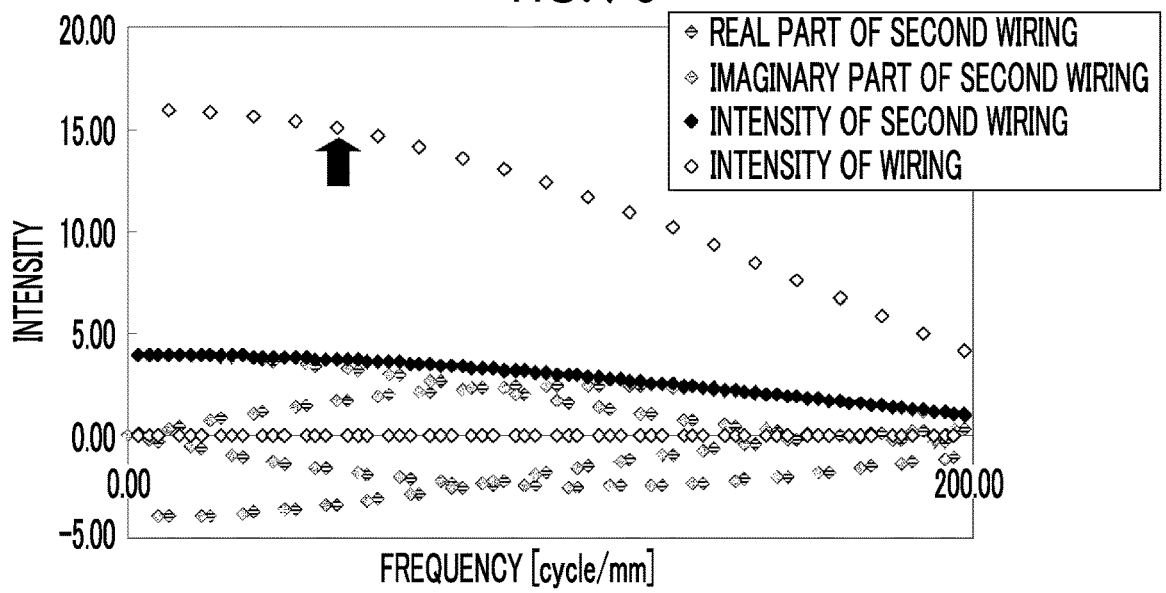
FIG. 73 is a diagram showing a 1-dimensional frequency distribution of the wiring pattern shown in FIGS. 71 and 72.

Here, FIG. 73 shows a 1-dimensional frequency distribution of the wiring patterns shown in FIGS. 71 and 72. It can be seen from FIG. 73 that the second extracted wiring has four times more (finer) frequency components than the original wiring, and the minimum frequency thereof is lower (¼) than that of the original wiring. Since the pitch of the second extracted wiring is four times longer than that of the original wiring, the frequency components are present at frequencies four times finer, and the minimum frequency thereof is also ¼ times lower. While the second extracted wiring has four times more frequency components than the original wiring, the number of the frequency components of the original wiring is small. The reason for this is that the respective frequency components of the second extracted wiring and the respective frequency components of the other wiring cancel each other. That is, each of the first wiring, the second wiring, the third wiring, and the fourth wiring has four times more frequency components than the original wiring. However, in a case where all the frequency components of those wirings are added, only a component of a specific frequency (a frequency that is an integer multiple of the frequency corresponding to the pitch of the original wiring) is added and can be enhanced to remain, and the components of other frequencies cancel each other and are the frequency components of the original wiring. The addition in the frequency space may be subtraction (addition of a negative value) depending on the phase relationship of the components to be added, and thus the components may cancel each other. The addition in the frequency space is performed by separately adding the real parts and the imaginary parts of the respective components. However, each of the real parts and the imaginary parts may have a negative value depending on the phase (refer to FIG. 73), and thus the parts may cancel each other.

Here, the present inventor has found that the frequency distribution of the wirings can be changed by setting the respective pitches of the predetermined number of wirings to be non-equal pitches while setting the repetitive pitches of the predetermined number of wirings to be equal pitches. This point will be described in the above-described example (example in which the predetermined number is four). The intensity of each frequency component of the first wiring, the third wiring, and the fourth wiring is the same as the intensity of the second wiring indicated by each black dot (rhomboid) in FIG. 73. Even in a case where the position of each wiring is changed (that is, even in a case where the pitch of each wiring is changed), the repetitive pitch of the four lines does not change. Therefore, the intensity of the second wiring is the same as that of the second wiring indicated by the black dots in FIG. 73 without change in intensity of each frequency component. However, in a case where the position of each wiring is changed (in a case where the pitch of each wiring is changed), the values of the real part and the imaginary part of each frequency component change as the phase changes. In a case where the position of the second wiring is changed, the values of the real part and the imaginary part shown in FIG. 73 change. This change is able to change the frequency distribution of the result obtained by adding the frequency components of the first wiring, the second wiring, the third wiring, and the fourth wiring.

Since the component indicated by the black arrow in FIG. 73 is close to the frequency component of the black arrow in the pixel array pattern of FIG. 14, a low-frequency moiré visible to the human eye occurs as shown in FIG. 17.

Therefore, optimization of the positions (pitches) of the first wiring, the second wiring, the third wiring, and the fourth wiring was examined such that the component indicated by the black arrow in FIG. 73 is small. The results are shown in FIGS. 74 and 75.

Figure 74:
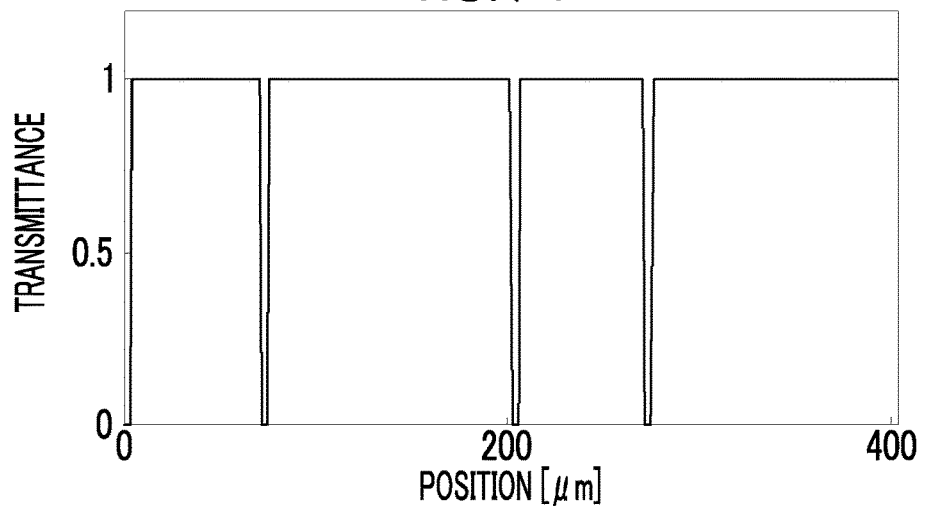
FIG. 74 is a 1-dimensional profile of the transmittance of four wirings as a result of optimization of a wiring pattern in which a predetermined number of wiring pitches are non-equal pitches.
Figure 75:
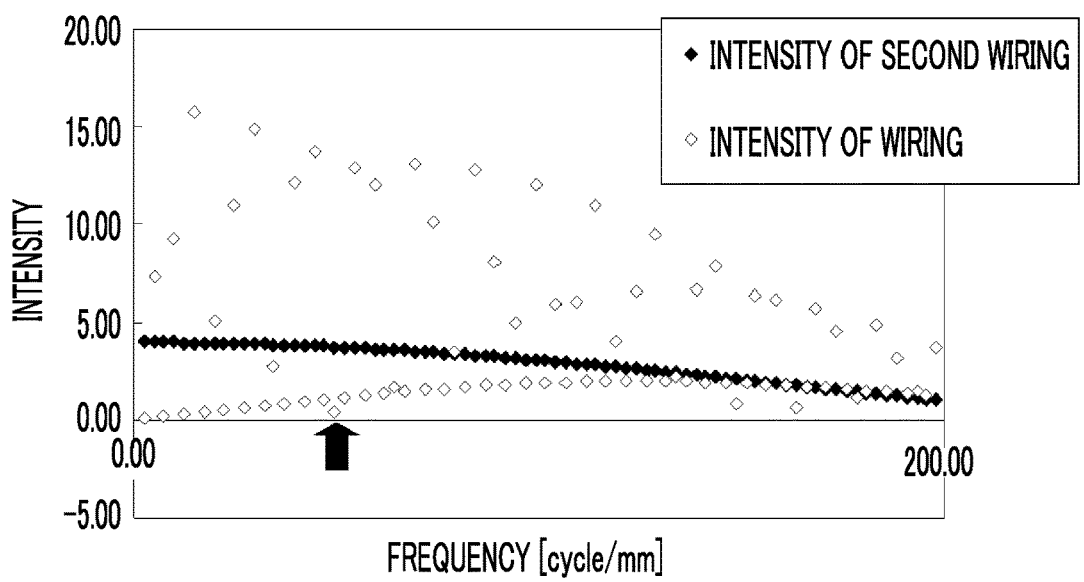
FIG. 75 is a diagram showing a 1-dimensional frequency distribution of the wiring pattern shown in FIG. 74.

FIG. 74 is a 1-dimensional profile of the transmittances of the four wirings as an optimization result. FIG. 75 shows a frequency distribution. It can be clearly seen from FIG. 75 that the intensity of the frequency component indicated by the black arrow can be reduced.

Figure 76:
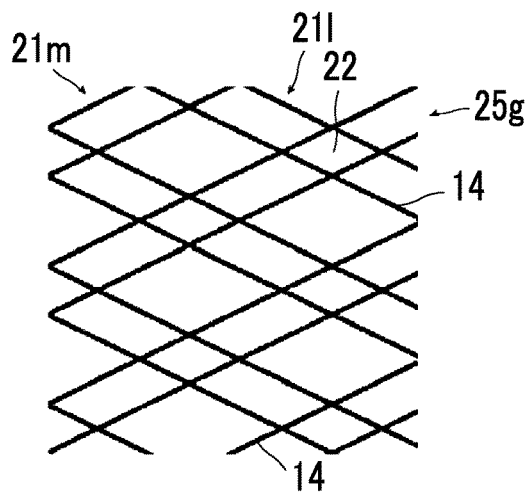
FIG. 76 is a plan view schematically showing a wiring pattern as a result of optimization of a wiring pattern in which a predetermined number of wiring pitches are non-equal pitches.
Figure 77:
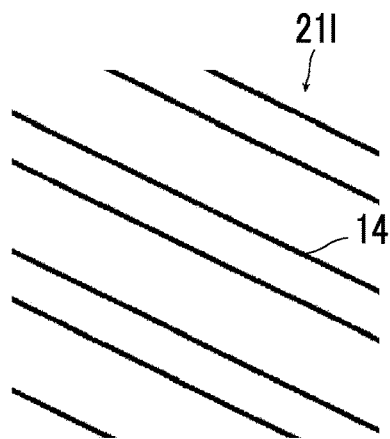
FIG. 77 is a plan view schematically showing a wiring pattern in a straight line wiring of the wiring pattern in one direction shown in FIG. 76.
Figure 78:
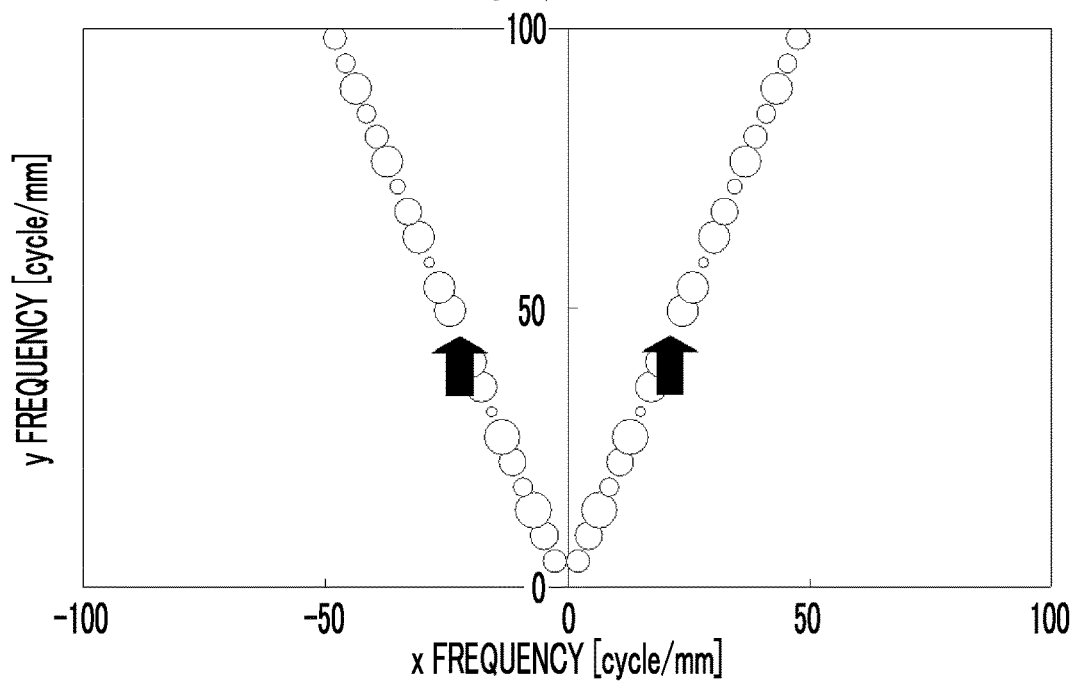
FIG. 78 is a diagram showing a 2-dimensional frequency distribution of the wiring pattern shown in FIG. 76.

Further, FIGS. 76 and 77 show the transmittance patterns of the wirings as the exemplary optimization result. In the wiring pattern 25*g* shown in FIGS. 76 and 77, the repetitive pitches of the four wirings of each of the straight line wirings 21*l* in the right direction and the straight line wiring 21*m* in the left direction are 404 µm, which is the same as those in FIGS. 12 and 13. FIG. 78 is a 2-dimensional frequency distribution of the wiring pattern shown in FIG. 76, where the intensity of each frequency component is indicated by the area of the circle. It can be seen that in the frequency distribution of the pixel array pattern in FIG. 14, the intensity of the component (indicated by the black arrow) close to the component indicated by the black arrow is smaller than that in FIG. 15.

Figure 79:
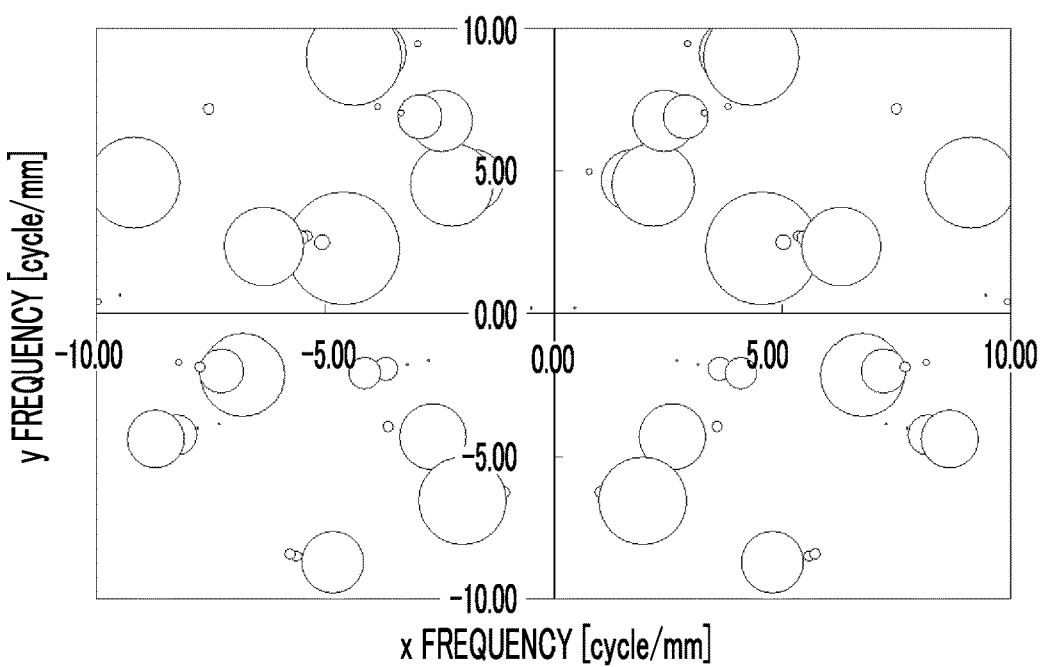
FIG. 79 is a diagram in which each frequency component of the pixel array pattern shown in FIG. 14 and a moiré component calculated from each frequency component of the wiring pattern shown in FIG. 76 are plotted.
Figure 80:
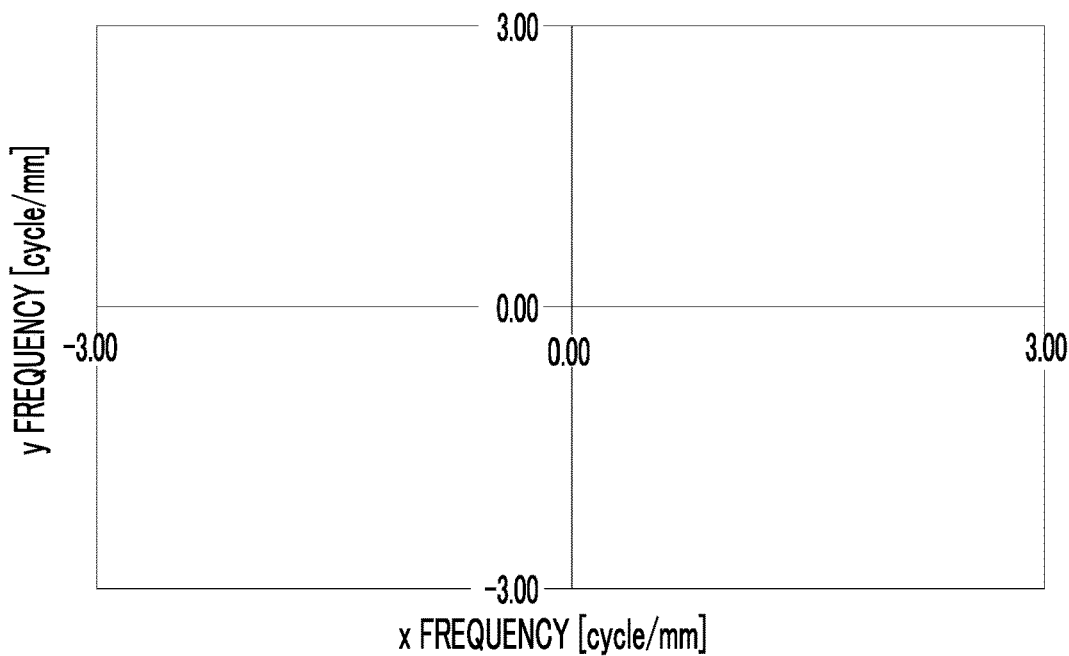
FIG. 80 is a diagram showing a result of multiplying each moiré component shown in FIG. 79 by the sensitivity of the human eye's visual characteristics.

FIG. 79 shows moiré components calculated from the frequency components of the pixel array pattern shown in FIG. 14 and the frequency components of the wiring pattern shown in FIG. 76. FIG. 80 shows a result obtained by multiplying the visual transfer function VTF, which indicates the sensitivity of the human eye's visual response characteristics represented by Expression (1), by moiré components shown in FIG. 79. It can be seen that there is no low-frequency moiré as shown in FIG. 17. It should be noted that in FIGS. 15 and 78, FIGS. 16 and 79, and FIGS. 17 and 80, the magnitudes of intensities respectively indicated by the areas of the circles of components are the same.

Here, as can be seen by comparing FIG. 73 and FIG. 75 and comparing FIG. 15 and FIG. 78, the wiring pattern, in which "the repetitive pitches of the predetermined number of wirings are set as equal pitches, and the respective pitches of the predetermined number of wirings are set as non-equal pitches", has a smaller minimum frequency than the equal pitch wiring. For example, in a case where the predetermined number is 4, as shown in FIGS. 74, 76, and 77, the minimum frequency is ¼. The reason can be described as follows. As described above, each of the first to fourth wirings shown in FIG. 73 has four times more frequency components than the original equal pitch wiring, and the minimum frequency thereof is also ¼. In a case where the frequency components of these wirings are added, at equal pitches, only frequencies that are integer multiples of the frequencies corresponding to the pitch of the original wiring (a pitch of ¼ of the first to fourth wirings) are added and can be enhanced to remain, and the components of other frequencies cancel each other.

However, as in the example, in a case where the pitches of the first to fourth wirings are set to non-equal pitches, the components remain without being canceled. As described above, in the example, a low-frequency component of the wiring pattern is generated as compared with the equal pitch wiring. Thus, it should be taken into account that it is necessary to make the wiring pattern not visible. For that purpose, in Expression (7) representing the pattern in which the pixel array pattern and the wiring pattern are overlapped, not only the moiré component of Expression in the fourth row, but also "each frequency component of the wiring pattern multiplied by the average luminance A0 of the pixel array pattern" in the expression in the third row may be evaluated. Specifically, in a case of deriving the moiré component of FIG. 79 from each frequency component of the pixel array pattern of FIG. 14 and each frequency component of the wiring pattern of FIG. 78, a component of the frequency 0 may be included in the frequency distribution of the pixel array pattern (corresponding to A0 in Expression (7)). Each moiré component shown in FIG. 79 is a moiré component derived in such a manner by adding the component of the frequency 0 to the frequency distribution of the pixel array pattern. The moiré components shown below also mean "a moiré component derived by adding a component of the frequency 0 to the frequency distribution of the pixel array pattern" unless otherwise specified.

The principle of moiré reduction according to the example will be described once again. First, assuming that the predetermined number of wiring patterns is n, each wiring pattern (herein referred to as a sub-wiring pattern) in which only the first wiring, . . . , and the nth wiring are extracted will be considered. Each sub-wiring pattern has n times finer and more frequency components than the original wiring pattern (4 times in FIG. 73), and includes a frequency component that causes low-frequency moiré visible to the human eye in the vicinity of each frequency component of the pixel array pattern. The respective sub-wiring patterns are overlapped at equal pitches (corresponding to the original wiring pattern), and the respective frequency components can be most canceled out and reduced. Thus, the minimum frequency can be increased. On the other hand, the frequency component, which is included in each sub-wiring pattern and causes moiré, remains (the largest frequency component is indicated by the black arrow in FIG. 73). Therefore, by overlapping the sub-wiring patterns having pitches that cancel out the frequency components included in the respective sub-wiring patterns that cause moiré, the number of frequency components is greater than that in the case of overlapping with the equal pitches, and the minimum frequency thereof is lowered, but moiré can be reduced. The example is the principle of moiré reduction.

The example is characterized in the wiring pattern which has the moiré frequency distributions shown in FIGS. 79 and 80 with respect to the moiré frequency distributions of the equal pitch wiring pattern shown in FIGS. 16 and 17 and in which "the predetermined number of repetitive pitches are equal pitches and the predetermined number of respective pitches are non-equal pitches".

The wiring pattern of the example has a "predetermined number of repetitive pitches at equal intervals", and is characterized in that the sum of moirés is smaller compared to the frequency distribution of the moiré in such a case of the equal pitch wiring patterns shown in FIGS. 16 and 17, as shown in the frequency distribution of moiré in FIGS. 79 and 80.

As described in FIG. 73, in the example, the larger the number of non-equal pitches, the lower the minimum frequency. Therefore, there is a concern that the wiring pattern may be visible. Similarly, as can be seen from FIG. 73, in the example, as the number of non-equal pitches increases, the frequency components of the sub-wiring patterns are finer. Among the frequency components, many frequency components, which cause low-frequency moirés visible to the human eye are included therein. Thus, it may be difficult to optimize such pitches that these frequency components cancel each other.

Therefore, it is desirable to reduce the number of non-equal pitches as much as possible. According to an experiment conducted by the present inventor, the number of moirés that can be reduced by setting the pitches of the predetermined number of wirings to non-equal pitches is 16 or less at most as compared with the equal pitch wiring pattern. Even in a case where the pitches of the 16 or more wirings are set as non-equal pitches, the moiré reduction effect does not change or is worse, while the wiring pattern itself is easily visible. In most cases, the effect of reducing moiré is maximized in a case where the number of wirings having non-equal pitch is about 2 to 8, and does not change or is worse even in a case where the number of wirings is further increased. Therefore, in order to sufficiently reduce moiré without making the wiring pattern visible, it is desirable that the number of non-equal pitches is 16 or less at most. The examples shown in FIGS. 74 and 75 are examples in which the optimization of the pitches of the four wirings was examined. However, as a result, the repetitive pitches of the two wirings are approximately equal pitches. That is, the examples show that the same moiré reduction effect can be obtained by optimizing the pitches of the two wirings.

Figure 81:
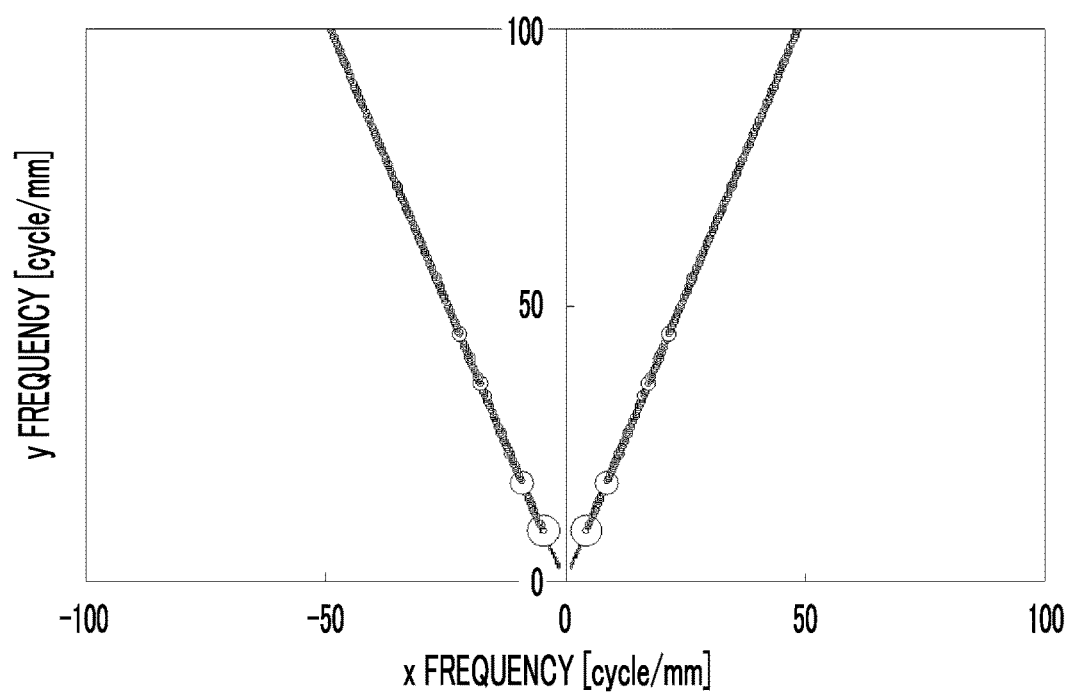
FIG. 81 is a diagram of a 2-dimensional frequency distribution of a wiring pattern in which 512 wirings have non-equal pitches.
Figure 82:
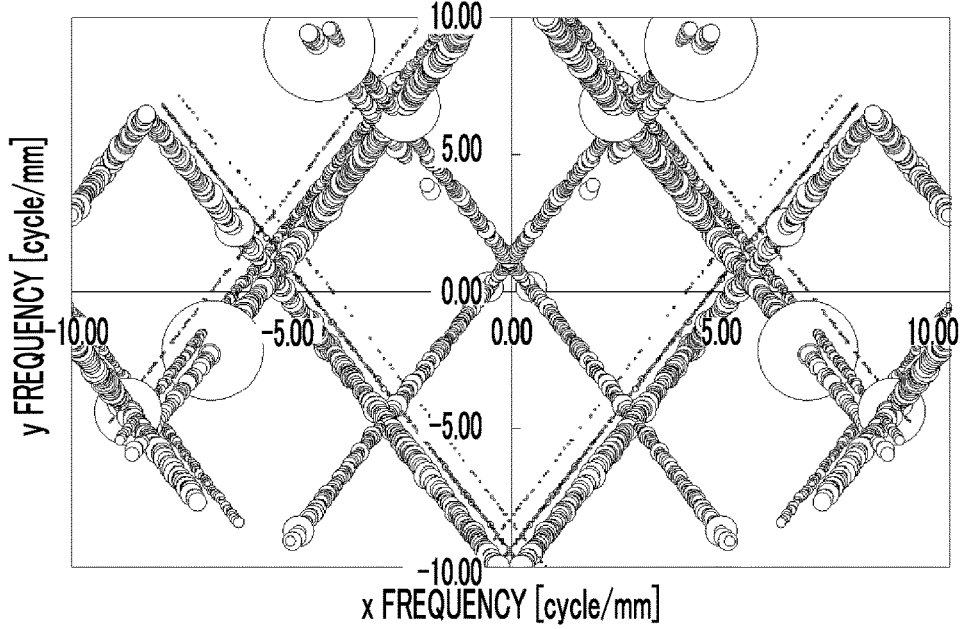
FIG. 82 is a diagram in which each frequency component of the pixel array pattern shown in FIG. 14 and a moiré component calculated from each frequency component of the wiring pattern shown in FIG. 81 are plotted.
Figure 83:
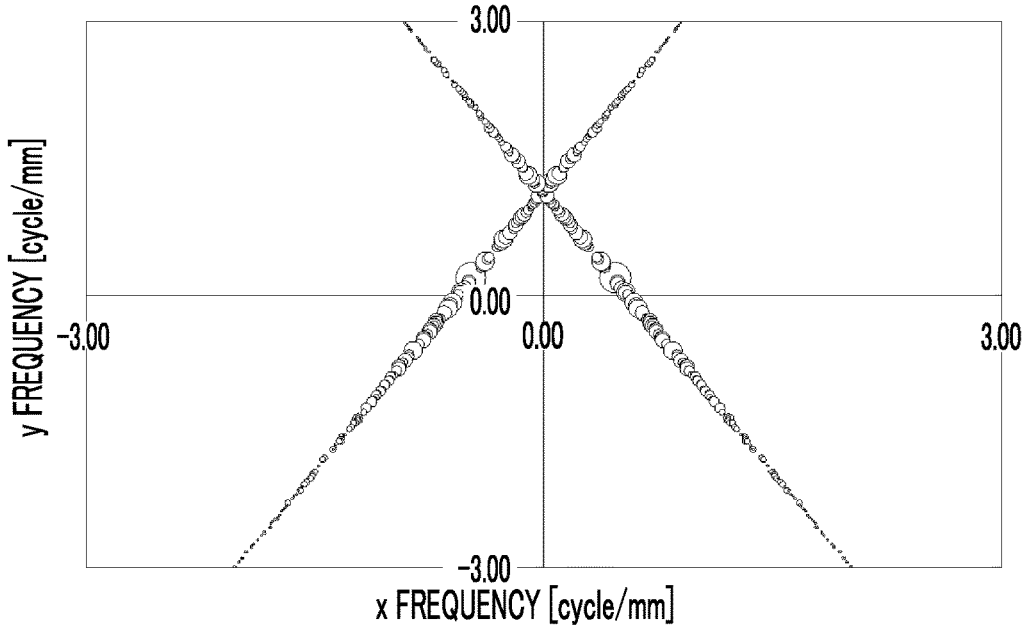
FIG. 83 is a diagram showing a result of multiplying each moiré component shown in FIG. 82 by the sensitivity of the human eye's visual characteristics.

For example, in the prior arts described in JP2013-214545A and JP2016-014929A described above, with respect to the irregularity provided to the wiring pitches, the example has a restriction that "the predetermined number of repetitive pitches are equal pitches". Further, as compared with the above-described prior art, the example clarifies the following and the principle thereof. As compared with the moiré of the equal pitch wiring patterns as shown in FIGS. 16 and 17, it is possible to reduce the sum of moirés as shown in FIG. 80, by using such wiring patterns. The example further describes that "it is desirable to set the number of non-equal pitches to 16 or less in order to sufficiently reduce moiré without making the wiring pattern visible". As a trial, the number of non-equal pitches was increased to 512, and random irregularities of about 16% were provided to the pitches to investigate the moiré component. The results are shown in FIGS. 81 to 83. FIG. 81 is a 2-dimensional frequency distribution of the wiring pattern. FIG. 82 is a frequency distribution of moiré derived from the frequency distribution of the pixel array pattern of FIG. 14 and the frequency distribution of the wiring pattern of FIG. 81. Further, FIG. 83 shows a distribution obtained by multiplication of the visual transfer function VTF shown in Expression (1). Here, FIG. 81 is the same as FIGS. 15 and 78, FIG. 82 is the same as FIGS. 16 and 79, FIG. 83 is the same as FIGS. 17 and 80, in terms of the magnitudes of the intensities indicated by the areas of the circles of the respective components.

It can be seen that there is a clear difference in a case of comparing FIGS. 78 to 80, each of which is the distribution of the example, with FIGS. 81 to 83, which is the distribution to which irregularity is assumed to be provided in the above-mentioned prior art. In FIGS. 78 to 80, the intensities of the wiring pattern frequency components (indicated by the black arrows) close to the frequency components of the pixel array pattern are clearly smaller than that of the equal pitch wiring pattern (refer to FIG. 15). As a result, it can be seen that there is no low frequency moiré component (refer to FIGS. 16 and 17) found in the equal pitch wiring pattern. On the other hand, in FIGS. 81 to 83, the frequency component of the wiring pattern spreads finely. As a result, it can be seen that there is no specific low frequency moiré component (refer to FIGS. 16 and 17) found in the equal pitch wiring pattern, but a large number of fine moiré components are generated. A large number of these fine moiré components are visible as irregular noise. Compared to the moirés shown in FIG. 17, the moirés shown in FIG. 83 have no specific large moiré, but the sum of moirés is rather large.

By the way, focusing on the respective wiring patterns on the upper surface and the lower surface according to the embodiment of the present invention, the above-mentioned example of the present invention is practically "the wiring pattern in which the repetitive pitches of the predetermined number of wirings are equal pitches and the respective pitches of the predetermined number of wirings are non-equal pitches", and is a wiring pattern having less moiré than the equal pitch wiring pattern according to the principle described above. This is clear from the following points.

The respective equal pitch wiring patterns on the upper surface and the lower surface are, for example, the examples shown in FIGS. 31 to 35, and the examples shown in FIGS. 61 to 65 mostly have equal pitches. On the other hand, in the examples shown in FIGS. 36 to 40 and FIGS. 66 to 70, each of the wiring patterns on the upper surface and the lower surface is "the wiring pattern in which the repetitive pitches of the predetermined number of (two) wirings are equal pitches and the respective pitches of the predetermined number of wirings are non-equal pitches", and is a wiring pattern having less moiré than the examples shown in FIGS. 31 to 35 and 61 to 65. The characteristic is not accidental. In the present invention, it is premised that the front observed wiring pattern is a wiring pattern having less moiré, and the present invention is characterized in that the wiring patterns on the upper surface and the lower surface each have a frequency distribution similar to the front observed wiring pattern. Therefore, the wiring patterns on the upper surface and the lower surface each are a wiring pattern having less moiré than the equal pitch wiring pattern.

(Summary of Characteristics of wiring Pattern of Embodiment of Present Invention and Method of Producing wiring Pattern)

The characteristics of the wiring pattern of the embodiment of the present invention will be summarized below, and the method of producing the wiring pattern of the conductive film of the embodiment of the present invention will be described.

To summarize the characteristics of the wiring pattern of the embodiment of the present invention, the wiring pattern of the embodiment of the present invention has the following characteristics.

A mesh-shaped wiring pattern in which straight line wirings in two or more directions are overlapped, or a mesh-shaped wiring pattern in which straight line wirings in one or more directions and non-straight line wirings (for example, curved lines or polygonal lines) in other one or more directions are overlapped.

Two or more wiring layers are provided.

For straight line wiring in at least one direction,

The predetermined number of consecutive wirings are repeatedly arranged on each wiring layer.

Among the predetermined number of wirings, at least two consecutive wirings are arranged in one layer.

Due to the characteristic, in the straight line wiring in at least one direction, as compared with the wiring pattern in the related art in which one wiring is alternately arranged on each wiring layer, the frequency distribution of the wiring pattern on each wiring layer, in which two or more wirings are consecutively arranged, can be made close to that of the wiring pattern in front observation in which the wirings are overlapped. As a result, it is possible to make the frequency distribution of the wiring pattern in oblique observation close to that of the wiring pattern in front observation in which the wiring patterns of the respective wiring layers are overlapped in various shift directions and by various shift amounts. Thus, occurrence of moiré in oblique observation can be reduced.

Although the description of FIGS. 29 and 30 and the examples of FIGS. 31 to 70 show the case where there are two wiring layers. However, it is easy to understand that the principle that two or more wiring layers can reduce occurrence of moiré in oblique observation is not limited to two layers.

First, assuming that there are n layers from the top to 1 . . . i . . . nth from the top and the thickness from the 1st to the i-th layer is d[i], the wiring pattern in oblique observation is a wiring pattern in which the respective wiring patterns on the first to n-th wiring layers are shifted by d[i]*sinθ*sin(φ-α) and overlapped. In this case, in a case where at least two or more consecutive wirings are arranged on each wiring layer so as to include equal pitch as at least a part of the overlapped wiring patterns, the frequency distribution of the wiring pattern on each wiring layer and that of the wiring pattern in front observation can be made closer to each other than the wiring patterns alternately arranged on each wiring layer. As a result, it is possible to make the frequency distribution of the wiring pattern in oblique observation close to that of the wiring pattern in front observation in which the wiring patterns of the respective wiring layers are shifted and overlapped by d[i]*sinθ*sin(φ-α). Thus, occurrence of moiré in oblique observation can be reduced.

The wiring pattern of the embodiment of the present invention also has the following characteristics.

In a straight line wiring in at least one direction, the sum of moiré components (moiré evaluation value) derived from the wiring pattern on each wiring layer, in which two or more wirings are consecutively arranged, and the luminance pattern of the pixel array is smaller than the sum of moiré components derived from the equal pitch wiring patterns having the same average pitches and the luminance pattern of the pixel array.

The characteristic means that, in the straight line wiring in at least one direction, the wiring pattern on each wiring layer is a wiring pattern having less moiré.

Here, the above-mentioned moiré component is a moiré component obtained by applying human eye's visual response characteristics. To act on the human eye's visual response characteristics means to multiply by the visual transfer function VTF (Dooley-Shaw expression) represented by Expression (1). The observation distance d in Expression (1) is any distance in the range of 100 mm to 1000 mm. Here, the observation distance is preferably 300 mm to 800 mm. However, in the example of the embodiment of the present invention, the observation distance was set to 500 mm.

Further, as the method of calculating the sum of moiré components, that is, the moiré evaluation value I, it is preferable to use Expression (2), which is proposed by Quick et al., as an approximation of the stochastic addition model in the past visual sense research.

$$I = (\Sigma (R[i])^x)^{1/x} \qquad (2)$$

Here, R[i] indicates the intensity of the i-th frequency component of the moiré, that is, each moiré component after VTF multiplication (refer to FIGS. 17, 23, 28, 45, 50, 55, 60, and 80). The order x is a certain value in the range of 1 to 4, which has been proposed as an order that fits well with the visual experiment results in the past visual sense research. As a typical order, the order x=2 presented by Quick is employed.

The wiring pattern of the embodiment of the present invention also has the following characteristics.

Regarding the straight line wiring in at least one direction, in the wiring pattern in front observation in which the wiring patterns of the respective wiring layers are overlapped, the repetitive pitches of the predetermined number of the thin metal wires are equal pitches, and the respective wiring pitches of the predetermined number of the thin metal wires are non-equal pitches.

In such a wiring pattern of the non-equal pitch wiring pattern straight line wiring, arranging two or more consecutive wirings on one layer is particularly effective in reducing occurrence of moiré in oblique observation (hereinafter, "the non-equal pitch wiring pattern straight line wiring" is also simply referred to as "non-equal pitch wiring pattern". Further, "the wiring pattern of the equal pitch straight line wiring" is also simply referred to as an "equal pitch wiring pattern").

Further, the non-equal pitch wiring pattern of the embodiment of the present invention also has the following characteristics.

The sum of the moiré components in the wiring pattern in front observation, in which the wiring patterns of the respective wiring layers are overlapped, is smaller than that in the equal pitch wiring pattern having the same average pitch.

Here, among the moiré components obtained by multiplying the VTF of Expression (1) by the moiré components derived from the wiring pattern and the luminance pattern of the pixel array, the component having the highest intensity is defined as the main moiré component, the main moiré component based on the non-equal pitch wiring pattern of the embodiment of the present invention is defined as a non-equal pitch main moiré component, and the main moiré component based on the equal pitch wiring pattern having the same average pitch is defined as an equal pitch main moiré component. With such definitions, the non-equal pitch wiring pattern of the embodiment of the present invention also has one of the following characteristics.

The intensity of the non-equal pitch main moiré component is smaller than that of the equal pitch main moiré component.

The frequency of the non-equal pitch main moiré component is higher than that of the equal pitch main moiré component.

The sum of moiré components in the frequency range equal to or less than the frequency of the equal pitch main moiré component is smaller than that of the equal pitch wiring pattern.

The intensity of moiré component at the frequency of the equal pitch main moiré component is smaller than that of the equal pitch wiring pattern.

Further, the frequency component of the wiring pattern that causes the main moiré component is defined as the main wiring frequency component, the main wiring frequency component of the non-equal pitch wiring pattern of the embodiment of the present invention is defined as the non-equal pitch main wiring frequency component, and the main wiring frequency component of the equal pitch wiring pattern having the same average pitch is defined as the equal pitch main wiring frequency component. With such definitions, the non-equal pitch wiring pattern of the embodiment of the present invention also has any of the following characteristics.

The intensity of the non-equal pitch main wiring frequency component is less than that of the equal pitch main wiring frequency component.

The intensity of the equal pitch main wiring frequency components is less than that in the equal pitch wiring pattern.

From the characteristic in which "the intensity at the frequency of the equal pitch main wiring frequency component is less than that of the equal pitch wiring pattern" in the non-equal pitch wiring pattern of the embodiment of the present invention, the characteristics relating to the pitch of the non-equal pitch wiring pattern of the embodiment of the present invention is also derived. FIG. 76 specifically describes an example of the wiring pattern in which the predetermined number of repetitive pitches are equal pitches, and the respective pitches of the predetermined number of wirings are non-equal pitches, in the non-equal pitch wiring pattern according to the embodiment of the present invention, that is, a wiring pattern in front observation. FIG. 12 specifically describes an example of the non-equal pitch wiring pattern according to the embodiment of the present invention and the equal pitch wiring pattern having the same average pitch.

Here, in the example shown in FIG. 76, the repetitive pitches of the two wirings are approximately equal, but for the sake of explanation, the repetitive pitches of the four wirings are regarded as the equal pitches. First, the frequency of the main wiring frequency component (equal pitch main wiring frequency component) of the wiring pattern of FIG. 12 is the frequency of the component indicated by the black arrow in FIG. 15. The component indicated by the black arrow in FIG. 15 is the fifth component counted from the side close to the frequency 0. Since the wiring pitch in FIG. 12 is 101 μm, the frequency of the first component in FIG. 15 is approximately 9.9 cycle/mm (=1000 μm/101 μm). The frequency mentioned herein represents the frequency in the wiring direction (the angle to the y direction is 26°). The frequency of the fifth component is 49.5 cycle/mm (=9.9 cycle/mm*5).

In the example shown in FIG. 76 of the embodiment of the present invention, the intensity at the frequency of 49.5 cycle/mm of this equal pitch main wiring frequency component (the intensity of the component indicated by the black arrow in FIG. 78) is small. From this, the characteristics relating to the wiring pitch are derived.

Figure 84:
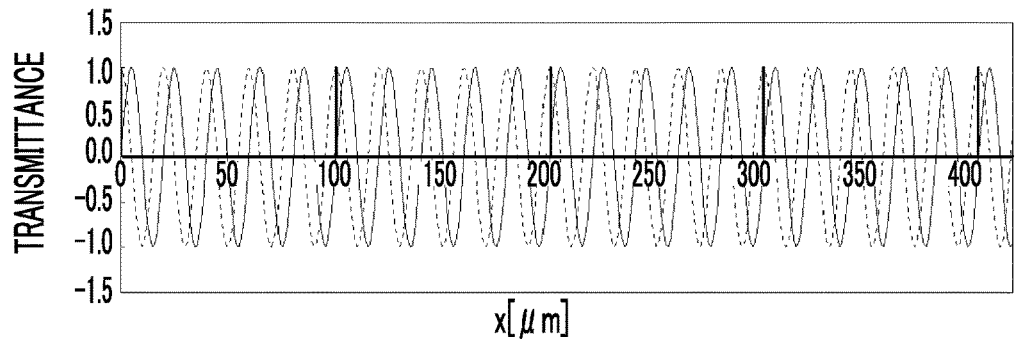
FIG. 84 is a graph showing a 1-dimensional profile of the transmittance pattern of the wiring shown in FIG. 12 and a cosine wave and a sine wave of a main wiring frequency component.
Figure 85:
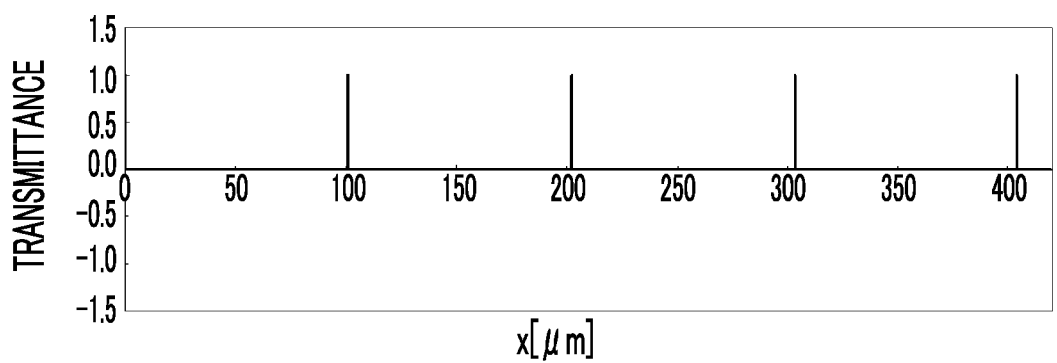
FIG. 85 is a graph showing a profile obtained by multiplying a 1-dimensional profile of the transmittance pattern of the wiring shown in FIG. 84 by a cosine wave.

The thick solid line in FIG. 84 is a 1-dimensional profile of a straight line wiring in one direction, that is, the straight line wiring 21*d* in the right direction or the straight line wiring 21*e* in the left direction, as viewed in the wiring direction, in the transmittance pattern of the wiring in FIG. 12. For the sake of explanation, in the profile of this thick solid line, the transmittances 1 and 0 are inverted, that is, the transmittance of a portion without wiring is set to 0 and the transmittance of a portion with wiring is set to 1. In addition, the width of the wiring is represented by an infinitesimal. Assuming that the position of the first wiring is 0 µm, it would appear that, from this wiring, there are second, third, fourth, and fifth wirings at positions 101 µm, 202 µm, 303 µm, and 404 µm at an equal pitch of 101 µm, respectively. FIG. 84 also shows a cos (cosine) wave (dotted line) and a sin (sine) wave (solid line) having a frequency of 49.5 cycle/mm of the main wiring frequency component (equal pitch main wiring frequency component). The values obtained by multiplying the transmittance profile in FIG. 84 by the cosine wave and the sine wave in FIG. 84 and performing integration therefor with respect to all positions correspond to the real part and the imaginary part of the main wiring frequency component, respectively. The square root of the sum of squares of the real part and the imaginary part is the intensity of the main wiring frequency component. It can be seen from FIG. 84 that all of the first to fifth wirings belong to the section where the cosine wave has a positive value. FIG. 85 shows a profile obtained by multiplying the transmittance profile of the wiring by a cosine wave. All the transmittances of the first to fifth wirings have positive values. It can be seen that the integral value of the transmittance of these wirings is the real part at the frequency of 49.5 cycle/mm of the main wiring frequency component, and this value is large. In addition, since the first to fifth wirings in FIG. 84 are all distributed around 0 in the sine wave, the value obtained by multiplying by the sine wave and performing integration therefor is small. That is, it can be seen that the imaginary part at the frequency of 49.5 cycle/mm is a value close to 0. That is, here, it can be seen that the intensity of the main wiring frequency component is determined by the real part and has a large value.

Figure 86:
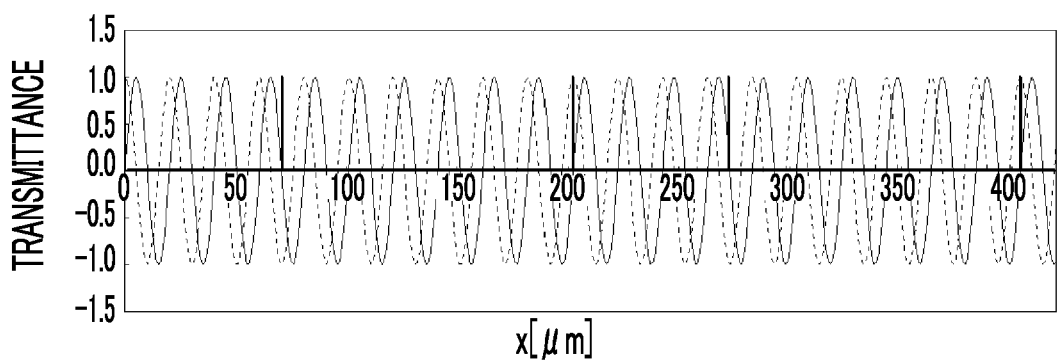
FIG. 86 is a graph showing a 1-dimensional profile of the transmittance pattern of the wiring shown in FIG. 76 and a cosine wave and a sine wave of an equal pitch main wiring frequency component.
Figure 87:
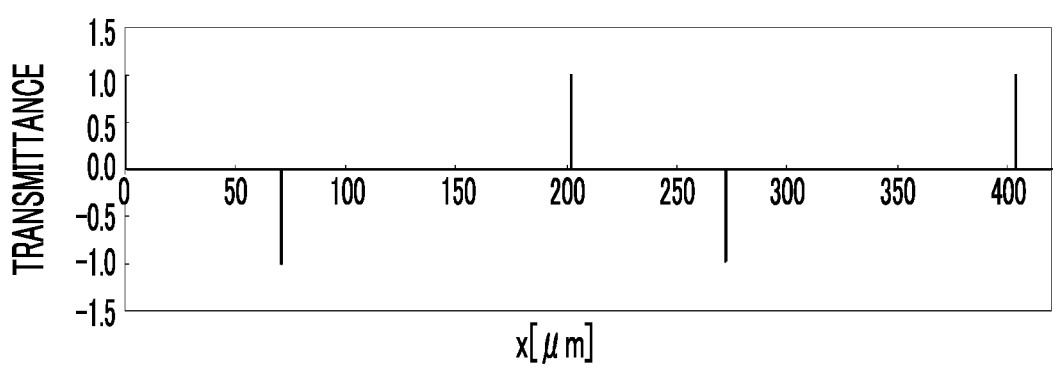
FIG. 87 is a graph showing a profile obtained by multiplying a 1-dimensional profile of the transmittance pattern of the wiring shown in FIG. 86 by a cosine wave.

Next, in FIG. 86, in the transmittance pattern of the wiring shown in FIG. 76, the thick solid line indicates the 1-dimensional profile by viewing, along the wiring direction, the straight line wiring in one direction, that is, the straight line wiring 21*l* in the right direction or the straight line wiring 21*m* in the left direction. FIG. 86 is different from FIG. 84 only in the transmittance profile, and is the same as FIG. 84 in other respects. In FIG. 86, assuming that the position of the first wiring is 0 µm, there are second, third and fourth wirings at positions 71 µm, 202 µm and 272 µm from this wiring, respectively. Here, since the repetitive pitches of the four wirings are equal pitches of 404 µm (=101 µm*4), the position of the fifth wiring is 404 µm. Further, since the four wirings are repeated at an equal pitch of 404 µm, all the frequency components forming this wiring pattern are repeated at a pitch of 404 µm. Thus, here, it suffices to focus on only the first to fourth wirings in the section of 404 µm (the fifth wiring is the repetition of the first wiring, the sixth wiring is the repetition of the second wiring, . . . ). It can be seen from FIG. 86 that the first and third wirings belong to the section where the cosine wave has a positive value, and the second and fourth wirings belong to the section where the cosine wave has a negative value. FIG. 86 shows a profile obtained by multiplying the transmittance profile of FIG. 87 by a cosine wave. It can be seen from FIG. 87 that the transmittances of the first and third wirings are positive values and the transmittances of the second and fourth wirings are negative values. From this, it can be seen that the real part at the frequency of 49.5 cycle/mm of the equal pitch main wiring frequency component obtained by integrating these values is a small value. Here, since the first to fourth wirings in FIG. 86 are all distributed around 0 of the sine wave, the value obtained by multiplying by the sine wave and performing integration therefor is small. That is, it can be seen that the imaginary part at the frequency of 49.5 cycle/mm is a value close to 0. That is, here, it can be seen that the intensity of the main wiring frequency component is determined by the real part and has a small value.

From the above description, the characteristics of the pitch of the non-equal wiring of the embodiment of the present invention are summarized. In the examples of FIGS. 84 to 87, in the case of the equal pitches belong to a section where the cosine wave of the frequency of the equal pitch main wiring frequency component in which all the pitches of the first, second, third, and fourth wirings from the first wiring are equal pitches has a positive value. On the other hand, in the case of the non-equal pitches of the embodiment of the present invention, the number of (first and third) non-equal pitches belonging to the section where the cosine wave has a positive value is equal to the number of (second and fourth) non-equal pitches belonging to a section where the cosine wave has a negative value. Here, in the example of FIGS. 84, all the four wirings may be wirings of which the pitches belong to the section where the cosine wave has a positive value but are not equal pitches and belong to the section where the cosine wave has a negative value in a case where the irregularity is provided to the pitches. In other words, the first wiring constantly belongs to the section in which the cosine wave has a positive value (since the pitch is 0), but the other wirings are made to be irregular. Thereby, each pitch thereof may change by an amount corresponding to a phase larger than ±π/2 from the pitch of the equal pitch wiring and may belong to the section where the cosine wave has a negative value.

However, even in a case where the pitches are simply made to be irregular, there is a bias in the number of wirings belonging to the positive value section in the cosine wave and the number of wirings belonging to the negative value section in the cosine wave. Therefore, as a result of multiplying by the cosine wave and performing integration therefor, there is a positive/negative bias in the transmittances of the wirings after the cosine wave multiplication, and the transmittances are not canceled sufficiently. As a result, the absolute value of the real part at the frequency of the equal pitch main wiring frequency component is a larger value than the absolute value thereof in the embodiment of the present invention.

That is, as in the embodiment of the present invention, in order to sufficiently reduce the intensity at the frequency of the equal pitch main wiring frequency component, it is necessary to optimize the pitch such that the number of wirings belonging to the positive value section in the cosine wave is approximately equal to the number of wirings belonging to the negative value section in the cosine wave. In the embodiment of the present invention, as a result of studying the optimization of the wiring pitch such that "the intensity at the frequency of the equal pitch main wiring frequency component is less than that of the equal pitch wiring pattern", a difference between the number belonging to the positive value section in the cosine wave and the number belonging to the negative value section in the cosine wave is ±1 or less.

On the other hand, even in a case where the number belonging to the positive value section in the cosine wave and the number belonging to the negative value section in the cosine wave are approximately set to be equal to each other, the intensity at the frequency of the equal pitch main wiring frequency component may not be made to be sufficiently small. That is, since the intensity at the frequency of the equal pitch main wiring frequency component is the square root of the sum of squares of the real part and the imaginary part, it is necessary to reduce not only the real part but also the imaginary part. That is, it is necessary for the number belonging to the positive value section and the number belonging to the negative value section in not only the cosine wave (corresponding to the real part) but also the sine wave (corresponding to the imaginary part) to be approximately equal. However, as in the examples of FIGS. 86 and 87, in a case where the pitch of each wiring is in the section having a small value around 0 in the sine wave, the contribution of the imaginary number to the intensity is small. Therefore, even in a case where there is a bias in the number belonging to the positive value section in the sine wave and the number belonging to the negative value section in the sine wave, the effect of increasing the intensity is small.

In summary, as in the embodiment of the present invention, in order to sufficiently reduce the intensity at the frequency of the equal pitch main wiring frequency component, it is necessary to make approximately equal (±1 or less) the number of wirings belonging to the positive value section and the number of wirings belonging to the negative value section in at least one wave (which has a larger contribution to the intensity) of the cosine wave or the sine wave of the frequency of the equal pitch main wiring frequency component.

In a case where the position of the first wiring is 0, a positive value section in the cosine wave is given by $(N-0.25)*T<x<(N+0.25)*T$, and a negative value section in the cosine wave is given by $(N+0.25)*T<x<(N+0.75)*T$. On the other hand, the positive value section of the sine wave is given by $N*T<x<(N+0.5)*T$, and the negative value section in the sine wave is $(N+0.5)*T<x<(N+1.0)*T$. Here, N represents an integer of 0, 1, . . . T represents the period of the equal pitch main wiring frequency component, and has a relationship of $1000/F$ (μm), where F (cycle/mm) is the frequency of the equal pitch main wiring frequency component.

Therefore, it can be said that the non-equal pitch wiring of the embodiment of the present invention has the following characteristics.

In a case where the predetermined number of wirings having non-equal pitches is n and each wiring is wiring 1, wiring 2, . . . , wiring n, the pitch p of each wiring with the wiring 1 set as the origin satisfies at least one of Condition 1 or 2.

Condition 1: The difference between the number of thin metal wires belonging to the section where the pitch p is $(N-0.25)*T<p<(N+0.25)*T$ and the number of thin metal wires belonging to the section where the pitch p is $(N+0.25)*T<p<(N+0.75)*T$ is equal to or less than 1.

Condition 2: The difference between the number of thin metal wires belonging to the section where the pitch p is $N*T<p<(N+0.5)*T$ and the number of thin metal wires belonging to the section where the pitch p is $(N+0.5)*T<p<(N+1.0)*T$ is equal to or less than 1.

Here, T is the period of the main wiring frequency component of the equal pitch wiring having the same average pitch, and is given by $1000/F$ (μm) ($1/F$ (mm)), where F (cycle/mm) is the frequency of the equal pitch main wiring frequency component. N is an integer of 0, 1, . . . , and is an integer of $(n*PA/T)$ or less where PA is the average pitch.

Condition 1 of the above characteristic indicates the characteristic that "the number of wirings belonging to the positive value section and the number of wirings belonging to the negative value section in the cosine wave are approximately equal".

Condition 2 of the above characteristic indicates the characteristic that "the number of wirings belonging to the positive value section and the number of wirings belonging to the negative value section in the sine wave are approximately equal".

In order to determine the above characteristics, in a case of counting the number of wirings belonging to the positive or negative value section in the cosine wave or the sine wave, each wiring located around 0 of the cosine wave or the sine wave should be removed since the wiring causes a counting error. Therefore, the above characteristics can be redefined as follows.

In the wiring pattern in front observation, in a case where the predetermined number of wirings having non-equal pitches is n and each wiring is wiring 1, wiring 2, . . . , wiring n, the pitch p of each wiring with the wiring 1 set as the origin satisfies at least one of Condition 1 or 2.

Condition 1: a difference between a number of thin metal wires where the pitch p belongs to an interval of $(N-d)*T<p<(N+d)*T$ and a number of thin metal wires where the pitch p belongs to an interval of $(N+0.5-d)*T<p<(N+0.5+d)*T$ is equal to or less than 1.

Condition 2: a difference between a number of thin metal wires where the pitch p belongs to an interval of $(N+0.25-d)*T<p<(N+0.25+d)*T$ and a number of thin metal wires where the pitch p belongs to an interval of $(N+0.75-d)*T<p<(N+0.75+d)*T$ is equal to or less than 1.

Here, T is the period of the main wiring frequency component of the equal pitch wiring having the same average pitch, and is given by $1000/F$ (μm) ($1/F$ (mm)), where F (cycle/mm) is the frequency of the equal pitch main wiring frequency component. That is, T is a period given by $1/F$, where F is the frequency of the frequency component of the equal pitch wiring pattern, which causes the frequency component of moiré that contributes most to the moiré in the equal pitch wiring pattern.

N is an integer of 0, 1, . . . (0 or a positive integer), and is an integer of $(n*PA/T)$ or less, where PA is the average pitch.

Further, d is a certain value in the range of 0.025 to 0.25.

The above d indicates the range of the section centered on the maximum or minimum position of the cosine wave or sine wave. In a case where d is 0.25, d indicates the entire range of the section where the cosine wave or sine wave has a positive value or a negative value. In a case where d is 0.025, d indicates a range of 1/10 of the section in which the cosine wave or sine wave has a positive value or a negative value. The smaller the value of d, the more only the wirings that make a large contribution to the magnitude of the real part or the imaginary part are counted.

As already described in the section "Principle of Moiré Reduction by Setting Predetermined Number of Pitches as Non-Equal Pitches", in the present invention, the wiring pattern in front observation is a wiring pattern in which "the predetermined number of the repetitive pitches are equal pitches and the respective pitches of the predetermined number of wirings are non-equal pitches". In this case, the wiring pattern in front observation is a wiring pattern overlapped at a pitch which is set such that frequency components causing moiré included in each sub-wiring pattern cancel each other out. Here, the sub-wiring pattern is each of wiring patterns from which only the first wiring, . . . , and n-th wiring are extracted, where the predetermined number of wirings having non-equal pitches is n.

That is, the largest moiré component visible to the human eye in a case where the sub-wiring pattern is overlapped on the pixel array pattern (the moiré component having the highest intensity after VTF multiplication) is defined as the sub-main moiré component. In a case where the frequency component of the sub-wiring pattern that causes the sub-main moiré component is defined as the sub-main wiring frequency component, the wiring in front observation has exactly the same characteristics as described above, where T is the period of the sub-main wiring frequency component.

In other words, the pitch of the wiring pattern in front observation is a pitch where the frequency components causing moiré included in the sub-wiring pattern cancel each other out. Therefore, at least the sub-main wiring frequency components causing the largest moiré are canceled with a pitch that satisfies the above characteristics. Here, since the frequency component of the sub-wiring pattern is present at a frequency that is n times finer while including the frequency of the frequency component of the equal pitch wiring pattern. Therefore, the sub-main wiring frequency component and the equal pitch main wiring frequency component do not necessarily coincide with each other.

Further, as already described in the section "Principle of Moiré Reduction by Setting Predetermined Number of Pitches as Non-Equal Pitches", focusing on the wiring pattern on each wiring layer in which two or more wirings are consecutively arranged according to the embodiment of the present invention, the wiring pattern on each wiring layer is practically a wiring pattern in which "the repetitive pitches of the predetermined number of wirings are equal pitches and the respective pitches of the predetermined number of wirings are non-equal pitches", and a wiring pattern having less moiré than the equal pitch wiring pattern. That is, the wiring pattern on each wiring layer according to the embodiment of the present invention has the same characteristics as the non-equal pitch wiring pattern according to the embodiment of the present invention described above. That is, the wiring pattern on each wiring layer in which two or more wirings are consecutively arranged has the following characteristics relating to the pitches.

In a case where the predetermined number of wirings having non-equal pitches on each wiring layer is n1 and each wiring is wiring 1, wiring 2, . . . , wiring n1, the pitch p of each wiring with the wiring 1, which is set as the origin, satisfies at least one of Condition 1 or 2, in the wiring pattern on each wiring layer.

Condition 1: a difference between a number of thin metal wires where the pitch p belongs to an interval of $(N-d)*T<p<(N+d)*T$ and a number of thin metal wires where the pitch p belongs to an interval of $(N+0.5-d)*T<p<(N+0.5+d)*T$ is equal to or less than 1.

Condition 2: a difference between a number of thin metal wires where the pitch p belongs to an interval of $(N+0.25-d)*T<p<(N+0.25+d)*T$ and a number of thin metal wires where the pitch p belongs to an interval of $(N+0.75-d)*T<p<(N+0.75+d)*T$ is equal to or less than 1.

Here, T is the period of the main wiring frequency component of the equal pitch wiring having the same average pitch on the wiring layer, and is given by $1000/F$ (μm) ($1/F$ (mm)), where F (cycle/mm) is the frequency of the main wiring frequency component of the equal pitch wiring.

N is an integer of 0, 1, . . . , and is an integer (0 or a positive integer) of $(n1*PA/T)$ or less where PA is the average pitch.

Further, d is a certain value in the range of 0.025 to 0.25.

Similarly, the wiring pattern on each wiring layer in which two or more wirings are consecutively arranged also has the following characteristics relating to the pitches.

In a case where the predetermined number of wirings having non-equal pitches on each wiring layer is n1 and each wiring is wiring 1, wiring 2, . . . , wiring n1, the pitch p of each wiring with the wiring 1, which is set as the origin, satisfies at least one of Condition 1 or 2, in the wiring pattern on each wiring layer.

Condition 1: a difference between a number of thin metal wires where the pitch p belongs to an interval of $(N-d)*T<p<(N+d)*T$ and a number of thin metal wires where the pitch p belongs to an interval of $(N+0.5-d)*T<p<(N+0.5+d)*T$ is equal to or less than 1.

Condition 2: a difference between a number of thin metal wires where the pitch p belongs to an interval of $(N+0.25-d)*T<p<(N+0.25+d)*T$ and a number of thin metal wires where the pitch p belongs to an interval of $(N+0.75-d)*T<p<(N+0.75+d)*T$ is equal to or less than 1, Here, T is a period of the main wiring frequency component (sub-main wiring frequency component) in the sub-wiring pattern being composed of only one of the wiring 1, the wiring 2, . . . , the wiring n1 on the wiring layer, and is given by $1000/F$ (μm) ($1/F$ (mm)), where F (cycle/mm) is a frequency of the main wiring frequency component of the sub-wiring pattern. That is, T is a period given by $1/F$ where F is the frequency of the frequency component of the sub-wiring pattern causing a frequency component of the moiré that contributes most to the moiré in the sub-wiring pattern being composed of only wirings of any of the wiring 1, the wiring 2, . . . , and the wiring n.

N is an integer of 0, 1, . . . , and is an integer (0 or a positive integer) of $(n1*PA/T)$ or less where PA is the average pitch.

Further, d is a certain value in the range of 0.025 to 0.25.

Further, in the non-equal pitch wiring pattern according to the embodiment of the present invention and/or the wiring pattern on each wiring layer according to the embodiment of the present invention, it is desirable that the predetermined number of wirings of non-equal pitch is 16 or less. This constraint is also a characteristic.

Hereinafter, an implementation method of deriving the wiring pattern of the embodiment of the present invention will be described.

The wiring pattern according to the embodiment of the present invention is a wiring pattern having less moiré in front observation. Further, the wiring pattern according to the embodiment of the present invention is a wiring pattern in which two or more wirings are consecutively arranged on each wiring layer and at least a part of the wiring pattern on each wiring layer has the same pitch as the wiring pattern in front observation such that the frequency distributions thereof are made to be close and which has less moiré as in the case of the front observed wiring pattern. As a result, the wiring pattern is characterized in that the wiring pattern in oblique observation has less moiré as in the case of the front observed wiring pattern.

A method of obtaining such a wiring pattern according to the embodiment of the present invention does not matter. A simple method therefor may be a method of searching for a wiring pattern having less moiré in front observation by trial and error and assigning two or more consecutive wirings to each wiring layer in a case where an optimal wiring pattern in front observation is obtained. The method of searching for the wiring pattern having less moiré in front observation may be a method of first deriving the frequency distribution of the pixel array pattern, then variously changing the wiring angle and wiring pitch so as to derive the frequency distribution of the wiring pattern and derive the frequency distribution of the moiré, and searching for a wiring pattern of an angle and a pitch with which the low-frequency moiré that is visible to the human eye is small.

In a case where a predetermined number of wirings have non-equal pitches, for example, the frequency distributions of the wiring and the moiré in a case of the equal pitch are derived. Thereafter, the pitches of the predetermined number of wirings are variously changed, and whether or not the moiré is reduced is evaluated as compared with the case of the equal pitch. In a case where the moiré is reduced, the selection may be repeated to obtain an optimum wiring pattern. Whether the moiré can be reduced in a case where the pitches are not equal can be determined as follows.

The main wiring frequency component having the largest moiré component with the pixel array pattern in the frequency distribution of the wiring pattern is specified, and it may be evaluated whether the component is small.

Alternatively, it may be evaluated whether various moiré components including the main moiré component having the highest intensity have been small in the low frequency range visible to the human eye, for example, in the frequency range of 5 cycle/mm or less.

Alternatively, in the moiré frequency distribution multiplied by VTF, it may be evaluated whether various moiré components including the main moiré component and visible to the human eye are small.

As described above, it is possible for a person to obtain the optimum wiring pattern by trial and error by deriving the wiring pattern or the moiré frequency distribution. At that time, focusing on the relationship between the cosine wave of the main wiring frequency component and the sine wave and the pitch, the pitch may be adjusted such that the number of wirings, of which the transmittances multiplied by the cosine wave or the sine wave are positive or negative, is equal. The relationship diagrams of the cosine wave, the sine wave, and the pitch can be created not only for the main wiring frequency component but also for various wiring frequency components that cause moiré.

Further, as described above, by setting the wiring pitches as non-equal pitches, a frequency component lower than that of the equal pitch wiring is generated. In this case, there is a concern that the wiring pattern may be visible. Therefore, regarding the low-frequency component generated by setting the wiring pitches as non-equal pitches, for example, in a case where the predetermined number is 4, also at ¼, 2/4, and ¾ of the minimum frequency of the original equal pitch wiring, the relationship diagrams of the cosine wave, the sine wave, and the pitch may be created. Among the frequency components of the wiring, regarding the frequency components that cause moiré and the low-frequency components that affect visibility of the wiring, the relationship diagrams of the cosine wave, the sine wave, and the pitch are created. Thereby, it is possible to adjust the pitch such that each frequency component is not large while looking at the diagrams.

Regarding the main wiring frequency component, it is desirable to adjust the pitch such that the number of wirings each having a positive or negative transmittance obtained by multiplying a cos wave or a sin wave by the main wiring frequency component is as uniform as possible. However, regardless of uniformization in the number of wirings each having a positive or negative transmittance obtained by multiplying a cosine wave or a sin wave by other frequency components having small contribution to the moiré and wiring visibility, the number may be reduced in a range in which an effect thereof is small.

As described above, a person first searches for a wiring pattern having less moiré in front observation by trial and error and assigns two or more consecutive wirings to each wiring layer in a case of obtaining an optimal wiring pattern in front observation. In such manner, it is possible to obtain the wiring pattern according to the embodiment of the present invention. On the other hand, it is also possible to automatically obtain a wiring pattern having less moiré in front observation. Further, in a case where the wiring pattern having less moiré is intended to be obtained by evaluating the moiré in oblique observation, the amount of processing increases and the process is complicated. Therefore, an automatic method for search is desirable. In the following implementation method, the automatic method will be described.

Hereinafter, the producing method of the wiring pattern of the conductive film of the embodiment of the present invention for obtaining an optimum wiring pattern automatically will be described. That is, the method of automatically optimizing the wiring pattern of the conductive film of the embodiment of the present invention will be described.

Figure 88:
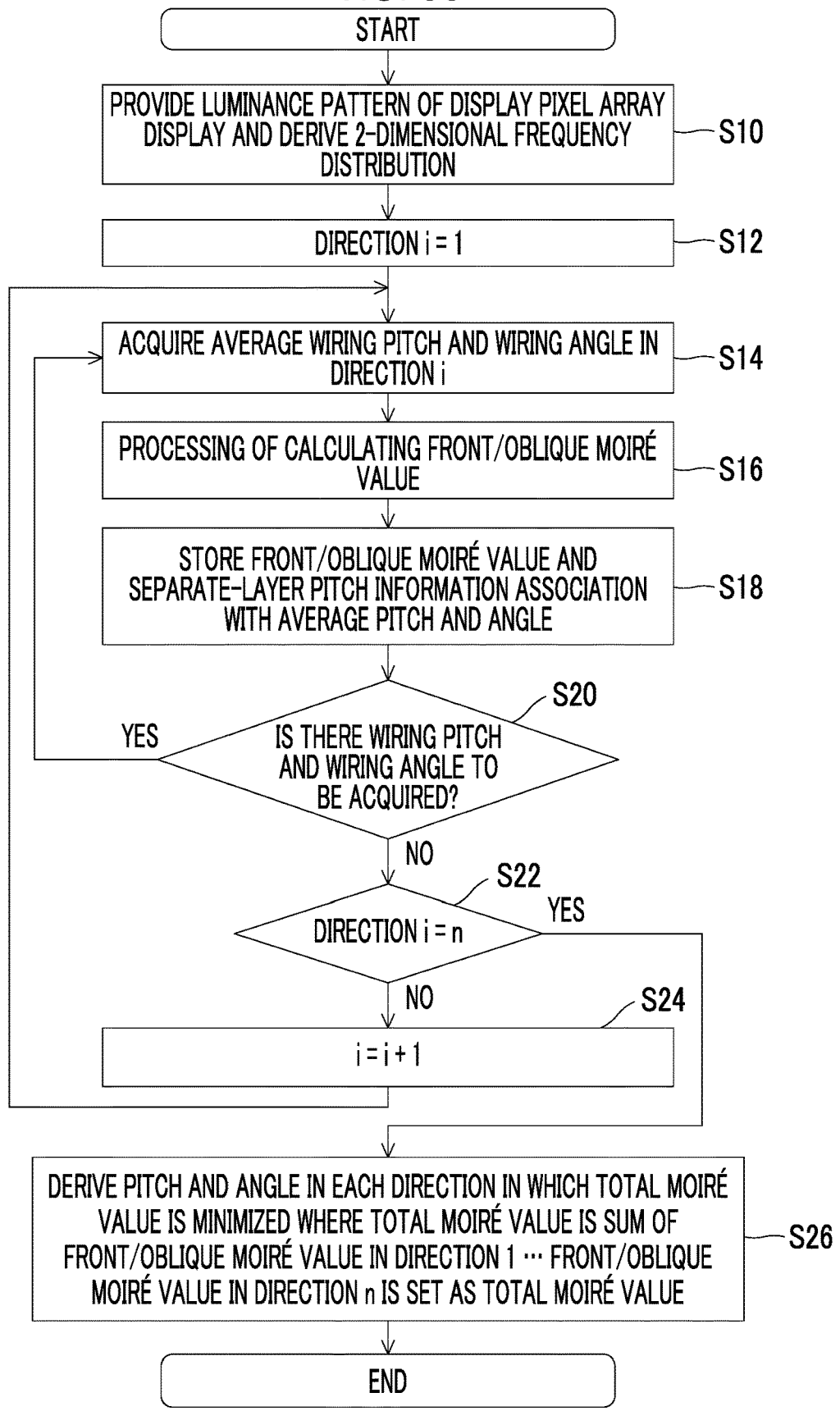
FIG. 88 is a flowchart showing an example of a method of producing a wiring pattern of a conductive film according to the embodiment of the present invention.

FIG. 88 shows a flow of a method of producing a wiring pattern of a conductive film of the embodiment of the present invention.

In addition, hereinafter, description will be given on the premise that the line wirings in all directions to be overlapped as the wiring pattern of the conductive film of the embodiment of the present invention are straight line wirings. However, the line wiring to be overlapped also may include a non-straight line wiring. In such a case, the wiring pattern may be created by deriving the pitch and the angle at which the total moiré value is the minimum for the straight line wiring in each direction excluding the non-straight line wiring in accordance with the flow of FIG. 88. In this case, it is possible to obtain at least an optimum wiring pattern having less moiré both in front observation and oblique observation for the straight line wiring in each direction excluding the non-straight line wiring.

First, in Step S10, the luminance pattern of the pixel array of the display is provided in advance. The luminance pattern of the pixel array may be image data captured by a microscope or the like, or may be created by performing convolution of the digital data of the pixel array pattern and an appropriate blurring function. The blurring function is preferably determined on the basis of the degree of blurring of the luminance pattern of the pixel array of the image captured by imaging the display.

In addition, as might expected, it is desirable that the luminance pattern of the pixel array provided herein reproduces the luminance pattern in a case where this pixel array actually emits light. In other words, in a case of using image data captured by a microscope or the like as the luminance pattern of the pixel array, or in a case of determining the blurring function of the luminance pattern of the pixel array from the image captured by the microscope, it is desirable that the effect of blurring caused by the imaging system such as the microscope is small. In other words, it is desirable to perform imaging through a system capable of capturing images sufficiently including and not reducing the high-frequency component of the luminance pattern in a case where this pixel array actually emits light. In a case where the high-frequency component of the luminance pattern of the pixel array is reduced due to blurring caused by the imaging system in the captured image, it is desirable that the image data that compensates for the reduction is used as the luminance pattern of the pixel array or the blurring function is determined from the compensated image data.

Further, in Step S10, the 2-dimensional frequency distribution may be derived in advance.

Next, in Step S12, the direction i is set to 1 (i=1).

Next, in Step S14, the average wiring pitch and angle in the direction i of the wiring pattern of the conductive film are acquired.

Next, in Step S16, the front or oblique (observed) moiré value of the wiring pattern is calculated by the method described below.

Next, in Step S18, the calculated front/oblique moiré value and separate-layer pitch information are stored in a memory or the like in association with the average wiring pitch and angle by the method described below. It should be noted that the separate-layer pitch information means information about a pitch of a predetermined number of thin metal lines forming a wiring pattern on each separate wiring layer.

Next, in Step S20, it is determined whether or not there is an average wiring pitch and angle in the direction i to be acquired.

In a case where there is an average wiring pitch and angle in the direction i to be acquired (YES), the processing returns to Step S14, the average wiring pitch and angle in the required direction i is acquired, and steps S14 to S20 are repeated. This loop means a loop in which the average wiring pitch and angle are variously changed.

On the other hand, in a case where there is no average wiring pitch and angle in the direction i to be acquired (NO), the processing proceeds to Step S22.

In Step S22, it is determined whether the direction i is n (i=n) (whether the direction i remains).

In a case where the direction i is not n (i≠n) (NO), the direction i is set to i+1 (i=i+1) in Step S24, the processing returns to Step S14, and steps S14 to S20 are repeated.

In a case where the direction i is n (i=n) (YES), the processing proceeds to Step S26.

Next, in Step S26, the sum of the front/oblique moiré value in the direction 1, the front/oblique moiré value in the direction 2, . . . , and the front/oblique moiré value in the direction n is set as the total moiré value (moiré evaluation value), and the pitch and angle in each direction i, in which the total moiré value is minimized, are derived.

Here, deriving the pitch and angle in each direction i means deriving the separate-layer pitch information together with the pitch and angle in each direction i.

Thus, the method of producing a wiring pattern of the conductive film of the embodiment of the present invention is completed.

Here, a linear sum may be used as a method of calculating the sum of front/oblique moiré values in the direction 1, the direction 2, . . . , and the direction n. That is, the sum may be calculated by the following expression.

Front/oblique moiré value in direction 1+front/oblique moiré value in direction 2+ . . . +front/oblique moiré value in direction n However, in a front/oblique moiré calculation processing, in a case where the moiré value is calculated by the stochastic addition described later, it is desirable that the sum thereof is also calculated by the stochastic addition. That is, it is desirable to calculate the sum by the following expression.

(Front/oblique moiré value$^X$ in direction 1+front/oblique moiré value$^X$ in direction 2++ . . . +front/oblique moiré value$^X$ in direction n)$^{1/X}$ Here, the order x is set to the same value as the order of stochastic addition in the front/oblique moiré value calculation processing.

Further, in a case where it is desirable to simply derive the combination having the minimum front/oblique moiré value in the combination of the wiring pitches and angles in all the directions of direction 1, . . . , and direction n, the wiring pitch and the angle (and separate-layer pitch information), at which the front/oblique moiré value is the minimum in each loop in direction 1, . . . , and direction n, may be simply derived (it is not necessary for the front/oblique moiré value to be stored in association with the wiring pitch and the angle). However, in a case where it is necessary to limit the wiring pitch and the angle to only the combination that satisfies a certain condition, as shown in FIG. 88, the front/oblique moiré value is temporarily stored in association with the wiring pitch and the angle in each direction, and the wiring pitch and the angle is limited to only the combination satisfying the condition among the combinations of the wiring pitch and the angle in each direction at the last. With such a limitation, the combination having the minimum total moiré value is derived. For example, in a case where it is desirable to limit the number of wirings per unit area from the viewpoint of wiring transmittance, assuming that the average pitch of wirings in the direction 1 is p1, the average pitch of wirings in the direction 2 is p2, . . . , and the average pitch of wirings in the direction n is pn, a total moiré value is calculated with a limitation using only a combination in which 1/p1+1/p2+ . . . +1/pn is equal to or less than a predetermined value. Thereby, a combination in which the total moiré value is the minimum is derived.

Further, the angular range in the direction 1, the direction 2, . . . , and the direction n is set to 0 to 180° (the angle formed with the x direction) such that the respective angular ranges do not overlap (do not include the same direction). In a case where there are four directions, for example, the angular range in the direction 1 is set to 0° or more and less than 45°, the angular range in the direction 2 is set to 45° or more and less than 90°, the angular range in the direction 3 is set to 90° or more and 135° or less, and the angular range in the direction 4 is set to more than 135° and 180° or less. In a case where there are two directions, the angular range in the direction 1 is set to 0° or more and less than 90°, and the angular range in the direction 2 is set to 90° or more and 180° or less. Here, in a case where the pixel array pattern is bilaterally symmetric as shown in FIG. 11, the 2-dimensional frequency distribution of the pixel array pattern is also bilaterally symmetric as shown in FIG. 14. Thus, in a case where the front/oblique moiré value at the bilateral symmetry angle and the separate-layer pitch information have already been derived, the information may be diverted to the other bilateral symmetry angle. For example, in a case where there are two directions, the front/oblique moiré value and the separate-layer pitch information are derived for each angle and the average pitch of the angular range of 0 degree or more and less than 90° in the direction 1, and thereafter the information may be diverted to a symmetry angle in an angular range of more than 90° and 180° or less in the direction 2.

Further, in a case where it is desirable to simply derive the combination having the minimum front/oblique moiré value in the combination of the wiring pitch and the angle in all the direction 1, the direction 2, . . . , and the direction n (in a case where it is not necessary to limit the combination on a certain condition about the wiring pitch, the angle, and the separate-layer pitch information), the angular range in the direction 1, the direction 2, . . . , and the direction n may be bilaterally symmetric. In this case, the wiring pitch, the angle, and the separate-layer pitch information by which the front/oblique moiré value is the minimum in the bilaterally symmetric direction are derived. Then, the information may be diverted to the other bilaterally symmetric direction (the angle is converted to a bilateral symmetry angle). For example, in the case of two directions, the wiring pitch, the angle, and the separate-layer pitch information by which the front/oblique moiré value is the minimum in the angular range of 0 degree or more and less than 90° in the direction 1 are derived, and then the wiring pitch, the angle (bilateral symmetry angle), and the separate-layer pitch information is a wiring pitch, an angle, and separate-layer pitch information by which the front/oblique moiré value is the minimum even in the angular range of more than 90° and 180° or less in the direction 2.

Although it takes a long time to search, the angular range of 0 to 180° in all of the direction 1, the direction 2, . . . , and the direction n may be searched for (the angular range to be searched for in each direction may be widened and overlap each other). By allowing overlapping in such a manner and searching for a wide angular range, it is possible to reduce the moiré value as compared to avoiding overlapping. The reason for this is that there may be a plurality of angles in which the front/oblique moiré value is small in a specific angular range. For example, in the angular range of 0 to 180°, in a case where there is an angle with the smallest front/oblique moiré value in the angular range of 0° or more and less than 45° and there is also an angle with the second smallest front/oblique moiré value, the angle of the wiring pattern in the direction 1 is set to an angle having the smallest front/oblique moiré value in the angular range of 0 degree or more and less than 45°, and the angle of the wiring pattern in the direction 2 is set to an angle having the second smallest front/oblique moiré value in the angular range of 0 degree or more and less than 45°. In such a manner, it is possible to reduce the front/oblique moiré value as compared with the case where the angle of the wiring pattern in the direction 2 is searched for in an angular range different from the angular range of 0 degree or more and less than 45°. However, in the case of allowing overlapping in such a manner and searching in a wide angular range, finally, it is necessary to pay attention such that the angles of the direction 1, the direction 2, . . . , and the direction n are not the same in a case where a combination of the wiring pitches, the angles, and the separate-layer pitch information pieces in the direction 1, the direction 2, . . . , and the direction n in which the total moiré value is the minimum is derived.

Further, among the direction 1, the direction 2, . . . , and the direction n, the direction in which the wiring pitch, the angle, and the separate-layer pitch information are changed may be limited. In a case where there are four directions, for example, the angle in the direction 2 is fixed to 67.5°, the angle in the direction 3 is fixed to 112.5°, and the wiring pitches and the separate-layer pitch information pieces in both the directions 2 and 3 are fixed to predetermined values, and the wiring pitches, the angles, and the separate-layer pitch information pieces only in the directions 1 and 4 are changed, thereby deriving the combination in which the front/oblique moiré value is the minimum.

In the following description, two types of implementation methods will be described for the calculation processing of the front/oblique moiré value (Step S16 in FIG. 88).

(Implementation Method 1 of Front/Oblique Moiré Value Calculation Processing)

Figure 89:
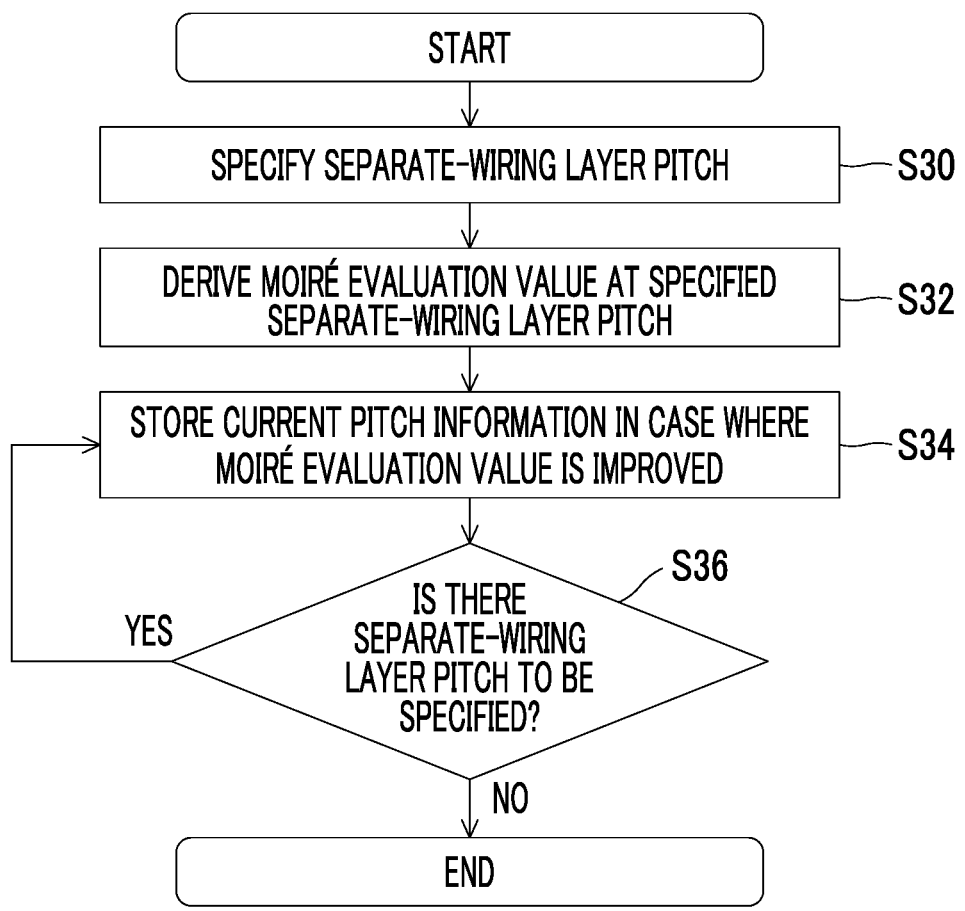
FIG. 89 is a flowchart showing an example of a front/oblique moiré value calculation processing method according to the embodiment of the present invention.

FIG. 89 shows a flow of the method 1 of executing the front/oblique moiré value calculation processing in the embodiment of the present invention.

In this method, information about a predetermined number of the separate-wiring layer pitches is provided in advance, and all the pitches are evaluated. It should be noted that the information about a predetermined number of the separate-wiring layer pitches means a pitch of a predetermined number of thin metal wirings forming a wiring pattern on each separate wiring layer.

First, the information about the predetermined number of the separate-wiring layer pitches is provided in advance, and the information about the predetermined number of the separate-wiring layer pitches is acquired and specified in Step S30.

Next, in Step S32, the moiré evaluation value is derived at the specified separate-wiring layer pitch.

Specifically, first, the transmittance pattern of the wiring is created at the specified separate-wiring layer pitch, and the 2-dimensional frequency distribution is derived. Next, the moiré component is derived using the 2-dimensional frequency distribution of the pixel array pattern and the 2-dimensional frequency distribution of the wiring pattern. Next, a moiré evaluation value is derived from the moiré component.

Next, in Step S34, in a case where the moiré evaluation value is improved from the stored moiré evaluation value, the improved pitch information is stored.

Next, in Step S36, in the information about the predetermined number of the separate-wiring layer pitches provided in advance, in a case where the information about the predetermined number of the separate-wiring layer pitches at which the moiré evaluation values are not obtained remains and there is information about the predetermined number of the separate-wiring layer pitches to be specified (YES), the processing returns to Step S30, and steps S30 to S34 are repeated.

On the other hand, in a case where there is no information about the predetermined number of the separate-wiring layer pitches to be specified (NO), the method 1 for executing the front/oblique moiré value calculation processing ends.

As described above, the wiring pattern according to the embodiment of the present invention is a wiring pattern in which the wiring pattern in front observation has less moiré. In addition, at least a part of the wiring pattern on each wiring layer has the same pitch as the wiring pattern in front observation such that the frequency distributions thereof are made to be close and has less moiré as in the case of the front observed wiring pattern. As a result, the wiring pattern in oblique observation also has less moiré as in the case of the front observed wiring pattern. The following three methods will be described herein as Implementation Method 1 of the front/oblique moiré value calculation processing for obtaining such a wiring pattern.

1. Method of deriving only moiré values in front observation
2. Method of deriving a moiré value for each wiring layer
3. Method of deriving moiré values in front observation and oblique observation In addition, as briefly described, the front/oblique moiré value calculation processing methods are different between the case of an equal pitch wiring pattern shown in FIG. 41 and the case of a predetermined number (4 in FIG. 56) of wiring patterns having non-equal pitches shown in FIG. 56. Each of these methods will be described.

It should be noted that "the equal pitch wiring pattern" described below means a wiring pattern having an equal pitch in front observation, and "the wiring pattern having the predetermined number of non-equal pitches" means a wiring pattern having a predetermined number of non-equal pitches in front observation. That is, the wiring pattern of FIG. 41 described in the outline is "the equal pitch wiring pattern" since the wiring pattern is a wiring pattern shown in FIG. 19 in front observation, and the wiring pattern of FIG. 56 is "the wiring pattern having the predetermined number (4 in FIG. 46) of non-equal pitches" since the wiring pattern is a wiring pattern shown in FIG. 46 in front observation.

(Case of Equal Pitch Wiring Pattern)

1. Method of Deriving Only moiré Values in Front Observation

The processing of Implementation Method 1 shown in FIG. 89 is unnecessary. In FIG. 88, the moiré value in front observation may be derived for each wiring pitch and angle. That is, for the wiring pitch and angle in the direction i acquired in Step S14 of FIG. 88, a moiré value in front observation is calculated in Step S16, and the calculated moiré value in front observation may be stored in the memory or the like in association with the wiring pitch and angle in Step S18. It is not necessary to store the separate-layer pitch information in Step S18 of FIG. 88. Also in Step S26, the pitch and angle in each direction i that minimizes the total moiré value may be derived, and the derivation of the separate-layer pitch information is not necessary. However, at the end of the flow in FIG. 88, it is necessary for two or more of the predetermined number of wirings in each direction to be assigned to be consecutively arranged on each wiring layer. For example, in a case where the number of wiring layers is two and the predetermined number is four, four wirings may be assigned such that two wiring layers are consecutively arranged on each of the wiring layer 1 and the wiring layer 2.

The method of deriving the moiré value is as described above, but will be briefly described.

First, a transmittance pattern in front observation of the wiring is created at a specified wiring pitch and angle, and a 2-dimensional frequency distribution is derived. Next, the moiré component in front observation is derived from the 2-dimensional frequency distribution of the pixel array and the 2-dimensional frequency distribution of the wiring. Finally, after each moiré component is multiplied by VTF, the sum is calculated to be set as a moiré value in front observation.

Here, a method of deriving the sum of the intensities of the respective moiré components after VTF multiplication will be described later.

2. Method of Deriving a moiré Value for Each Wiring Layer

Information about a predetermined number of the separate-wiring layer pitches is provided in advance, and all the pitches are evaluated. Here, in the flow of FIG. 88, the average wiring pitch is changed variously. In order to be able to reuse the same separate-wiring layer pitch information for each average wiring pitch, it is preferable to provide the separate-wiring layer pitch information as information about the ratios of the non-equal pitches to the average pitch. For example, in a case where the number of wiring layers is two and the predetermined number is four, the following information is used. The information about a predetermined number of the separate-wiring layer pitches means a pitch of a predetermined number of thin metal wirings forming a wiring pattern on each separate wiring layer.

TABLE 1

|  | Wiring 1 Wiring layer 1 | Wiring 2 Wiring layer 2 | Wiring 3 Wiring layer 1 | Wiring 4 Wiring layer 2 |
| --- | --- | --- | --- | --- |
| Separate-wiring layer pitch 1 | 0 | 1 | 2 | 3 |
| Separate-wiring layer pitch 2 | 0 | 1 | 3 | 2 |
| Separate-wiring layer pitch 3 | 0 | 2 | 1 | 3 |
| Separate-wiring layer pitch 4 | 0 | 2 | 3 | 1 |

Table 1 described above is information about the pitches of the four wirings from the first wiring. The wirings 1 and 3 are wirings arranged on the wiring layer 1, and the wirings 2 and 4 are wirings arranged on the wiring layer 2. The separate-wiring layer pitches 1 to 4 are formed of information about combinations of pitches of the wirings 1 to 4. Each pitch is a ratio to the average pitch, and the pitch of each wiring can be obtained by multiplying the pitch of this ratio by the average pitch. For example, in a case where the average pitch is 200 μm, the separate-wiring layer pitch 1 indicates a combination of pitches of 0 μm for wiring 1, 200 μm for wiring 2, 400 μm for wiring 3, and 600 μm for wiring 4. As described above, by providing the pitches as the ratio information, the pitch information can be reused for an optional average pitch. Here, since the wiring pattern in front observation has an equal pitch, in Table 1, only an integer value can be taken for the pitch of each wiring, and each value of pitches 0, 1, 2, and 3 can be taken for each of wirings 1 to 4, but there is no repetition in the pitches. Since the four wirings are repeated at an equal pitch, for example, the pitch of the wiring 1 is 0, 4, 8, . . . .

The separate-wiring layer pitch 1 is a pitch combination of the wirings 1 to 4 of the wiring pattern in the related art, that is, a pitch combination in a case where wirings are alternately arranged on each wiring layer. On the other hand, the separate-wiring layer pitches 2 to 4 each are a pitch combination in which two wiring layers are consecutively arranged on each of the wiring layer 1 and the wiring layer 2. Since the separate-wiring layer pitches 2 to 4 are all substantially the same wiring pattern (a relationship in which the pitches of the wiring 1 to the wiring 4 are entirely shifted), moiré at only the separate-wiring layer pitch 2 may be evaluated (the same result is obtained even in a case where other combinations are evaluated).

In the present invention, the number of wiring layers and the predetermined number of repetitions in wiring arrangement in each wiring layer are optional. For example, in a case where there are four wiring layers and the predetermined number is 12, the separate-wiring layer pitch information is as shown in Table 2 below. In Table 2, the separate-wiring layer pitch 1 shows a pitch combination of wiring patterns in the related art.

TABLE 2

|  | Wiring 1 Wiring layer 1 | Wiring 2 Wiring layer 2 | Wiring 3 Wiring layer 3 | Wiring 4 Wiring layer 4 | Wiring 5 Wiring layer 1 | Wiring 6 Wiring layer 2 |
|---|---|---|---|---|---|---|
| Separate-wiring layer pitch1 | 0 | 1 | 2 | 3 | 4 | 5 |
| Separate-wiring layer pitch2 | 0 | 1 | 2 | 3 | 4 | 5 |
|  | . . . |  |  |  |  |  |
|  | Wiring 7 Wiring layer 3 | Wiring 8 Wiring layer 4 | Wiring 9 Wiring layer 1 | Wiring 10 Wiring layer 2 | Wiring 11 Wiring layer 3 | Wiring 12 Wiring layer 4 |
| Separate-wiring layer pitch 1 | 6 | 7 | 8 | 9 | 10 | 11 |
| Separate-wiring layer pitch 2 | 6 | 7 | 8 | 9 | 11 | 10 |
|  | . . . |  |  |  |  |  |

In the following description of the embodiments, in order to simplify the description together with the description of the outline, an example will be described in which the number of wiring layers is two and the predetermined number is four (however, in a case where the wiring layer and the predetermined number are different therefrom, other examples will be described as description is necessary).

For the combination of the separate-wiring layer pitch, the moiré evaluation value is calculated as follows. In a case of the separate-wiring layer pitch 2 in Table 1, the wiring 1 and the wiring 3 are arranged on the wiring layer 1 at pitches (ratios) of 0, 3, 4, 7, 8, . . . , and the wiring 2 and the wiring 4 are arranged at pitches (ratios) of 1, 2, 5, 6, . . . . For example, in a case where the average pitch is 200 µm, the wiring 1 and the wiring 3 are arranged at the pitches of 0 µm, 600 µm, 800 µm, 1400 µm, 1600 µm, . . . on the wiring layer 1, and the wiring 2 and the wiring 4 are arranged at the pitches of 200 µm, 400 µm, 1000 µm, 1200 µm, . . . on the wiring layer 2.

In this way, the transmittance patterns of the wiring layer 1 and the wiring layer 2 in which the wirings are arranged are respectively created, and the 2-dimensional frequency distribution is derived. Then, a moiré component is derived from each of the 2-dimensional frequency distribution of the pixel array pattern and the 2-dimensional frequency distribution of the wiring pattern, each moiré component is multiplied by VTF, and then the sum thereof is calculated. As a result, the sum is set as the moiré evaluation value of each of the wiring layer 1 and the wiring layer 2. Then, the larger value of the moiré evaluation values of the wiring layer 1 and the wiring layer 2 or the total value is set as the moiré evaluation value of the separate-wiring layer pitch 2. Similarly, a moiré evaluation value is calculated for each combination of separate-wiring layer pitches, and the separate-wiring layer pitch having the smallest moiré evaluation value is stored as the front/oblique moiré value and the separate-layer pitch information associated with the average pitch and the angle in FIG. 88.

3. Method of Deriving moiré Values in Front Observation and Oblique Observation

The method is substantially the same as "2. Method of Deriving Moiré Value of Each Wiring Layer", but the method of calculating the moiré evaluation value is different therefrom. For example, in the case of the separate-wiring layer pitch 2 in Table 1 and the average pitch of 200 µm, the wiring 1 and the wiring 3 are arranged at pitches of 0 µm, 600 µm, 800 µm, 1400 µm, 1600 µm, . . . on the wiring layer 1, and the wiring 2 and the wiring 4 are arranged at the pitches of 200 µm, 400 µm, 1000 µm, 1200 µm, . . . on the wiring layer 2. Thereafter, the pitches are shifted under the assumption of oblique observation, for only the wiring 2 and the wiring 4 on the wiring layer 2. Then, a transmittance pattern in which the wirings (wirings 1 and 3) of the wiring layer 1 and the wirings (wirings 2 and 4) of the wiring layer 2 are overlapped is created, and the 2-dimensional frequency distribution is derived.

Then, a moiré component is derived from the 2-dimensional frequency distribution of the pixel array pattern and the 2-dimensional frequency distribution of the wiring pattern, each moiré component is multiplied by VTF, and then the sum is calculated and set as a moiré evaluation value under assumption of oblique observation. Here, since the wiring layer 1 corresponds to the upper surface of FIG. 30 and the wiring layer 2 corresponds to the lower surface, the pitches are shifted for only the wiring layer 2. The shift amount is given by $d*\sin\theta*\sin(\varphi+\alpha)$ or $d*\sin\theta*\sin(\varphi-\alpha)$ from the description of FIGS. 29 and 30. Here, d is the distance from the wiring layer 1 to the wiring layer 2, that is, the thickness of the transparent substrate interposed between the wiring layer 1 and the wiring layer 2, and $\theta$ and $\varphi$ are angles in the observation direction as shown in FIG. 29. Here, the obliquely observed wiring patterns, that is, the transmittance patterns in which the wirings of the wiring layer 1 and the wiring layer 2 are overlapped are different depending on $\theta$ and $\varphi$, and the moiré evaluation values thereof are also different.

Therefore, the moiré evaluation values are calculated for various $\theta$ and $\varphi$, and the maximum value (the evaluation value indicating that the moiré is the largest) is set as the moiré evaluation value in oblique observation of the separate-wiring layer pitch 2. Then, as a moiré evaluation value in front observation ($\theta=0°$), a transmittance pattern in which the wirings of the wiring layer 1 and the wiring layer 2 are overlapped without being shifted is created, and the moiré evaluation value thereof is calculated. The larger value of the moiré evaluation values in oblique observation and front observation (the value in more moiré) is taken as the moiré evaluation value for the separate-wiring layer pitch 2.

Assuming that $\theta$ is, for example, 30° and 60° and $\varphi$ is, for example, 0°, +45°, −45°, +90°, −90°, +135°, −135°, +180°, the moiré evaluation values are calculated for all the combinations of $\theta$ and $\varphi$. The maximum value thereof is set as the moiré evaluation value in oblique observation. Similarly, the moiré evaluation value is calculated for each combination of the separate-wiring layer pitches. In the combinations of separate-wiring layer pitches, the moiré value in a case where the moiré evaluation value is the smallest is stored as the front/oblique moiré value associated with the average pitch and angle in FIG. 88, and the separate-wiring layer pitch is stored as separate-layer pitch information.

It should be noted that the moiré evaluation value in oblique observation can be calculated regardless of the number of wiring layers in two or more layers. That is, in a case where the wiring of the wiring layer i is observed from the directions of $\theta$ and $\varphi$, the shift amount of the wiring layer i with respect to the wiring layer 1 is $d*\sin\theta*\sin(\varphi+\alpha)$ or $d*\sin\theta*\sin(\varphi-\alpha)$, where d is the distance from the wiring layer 1 to the wiring layer i. Therefore, each wiring layer is shifted by the shift amount $d*\sin\theta*\sin(\varphi+\alpha)$ or $d*\sin\theta*\sin$ (φ-α) corresponding to that wiring layer, and the wiring layers are overlapped. In such a manner, the obliquely observed wiring pattern can be created, and the moiré evaluation value can be calculated.

(Case of Wiring Pattern Having Predetermined Number of Non-Equal Pitches)

1. Method of Deriving Only moiré Values in Front Observation

In the flow shown in FIG. 89, information about the separate-wiring layer pitches of the predetermined number of non-equal pitches is provided in advance, and all moirés in front observation for those pitches are evaluated. The information about non-equal pitches is easily obtained through a method of giving random numbers in a predetermined range to the equal pitches. As described above, in order to be able to reuse the same separate-wiring layer pitch information for each average wiring pitch, it is preferable to provide the separate-wiring layer pitch information as information about the ratios of the non-equal pitches to the average pitch. Here, in a case where the number of wiring layers is two and the predetermined number is four, the following information is used.

TABLE 3

|  | Wiring 1 Wiring layer 1 | Wiring 2 Wiring layer 2 | Wiring 3 Wiring layer 1 | Wiring 4 Wiring layer 2 |
| --- | --- | --- | --- | --- |
| Separate-wiring layer pitch 1 | −0.05515447 | 1.009144324 | 2.087233728 | 3.073827362 |
| Separate-wiring layer pitch 2 | 0.048012206 | 0.980814732 | 1.931622256 | 3.008651204 |
| Separate-wiring layer pitch 3 | 0.043818677 | 0.915255691 | 1.956276096 | 2.940351965 |

The separate-wiring layer pitches in Table 3 are pitch information in which random numbers in the range of −0.1 to +0.1 are respectively given to the pitches of 0, 1, 2, and 3 in the case of the equal pitches of the four wirings from the first wiring. The greater the number of combinations of the separate-wiring layer pitches, the more moiré can be evaluated in non-equal pitch combinations, and the higher the probability of finding a pitch combination with smaller moiré (however, the search time is longer). The separate-wiring layer pitch 1 in Table 3 can be multiplied by, for example, an average pitch of 200 μm. Thereby, it is possible to obtain a non-equal pitch combination of "−11 μm, 202 μm, 417 μm, and 615 μm".

In the method of deriving only the moiré value in front observation, only the information about the pitches of the predetermined number of wirings is necessary in the flow shown in FIG. 89, and the information about the wiring layer in which the respective wirings are arranged is unnecessary. For example, in the case of Table 3, only the information about the pitches of the four wirings is necessary to derive the moiré value in front observation, and the information about the wiring layer in which each wiring is arranged (the wiring 1 and the wiring 3 are Information indicating that the wiring layer 1, the wiring 2, and the wiring 4 are arranged on the wiring layer 2) is unnecessary. Then, at the end of the flow shown in FIG. 88, each of the predetermined number of wirings is reassigned such that two or more wirings are consecutively arranged on each wiring layer. That is, in the method of deriving only the moiré value in front observation, first, in accordance with the flow shown in FIG. 89, a combination of the pitches of the predetermined number of wirings that reduce moiré in front observation is obtained. Then, at the end of the flow shown in FIG. 88, by assigning each of the number of wirings such that two or more wirings are consecutively arranged on each wiring layer, it is possible to obtain a wiring pattern in which moiré is reduced even in oblique observation.

2. Method of Deriving a moiré Value for Each Wiring Layer

The method is the same as the method of deriving the moiré value of each wiring layer in the case of an equal pitch wiring pattern. However, in the case of an equal pitch wiring pattern, the pitch of each wiring could take only an integer value in separate-wiring layer pitch information, but in the case of non-equal pitch, in the pitch information, random numbers in a range wider than −0.5 to +0.5 are respectively given to the pitches in the case of equal pitches from the first wiring of the wirings. By assigning random numbers in a range wider than −0.5 to +0.5 to the respective wiring pitches, moiré evaluation at the wiring pitches including combinations in which the pitches of the wirings are reversed can be performed. Reversal of the pitches of the wirings means that two or more wirings are consecutively arranged on each wiring layer.

The wider the range of assigned random numbers, the more combinations of consecutive arrangements are included therein. For example, in a case where the range of random numbers exceeds the range of −1.0 to +1.0, three combinations of the consecutive arrangement is included therein. The range of random numbers to be given depends on the upper limit of consecutive arrangement for ensuring the touch sensor function and/or the efficiency of search (the wider the range of random numbers, the more sparse the pitch values and the less efficient the search). In a case where the number of wiring layers is two and the predetermined number is four, for example, the following information is used. The separate-wiring layer pitches in Table 4 are pitch information in which random numbers in the range of −2.0 to +2.0 are respectively given to the pitches of 0, 1, 2, and 3 in the case of the equal pitches of the four wirings from the first wiring. In Table 4, in a case where the pitch has a negative value, a positive value obtained by adding 4 to the pitch is used. In a case where the pitch exceeds 4, a value obtained by subtracting 4 from the pitch is used.

TABLE 4

|  | Wiring 1 Wiring layer 1 | Wiring 2 Wiring layer 2 | Wiring 3 Wiring layer 1 | Wiring 4 Wiring layer 2 |
| --- | --- | --- | --- | --- |
| Separate-wiring layer pitch 1 | 0.157414472 | 0.848323008 | 0.569353313 | 1.941312906 |
| Separate-wiring layer pitch 2 | 1.448957793 | 2.118625446 | 0.838404492 | 0.374614704 |
| Separate-wiring layer pitch 3 | 1.987182226 | 1.445997497 | 3.99877926 | 2.569750053 |

As shown in Table 4, in a case where a combination in which the separate-wiring layer pitch is reversed is included, it is possible to obtain a combination that gives a favorable moiré evaluation value by comprehensively searching for a pitch combination including a pitch in which two or more wirings are consecutively arranged on each wiring layer and a pitch in which the wirings are not consecutively arranged.

3. Method of Deriving moiré Values in Front Observation and Oblique Observation

The method is the same as the method of deriving the moiré values in front observation and oblique observation in the case of an equal pitch wiring pattern. However, in the case of an equal pitch wiring pattern, the pitch of each wiring could take only an integer value in separate-wiring layer pitch information, but in the case of non-equal pitch, in the pitch information, random numbers in a range wider than −0.5 to +0.5 are respectively given to the pitches in the case of equal pitches from the first wiring of the wirings. The method of determining such pitch information is the same as the method of deriving the moiré value of each wiring layer in the case of a non-equal pitch wiring pattern.

(Implementation Method 2 of Front/Oblique Moiré Value Calculation Processing)

In the case of a predetermined number of wiring patterns having non-equal pitches, the front/oblique moiré values may be calculated by the implementation method shown in FIG. 90 instead of the implementation method shown in FIG. 89. In the method shown in FIG. 89, information about the predetermined number of separate-wiring layer pitches is provided in advance, and the moiré evaluation value is derived for each combination of the wiring layer pitches. However, in the method shown in FIG. 90, the separate-wiring layer pitch is changed by a predetermined minute value in a predetermined range, and the moiré evaluation value is derived. In Implementation Method shown in FIG. 90, it is possible to perform an exhaustive search as compared with Implementation Method shown in FIG. 89, but there is a disadvantage in that it takes a long time to search.

FIG. 90 shows a flow of Implementation Method 2 of the front/oblique moiré value calculation processing in the embodiment of the present invention.

In this method, the predetermined number is 4, and the moiré is evaluated by changing the pitch by a predetermined minute value within a predetermined range of values added to and subtracted from the pitches 0, 1, 2, and 3 in the case of the equal pitch for each wiring.

First, in Step S50, as the pitch of the wiring 1, a pitch changed in a predetermined range of values added to and subtracted from the pitch 0 in the case of the equal pitch is specified.

Next, in Step S52, as the pitch of the wiring 2, a pitch changed in a predetermined range of values added to and subtracted from the pitch 1 in the case of an equal pitch is specified.

Next, in Step S54, as the pitch of the wiring 3, a pitch changed in a predetermined range of values added to and subtracted from the pitch 2 in the case of an equal pitch is specified.

Next, in Step S56, as the pitch of the wiring 4, a pitch changed in a predetermined range of values added to and subtracted from the pitch 3 in the case of the equal pitch is specified.

Next, in Step S58, the transmittance pattern of the wiring is created at the specified pitches of the wiring 1, the wiring 2, the wiring 3, and the wiring 4, and the 2-dimensional frequency distribution is derived.

Next, in Step S58, the moiré evaluation value is derived at the specified pitches of the wiring 1, the wiring 2, the wiring 3, and the wiring 4.

Specifically, first, the moiré component is derived using the 2-dimensional frequency distribution of the pixel array pattern and the 2-dimensional frequency distribution of the wiring pattern. Next, a moiré evaluation value is derived from the moiré component.

Next, in Step S60, in a case where the moiré evaluation value is improved from the stored moiré evaluation value, the improved pitch information is stored.

Next, in Step S62, in a case where the pitch of the wiring 4 to be specified remains, the predetermined minute value determined in advance is added to or subtracted from the current pitch of the wiring 4, and thereby a new pitch of the wiring 4 to be specified is provided. The processing returns to Step S56, and steps S56 to S60 are repeated.

In a case where the pitch of the wiring 4 to be specified does not remain in Step S62, the processing proceeds to Step S64.

Next, in Step S64, in a case where the pitch of the wiring 3 to be specified remains, the predetermined minute value determined in advance is added to or subtracted from the current pitch of the wiring 3, and thereby a new pitch of the wiring 3 to be specified is provided. The processing returns to Step S54, and steps S54 to S62 are repeated.

In a case where the pitch of the wiring 3 to be specified does not remain in Step S64, the processing proceeds to Step S66.

Next, in Step S66, in a case where the pitch of the wiring 2 to be specified remains, the predetermined minute value determined in advance is added to or subtracted from the current pitch of the wiring 2, and thereby a new pitch of the wiring 2 to be specified is provided. The processing returns to Step S52, and steps S52 to S64 are repeated.

In a case where the pitch of the wiring 2 to be specified does not remain in Step S66, the processing proceeds to Step S68.

Next, in Step S68, in a case where the pitch of the wiring 1 to be specified remains, the predetermined minute value determined in advance is added to or subtracted from the current pitch of the wiring 1, and thereby a new pitch of the wiring 1 to be specified is provided. The processing returns to Step S50, and steps S50 to S66 are repeated.

In Step S68, in a case where the pitch of the wiring 1 to be specified does not remain, Implementation Method 2 of the front/oblique moiré value calculation processing ends.

Here, there are combinations in which the predetermined number of pitches are substantially the same (as in the case of the separate-wiring layer pitch 3 and separate-wiring layer pitch 4 for the separate-wiring layer pitch 2 in Table 1, there are combinations in which the predetermined number of pitches are simply shifted as a whole). Therefore, it is desirable to omit the combinations in order to shorten the optimization time. In such a case, pitch information in which equal pitch combinations are omitted may be provided in advance, and may be optimized by Implementation Method 1 of the front/oblique moiré value calculation processing.

In the Implementation Method 2 of the front/oblique moiré value calculation processing, "the method of deriving only the moiré value in front observation", "the method of deriving the moiré value for each wiring layer", or "the method of deriving the moiré values in front observation and oblique observation", for combinations of pitches of the wirings, each are the same as each method in the method 1 of executing the front/oblique moiré value calculation processing. Here, in "the method of deriving the moiré value of each wiring layer" or "the method of deriving the moiré values in front observation and oblique observation", the pitch range is set to be wider than a range of −0.5 to +0.5 with respect to the pitch in the case of equal pitch and to include combinations in which the pitches of the wirings are reversed.

As in the case of Implementation Method 1, the pitch range and the minute value information may be determined by the ratio information with respect to the average pitch. By multiplying the ratio by the average pitch, the actual pitch range and minute value information can be obtained. By providing the ratio information, the pitch range and minute value information can be reused for an optional average pitch.

Points to Be Noted in Deriving Wiring Pattern according to Embodiment of Present Invention In the wiring pattern deriving method according to the embodiment of the present invention shown in FIG. 88, in a case of deriving the wiring pattern by "the method of deriving only the moiré value in front observation", as already described, the pitch and angle in each direction are derived at the end of the flow in FIG. 88. Thereafter, it is necessary to assign a predetermined number of wirings in each direction such that two or more wirings are consecutively arranged on each wiring layer. For example, in a case where the number of wiring layers is two and the predetermined number is four, for example, four wirings are assigned such that two wiring layers are consecutively arranged on each wiring layer 1 and the wiring layer 2.

In the wiring pattern deriving method according to the embodiment of the present invention shown in FIG. 88, the following three methods were described: "the method of deriving only the moiré value in front observation"; "the method of deriving the moiré value for each wiring layer"; and "the method of deriving moiré values in front observation and oblique observation". Since the wiring pattern having less moiré can be obtained in each wiring layer by "the method of deriving the moiré value of each wiring layer" among the methods, the obliquely observed wiring pattern, in which the wiring layers are shifted by an optional shift amount and overlapped, has less moiré (including the front observation in which the wiring layers are overlapped without being shifted). However, "the method of deriving the moiré values in front observation and oblique observation" provides an obliquely observed (and front observed) wiring pattern having even less moiré. That is, the shift amount of each wiring layer in oblique observation is not optional, but is within a certain range determined by the thickness d of the transparent substrate at $d*\sin\theta*\sin(\gamma+\alpha)$ and the angles $\theta$ and $\varphi$ in the observation direction. Therefore, considering the effect of canceling the frequency components in a case of shifting and overlapping by the shift amount within that range, in "the method of deriving the moiré values in front observation and oblique observation", it is possible to obtain the obliquely observed (and front observed) wiring pattern having less moiré than that in "the method of deriving each wiring layer".

As described above, the angle and average pitch of the wiring pattern, which includes "the wiring pattern having the predetermined number of non-equal pitches", and the respective pitches of the predetermined number of wirings are variously changed, such that investigation for improving both moirés in front observation and oblique observation is made. As a result, "the wiring pattern in which two or more wirings are consecutively arranged on each wiring layer" according to the embodiment of the present invention was constantly excellent in moirés in front observation and oblique observation, regardless of the pixel array pattern. Specifically, in the wiring pattern in which the wiring layers are two layers and the straight line wirings in the two directions are overlapped, according to the flow shown in FIG. 88, a wiring pattern in which the moiré value is minimized by "the method of deriving the moiré values in front observation and oblique observation" is derived. As a result, the moiré value in the wiring pattern, in which two or more wirings are consecutively arranged on the wiring layer 1 (upper surface) and the wiring layer 2 (lower surface) in the two directions, was the minimum, regardless of the pixel array pattern.

The above-described method of producing a wiring pattern of the conductive film of the embodiment of the present invention shown in FIGS. 88 to 90 relates to a wiring pattern of a wiring portion which is carried out regardless of the presence or absence of a transparent substrate of the conductive film. Therefore, it can be said that the method may be a method of producing a wiring pattern of a conductive member having at least a wiring portion although the transparent substrate is not specified. That is, it can be said that FIGS. 88 to 90 show the flow of the method of producing the conductive member and the wiring pattern of the conductive film of the embodiment of the present invention.

JP2016-014929A discloses a method of determining a wiring pattern of which the moiré evaluation value is equal to or less than a threshold value by providing irregularities to the pitches of rhomboid-shaped wirings. However, the method has a problem. The problem is "excluding a moiré component having a small intensity by using a threshold value". In this method, in addition to "the wiring pattern having a small amount of low-frequency range moiré components visible to the human eye" that is originally desired, a wiring pattern having a large amount of moiré components equal to or less than the threshold value is also selected.

Originally, in a case where irregularity is provided to the wiring pitch, the frequency components of the wiring pattern increase, but in this case, the sum of the intensities of the frequency components of the wiring pattern inevitably increases. The reason for this is that since the square sum of the transmittance of the wiring pattern does not change regardless of whether or not irregularity is provided to the wiring pitch, according to Parseval's theorem, the sum of powers (the square of intensities) of the frequency components of the 2-dimensional frequency distribution of the wiring pattern does not change. The fact that the number of frequency components increases without changing the sum of powers (the square of intensities) means that the sum of intensities increases.

The increase in sum of intensities of the wiring patterns also means the increase in sum of intensities of the moiré components. That is, as a result of the increase in number of frequency components of the wiring pattern, the moiré component is inevitably increased, and the sum of the intensities (multiplication values of the frequency components of the pixel array and the frequency components of the wiring pattern) also increases. As a result, the sum of the intensities of the moiré components after being multiplied by VTF tends to increase. Under such a tendency, in a case where a wiring pattern to which irregularity is provided and of which the low moiré evaluation value (sum of intensities of moiré components after VTF multiplication) is low is selected, it is considered that a wiring pattern having a large number of moiré components of which the intensities are equal to or less than a threshold value tends to be selected (moiré components that are equal to or less than the threshold value are excluded from the evaluation value).

In other words, even in a case where the search is performed by providing irregularity, it is considered that a wiring pattern having the following characteristic tends to be selected. Reduction in moiré evaluation value caused by "increasing the moiré components that are equal to or less than the threshold value" is greater than reduction in moiré evaluation value caused by "shifting the frequency of each moiré component to the high frequency side from the low frequency range visible to the human eye".

The present inventor had set the threshold value of the intensity of the moiré component as in the method of JP2016-014929A in a case of searching for "the wiring pattern having a predetermined number of non-equal pitches" according to the embodiment of the present invention and the wiring pattern having a favorable moiré evaluation value, and the above wiring pattern was derived. In such a wiring pattern, a large number of moiré components are distributed around the threshold value or less. In a case where the moiré evaluation value is derived by lowering the threshold value a little, the moiré evaluation value is poor. Thus, the wiring pattern is not a desirable pattern. However, in a case where the moiré components of low intensity are not excluded by using the threshold value, in the wiring pattern having the predetermined non-equal pitches, more frequency components having small intensities than the equal pitch wiring pattern inevitably occur. Therefore, as described above, the moiré evaluation value tends to increase, and a sufficiently optimum wiring pattern cannot be selected.

Here, in the past visual sense research, an experimental result showing that "visibility of a pattern in which a plurality of frequencies is overlapped is not a linear sum of visibilities of the frequencies but a non-linear sum" is obtained. Therefore, in the embodiment of the present invention, the wiring pattern is set to have non-equal pitches and the frequency components are increased more than frequency components of the equal pitches. Even in this case, as a method of obtaining the evaluation value from each moiré component such that an accurate moiré evaluation value can be derived and a sufficiently optimum wiring pattern can be derived, there is a method of "deriving a non-linear sum of the intensities of the moiré components", instead of "deriving the sum (linear sum) of intensities by excluding the moiré components having small intensities through the threshold value" and "deriving the sum (linear sum) of intensities without the threshold value". In the past visual sense research, generally the following two types of models have been proposed and these methods are used.

1. After converting the intensities of the moiré components through a non-linear function (assuming a conversion function (transducer function) from luminance contrast to psychological contrast), the sum (linear sum) thereof is derived as the moiré evaluation value. Here, since various conversion expressions such as the expression proposed by Hamerly et al. or Wilson et al. have been proposed as a non-linear conversion function (transducer function), any one of these expressions is used for conversion.

2. The stochastic addition values of the intensities of the moiré components are derived as the moiré evaluation values. Here, the moiré evaluation value I is derived using Expression (2), which is proposed by Quick et al., as a stochastic addition expression.

$$I = (\Sigma(R[i])^X)^{1/X} \qquad (2)$$

Here, R[i] represents the intensity of the i-th frequency component of the moiré, that is, each moiré component after VTF multiplication.

The stochastic addition order x employs a certain value in the range of 1 to 4, which has been proposed as an order that fits well with the visual experiment results in the past visual sense research. Here, in a case where the order x is 1, Expression (2) means that the sum (linear sum) of the intensities of the moiré components is derived as the moiré evaluation value. In this case, as described above, similarly to "the wiring pattern having the predetermined non-equal pitches of the embodiment of the present invention", the moiré evaluation value of the non-equal pitch wiring pattern tends to increase more than the equal pitch wiring pattern. Therefore, it is difficult to select a sufficiently optimum wiring pattern. However, even in this case, since it is possible to select the non-equal pitch wiring pattern with at least less moiré than the equal pitch wiring pattern, the value 1 is also employed as the order x. As the typical order x, the value 2 presented by Quick is employed.

As described above, in a case where two or more wirings are consecutively arranged on each wiring layer as in the present invention, the wiring pitch of each wiring layer includes pitches narrower and wider than the pitch of the alternate arrangement in the related art. Therefore, the minimum frequency is low. As a result, the minimum frequency of the wiring pattern in oblique observation is lower than that in the related art, and it is necessary to take care such that the wiring is not visible in oblique observation. Further, in a case where the pitch of the wiring pattern is set to be a non-equal pitch as in "the wiring pattern having the predetermined number of non-equal pitches" according to the embodiment of the present invention, the minimum frequency is lowered, and it is necessary to take care such that the wiring is not visible.

For this reason, it is desirable to evaluate not only the moiré but also the visibility of the wiring pattern itself. In Expression (7), not only each moiré component represented by the expression on the fourth row, but also the frequency component of the wiring pattern represented by the expression on the third row is incorporated into the moiré evaluation value. Thereby, the components can be easily evaluated. Specifically, the frequency 0 (corresponding to A0 in Expression (7)) may be included in the frequency distribution of the pixel array pattern shown in FIG. 14. As a result, in a case of deriving each moiré component on the basis of each frequency component of the pixel array pattern of FIG. 14 and each frequency component of the wiring pattern, each component represented by the expression on the third row of Expression (7) is derived as a moiré component with the frequency 0 (corresponding to A0 of Expression (7)) of the pixel array pattern, and then can be incorporated into the total value (moiré evaluation value) derived by multiplying by the VTF.

In the present invention, in a case where the wiring pattern having the predetermined number of non-equal pitches is used, non-equal pitches may be used only for straight line wiring in one direction, or non-equal pitches may be used for straight line wiring in all directions, in a wiring pattern in which straight line wirings in two or more directions are overlapped, or a wiring pattern in which a straight line wiring in one or more directions and a different non-straight line wiring (for example, a curved line, a polygonal line, and the like) other than the straight line wiring in one or more directions are overlapped on each other.

The wiring pattern of the embodiment of the present invention is preferably a wiring pattern in which straight line wirings in two directions are overlapped. The reason for this is that there is an upper limit on the number of wirings per unit area in order to secure the transmittance. In a case where the number of wirings per unit area has an upper limit, the number of wirings in one direction can be increased in a case where the number of wiring patterns is small. As a result thereof, the wiring pitch can be narrowed. The narrower the wiring pitch, the more difficult occurrence of moiré.

Specifically, in a case where the wiring pitch is narrower, the frequency of each component in the frequency distribution is farther away. Therefore, a component close to each frequency component of the pixel array is less likely to occur, and low-frequency moiré is less likely to occur.

Further, the narrower the wiring pitch, the higher the minimum frequency. Therefore, even in a case where the minimum frequency is low due to the shift of each wiring layer in oblique observation, the visibility of the wiring pattern is less affected. In particular, in a case where two or more wirings are consecutively arranged on each wiring layer as in the present invention, the minimum frequency in oblique observation is lower than that in the alternate arrangement in the related art. Accordingly, the visibility of the wiring pattern is less affected. In addition, the narrower the wiring pitch, the more advantageous it is to reduce moiré due to the wiring pattern having the predetermined of non-equal pitches in the embodiment of the present invention. In the non-equal pitch wiring pattern, a low-frequency component occurs as compared with the equal pitch wiring pattern. However, the narrower the wiring pitch, the higher the minimum frequency. Therefore, even in a case where the low-frequency component occurs, the visibility of the wiring pattern is less affected.

In summary, in a case where two or more wirings are consecutively arranged on each wiring layer as in the present invention, and in a case where a wiring pattern having the predetermined number of non-equal pitches are used, the narrower the wiring pitch, the higher the minimum frequency. Therefore, moiré can be reduced more freely by optimizing the wiring pitch of each wiring layer within a range that does not affect the visibility of the wiring pattern. As described above, the smaller the direction of the wiring pattern, the better the moiré and visibility of the wiring pattern. However, at least two directions are necessary to prevent the conductive film from losing a function as a touch sensor. That is, in order to maintain the sensor function even in a case where the wiring is disconnected, it is necessary to have a pattern in which wirings in at least two directions are overlapped and have intersections and a plurality of paths (current paths) to the electrodes. Therefore, a wiring pattern in which straight line wirings in two directions are overlapped is desirable.

In the case of OELD, there are displays with different pixel array patterns (for example, pen-tile array) for at least two colors of RGB. In the case of such a display, since the 2-dimensional frequency distributions of the pixel array patterns are different for at least two colors of R, G, and B, moirés are also different. In the case of such a display, it is necessary to provide a wiring pattern that reduces all R, G, and B moirés.

In this case, in the flow shown in FIG. 88, in a case of deriving the frequency distribution of the pixel array pattern for each color of R, G, and B and deriving the moiré evaluation value of the separate-wiring layer pitch of FIGS. 89 and 90, the moiré evaluation value for each color of R, G, and B may be derived. The worst value (maximum value) may be used as the moiré evaluation value at the wiring layer pitch. In the case of "an equal pitch wiring pattern" and "a method of deriving only a moiré value in front observation", in FIG. 88, the moiré of front observation for each color of R, G, and B for each wiring pitch and angle. The moiré value may be derived and the worst value (maximum value) may be used as the moiré value at the wiring pitch and angle.

As described above, the difference between the present invention and the prior art is as follows. The wiring pattern according to the embodiment of the present invention is a wiring pattern in which straight line wirings in two or more directions are overlapped or a wiring pattern in which a straight line wiring in one or more directions and a non-straight line wiring (for example, a curved line or a polygonal line) that is not a straight line wiring in one or more directions are overlapped, two or more wiring layers are provided, and two or more wiring patterns are consecutively arranged in one layer, in at least one direction of straight line wiring.

The effect according to the embodiment of the present invention is able to reduce occurrence of moiré in oblique observation, as compared with a wiring pattern in which wirings are alternately arranged in each layer.

In addition, in the present invention, it is a premise that moiré occurrence is reduced even in the wiring pattern in front observation.

In a wiring pattern in which straight line wirings are overlapped in two directions as shown in FIGS. 2, 5, 41, 46, and 76, the inclination angles of the straight line wirings 21p and 21q in the two directions may be different, as shown in FIG. 91, from the bilaterally symmetric pixel array pattern as shown in FIG. 11. That is, as shown in FIG. 91, the wiring pattern of the embodiment of the present invention may be a bilaterally asymmetric wiring pattern 25h in which straight line wirings 21p and 21q in two directions having different inclination angles are overlapped. Here, the bilaterally symmetric pixel array pattern can be defined by "bilateral symmetry of at least the positions of the respective pixels". Further, the pattern can also be defined by "the bilateral symmetry additionally including bilateral symmetry of the shape and size of each pixel".

In the embodiment of the present invention, as shown in FIG. 91, the reason why the wiring pattern may be more preferably bilaterally asymmetric is as follows. "In a case where the average pitches of the straight line wirings in two directions are different, the directions (angles) in which the moirés of the straight line wirings are the optimum are not necessarily the same". In addition, "the closer the angle formed by the straight line wirings in the two directions to the right angle (90°), the higher the accuracy of 2-dimensional contact position detection using a touch sensor".

FIG. 91 shows an example of a wiring pattern having a favorable total moiré value, which is derived after the number of wirings per unit area is limited in terms of the transmittance of the wiring in accordance with the flow of the method of producing the wiring pattern of the conductive film of the embodiment of the present invention shown in FIG. 88, relative to the bilaterally symmetric pixel array pattern shown in FIG. 11. In such an example, since the average pitches of the straight line wirings in the two directions are different, the directions (angles) in which the moiré values are favorable are different in the respective straight line wirings. Further, in such an example, the straight line wirings in the two directions are both directed to the right. It is needless to say that the present invention includes such an example in which the straight line wirings in the two directions are both directed to the right or left.

By the way, in a wiring pattern in which straight line wirings are overlapped in two directions, the closer the angle formed between the two directions to the right angle (90°), the higher the accuracy of 2-dimensional contact position detection using a touch sensor. Further, in a case where there are two or more wiring layers, for example, in a case of observing from an oblique direction, there may be deviation in the position of the wiring pattern of each layer. Then, the pitch of the straight line wiring may change due to this deviation, but in this case, the degree of change in pitch of the straight line wiring differs depending on the direction of the deviation of the wiring pattern of each layer and the direction of the straight line wiring. In a case where the angle formed by the deviation direction and the direction of the straight line wiring is the right angle (90°), the pitch does not change, and in a case where the deviation direction and the direction of the straight line wiring are the same, the change in pitch is the maximum. From this fact, even in a case where the position of the wiring pattern of each layer more deviates as the angle formed by the straight line wirings in the two directions is closer to the right angle (90°), the wiring in which the straight line wirings in the two directions are overlapped does not depend on the deviation direction. The change in total pitch of the wiring pattern is small. Therefore, occurrence of moiré due to the change in pitch of the wiring pattern and/or reduction in visibility of the wiring pattern are small. Further, in the technology of optimizing the pitch of the wiring pattern from the viewpoint of moiré visibility as in the embodiment of the present invention, it is particularly effective that the angle formed by the straight line wirings in the two directions is close to the right angle) (90°). From the above, the angle formed by the straight line wirings in the two directions is not particularly limited, but is preferably in the range of 40° to 140° (90°±50°), more preferably in the range of 60° to 120° (90°±30°), and still more preferably in the range of 75° to 105° (90°±15°).

The average pitch of the straight line wiring is not particularly limited, but is preferably 30 µm to 600 µm. The reason for this is that in a case where the average pitch is narrow, the transmittance is low, and in contrast, in a case where the average pitch is wide, the thin metal wires are easily noticeable and visibility is deteriorated. It is preferable that the average pitch is within the above range such that the transmittance is in an allowable range and visibility of the thin metal wires is low.

The present invention is characterized in a non-equal pitch wiring pattern. In the pattern, in a straight line wiring in at least one direction, the repetitive pitches of the predetermined number of the thin metal wires are equal pitches, and the pitches of at least two thin metal wires among the respective pitches of the predetermined number of thin metal wires are non-equal pitches. In this case, as described above, by setting the pitches of the thin metal wires to non-equal pitches, the minimum frequency of the wiring pattern is lower than that in the case of equal pitch. Thus, it should be taken into account that it is necessary to make the wiring pattern not visible. Therefore, the average pitch is preferably 300 µm or less, more preferably 200 µm or less, still more preferably 150 µm or less, in order to sufficiently optimize the pitch and reduce moiré within a range that does not affect visibility of the wiring pattern.

The present invention is characterized in that the line wiring (line wiring in one direction) being composed of a plurality of thin metal wires arranged in parallel in one direction is a straight line wiring. However, in the embodiment of the present invention, the thin metal wire does not have to be a perfect straight line, and may be bent as long as the line is within a predetermined range. The straight line wiring in the embodiment of the present invention can be defined as follows.

In the embodiment of the present invention, in the 2-dimensional frequency distribution of the transmittances of the line wiring in one direction, in a case where the frequency components of the line wiring are concentrated only in a specific direction, the line wiring can be regarded as a straight line wiring. Specifically, in the 2-dimensional frequency distribution of the transmittances of the line wiring, a ratio of the sum of intensities of the frequency components, from which the zero frequency component is excluded, in the angular range of −10° or more to +10° or less centered on a certain specific direction to the sum of the intensities of all frequency components (from which the zero frequency component is excluded) may be equal to or greater than a predetermined ratio. In this case, the line wiring can be regarded as a straight line wiring. Here, the predetermined ratio is 30%, more preferably 45%, and still more preferably 55%. In addition, the certain specific direction indicates both a direction of any angle of optional angles in the angular range of 0 degree or more and less than 360° and a direction of an angle different from that angle by 180°. In other words, the sum of the intensities of the frequency components in the angular range of −10° or more to +10° or less centered on a certain specific direction also includes the intensities of the frequency components having the conjugate relation (the frequency components in a direction different by 180° (the opposite direction)).

Figure 92:
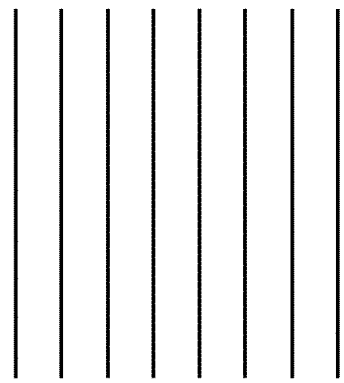
FIG. 92 is a plan view schematically showing an example of the line wiring of the wiring portion of the conductive film.
Figure 93:
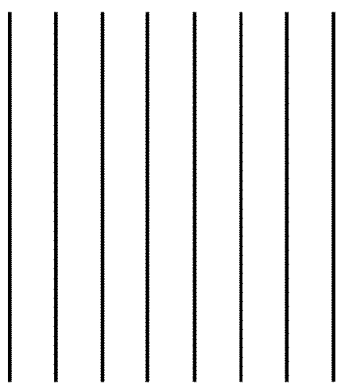
FIG. 93 is a plan view schematically showing another example of the line wiring of the wiring portion of the conductive film.
Figure 95:
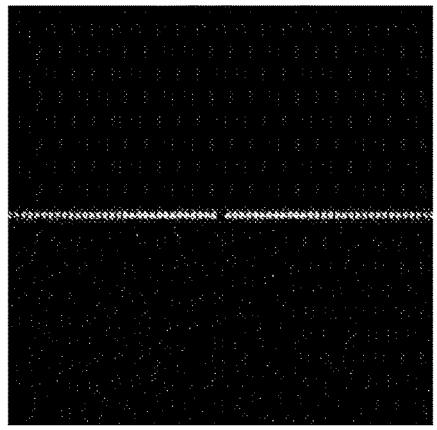
FIG. 95 is a diagram showing a 2-dimensional frequency distribution of the wiring pattern shown in FIG. 92.
Figure 96:
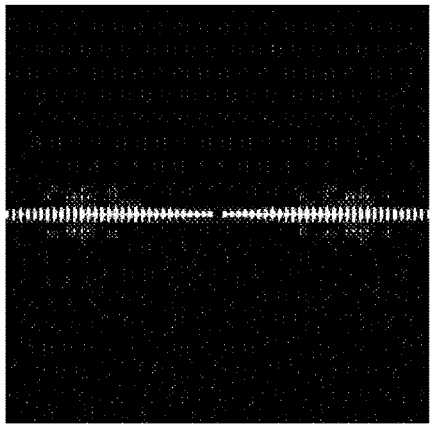
FIG. 96 is a diagram showing a 2-dimensional frequency distribution of the wiring pattern shown in FIG. 93.
Figure 97:
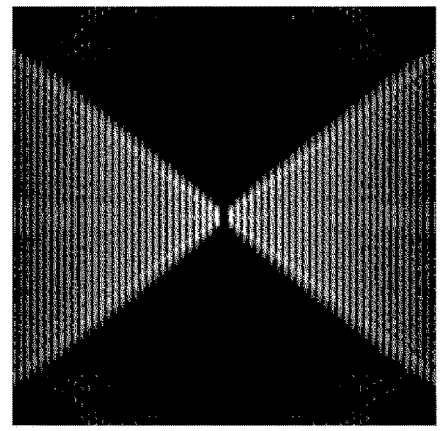
FIG. 97 is a diagram showing a 2-dimensional frequency distribution of the wiring pattern shown in FIG. 94.

Here, as examples of the line wiring, line wirings shown in FIGS. 92 to 94 are shown. Further, FIGS. 95 to 97 show 2-dimensional frequency distributions of the transmittances of the line wirings shown in FIGS. 92 to 94, respectively. In addition, in the frequency distribution, the intensity scale is appropriately adjusted in order to make the intensities easily visible. Further, the zero frequency component is removed. The line wiring 23$d$ shown in FIG. 92 is a straight line wiring in which perfect straight lines are arranged in the horizontal direction, and the frequency distribution shown in FIG. 95 is also concentrated only in the horizontal direction. In contrast, in the line wiring 23$f$ shown in FIG. 94, the lines forming the wiring each have a cosine wave shape, and the frequency distribution shown in FIG. 97 spreads not only in the horizontal direction but also in the peripheral direction. Thus, the line wiring 23$f$ can not be regarded as the straight line wiring. On the other hand, in the line wiring 23$e$ shown in FIG. 93, although the lines forming the wiring each have a slight cosine wave shape, the frequency distribution shown in FIG. 96 is mostly concentrated in the horizontal direction. Therefore, the line wiring 23$e$ can be regarded as a straight line wiring.

Figure 98:
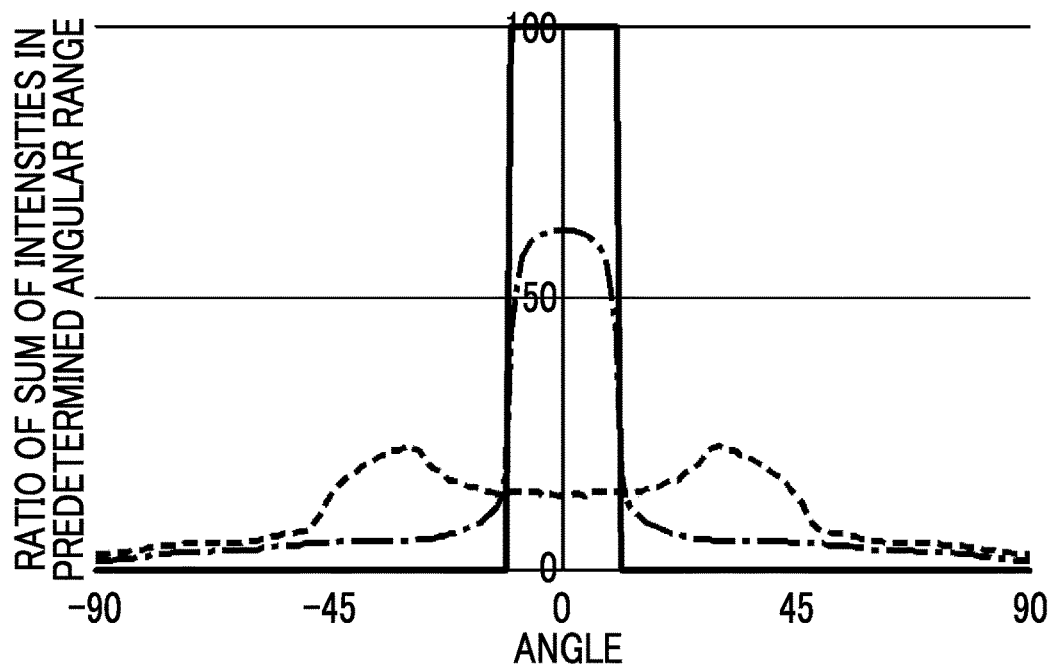
FIG. 98 is a graph showing the ratio of the sum of intensities of frequency components to the sum of intensities of all frequency components in a predetermined angular range in the 2-dimensional frequency distribution of the wiring patterns shown in FIGS. 95 to 97.

FIG. 98 is a graph showing a ratio of the sum of the intensities of frequency components (from which the zero frequency component is excluded) in the angular range of −10° to +10° centered on each direction from −90° to +90° (and in addition, a direction different from each direction by 180° (opposite direction)) in a case where the horizontal direction is set as an angle of 0 degree to the sum of the intensities of all frequency components (from which the zero frequency component is excluded), in the 2-dimensional frequency distribution of the transmittances of the line wiring. In FIG. 98, the solid line indicates a graph of the ratio of intensities of the frequency components of the line wiring 23$d$ shown in FIG. 92, the chain line indicates a graph of the ratio of intensities of the frequency components of the line wiring 23$e$ shown in FIG. 93, and the dotted line indicates a graph of the ratio of intensities of frequency components of the line wiring 23$f$ shown in FIG. 94. As can be seen from the ratio of the sum of intensities of frequency components in the angular range of −10° or more and +10° or less centered on the horizontal direction as a specific direction, that is, the direction of the angle of 0 degree (and in addition, the direction of the angle of 180°), in the case of the line wiring 23*d* shown in FIG. 92, the ratio is naturally 100%, and the line wiring 23*d* can be regarded as a straight line wiring. In the case of the line wiring 23*e* shown in FIG. 93, the ratio is 55% or more, and the line wiring 23*e* can also be regarded as a straight line wiring. On the other hand, in the case of the line wiring 23*f* shown in FIG. 94, it can be seen that the ratio is less than 30% and the line wiring 23*f* cannot be regarded as a straight line wiring.

The dummy electrode portion such as the dummy electrode portion 26 of the conductive film 11 shown in FIG. 7 described above is provided so as to be electrically insulated (disconnected) from the first electrode portions 17*a*, between the adjacent first electrode portions 17*a*, in the first sub-wiring portion 16*a* like the non-conductive pattern described in WO2013/094729A. In addition, the dummy electrode portion is provided so as to be electrically insulated (disconnected) from the second electrode portions 17*b*, between the adjacent second electrode portions 17*b*, in the second sub-wiring portion 16*b*. However, the present invention is not limited to this.

Figure 107:
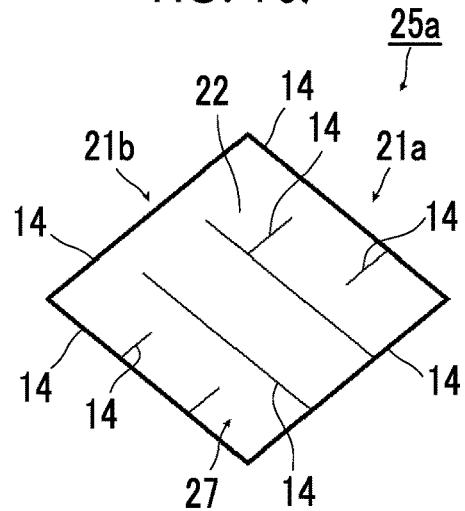
FIG. 107 is a plan view schematically showing an example of an in-electrode dummy pattern portion in one opening portion of the wiring pattern of the embodiment of the present invention.

In a case where the pitch of the at least one straight line wiring 21*a* of the first electrode portion 17*a* and/or the second electrode portion 17*b* is wide, as shown in FIG. 107, in one opening portion 22 of the mesh-shaped wiring pattern 25*a*, the in-electrode dummy pattern portion 27 may be formed by extending new thin metal wires 14 in parallel with the thin metal wires 14 of the one straight line wiring 21*a* such that the tip is not connected to any of the thin metal wires 14, that is, the wiring is disconnected (broken) or cut in the middle, from one thin metal wire 14 of the straight line wiring 21*b* in the other direction to be overlapped to the other thin metal wire 14, or reversely from the other thin metal wire 14 to the one thin metal wire 14, between the thin metal wires 14 of one straight line wiring 21*a*. On the contrary, the in-electrode dummy pattern portion 27 may be formed by extending new thin metal wires 14 in parallel with the thin metal wires 14 of the one straight line wiring 21*b* such that the tip is not connected to any of the thin metal wires 14, that is, the wiring is disconnected (broken) or cut in the middle, from one thin metal wire 14 of the other straight line wiring 21*a* to the other thin metal wire 14, or reversely from the other thin metal wire 14 to the one thin metal wire 14, between the thin metal wires 14 of one straight line wiring 21*b*. The in-electrode dummy pattern portion 27 may be formed by further branching from the thin metal wires 14 forming the in-electrode dummy pattern portion 27 in parallel with the thin metal wires 14 of the straight line wirings 21 in the other direction. Needless to say, the distal ends of the branched thin metal wires 14 are disconnected (broken) or cut in the middle, and are not connected to any thin metal wires 14. Needless to say, the example shown in FIG. 107 shows the in-electrode dummy pattern portion 27 formed in only one opening portion of the mesh-shaped wiring pattern, but similarly the in-electrode dummy pattern portion 27 may be formed in the other opening portions.

By forming the in-electrode dummy pattern portion 27 in such a manner, the following effects are obtained. In general, in a case where the pitches of the thin metal wires of the electrode portion are narrowed, the parasitic capacitance of the electrode increases. As a result, the accuracy of detecting the touch position decreases. On the other hand, in a case where the pitches of the thin metal wires are widened in order to improve the detection sensitivity, the thin metal wires tend to be conspicuous and visibility deteriorates. In addition, moiré due to interference between the pixel array pattern and the wiring pattern of the thin metal wires of the electrode portion is likely to occur. Therefore, the pitches of the thin metal wires in the electrode portion are widened and the parasitic capacitance of the electrode is reduced to improve the touch position detection accuracy. On the other hand, by forming the in-electrode dummy pattern portion, the pitches of the combination of the thin metal wires in the electrode portion and the thin metal wires in the in-electrode dummy pattern portion are narrowed. As a result, visibility of the thin metal wires can be lowered, and moiré can be made less likely to occur.

In the case of forming the in-electrode dummy pattern portion as described above, in the embodiment of the present invention, a combined wiring pattern includes a non-equal pitch wiring pattern optimized in terms of visibility of moiré. The combined wiring pattern is formed by overlapping a wiring pattern, which is formed by the combination of the thin metal wires of the electrode portion and the thin metal wires of the in-electrode dummy pattern portion, and in a case where there are a plurality of wiring layers, wiring patterns on the wiring layers. As a result, the combined wiring pattern is able to improve the moiré visibility due to the interference with the display. For example, in the case of the conductive film 11 according to the second embodiment of the present invention shown in FIG. 7, a combined wiring pattern includes a non-equal pitch wiring pattern optimized in terms of visibility of moiré. The combined wiring pattern is formed by overlapping a wiring pattern, which is formed by the combination of the thin metal wires of the first electrode portion 17*a* in one wiring layer 28*a* of the two wiring layers 28*a* and 28*b* and the thin metal wires of the in-electrode dummy pattern portion, and a wiring pattern which is formed by the combination of the wiring pattern of the dummy electrode portion 26 and the combination of the thin metal wire of the second electrode portion 17*b* and the thin metal wires of the in-electrode dummy pattern portion in the other wiring layer 28*b*. As a result, the combined wiring pattern is able to improve the moiré visibility due to the interference with the display.

As another form of the dummy electrode portion, there is a form of the sub non-conductive pattern described in WO2013/094729A.

As shown in FIG. 7, the conductive film according to the embodiment of the present invention has two wiring layers 28*a* and 28*b* on the upper side and the lower side of the transparent substrate 12, and further includes electrode portions 17*a* and 17*b* and the thin metal wires 14 of the dummy electrode portion 26, on each wiring layer. Alternatively, as shown in FIG. 107, the in-electrode dummy pattern portion 27 is formed in each opening portion 22 of the wiring pattern 25*a* of the electrode portion, that is, the thin metal wires 14 of the in-electrode dummy pattern portion 27 is also included. In this case, even in a case where the combined wiring patterns obtained by overlapping the wiring patterns of the upper and lower wiring layers are substantially the same, there are various combinations of the wiring patterns of the upper electrode portion, the upper in-electrode dummy pattern portion, the upper dummy electrode portion, the lower electrode portion, the lower in-electrode dummy pattern portion, and the lower dummy electrode portion. For example, the wiring pattern 25*a* of the conductive film 10 shown in FIG. 2 has the wiring pattern 24*a* of the first sub-electrode portion 16*a* on the upper side and the wiring pattern 24*b* of the second sub-electrode portion 16*b* on the lower side of respective two wiring layers 28*a* and 28*b* on the upper side and the lower side of the transparent substrate 12. However, even in a case where the wiring pattern is substantially the same as the wiring pattern 25a, each wiring layer includes the thin metal wires of not only the electrode portion but also the dummy electrode portion, and also includes the thin metal wires of the in-electrode dummy pattern portion. In such a case, any combination of the electrode section, the in-electrode dummy pattern portion, the straight line wiring of the dummy electrode portion, and the wiring pattern may be used. For example, various straight line wirings as shown in FIGS. 99 to 101, and a combination wiring pattern of wiring patterns may be used.

Figure 99:
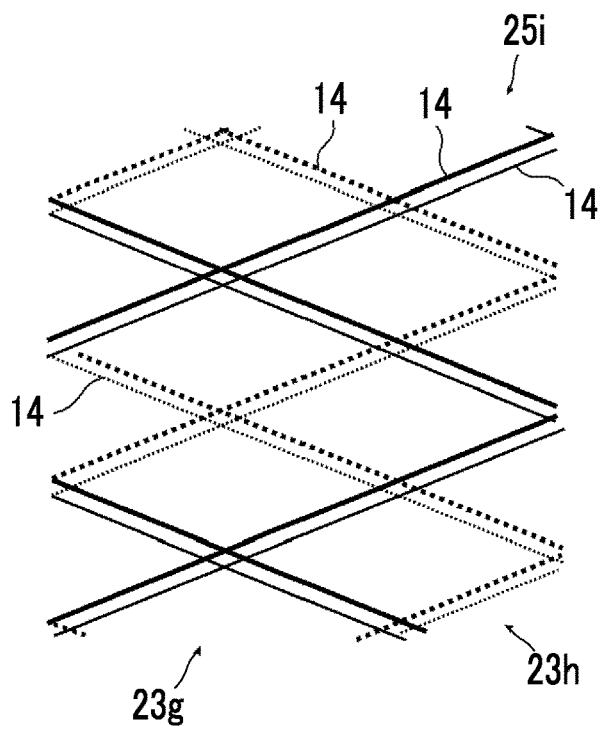
FIG. 99 is a plan view schematically showing an example of a wiring pattern of a wiring portion of the conductive film according to the embodiment of the present invention.
Figure 100:
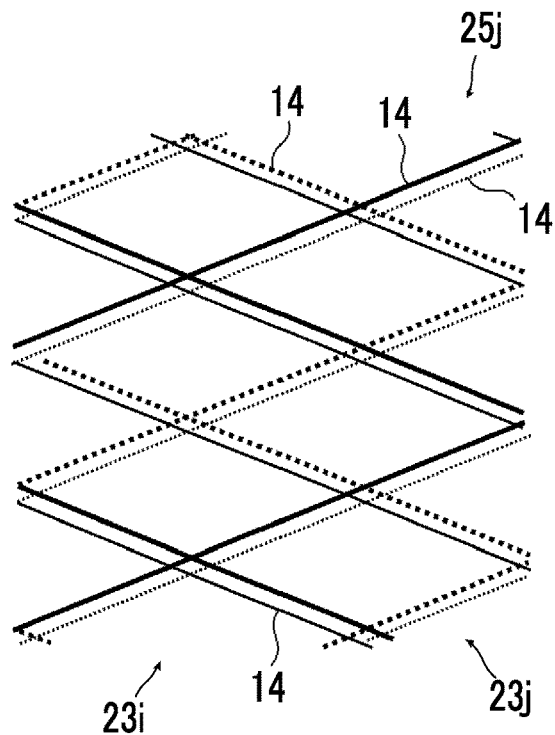
FIG. 100 is a plan view schematically showing another example of a wiring pattern of a wiring portion of the conductive film according to the embodiment of the present invention.
Figure 101:
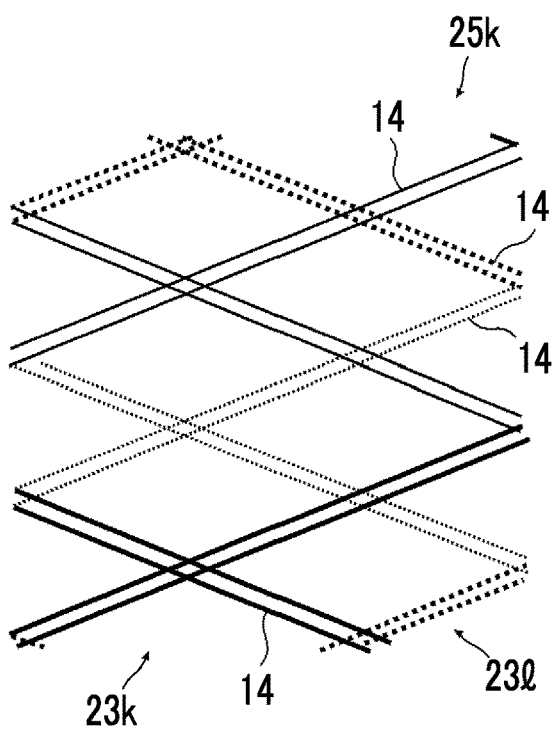
FIG. 101 is a plan view schematically showing another example of a wiring pattern of a wiring portion of the conductive film according to the embodiment of the present invention.

In the wiring patterns 25i, 25j, and 25k shown in FIGS. 99 to 101, the thick solid line indicates the thin metal wires 14 of the upper electrode portion (first electrode portion 17a: refer to FIG. 7), the thin solid line indicates the thin metal wires 14 of the upper in-electrode dummy pattern portion, the thick dotted line indicates the thin metal wires 14 of the lower electrode portion (second electrode portion 17b: refer to FIG. 7), and the thin dotted line indicates the thin metal wires 14 of the lower in-electrode dummy pattern portion. The thin metal wires 14 of the electrode portion and the thin metal wires 14 of the in-electrode dummy pattern portion are electrically insulated by providing the above-described disconnection (break) in the thin metal wires 14 of the in-electrode dummy pattern portion or cutting the thin metal wires 14 of the in-electrode dummy pattern portion in the middle.

The wiring pattern 25i shown in FIG. 99 is a wiring pattern in which the line wiring 23g in the right direction and the line wiring 23h in the left direction are overlapped. The line wiring 23g is composed of the metal wirings 14 of the upper electrode portion, the in-electrode dummy pattern portion, the lower electrode portion, and the in-electrode dummy pattern portion. Likewise, the line wiring 23h is composed of the thin metal wires 14 of the upper electrode portion, the in-electrode dummy pattern portion, the lower electrode portion, and the in-electrode dummy pattern portion. Although not shown, the thin metal wire 14 (thin solid line) of the upper in-electrode dummy pattern portion has a disconnection (break) in order to be electrically insulated with the thin metal wire 14 (thick solid line) of the upper electrode portion, and the thin metal wire 14 (thin dotted line) of the lower in-electrode dummy pattern portion has a disconnection (break) in order to be electrically insulated with the thin metal wire 14 (thick dotted line) of the lower electrode portion.

Similarly, the wiring pattern 25j shown in FIG. 100 is a wiring pattern in which the line wiring 23i in the right direction and the line wiring 23j in the left direction are overlapped. The line wiring 23i is composed of the metal wirings 14 of the upper electrode portion, the in-electrode dummy pattern portion, the lower electrode portion, and the in-electrode dummy pattern portion. Likewise, the line wiring 23j is composed of the thin metal wires 14 of the upper electrode portion, the in-electrode dummy pattern portion, the lower electrode portion, and the in-electrode dummy pattern portion. Although not shown, the thin metal wire 14 (thin solid line) of the upper in-electrode dummy pattern portion has a disconnection (break) in order to be electrically insulated with the thin metal wire 14 (thick solid line) of the upper electrode portion, and the thin metal wire 14 (thin dotted line) of the lower in-electrode dummy pattern portion has a disconnection (break) in order to be electrically insulated with the thin metal wire 14 (thick dotted line) of the lower electrode portion.

Similarly, the wiring pattern 25k shown in FIG. 101 is a wiring pattern in which the line wiring 23k in the right direction and the line wiring 23l in the left direction are overlapped. The line wiring 23k is composed of the thin metal wires 14 of the upper electrode portion, the in-electrode dummy pattern portion, the lower electrode portion, and the in-electrode dummy pattern portion. Likewise, the line wiring 23l is composed of the thin metal wires 14 of the upper electrode portion, the in-electrode dummy pattern portion, the lower electrode portion, and the in-electrode dummy pattern portion. Although not shown, the thin metal wire 14 (thin solid line) of the upper in-electrode dummy pattern portion has a disconnection (break) in order to be electrically insulated with the thin metal wire 14 (thick solid line) of the upper electrode portion, and the thin metal wire 14 (thin dotted line) of the lower in-electrode dummy pattern portion has a disconnection (break) in order to be electrically insulated with the thin metal wire 14 (thick dotted line) of the lower electrode portion.

In addition, the wiring patterns 25i, 25j, and 25k each are a wiring pattern which is formed by overlapping a wiring pattern being composed of the thin metal wires 14 of the upper electrode portion and the in-electrode dummy pattern portion and a wiring pattern being composed of thin metal wires 14 of the lower electrode portion and the in-electrode dummy pattern portion.

Similarly to the wiring pattern 25a shown in FIG. 2, each of the wiring patterns 25i, 25j, and 25k has a wiring pattern according to the embodiment of the present invention, that is, "a wiring pattern which has two or more wiring layers and in which two or more thin metal wires arranged in parallel in one wiring layer are consecutively arranged in at least one direction". Regardless of whether the thin metal wires belong to the electrode portion, the in-electrode dummy pattern portion, or the dummy electrode portion, in a case where the wiring pattern being composed of the thin metal wires is a wiring pattern having the characteristics according to the embodiment of the present invention, it can be said that the wiring pattern is the wiring pattern according to the embodiment of the present invention.

The wiring pattern including the thin metal wires of the in-electrode dummy pattern portion and the dummy electrode portion of the conductive film according to the embodiment of the present invention is not limited to the wiring patterns 25i, 25j, and 25k shown in FIGS. 99 to 101. The wiring pattern may be a wiring pattern using various combinations of the upper electrode portion, the in-electrode dummy pattern portion, the dummy electrode portion, and the lower electrode portion, and the metal wirings 14 of the in-electrode dummy pattern portion and the dummy electrode portion.

Figure 102:
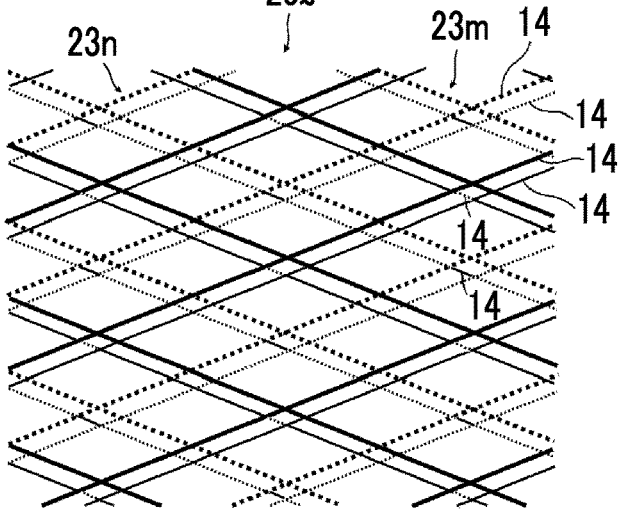
FIG. 102 is a plan view schematically showing another example of a wiring pattern of a wiring portion of the conductive film according to the embodiment of the present invention.
Figure 103:
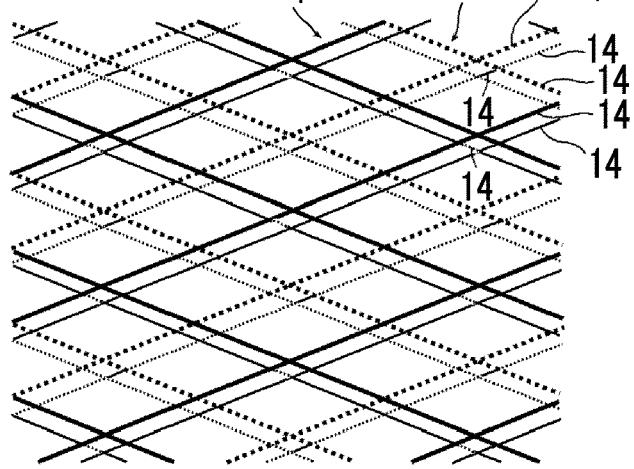
FIG. 103 is a plan view schematically showing another example of a wiring pattern of a wiring portion of the conductive film according to the embodiment of the present invention.
Figure 104:
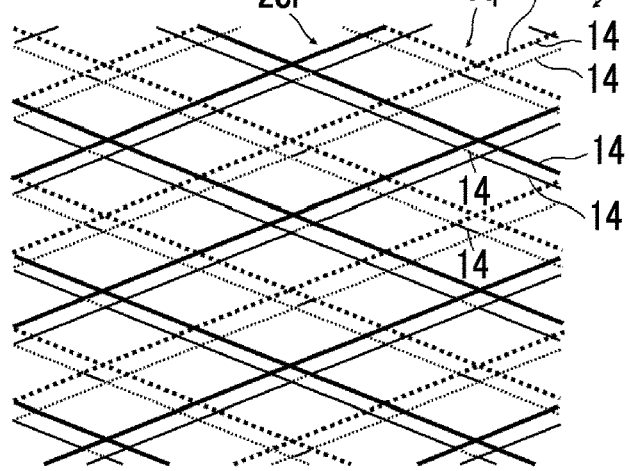
FIG. 104 is a plan view schematically showing another example of a wiring pattern of a wiring portion of the conductive film according to the embodiment of the present invention.

For example, like the wiring patterns 25l, 25m, and 25n shown in FIGS. 102 to 104, in the wiring pattern being composed of the line wiring of the thin metal wires of the in-electrode dummy pattern portion, the thin metal wires of the upper and lower wiring layers may be partially disconnected, and also include one straight line formed in the overlapped wiring pattern. The present invention also includes the case where the thin metal wires in each wiring layer are partially discontinued in this way.

The wiring pattern 25l shown in FIG. 102 is a wiring pattern in which the line wiring 23m in the right direction and the line wiring 23n in the left direction are overlapped. The line wiring 23m is composed of the thin metal wires 14 of the upper electrode portion, the in-electrode dummy pattern portion, the lower electrode portion, and the in-electrode dummy pattern portion. Likewise, the line wiring 23n is composed of the thin metal wires 14 of the upper electrode portion, the in-electrode dummy pattern portion, the lower electrode portion, and the in-electrode dummy pattern portion. Here, the thin metal wires 14 of the upper in-electrode dummy pattern portion in the right direction and the thin metal wires 14 of the lower in-electrode dummy pattern portion in the right direction are discontinuous. In front observation, the discontinuous portion of the thin metal wires 14 in the in-electrode dummy pattern portion can be buried under the thin metal wires 14 of the lower in-electrode dummy pattern portion, and can be regarded as one continuous straight line. Although not shown, the thin metal wire 14 (thin solid line) of the upper in-electrode dummy pattern portion has a disconnection (break) in addition to the discontinuous portion that is disconnected in the middle, in order to be electrically insulated with the thin metal wire 14 (thick solid line) of the upper electrode portion, and the thin metal wire 14 (thin dotted line) of the lower in-electrode dummy pattern portion has a disconnection (break) in addition to the discontinuous portion that is disconnected in the middle, in order to be electrically insulated with the thin metal wire 14 (thick dotted line) of the lower electrode portion.

Similarly, the wiring pattern 25*m* shown in FIG. 103 is a wiring pattern in which the line wiring 23*o* in the right direction and the line wiring 23*p* in the left direction are overlapped. The line wiring 23*o* is composed of the thin metal wires 14 of the upper electrode portion, the in-electrode dummy pattern portion, the lower electrode portion, and the in-electrode dummy pattern portion. Likewise, the line wiring 23*p* is composed of the thin metal wires 14 of the upper electrode portion, the in-electrode dummy pattern portion, the lower electrode portion, and the in-electrode dummy pattern portion. Although not shown, the thin metal wire 14 (thin solid line) of the upper in-electrode dummy pattern portion has a disconnection (break) in addition to the discontinuous portion that is disconnected in the middle, in order to be electrically insulated with the thin metal wire 14 (thick solid line) of the upper electrode portion, and the thin metal wire 14 (thin dotted line) of the lower in-electrode dummy pattern portion has a disconnection (break) in addition to the discontinuous portion that is disconnected in the middle, in order to be electrically insulated with the thin metal wire 14 (thick dotted line) of the lower electrode portion.

Similarly, the wiring pattern 25*n* shown in FIG. 104 is a wiring pattern in which the line wiring 23*q* in the right direction and the line wiring 23*r* in the left direction are overlapped. The line wiring 23*q* is composed of the thin metal wires 14 of the upper electrode portion, the in-electrode dummy pattern portion, the lower electrode portion, and the in-electrode dummy pattern portion. Likewise, the line wiring 23*r* is composed of the thin metal wires 14 of the upper electrode portion, the in-electrode dummy pattern portion, the lower electrode portion, and the in-electrode dummy pattern portion. Although not shown, the thin metal wire 14 (thin solid line) of the upper in-electrode dummy pattern portion has a disconnection (break) in addition to the discontinuous portion that is disconnected in the middle, in order to be electrically insulated with the thin metal wire 14 (thick solid line) of the upper electrode portion, and the thin metal wire 14 (thin dotted line) of the lower in-electrode dummy pattern portion has a disconnection (break) in addition to the discontinuous portion that is disconnected in the middle, in order to be electrically insulated with the thin metal wire 14 (thick dotted line) of the lower electrode portion.

In addition, the wiring patterns 25*l*, 25*m*, and 25*n* each are a wiring pattern which is formed by overlapping a wiring pattern being composed of the thin metal wires 14 of the upper electrode portion and the in-electrode dummy pattern portion and a wiring pattern being composed of thin metal wires 14 of the lower electrode portion and the in-electrode dummy pattern portion.

Similarly to the wiring pattern 25*a* shown in FIG. 2, each of the wiring patterns 25*l*, 25*m*, and 25*n* has a wiring pattern according to the embodiment of the present invention, that is, "a wiring pattern which has two or more wiring layers and in which two or more thin metal wires arranged in parallel in one wiring layer are consecutively arranged in at least one direction".

In the wiring pattern examples of FIGS. 99, 100, 102, 103 and 104, the wiring patterns of the thin metal wires 14 of the upper and lower electrode portions are formed as rhomboid meshes having the same shape with a constant pitch. Therefore, the resistance inside the electrode and the resistance between the electrodes are uniform. Thus, in a case where the electrodes are used as the electrodes of the touch panel, the sensitivity is uniform in the touch panel. As a result, this configuration is preferable.

The conductive film of the embodiment of the present invention is a conductive film provided on a display unit of a display device. The conductive film has a transparent substrate and wiring portions disposed on both surfaces of the transparent substrate and being composed of a plurality of thin metal wires. The wiring portion has a wiring pattern which has two or more wiring layers in at least one direction and in which two or more thin metal wires arranged in parallel on one wiring layer are consecutively arranged. The wiring portion is a wiring pattern in which straight line wirings being composed of a plurality of thin metal wires arranged in parallel on two or more wiring layers are overlapped in two or more directions. The wiring pattern in front observation which is observed in front observation of the conductive film may be a non-equal pitch wiring pattern in which repetitive pitches of the predetermined number of the thin metal wires are equal pitches and at least two thin metal wires among respective pitches of a predetermined number of the thin metal wires are non-equal pitches, in the straight line wiring in at least one direction.

According to the embodiment of the present invention, there may be provided a method of producing a wiring pattern of a conductive film which is provided on a display unit of a display device and has a wiring portion that is disposed on both surfaces of the transparent substrate and being composed of a plurality of thin metal wires. The wiring portion has a wiring pattern which has two or more wiring layers in at least one direction, in which two or more thin metal wires arranged in parallel on one wiring layer are consecutively arranged. The wiring portion is a wiring pattern in which straight line wirings each being composed of a plurality of thin metal wires arranged in parallel on two or more wiring layers are overlapped in two or more directions. The wiring pattern in front observation which is observed in front observation of the conductive film is a non-equal pitch wiring pattern in which repetitive pitches of a predetermined number of the thin metal wires are equal pitches and pitches of the at least two thin metal wires in the respective pitches of the predetermined number of the thin metal wires are non-equal pitches, in the straight line wiring in at least one direction. A luminance or a transmittance of the pixel array pattern of the display unit is obtained. Transmittances of respective wiring patterns of the non-equal pitch wiring pattern and an equal pitch wiring pattern, in which repetitive pitches of the predetermined number of the thin metal wires are equal to those of the non-equal pitch wiring pattern, are obtained. 2-dimensional Fourier frequency distributions of the transmittances of the wiring patterns is derived. A 2-dimensional Fourier frequency distribution of the luminance or the transmittance of the pixel array pattern is derived. Respective frequency components of moiré is calculated from frequency components of the 2-dimensional Fourier frequency distributions of the transmittances of the non-equal pitch wiring pattern and the equal pitch wiring pattern and frequency components of the 2-dimensional Fourier frequency distribution of the luminance or the transmittance of the pixel array pattern. In addition, human's visual response characteristics are applied to the calculated respective frequency components of the moiré so as to obtain a moiré evaluation value, which is a sum of intensities of the respective frequency components. In addition, the wiring pattern is produced in a state where the obtained moiré evaluation value in the non-equal pitch wiring pattern is less than a moiré evaluation value in the equal pitch wiring pattern.

As described above, the conductive member and the conductive film according to the embodiment of the present invention, the display device comprising the conductive film, the touch panel, the method of producing the wiring pattern of the conductive member, and the method of producing the wiring patterns of the conductive film have been described in various embodiments and examples. However, it is apparent that the present invention is not limited to the embodiments and the examples and may be improved and/or modified in various forms without departing from the scope of the embodiment of the present invention.

EXPLANATION OF REFERENCES 10, 11, 11A: conductive film
12, 12a, 12b: transparent base
14: thin line made of metal (thin metal wire)
16: wiring portion
16a, 16b: sub-wiring portion
17, 17a, 17b: electrode portion
18, 18a, 18b: adhesive layer
20, 20a, 20b: protective layer
21, 21a, 21a1, 21a2, 21b, 21b1, 21b2, 21c, 21c1, 21c2, 21d, 21e, 21f, 21g, 21gt, 21ft, 21ht, 21it, 21jt, 21kt, 21l, 21m, 21p, 21q: straight line wiring
22: opening portion
23, 23a, 23b, 23c, 24, 25: wiring pattern
23d, 23e, 23f, 23g, 23h, 23i, 23j, 23k, 23l, 23m, 23n, 23o, 23p, 23q, 23r: line wiring
    24a: first (upper side) wiring pattern
    24b: second (lower side) wiring pattern
    25a, 25b, 25g, 25h, 25i, 25j, 25k, 25l, 25m, 25n: non-equal pitch wiring pattern
    25c, 25d: equal pitch wiring pattern
    25at, 25dt, 25et, 25ft: obliquely observed wiring pattern
    26, 26a: dummy electrode portion
    27: in-electrode dummy pattern portion
    28, 28a, 28b: wiring layer
    30, 30a: display unit
    32, 32r, 32g, 32b: pixel
    34: black matrix (BM)
    36: region
    38: pixel array pattern
    40: display device
    42: input side
    44: touch panel
    46: housing
    48: cover member
    50: cable
    52: flexible substrate
    54: detection control unit
    56: adhesive layer
    58: contact body

What is claimed is:

1. A conductive member provided on a display unit of a display device, the conductive member comprising a wiring portion that is composed of a plurality of thin metal wires,
   wherein the wiring portion has two or more insulated wiring layers and has a mesh-shaped wiring pattern in which line wirings each being composed of a plurality of thin metal wires arranged in parallel in one direction are overlapped in two or more directions, in front observation of the conductive member,
   wherein the line wiring in at least one direction is a straight line wiring in which the plurality of thin metal wires are straight lines,
   wherein the straight line wiring in at least one direction is a wiring in which the two or more thin metal wires are consecutively arranged on at least one wiring layer among the two or more wiring layers, and has a non-equal pitch wiring pattern in which repetitive pitches of a predetermined number of the thin metal wires are equal pitches and at least two pitches of the respective pitches of the predetermined number of the thin metal wires are different, in front observation of the conductive member,
   wherein the mesh-shaped wiring pattern is overlapped on a pixel array pattern of the display unit,
   wherein a moiré evaluation value in the non-equal pitch wiring pattern is less than a moiré evaluation value in an equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, and
   wherein the moiré evaluation value is a sum of intensities of frequency components of moiré obtained by applying human's visual response characteristics to frequency components of moiré calculated from frequency components of 2-dimensional Fourier frequency distributions of transmittances of the non-equal pitch wiring pattern and the equal pitch wiring pattern and frequency components of a 2-dimensional Fourier frequency distribution of a luminance or a transmittance of the pixel array pattern.

2. The conductive member according to claim 1, wherein the visual response characteristics are given by a visual transfer function VTF represented by Expression (1):
   $k \leq \log(0.238/0.138)/0.1,$
   $VTF=1,$
   $k > \log(0.238/0.138)/0.1,$ $$VTF = 5.05 e^{-0.138k}(1 - e^{0.1k}) \qquad (1), \text{ and}$$

$k = \pi du/180,$
   where log is a natural logarithm, k is a spatial frequency defined by solid angle (cycle/deg), u is a spatial frequency defined by length (cycle/mm), and d is an observation distance (mm) within a range of 100 mm to 1000 mm.

3. The conductive member according to claim 2, wherein the observation distance d in the visual response characteristics is a certain distance in a range from 300 mm to 800 mm.

4. The conductive member according to claim 1, wherein assuming that the moiré evaluation value is I, the moiré evaluation value I is derived from an intensity of each frequency component of the moiré by Expression (2):

$$I = (\Sigma(R[i])^x)^{1/x} \qquad (2),$$

where R[i] is an intensity of an i-th frequency component of moiré, and an order x is a certain value in a range of 1 to 4.

5. The conductive member according to claim 4, wherein the order x is 2.

6. The conductive member according to claim 1, wherein the moiré evaluation value is derived by a non-linear sum of the intensities of the frequency components of the moiré.

7. The conductive member according to claim 1, wherein the moiré evaluation value also includes frequency components of the moiré calculated from a frequency of 0 of the pixel array pattern and the frequency components of the wiring pattern.

8. The conductive member according to claim 1, wherein the pixel array pattern is a black matrix pattern.

9. A display device comprising:
   a display unit having a predetermined pixel array pattern; and
   the conductive member according to claim 1, which is provided on the display unit.

10. The display device according to claim 9, wherein the display unit is an organic EL display (OELD), and the pixel array patterns for at least two colors of red (R), green (G), and blue (B) are different.

11. A touch panel using the conductive member according to claim 1.

12. A conductive member provided on a display unit of a display device, the conductive member comprising a wiring portion that is composed of a plurality of thin metal wires,
   wherein the wiring portion has two or more insulated wiring layers and has a mesh-shaped wiring pattern in which line wirings each being composed of a plurality of thin metal wires arranged in parallel in one direction are overlapped in two or more directions, in front observation of the conductive member,
   wherein the mesh-shaped wiring pattern is overlapped on a pixel array pattern of the display unit,
   wherein the line wiring in at least one direction is a straight line wiring in which the plurality of thin metal wires are straight lines, and
   wherein the straight line wiring in at least one direction is a wiring in which the two or more thin metal wires are consecutively arranged on at least one wiring layer among the two or more wiring layers, and has a non-equal pitch wiring pattern in which repetitive pitches of a predetermined number of thin metal wires are equal pitches and at least two pitches of the respective pitches of the predetermined number of the thin metal wires are different, on a wiring layer in which the two or more thin metal wires are consecutively arranged,
   wherein a moiré evaluation value in the non-equal pitch wiring pattern is less than a moiré evaluation value in an equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, and
   wherein the moiré evaluation value is a sum of intensities of frequency components of moiré obtained by applying human's visual response characteristics to frequency components of moiré calculated from frequency components of 2-dimensional Fourier frequency distributions of transmittances of the non-equal pitch wiring pattern and the equal pitch wiring pattern and frequency components of a 2-dimensional Fourier frequency distribution of a luminance or a transmittance of the pixel array pattern.

13. A conductive member provided on a display unit of a display device, the conductive member comprising a wiring portion that is composed of a plurality of thin metal wires,
   wherein the wiring portion has two or more insulated wiring layers and has a mesh-shaped wiring pattern in which line wirings each being composed of a plurality of thin metal wires arranged in parallel in one direction are overlapped in two or more directions, in front observation of the conductive member,
   wherein the line wiring in at least one direction is a straight line wiring in which the plurality of thin metal wires are straight lines,
   wherein the straight line wiring in at least one direction is a wiring in which the two or more thin metal wires are consecutively arranged on at least one wiring layer among the two or more wiring layers, and has a non-equal pitch wiring pattern in which repetitive pitches of a predetermined number of the thin metal wires are equal pitches and at least two pitches of the respective pitches of the predetermined number of the thin metal wires are different, in front observation of the conductive member,
   wherein the mesh-shaped wiring pattern is overlapped on a pixel array pattern of the display unit,
   wherein the conductive member further has at least one of the following configurations (1) to (8):
   (1) an intensity of a frequency component of the moiré that contributes most to the moiré in the non-equal pitch wiring pattern is less than an intensity of a frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal;
   (2) a frequency of the frequency component of the moiré that contributes most to the moiré in the non-equal pitch wiring pattern is greater than a frequency of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal;
   (3) at or below a frequency of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, the moiré evaluation value in the non-equal pitch wiring pattern is less than the moiré evaluation value in the equal pitch wiring pattern, and
   wherein the moiré evaluation value is a sum of intensities of frequency components of moiré obtained by applying human's visual response characteristics to frequency components of moiré calculated from frequency components of 2-dimensional Fourier frequency distributions of transmittances of the non-equal pitch wiring pattern and the equal pitch wiring pattern and frequency components of a 2-dimensional Fourier frequency distribution of a luminance or a transmittance of the pixel array pattern;

(4) at a frequency of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, an intensity of the frequency component of the moiré in the non-equal pitch wiring pattern is less than an intensity of the frequency component of the moiré in the equal pitch wiring pattern;

(5) an intensity of the frequency component of the non-equal pitch wiring pattern as a cause of the frequency component of the moiré that contributes most to the moiré in the non-equal pitch wiring pattern is less than an intensity of the frequency component of the equal pitch wiring pattern as a cause of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal;

(6) at a frequency of the frequency component of the equal pitch wiring pattern as a cause of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, an intensity of the frequency component of the non-equal pitch wiring pattern is less than an intensity of the frequency component of the equal pitch wiring pattern;

(7) assuming that the predetermined number is n and the thin metal wires are thin metal wires $1, 2, \ldots,$ and n in the non-equal pitch wiring pattern, a pitch p of each thin metal wire from the thin metal wire 1 satisfies at least one of Condition 1 or Condition 2:

Condition 1: a difference between a number of thin metal wires where the pitch p belongs to an interval of $(N-d)*T<p<(N+d)*T$ and a number of thin metal wires where the pitch p belongs to an interval of $(N+0.5-d)*T<p<(N+0.5+d)*T$ is equal to or less than 1; and Condition 2: a difference between a number of thin metal wires where the pitch p belongs to an interval of $(N+0.25-d)*T<p<(N+0.25+d)*T$ and a number of thin metal wires where the pitch p belongs to an interval of $(N+0.75-d)*T<p<(N+0.75+d)*T$ is equal to or less than 1, where T is a period given by 1/F in which F is a frequency of the frequency component of the equal pitch wiring pattern as a cause of the frequency component of the moiré that contributes most to the moiré in the equal pitch wiring pattern which is composed of a plurality of straight thin metal wires, in which repetitive pitches of the predetermined number of the thin metal wires are equal to those of the non-equal pitch wiring pattern, and in which respective pitches of the thin metal wires are equal, N is 0 or a positive integer and is an integer equal to or less than $(n*PA/T)$ in which PA is a pitch of the equal pitch wiring pattern, and d is a certain value in a range of 0.025 to 0.25;

(8) assuming that the predetermined number is n and the thin metal wires are thin metal wires $1, 2, \ldots,$ and n in the non-equal pitch wiring pattern, a pitch p of each thin metal wire from the thin metal wire 1 satisfies at least one of Condition 1 or Condition 2:

Condition 1: a difference between a number of thin metal wires where the pitch p belongs to an interval of $(N-d)*T<p<(N+d)*T$ and a number of thin metal wires where the pitch p belongs to an interval of $(N+0.5-d)*T<p<(N+0.5+d)*T$ is equal to or less than 1; and Condition 2: a difference between a number of thin metal wires where the pitch p belongs to an interval of $(N+0.25-d)*T<p<(N+0.25+d)*T$ and a number of thin metal wires where the pitch p belongs to an interval of $(N+0.75-d)*T<p<(N+0.75+d)*T$ is equal to or less than 1, where T is a period given by 1/F in which F is a frequency of the frequency component of the equal pitch wiring pattern as a cause of the frequency component of the moiré that contributes most to the moiré in the wiring pattern consisting only of any of thin metal wires $1, 2, \ldots,$ and n, N is 0 or a positive integer and is equal to or less than an integer of $(n*PA/T)$ in which PA is a pitch of the equal pitch wiring pattern which is formed of a plurality of straight thin metal wires, in which repetitive pitches of the predetermined number of the thin metal wires are equal to those of the non-equal pitch wiring pattern, and in which respective pitches of the thin metal wires are equal, and d is a certain value in a range of 0.025 to 0.25.

14. A conductive member comprising a wiring portion that is composed of a plurality of thin metal wires, wherein the wiring portion has two or more insulated wiring layers and has a mesh-shaped wiring pattern in which line wirings each being composed of a plurality of thin metal wires arranged in parallel in one direction are overlapped in two or more directions, in front observation of the conductive member, wherein the line wiring in at least one direction is a straight line wiring in which the plurality of thin metal wires are straight lines, wherein the straight line wiring in at least one direction is a wiring in which the two or more thin metal wires are consecutively arranged on at least one wiring layer among the two or more wiring layers, and has a non-equal pitch wiring pattern in which repetitive pitches of a predetermined number of the thin metal wires are equal pitches and at least two pitches of the respective pitches of the predetermined number of the thin metal wires are different, in front observation of the conductive member, and wherein the wiring portion has a wiring pattern in which an average pitch of the line wiring in at least one direction among the line wirings in two or more directions is different from an average pitch of the line wiring in at least one different direction.

15. The conductive member according to claim 14, wherein among the line wirings in two or more directions, a wiring pattern of a line wiring in a direction in which the average pitch is the narrowest is the non-equal pitch wiring pattern.

16. A conductive member comprising a wiring portion that is composed of a plurality of thin metal wires, wherein the wiring portion has two or more insulated wiring layers and has a mesh-shaped wiring pattern in which line wirings each being composed of a plurality of thin metal wires arranged in parallel in one direction are overlapped in two or more directions, in front observation of the conductive member, wherein the line wiring in at least one direction is a straight line wiring in which the plurality of thin metal wires are straight lines, wherein the straight line wiring in at least one direction is a wiring in which the two or more thin metal wires are consecutively arranged on at least one wiring layer among the two or more wiring layers, and has a non-equal pitch wiring pattern in which repetitive pitches of a predetermined number of the thin metal wires are equal pitches and at least two pitches of the respective pitches of the predetermined number of the thin metal wires are different, in the at least one wiring layer, and a non-equal pitch wiring pattern in which repetitive pitches of a predetermined number of the thin metal wires are equal pitches and at least two pitches of the respective pitches of the predetermined number of the thin metal wires are different, in front observation of the conductive member.

17. The conductive member according to claim 16, wherein the wiring portion has the mesh-shaped wiring pattern in which the line wirings are overlapped in two directions and all the plurality of thin metal wires are straight lines, and the mesh-shaped wiring pattern in which the line wirings are overlapped in two directions is a bilaterally asymmetric wiring pattern.

18. The conductive member according to claim 16, wherein the wiring portion has the mesh-shaped wiring pattern in which the line wirings are overlapped in two directions and all the plurality of thin metal wires are straight lines, and an angle formed by the line wirings in the two directions is in a range of 40° to 140°.

19. The conductive member according to claim 16, wherein an average pitch of the line wiring in at least one direction among the line wirings overlapped in the two or more directions is in a range of 30 μm to 600 μm.

20. The conductive member according to claim 19, wherein the average pitch is equal to or less than 300 μm.

21. A conductive member comprising a wiring portion that is composed of a plurality of thin metal wires, wherein the wiring portion has two or more insulated wiring layers and has a mesh-shaped wiring pattern in which line wirings each being composed of a plurality of thin metal wires arranged in parallel in one direction are overlapped in two or more directions, in front observation of the conductive member, wherein the line wiring in at least one direction is a straight line wiring in which the plurality of thin metal wires are straight lines, wherein the straight line wiring in at least one direction is a wiring in which the two or more thin metal wires are consecutively arranged on each wiring layer among the two or more wiring layers, and has a non-equal pitch wiring pattern in which repetitive pitches of a predetermined number of the thin metal wires are equal pitches and at least two pitches of the respective pitches of the predetermined number of the thin metal wires are different, in front observation of the conductive member.

22. A conductive film comprising: a transparent substrate; and a wiring portion that is composed of a plurality of thin metal wires, wherein the wiring portion has two or more insulated wiring layers and has a mesh-shaped wiring pattern in which line wirings each being composed of a plurality of thin metal wires arranged in parallel in one direction are overlapped in two or more directions, in front observation of the conductive film, wherein the line wiring in at least one direction is a straight line wiring in which the plurality of thin metal wires are straight lines, and wherein the straight line wiring in at least one direction is a wiring in which the two or more thin metal wires are consecutively arranged on at least one wiring layer among the two or more wiring layers, and has a non-equal pitch wiring pattern in which repetitive pitches of a predetermined number of the thin metal wires are equal pitches and at least two pitches of the respective pitches of the predetermined number of the thin metal wires are different, in front observation of the conductive film.

23. A method of producing a wiring pattern of a conductive member which is provided on a display unit of a display device and has a wiring portion that is composed of a plurality of thin metal wires, where the wiring portion has two or more insulated wiring layers and has a mesh-shaped wiring pattern in which line wirings each being composed of a plurality of thin metal wires arranged in parallel in one direction are overlapped in two or more directions, in front observation, in which the mesh-shaped wiring pattern is overlapped on a pixel array pattern of the display unit, the line wiring in at least one direction is a straight line wiring in which the plurality of thin metal wires are straight lines, and the straight line wiring in at least one direction is a wiring in which the two or more thin metal wires are consecutively arranged on at least one wiring layer among the two or more wiring layers, and has a non-equal pitch wiring pattern in which repetitive pitches of a predetermined number of the thin metal wires are equal pitches and at least two pitches of the respective pitches of the predetermined number of the thin metal wires are different, in front observation of the conductive member, the method comprising:

acquiring a luminance or a transmittance of the pixel array pattern;

acquiring transmittances of respective wiring patterns of the non-equal pitch wiring pattern and an equal pitch wiring pattern, which is composed of a plurality of straight thin metal wires, in which repetitive pitches of the predetermined number of the thin metal wires are equal to those of the non-equal pitch wiring pattern, and in which respective pitches of the thin metal wires are equal;

deriving 2-dimensional Fourier frequency distributions of the transmittances of the respective wiring patterns of the non-equal pitch wiring pattern and the equal pitch wiring pattern;

deriving a 2-dimensional Fourier frequency distribution of the luminance or the transmittance of the pixel array pattern;

calculating respective frequency components of moiré from frequency components of the 2-dimensional Fourier frequency distributions of the transmittances of the non-equal pitch wiring pattern and the equal pitch wiring pattern and frequency components of the 2-dimensional Fourier frequency distribution of the luminance or the transmittance of the pixel array pattern;

applying human's visual response characteristics to the calculated respective frequency components of the moiré so as to obtain a moiré evaluation value, which is a sum of intensities of the respective frequency components; and producing the non-equal pitch wiring pattern in which the obtained moiré evaluation value in the non-equal pitch wiring pattern is less than a moiré evaluation value in the equal pitch wiring pattern.

24. A method of producing a wiring pattern of a conductive member which is provided on a display unit of a display device and has a wiring portion that is composed of a plurality of thin metal wires, where the wiring portion has two or more insulated wiring layers and has a mesh-shaped wiring pattern in which line wirings each being composed of a plurality of thin metal wires arranged in parallel in one direction are overlapped in two or more directions, in front observation, in which the mesh-shaped wiring pattern is overlapped on a pixel array pattern of the display unit, the line wiring in at least one direction is a straight line wiring in which the plurality of thin metal wires are straight lines, and the straight line wiring in at least one direction is a wiring in which the two or more thin metal wires are consecutively arranged on at least one wiring layer among the two or more wiring layers, and has a non-equal pitch wiring pattern in which repetitive pitches of a predetermined number of the thin metal wires are equal pitches and at least two pitches of the respective pitches of the predetermined number of the thin metal wires are different, on a wiring layer in which the two or more thin metal wires are consecutively arranged, the method comprising:

acquiring a luminance or a transmittance of the pixel array pattern;

acquiring transmittances of respective wiring patterns of the non-equal pitch wiring pattern and an equal pitch wiring pattern, which is composed of a plurality of straight thin metal wires, in which repetitive pitches of the predetermined number of the thin metal wires are equal to those of the non-equal pitch wiring pattern, and in which respective pitches of the thin metal wires are equal;

deriving 2-dimensional Fourier frequency distributions of the transmittances of the respective wiring patterns of the non-equal pitch wiring pattern and the equal pitch wiring pattern;

deriving a 2-dimensional Fourier frequency distribution of the luminance or the transmittance of the pixel array pattern;

calculating respective frequency components of moiré from frequency components of the 2-dimensional Fourier frequency distributions of the transmittances of the non-equal pitch wiring pattern and the equal pitch wiring pattern and frequency components of the 2-dimensional Fourier frequency distribution of the luminance or the transmittance of the pixel array pattern;

applying human's visual response characteristics to the calculated respective frequency components of the moiré so as to obtain a moiré evaluation value, which is a sum of intensities of the respective frequency components; and producing the non-equal pitch wiring pattern in which the obtained moiré evaluation value in the non-equal pitch wiring pattern is less than a moiré evaluation value in the equal pitch wiring pattern.

* * * * *